(12) United States Patent
Mirzaei et al.

(10) Patent No.: US 8,655,299 B2
(45) Date of Patent: Feb. 18, 2014

(54) SAW-LESS RECEIVER WITH RF FREQUENCY TRANSLATED BPF

(75) Inventors: Ahmad Mirzaei, San Diego, CA (US); Hooman Darabi, Laguna Niguel, CA (US)

(73) Assignee: Broadcom Corporation, Irvine, CA (US)

( * ) Notice: Subject to any disclaimer, the term of this patent is extended or adjusted under 35 U.S.C. 154(b) by 322 days.

(21) Appl. No.: 13/076,183

(22) Filed: Mar. 30, 2011

(65) Prior Publication Data

US 2011/0299632 A1 Dec. 8, 2011

Related U.S. Application Data

(63) Continuation-in-part of application No. 13/070,980, filed on Mar. 24, 2011.

(60) Provisional application No. 61/351,284, filed on Jun. 3, 2010.

(51) Int. Cl.
*H04B 1/10* (2006.01)

(52) U.S. Cl.
USPC ........... 455/307; 455/280; 455/292; 455/293; 455/306; 375/343; 375/350

(58) Field of Classification Search
USPC ............... 455/39, 73, 130, 190.1, 191.1, 207, 455/209, 213, 280, 292, 293, 302, 306, 307, 455/323, 341, 193.1, 193.2, 248.1; 375/343, 350
See application file for complete search history.

(56) References Cited

U.S. PATENT DOCUMENTS

| | | | | |
|---|---|---|---|---|
| 4,661,799 | A * | 4/1987 | Buttemer | 340/941 |
| 5,434,541 | A | 7/1995 | Knoedl, Jr. | |
| 7,221,924 | B2 * | 5/2007 | Zheng et al. | 455/307 |
| 7,236,743 | B2 * | 6/2007 | Eichin et al. | 455/63.1 |

(Continued)

FOREIGN PATENT DOCUMENTS

| | | |
|---|---|---|
| EP | 2042350 A2 | 4/2009 |
| WO | WO 2004/012350 A1 | 2/2004 |

(Continued)

OTHER PUBLICATIONS

Partial European Search Report for Application No. 11003819.7, dated Sep. 30, 2011.

(Continued)

*Primary Examiner* — Tuan Pham
(74) *Attorney, Agent, or Firm* — Garlick & Markison; Bruce E. Garlick

(57) ABSTRACT

A SAW-less receiver includes an FEM interface module, an RF to IF receiver section, and a receiver IF to baseband section. The RF to IF receiver section includes a frequency translated bandpass filter (FTBPF), an LNA, and a mixing section. The FTBPF includes a switching network and a plurality of baseband impedances. The switching network is operable to couple the plurality of baseband impedances to the FEM interface in accordance with a plurality of phase-offset RF clock signals to RF bandpass filter the inbound RF signal. The LNA amplifies the filtered inbound RF signal and the mixing section mixes the amplified inbound RF signal with a local oscillation to produce an inbound IF signal. The receiver IF to baseband section converts the inbound IF signal into one or more inbound symbol streams.

20 Claims, 80 Drawing Sheets

(56) References Cited

U.S. PATENT DOCUMENTS

| | | | |
|---|---|---|---|
| 8,290,750 B1* | 10/2012 | Wong et al. | 702/189 |
| 2004/0023624 A1* | 2/2004 | Song et al. | 455/118 |
| 2004/0219900 A1 | 11/2004 | Zheng et al. | |
| 2004/0227584 A1 | 11/2004 | Lee et al. | |
| 2005/0042989 A1 | 2/2005 | Ho | |
| 2005/0164669 A1 | 7/2005 | Molnar et al. | |
| 2005/0221855 A1 | 10/2005 | Kuriyama et al. | |
| 2006/0092079 A1 | 5/2006 | de Rochemont | |
| 2007/0110171 A1 | 5/2007 | Iida | |
| 2007/0142089 A1* | 6/2007 | Roy | 455/562.1 |
| 2008/0096508 A1* | 4/2008 | Luff | 455/209 |
| 2008/0175307 A1* | 7/2008 | Brunn et al. | 375/148 |
| 2009/0068963 A1 | 3/2009 | Cabanillas et al. | |
| 2009/0111420 A1 | 4/2009 | Tasic et al. | |
| 2009/0174497 A1 | 7/2009 | Korden | |
| 2009/0232246 A1* | 9/2009 | Iida | 375/267 |
| 2009/0252252 A1 | 10/2009 | Kim et al. | |
| 2009/0253385 A1 | 10/2009 | Dent et al. | |
| 2010/0029323 A1 | 2/2010 | Tasic et al. | |

FOREIGN PATENT DOCUMENTS

| | | |
|---|---|---|
| WO | WO 2006/039699 A2 | 4/2006 |
| WO | 2007/068547 A1 | 6/2007 |
| WO | 2009003101 A3 | 12/2008 |
| WO | 2009123583 A1 | 10/2009 |

OTHER PUBLICATIONS

European Patent Office; European Search Report; EP Application No. 12007606.2; Jan. 31, 2013; 3 pgs.

Partial European Search Report for Application No. 11004418.7, dated Feb. 9, 2012.

Partial European Search Report for Application No. 11003987.2, dated Nov. 9, 2011.

European Patent Office; Office Action; May 3, 2013; 5 pgs.

Mizraei et al.; A fequency translation technique for SAW-less 3G receivers; IEEE 2009 Symposium on VLSI Circuits; Jun. 16, 2009; pp. 280-281.

European Patent Office; European Search Report; EP Application No. 13001741.1; May 31, 2013; 5 pgs.

\* cited by examiner portable computing
communication device 10 portable computing
communication device 10 portable computing
communication device 10 portable computing communication device 10 portable computing
communication device 10 portable computing
communication device 10 portable computing
communication device 10 portable computing
communication device 10 portable computing
communication device 10

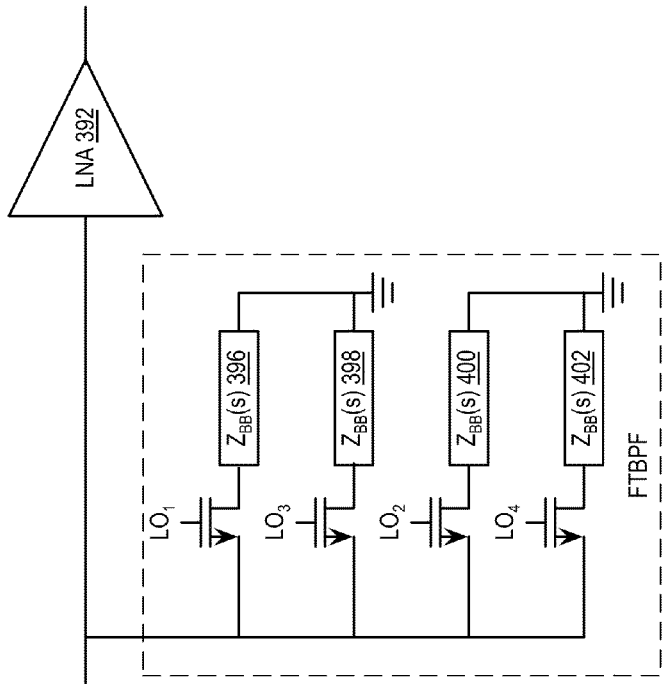
FIG. 25
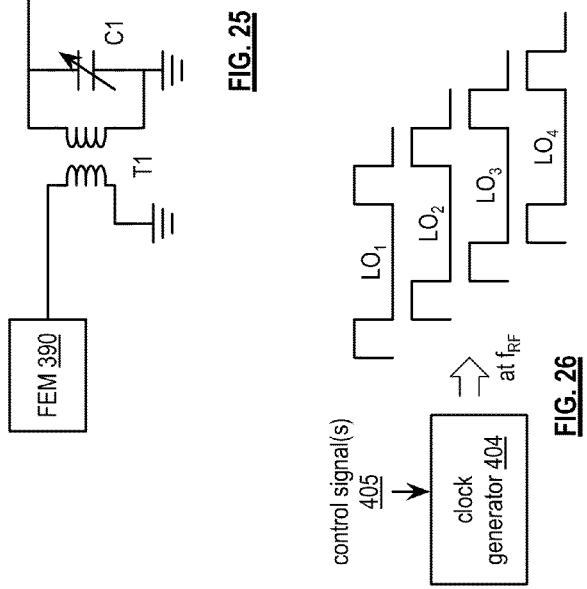
FIG. 26
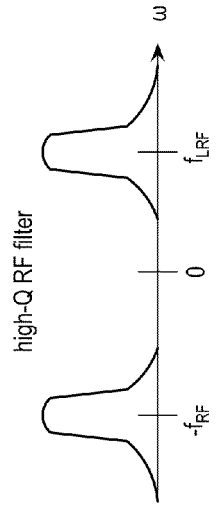
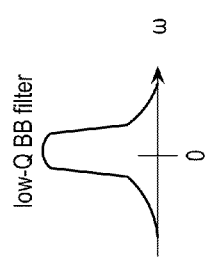
FIG. 27

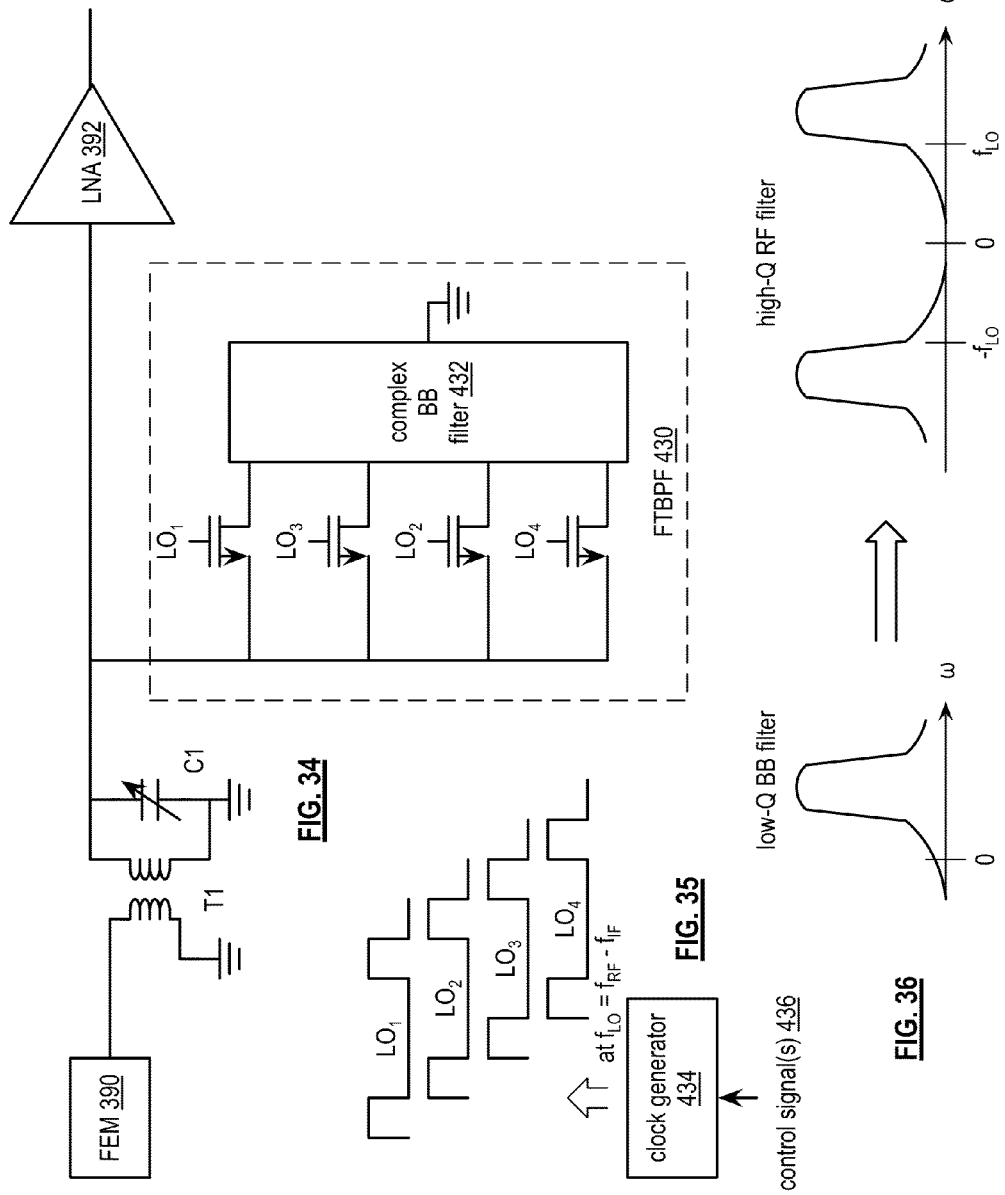

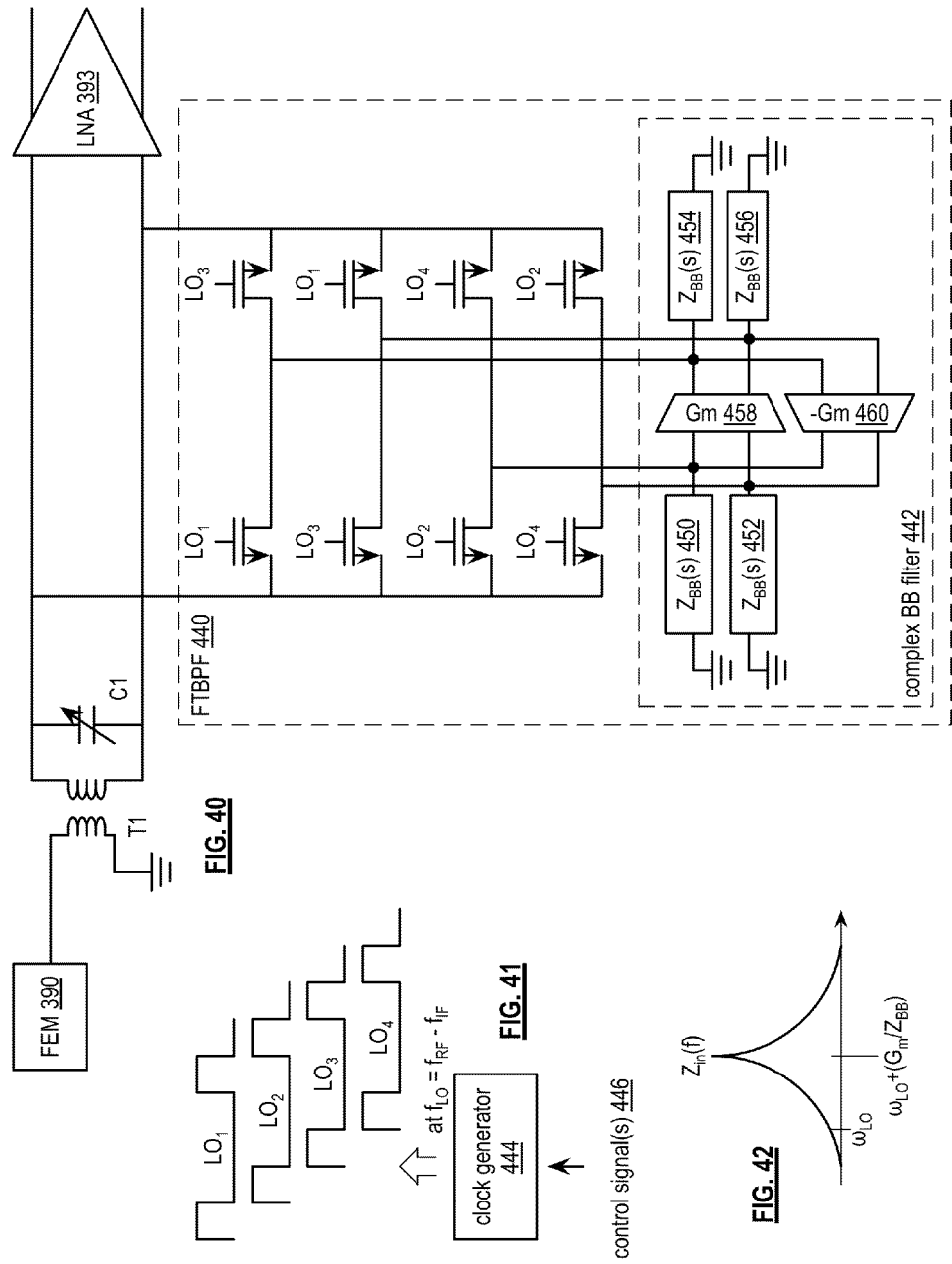

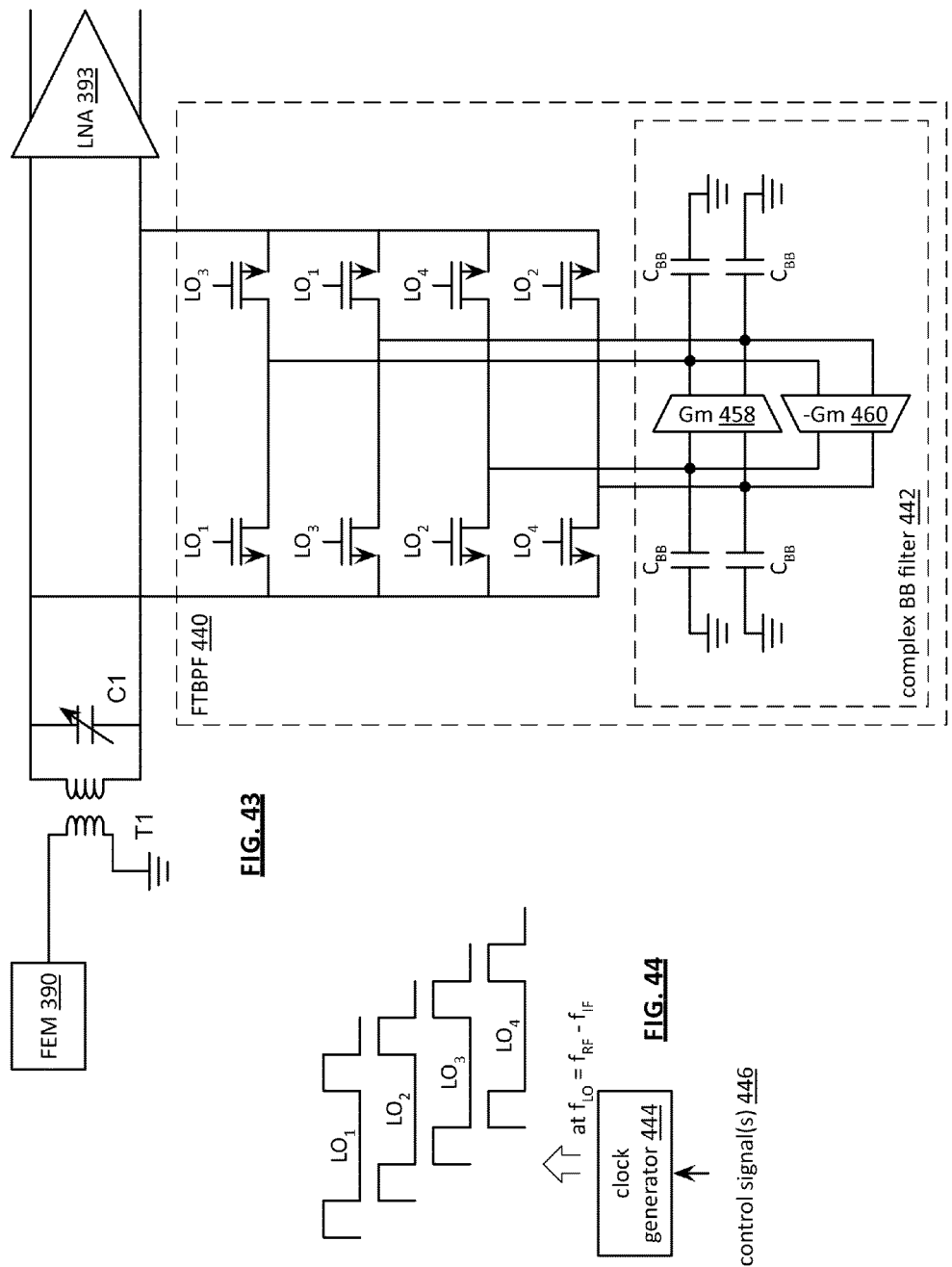

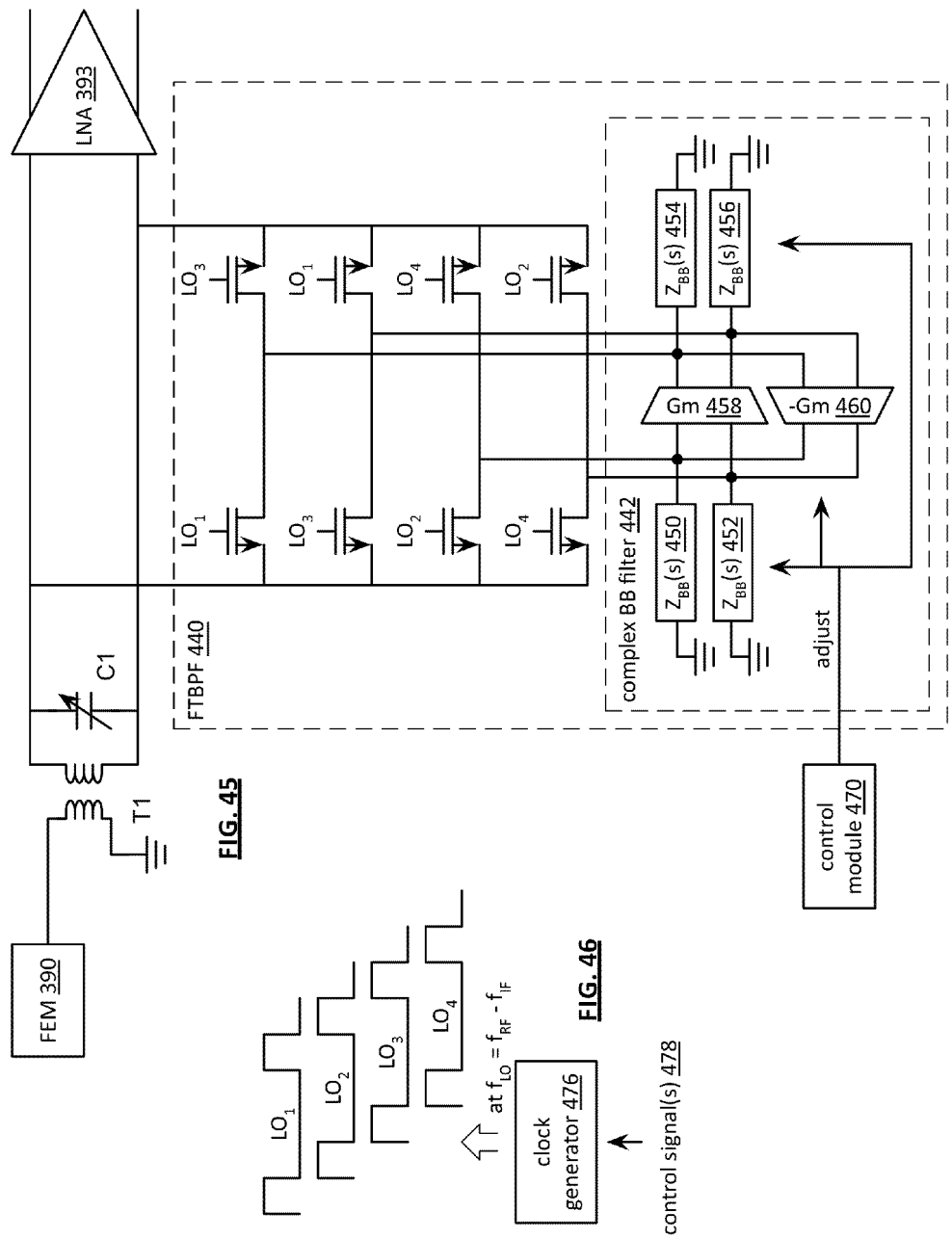

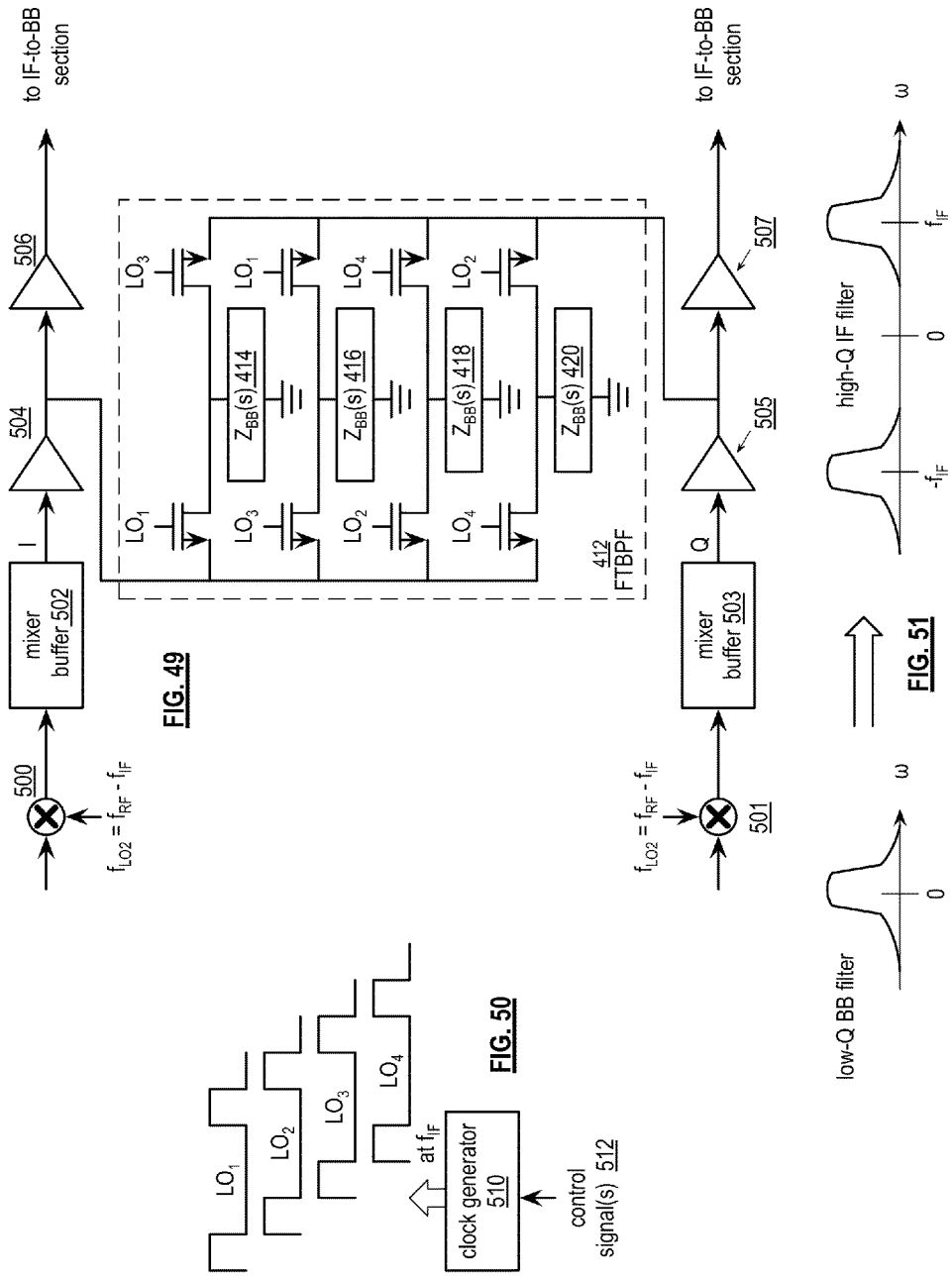

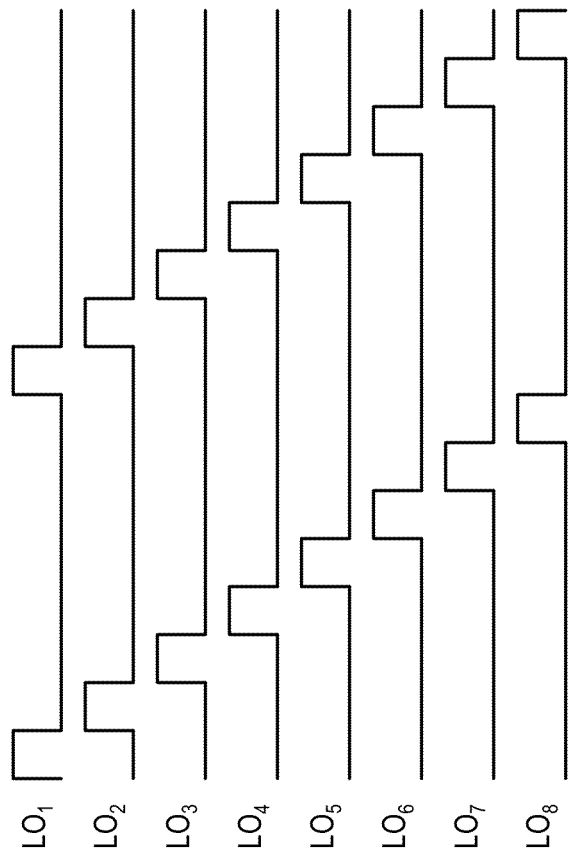
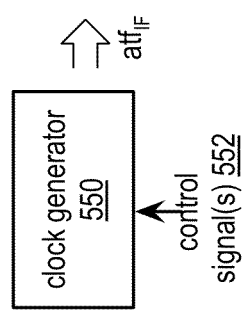
FIG. 53

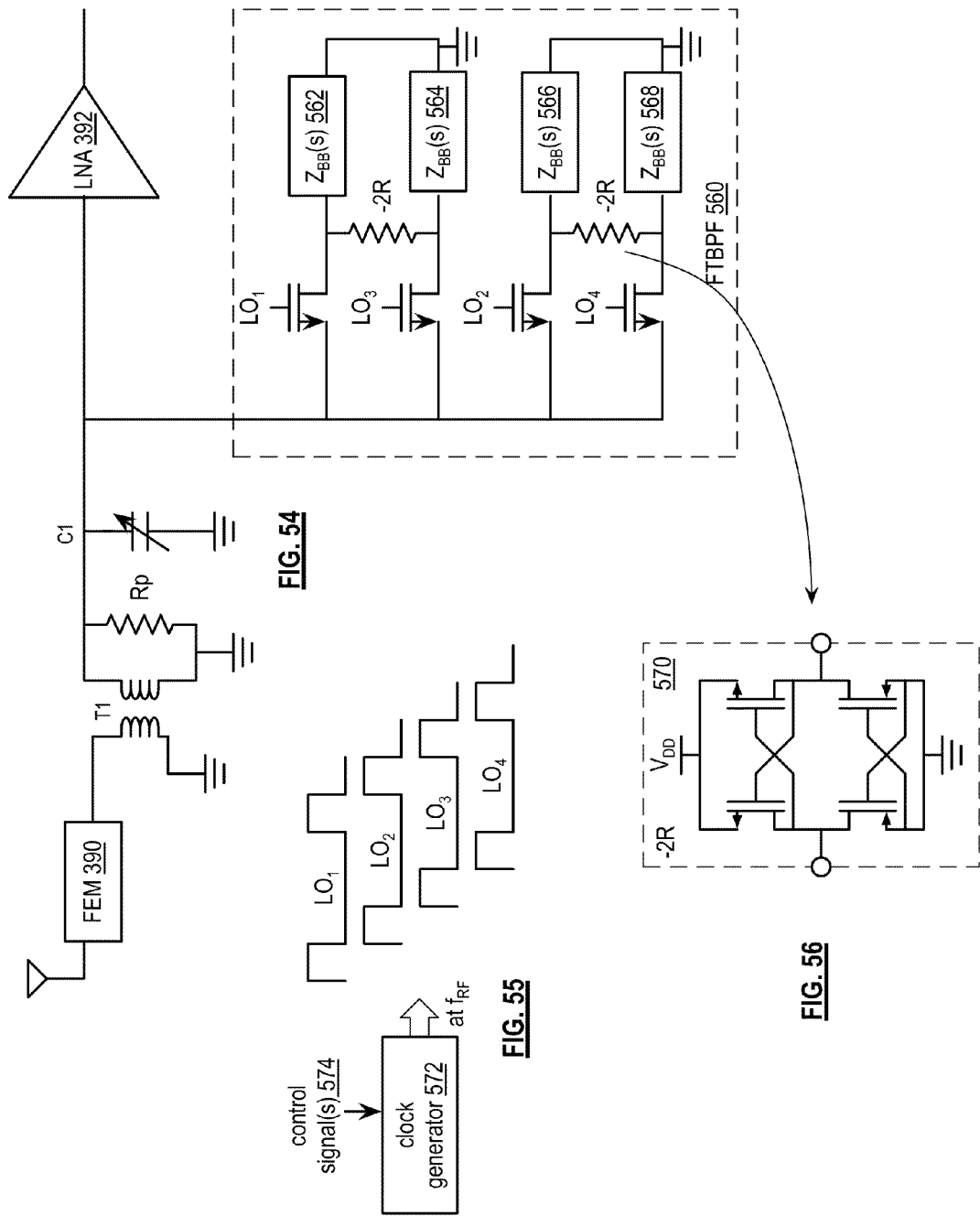

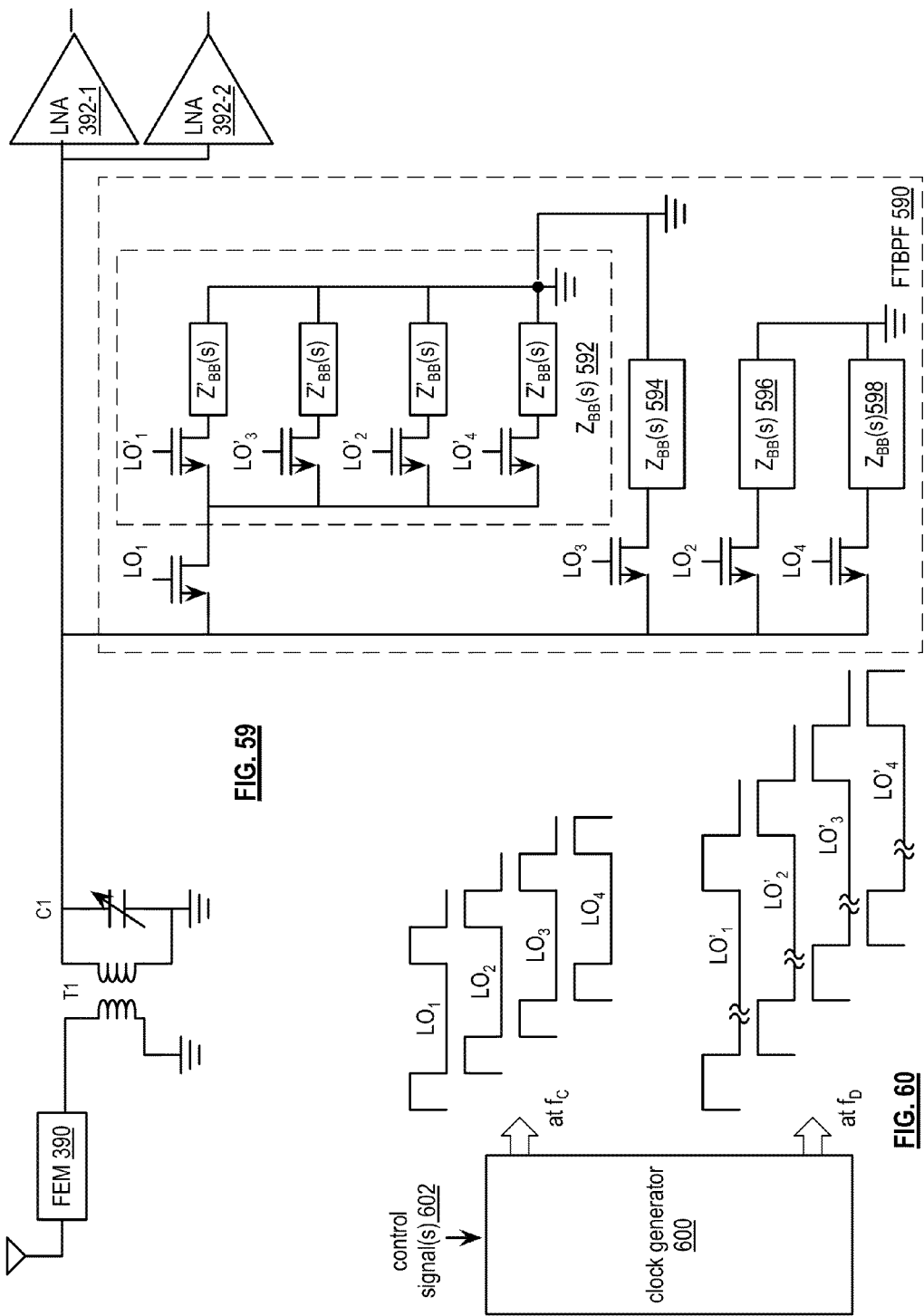

response for $Z_{BB}(s)$ response for 2 frequency band FTBPF

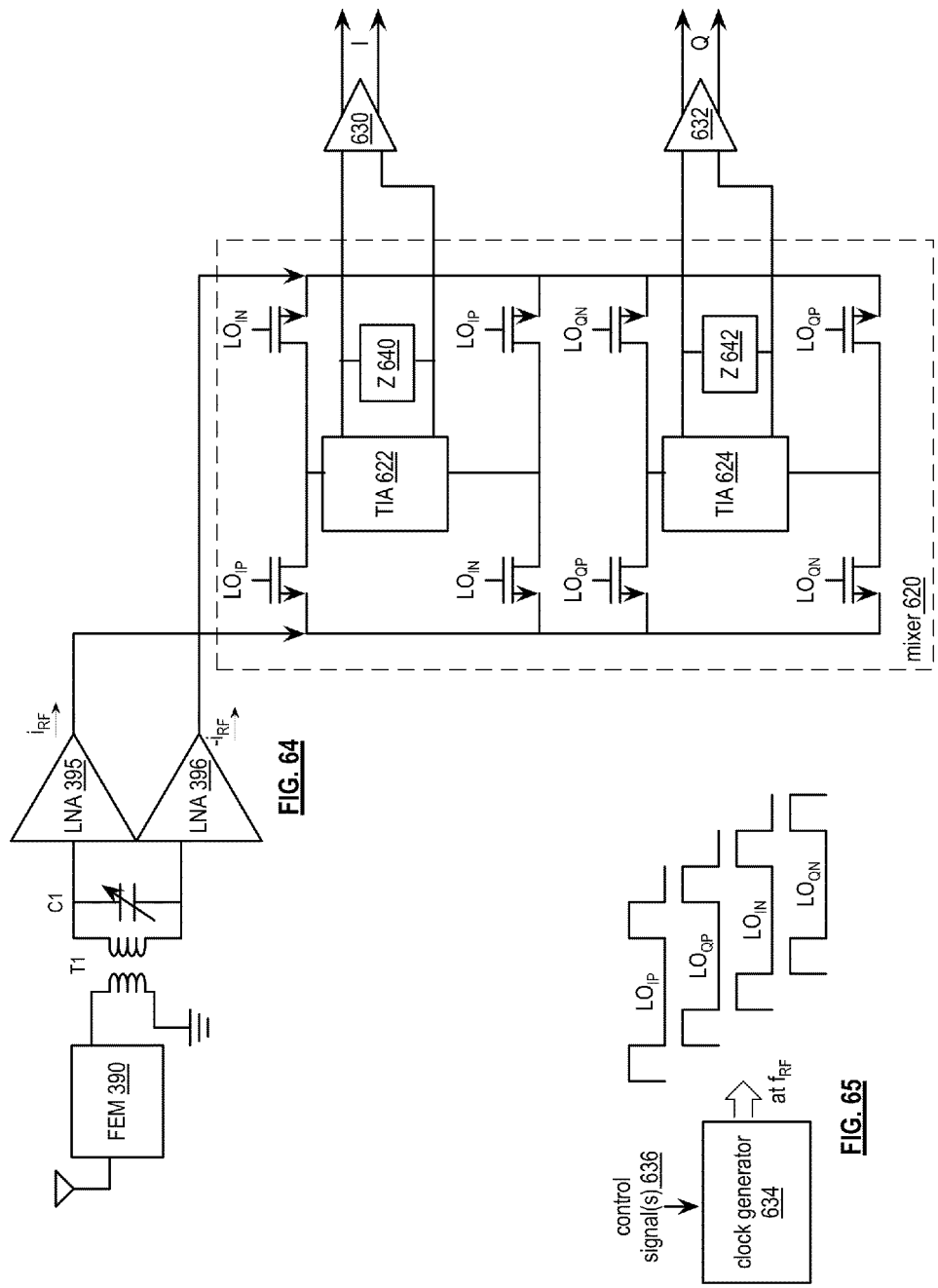

transimpedance amplifier (TIA)

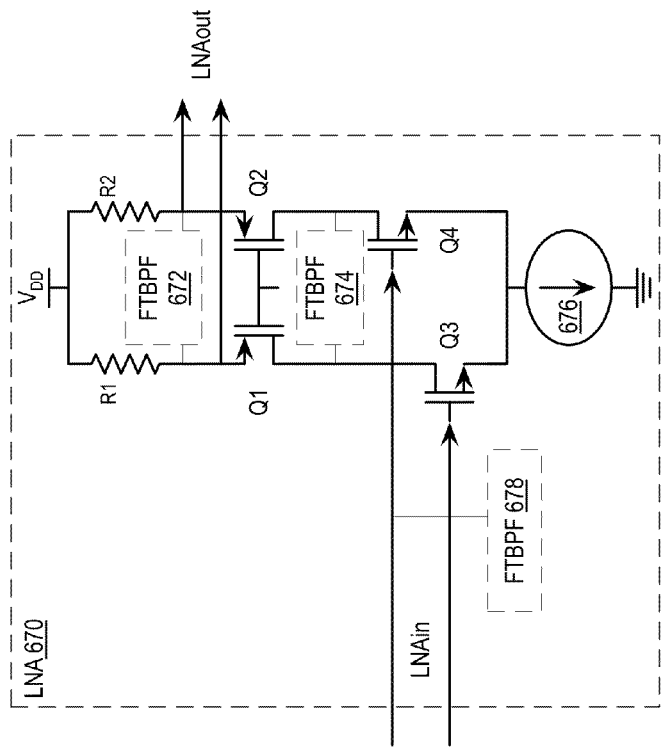
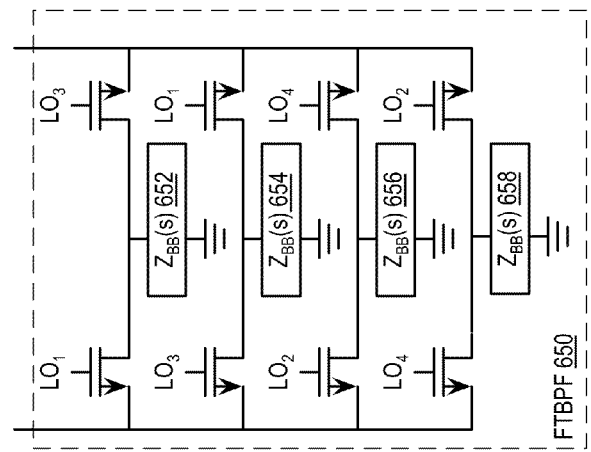
FIG. 67

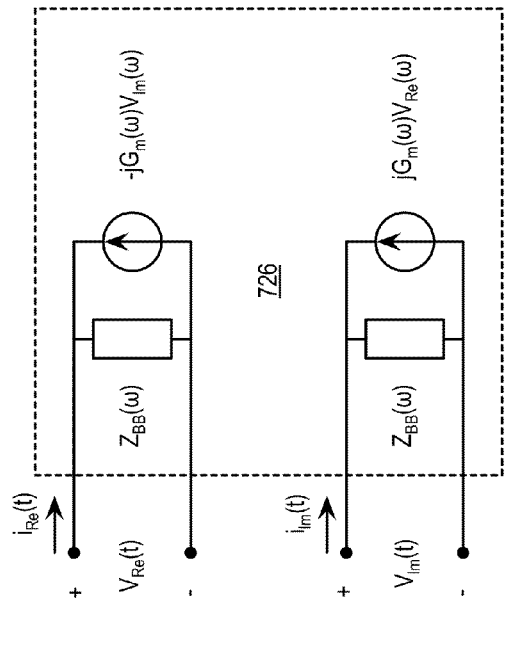
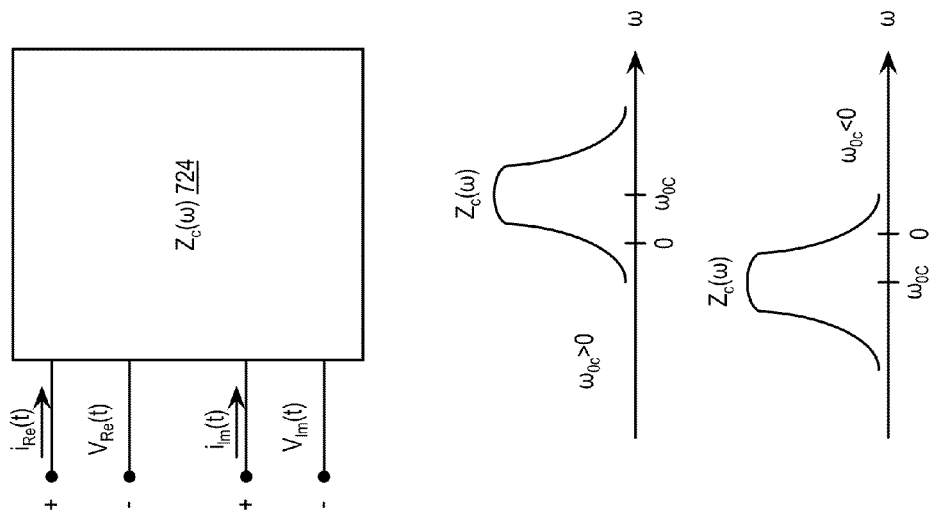
FIG. 77

M-phase FTBPF 734

M-phase FTBPF  736

M-phase FTBPF 738 clock for M-phase FTBPF 750 clock for M-phase FTBPF 750 clock for M-phase FTBPF 790 large signal balancing
network 882 small signal balancing
network 880

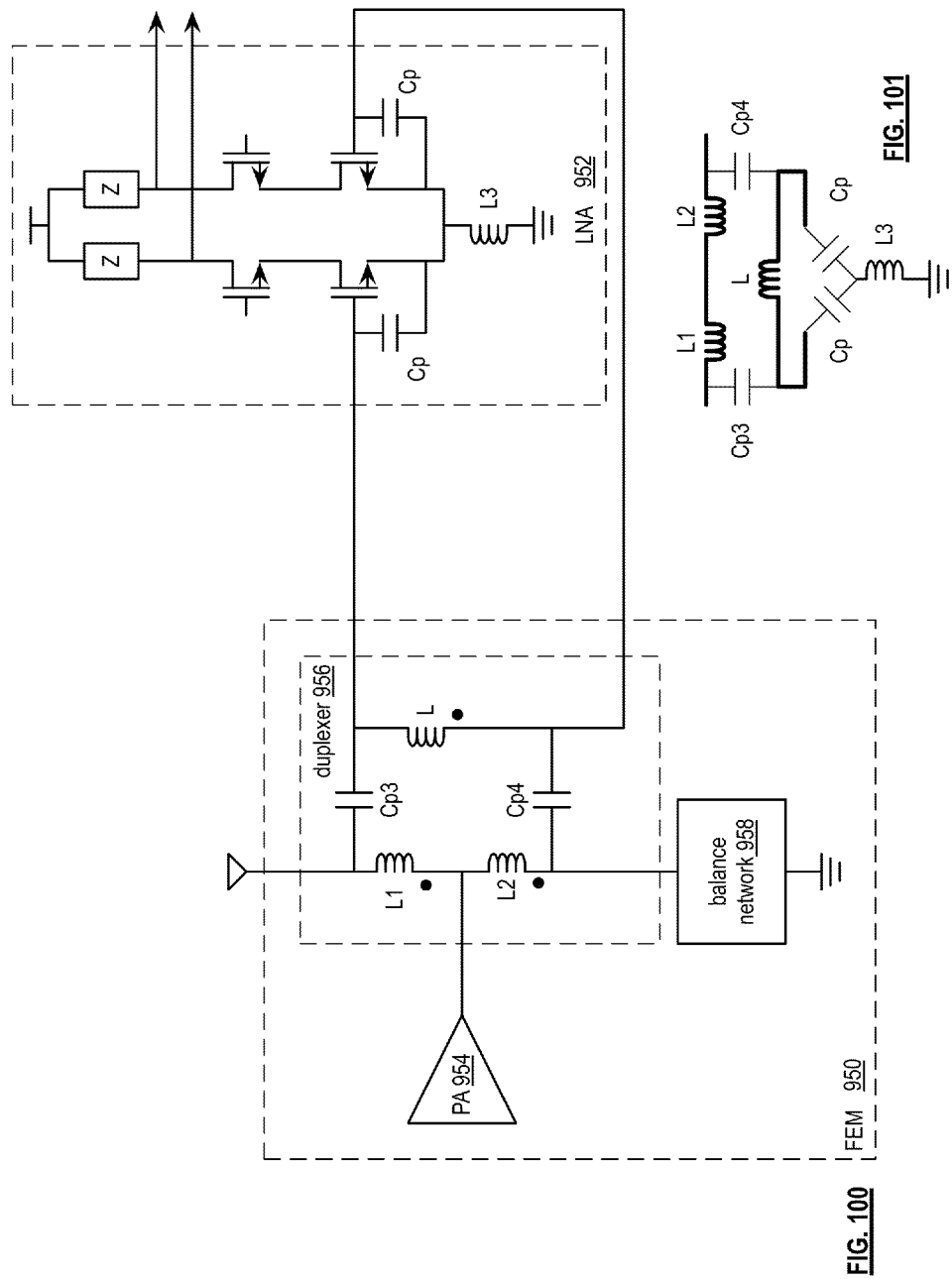

balun 980

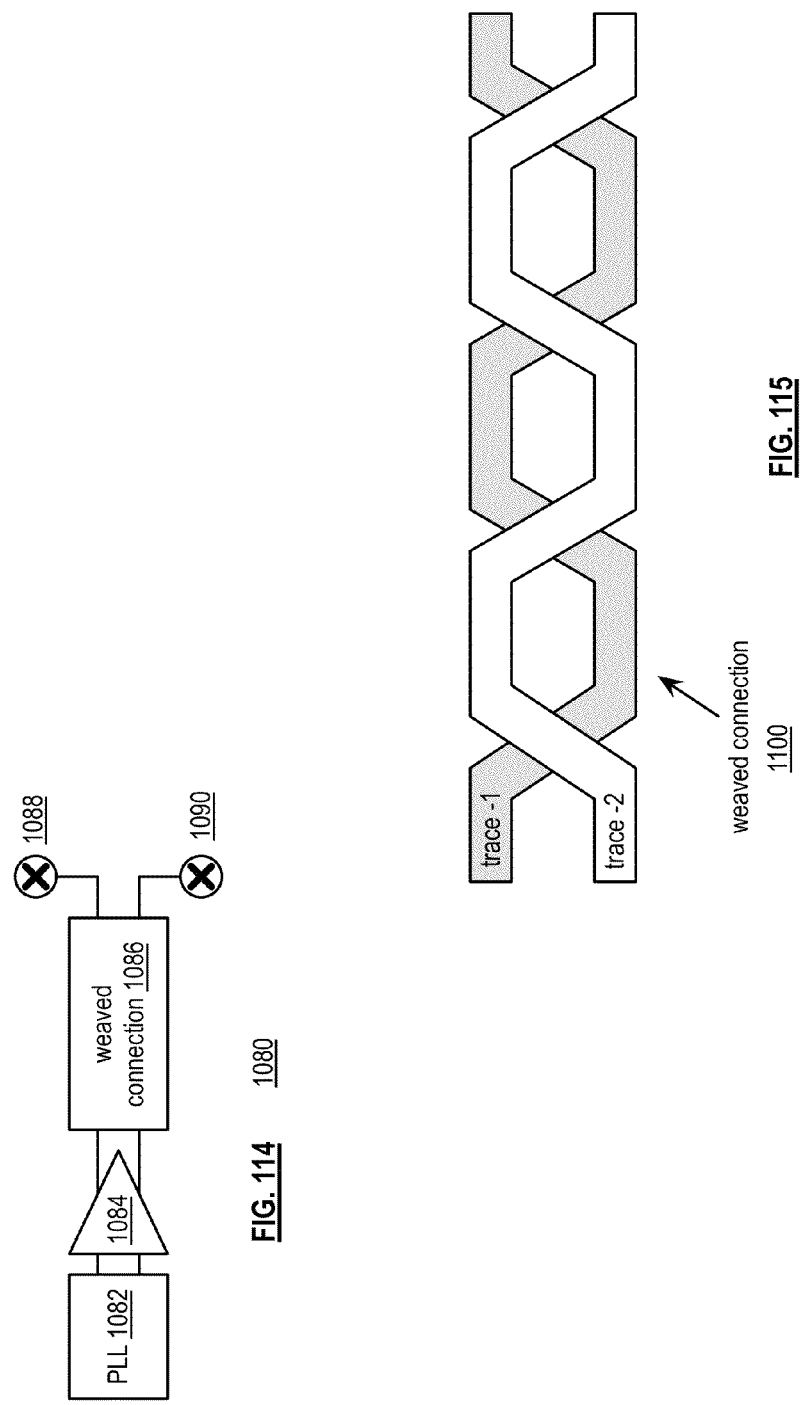

US 8,655,299 B2

SAW-LESS RECEIVER WITH RF FREQUENCY TRANSLATED BPF

CROSS REFERENCE TO RELATED PATENTS

This patent application is claiming priority under 35 U.S.C §120 as a continuation-in-part patent application of co-pending patent application entitled, "SAW-LESS RECEIVER WITH OFFSET RF FREQUENCY TRANSLATED BPF," having a filing date of Mar. 24, 2011, and Ser. No. 13/070,980, and which claims priority under 35 U.S.C. §119(e) to a provisionally filed patent application entitled, "CONFIGURABLE AND SCALABLE RF FRONT-END MODULE," having a provisional filing date of Jun. 3, 2010, and provisional Ser. No. 61/351,284, pending, all of which are incorporated herein by reference in their entirety and made part of the present U.S. Utility patent application for all purposes.

STATEMENT REGARDING FEDERALLY SPONSORED RESEARCH OR DEVELOPMENT

Not applicable

INCORPORATION-BY-REFERENCE OF MATERIAL SUBMITTED ON A COMPACT DISC

Not applicable

BACKGROUND OF THE INVENTION

1. Technical Field of the Invention

This invention relates generally to wireless communications and more particularly to radio transceivers.

2. Description of Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), radio frequency identification (RFID), Enhanced Data rates for GSM Evolution (EDGE), General Packet Radio Service (GPRS), WCDMA, LTE (Long Term Evolution), WiMAX (worldwide interoperability for microwave access), and/or variations thereof.

Depending on the type of wireless communication system, a wireless communication device, such as a cellular telephone, two-way radio, personal digital assistant (PDA), personal computer (PC), laptop computer, home entertainment equipment, RFID reader, RFID tag, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system or a particular RF frequency for some systems) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver is coupled to an antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers data from the filtered signals in accordance with the particular wireless communication standard.

As is also known, the transmitter includes a data modulation stage, one or more intermediate frequency stages, and a power amplifier. The data modulation stage converts data into baseband signals in accordance with a particular wireless communication standard. The one or more intermediate frequency stages mix the baseband signals with one or more local oscillations to produce RF signals. The power amplifier amplifies the RF signals prior to transmission via an antenna.

To implement a radio transceiver, a wireless communication device includes a plurality of integrated circuits (ICs) and a plurality of discrete components. FIG. 1 illustrates an example of a wireless communication device that supports 2G and 3G cellular telephone protocols. As shown, the wireless communication device includes a baseband processing IC, a power management IC, a radio transceiver IC, a transmit/receive (T/R) switch, an antenna, and a plurality of discrete components. The discrete components include surface acoustic wave (SAW) filters, power amplifiers, duplexers, inductors, and capacitors. Such discrete components add several dollars (US) to the bill of material for the wireless communication device, but are necessary to achieve the strict performance requirements of the 2G and 3G protocols.

As integrated circuit fabrication technology evolves, wireless communication device manufacturers require that wireless transceiver IC manufacturers update their ICs in accordance with the advancements in IC fabrication. For example, as the fabrication process changes (e.g., uses smaller transistor sizes), the wireless transceiver ICs are redesigned for the newer fabrication process. Redesigning the digital portions of the ICs is a relatively straightforward process since most digital circuitry "shrinks" with the IC fabrication process. Redesigning the analog portions, however, is not a straightforward task since most analog circuitry (e.g., inductors, capacitors, etc.) does not "shrink" with the IC process. As such, wireless transceiver IC manufacturers invest significant effort to produce ICs of newer IC fabrication processes.

BRIEF SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWING(S)

FIG. 25 is a schematic block diagram of an embodiment of a portion of an RF to IF receiver section that includes an FTBPF (frequency translated bandpass filter) in accordance with the present invention;

FIG. 26 is a schematic block diagram of an embodiment of a clock generator for the RF to IF receiver section in accordance with the present invention;

FIG. 27 is a diagram of an example of frequency responses for the RF to IF receiver section in accordance with the present invention;

FIG. 34 is a schematic block diagram of another embodiment of a portion of an RF to IF receiver section that includes an FTBPF (frequency translated bandpass filter) in accordance with the present invention;

FIG. 35 is a schematic block diagram of another embodiment of a clock generator for the RF to IF receiver section in accordance with the present invention;

FIG. 36 is a diagram of another example of frequency responses for the RF to IF receiver section in accordance with the present invention;

FIG. 40 is a schematic block diagram of another embodiment of a portion of an RF to IF receiver section that includes an FTBPF (frequency translated bandpass filter) in accordance with the present invention;

FIG. 41 is a schematic block diagram of another embodiment of a clock generator for the RF to IF receiver section in accordance with the present invention;

FIG. 42 is a diagram of another example of frequency responses for the RF to IF receiver section in accordance with the present invention;

FIG. 43 is a schematic block diagram of another embodiment of a portion of an RF to IF receiver section that includes an FTBPF (frequency translated bandpass filter) in accordance with the present invention;

FIG. 44 is a schematic block diagram of another embodiment of a clock generator for the RF to IF receiver section in accordance with the present invention;

FIG. 45 is a schematic block diagram of another embodiment of a portion of an RF to IF receiver section that includes an FTBPF (frequency translated bandpass filter) in accordance with the present invention;

FIG. 46 is a schematic block diagram of another embodiment of a clock generator for the RF to IF receiver section in accordance with the present invention;

FIG. 49 is a schematic block diagram of another embodiment of a portion of an RF to IF receiver section that includes an FTBPF (frequency translated bandpass filter) in accordance with the present invention;

FIG. 50 is a schematic block diagram of another embodiment of a clock generator for the RF to IF receiver section in accordance with the present invention;

FIG. 51 is a diagram of another example of frequency responses for the RF to IF receiver section in accordance with the present invention;

FIG. 53 is a schematic block diagram of another embodiment of a clock generator for the RF to IF receiver section in accordance with the present invention;

FIG. 54 is a schematic block diagram of another embodiment of a portion of an RF to IF receiver section that includes an FTBPF (frequency translated bandpass filter) in accordance with the present invention;

FIG. 55 is a schematic block diagram of another embodiment of a clock generator for the RF to IF receiver section in accordance with the present invention;

FIG. 56 is a schematic block diagram of an embodiment of a negative resistance in accordance with the present invention;

FIG. 59 is a schematic block diagram of another embodiment of a portion of an RF to IF receiver section that includes an FTBPF (frequency translated bandpass filter) in accordance with the present invention;

FIG. 60 is a schematic block diagram of another embodiment of a clock generator for the RF to IF receiver section in accordance with the present invention;

FIG. 64 is a schematic block diagram of another embodiment of a portion of an RF to IF receiver section that includes a mixer in accordance with the present invention;

FIG. 65 is a schematic block diagram of another embodiment of a clock generator for the RF to IF receiver section in accordance with the present invention;

FIG. 67 is a schematic block diagram of an embodiment of a low noise amplifier (LNA) that includes an FTBPF in accordance with the present invention;

FIG. 77 is a schematic block diagram of an embodiment of a complex baseband impedance for an FTBPF (frequency translated bandpass filter) in accordance with the present invention;

FIG. 100 is a schematic block diagram of another embodiment of a portion of each of a front-end module (FEM) and an LNA in accordance with the present invention;

FIG. 101 is a schematic block diagram of an embodiment of an equivalent circuit of a portion of each of a front-end module (FEM) and an LNA in accordance with the present invention;

FIG. 114 is a schematic block diagram of an embodiment of a buffer circuit in accordance with the present invention;

FIG. 115 is a schematic block diagram of an embodiment of a weaved connection in accordance with the present invention.

DETAILED DESCRIPTION OF THE INVENTION

Figure 1:
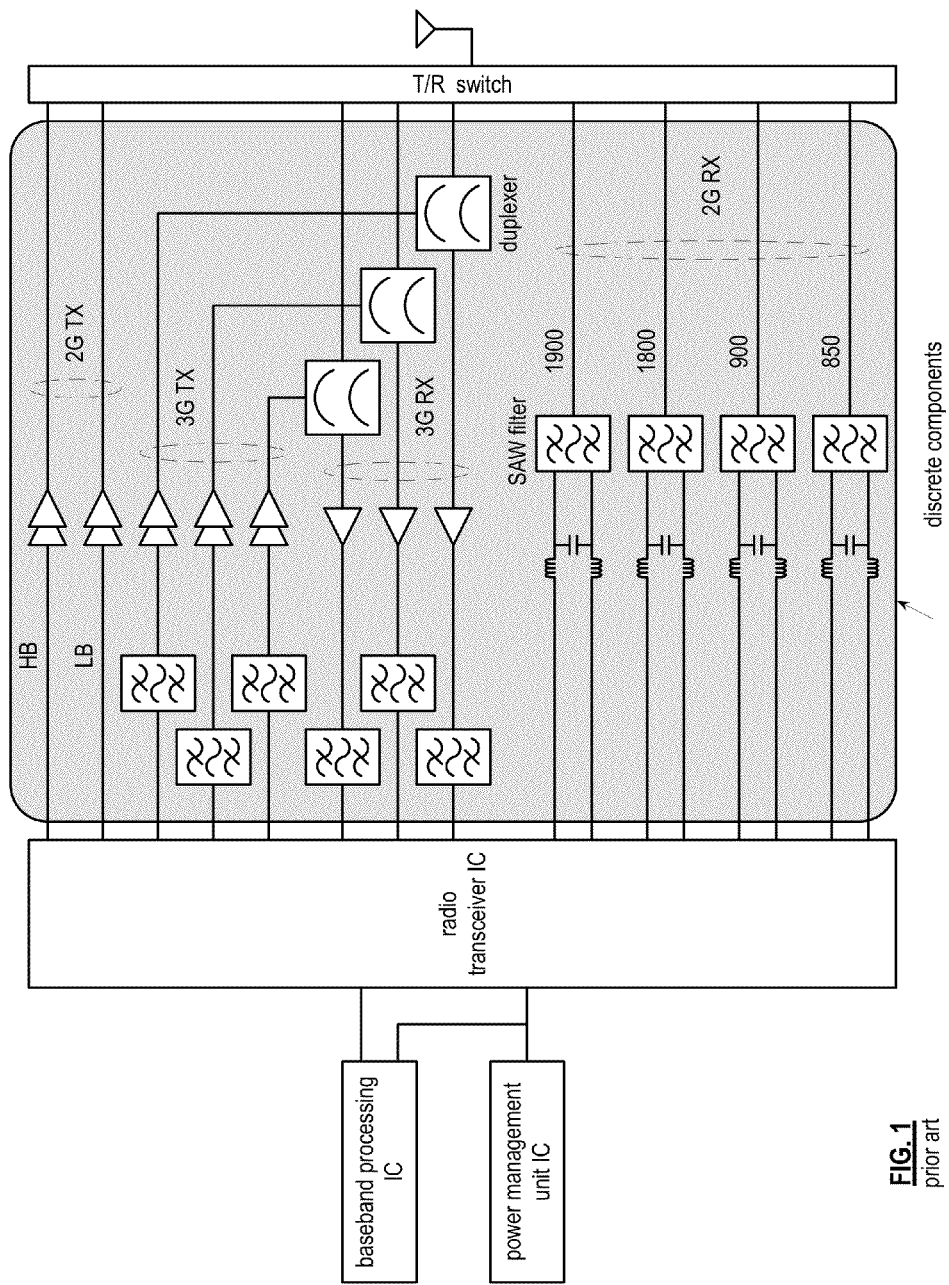
FIG. 1 is a schematic block diagram of a prior art wireless communication device.
Figure 2:
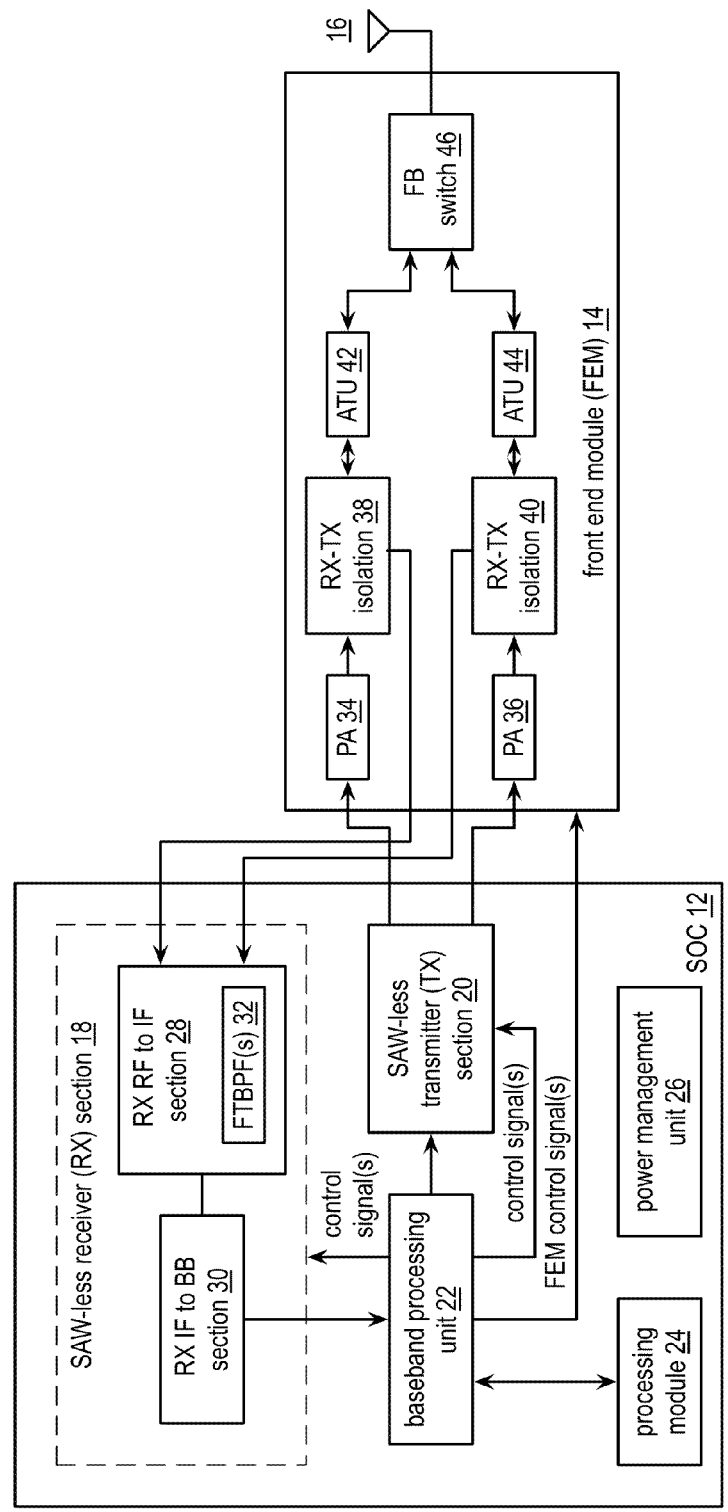
FIG. 2 is a schematic block diagram of an embodiment of a portable computing communication device in accordance with the present invention.

FIG. 2 is a schematic block diagram of an embodiment of a portable computing communication device 10 that includes a system on a chip (SOC) 12 and a front-end module (FEM) 14, which may be implemented on separate integrated circuits. The portable computing communication device 10 may be any device that can be carried by a person, can be at least partially powered by a battery, includes a radio transceiver (e.g., radio frequency (RF) and/or millimeter wave (MMW)) and performs one or more software applications. For example, the portable computing communication device 10 may be a cellular telephone, a laptop computer, a personal digital assistant, a video game console, a video game player, a personal entertainment unit, a tablet computer, etc.

The SOC 12 includes a SAW-less receiver section 18, a SAW-less transmitter section 20, a baseband processing unit 22, a processing module 24, and a power management unit 26. The SAW-less receiver 18 includes a receiver (RX) radio frequency (RF) to intermediate frequency (IF) section 28 and a receiver (RX) IF to baseband (BB) section 30. The RX RF to IF section 28 further includes one or more frequency translated bandpass filters (FTBPF) 32.

The processing module 24 and the baseband processing unit 22 may be a single processing device, separate processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module 24 and/or baseband processing unit 22 may have an associated memory and/or memory element, which may be a single memory device, a plurality of memory devices, and/or embedded circuitry of the processing module 24. Such a memory device may be a read-only memory, random access memory, volatile memory, non-volatile memory, static memory, dynamic memory, flash memory, cache memory, and/or any device that stores digital information. Note that if the processing module 24 and/or baseband processing unit 22 includes more than one processing device, the processing devices may be centrally located (e.g., directly coupled together via a wired and/or wireless bus structure) or may be distributedly located (e.g., cloud computing via indirect coupling via a local area network and/or a wide area network). Further note that when the processing module 24 and/or baseband processing unit 22 implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element stores, and the processing module 24 and/or baseband processing unit 22 executes, hard coded and/or operational instructions corresponding to at least some of the steps and/or functions illustrated in one or more of the Figures.

The front-end module (FEM) 14 includes a plurality of power amplifiers (PA) 34-36, a plurality of receiver-transmitter (RX-TX) isolation modules 38-40, a plurality of antenna tuning units (ATU) 42-44, and a frequency band (FB) switch 46. Note that the FEM 14 may include more than two paths of PAs 34-36, RX-TX isolation modules 38-40, and ATUs 42-44 coupled to the FB switch 46, or may include a single path. For example, the FEM 14 may include one path for 2G (second generation) cellular telephone service, another path for 3G (third generation) cellular telephone service, and a third path for wireless local area network (WLAN) service. Of course there are a multitude of other example combinations of paths within the FEM 14 to support one or more wireless communication standards (e.g., IEEE 802.11, Bluetooth, global system for mobile communications (GSM), code division multiple access (CDMA), radio frequency identification (RFID), Enhanced Data rates for GSM Evolution (EDGE), General Packet Radio Service (GPRS), WCDMA, high-speed downlink packet access (HSDPA), high-speed uplink packet access (HSUPA), LTE (Long Term Evolution), WiMAX (worldwide interoperability for microwave access), and/or variations thereof).

In an example of operation, the processing module 24 is performing one or more functions of the portable computing device that require wireless transmission of data. In this instance, the processing module 24 provides the outbound data (e.g., voice, text, audio, video, graphics, etc.) to the baseband processing unit or module 22, which converts the outbound data into one or more outbound symbol streams in accordance with one or more wireless communication standards (e.g., GSM, CDMA, WCDMA, HSUPA, HSDPA, WiMAX, EDGE, GPRS, IEEE 802.11, Bluetooth, ZigBee, universal mobile telecommunications system (UMTS), long term evolution (LTE), IEEE 802.16, evolution data optimized (EV-DO), etc.). Such a conversion includes one or more of: scrambling, puncturing, encoding, interleaving, constellation mapping, modulation, frequency spreading, frequency hopping, beamforming, space-time-block encoding, space-frequency-block encoding, frequency to time domain conversion, and/or digital baseband to intermediate frequency conversion. Note that the baseband processing unit 22 converts the outbound data into a single outbound symbol stream for Single Input Single Output (SISO) communications and/or for Multiple Input Single Output (MISO) communications and converts the outbound data into multiple outbound symbol streams for Single Input Multiple Output (SIMO) and Multiple Input Multiple Output (MIMO) communications.

The baseband processing unit 22 provides the one or more outbound symbol streams to the SAW-less transmitter section 20, which converts the outbound symbol stream(s) into one or more outbound RF signals (e.g., signals in one or more frequency bands 800 MHz, 1800 MHz, 1900 MHz, 2000 MHz, 2.4 GHz, 5 GHz, 60 GHz, etc.). The SAW-less transceiver section 20 includes at least one up-conversion module, at least one frequency translated bandpass filter (FTBPF), and an output module; which may be configured as a direct conversion topology (e.g., direct conversion of baseband or near baseband symbol streams to RF signals) or as a super heterodyne topology (e.g., convert baseband or near baseband symbol streams into IF signals and then convert the IF signals into RF signals).

For a direction conversion, the SAW-less transmitter section 20 may have a Cartesian-based topology, a polar-based topology, or a hybrid polar-Cartesian-based topology. In a Cartesian-based topology, the SAW-less transmitter section 20 mixes in-phase and quadrature components (e.g., $A_I(t)\cos(\omega_{BB}(t)+\phi_I(t))$ and $A_Q(t)\cos(\omega_{BB}(t)+\phi_Q(t))$, respectively) of the one or more outbound symbol streams with in-phase and quadrature components (e.g., $\cos(\omega_{RF}(t))$ and $\sin(\omega_{RF}(t))$, respectively) of one or more transmit local oscillations (TX LO) to produce mixed signals. The FTBPF filters the mixed signals and the output module conditions (e.g., common mode filtering and/or differential to single-ended conversion) them to produce one or more outbound up-converted signals (e.g., $A(t)\cos(\omega_{BB}(t)+\phi(t))+\omega_{RF}(t))$). A power amplifier driver (PAD) module amplifies the outbound up-converted signal(s) to produce a pre-PA (power amplified) outbound RF signal(s).

In a phase polar-based topology, the SAW-less transmitter section 20 includes an oscillator that produces an oscillation (e.g., $\cos(\omega_{RF}(t))$ that is adjusted based on the phase information (e.g., $+/-\Delta\phi$ [phase shift] and/or $\phi t$) [phase modulation]) of the outbound symbol stream(s). The resulting adjusted oscillation (e.g., $\cos(\omega_{RF}(t)+/-\Delta\phi)$ or $\cos(\omega_{RF}(t)+\phi(t))$) may be further adjusted by amplitude information (e.g., $A(t)$ [amplitude modulation]) of the outbound symbol stream(s) to produce one or more up-converted signals (e.g., $A(t)\cos(\omega_{RF}(t)+\phi(t))$ or $A(t)\cos(\omega_{RF}(t)+/-\Delta\phi)$). The FTBPF filters the one or more up-converted signals and the output module conditions (e.g., common mode filtering and/or differential to single-ended conversion) them. A power amplifier driver (PAD) module then amplifies the outbound up-converted signal(s) to produce a pre-PA (power amplified) outbound RF signal(s).

In a frequency polar-based topology, the SAW-less transmitter section 20 includes an oscillator that produces an oscillation (e.g., $\cos(\omega_{RF}(t))$ this is adjusted based on the frequency information (e.g., $+/-\Delta f$ [frequency shift] and/or $f(t)$) [frequency modulation]) of the outbound symbol stream(s). The resulting adjusted oscillation (e.g., $\cos(\omega_{RF}(t)+/-\Delta f)$ or $\cos(\omega_{RF}(t)+f(t))$) may be further adjusted by amplitude information (e.g., $A(t)$ [amplitude modulation]) of the outbound symbol stream(s) to produce one or more up-converted signals (e.g., $A(t)\cos(\omega_{RF}(t)+f(t))$ or $A(t)\cos(\omega_{RF}(t)+/-\Delta f)$). The FTBPF filters the one or more up-converted signals and the output module conditions (e.g., common mode filtering and/ or differential to single-ended conversion) them. A power amplifier driver (PAD) module then amplifies the outbound up-converted signal(s) to produce a pre-PA (power amplified) outbound RF signal(s).

In a hybrid polar-Cartesian-based topology, the SAW-less transmitter section 20 separates the phase information (e.g., $\cos(\omega_{BB}(t)+/-\Delta\phi)$ or $\cos(\omega_{BB}(t)+\phi(t))$) and the amplitude information (e.g., $A(t)$) of the outbound symbol stream(s). The SAW-less transmitter section 20 mixes in-phase and quadrature components (e.g., $\cos(\omega_{BB}(t)+\phi_I(t))$ and $\cos(\omega_{BB}(t)+\phi_Q(t))$, respectively) of the one or more outbound symbol streams with in-phase and quadrature components (e.g., $\cos(\omega_{RF}(t))$ and $\sin(\omega_{RF}(t))$, respectively) of one or more transmit local oscillations (TX LO) to produce mixed signals. The FTBPF filters the mixed signals and the output module conditions (e.g., common mode filtering and/or differential to single-ended conversion) them to produce one or more outbound up-converted signals (e.g., $A(t)\cos(\omega_{BB}(t)+\phi(t))+\omega_{RF}(t))$). A power amplifier driver (PAD) module amplifies the normalized outbound up-converted signal(s) and injects the amplitude information (e.g., $A(t)$) into the normalized outbound up-converted signal(s) to produce a pre-PA (power amplified) outbound RF signal(s) (e.g., $A(t)\cos(\omega_{RF}(t)+\phi(t))$). Other examples of the SAW-less transmitter section 20 will be described with reference to FIGS. 23 and 24.

For a super heterodyne topology, the SAW-less transmitter section 20 includes a baseband (BB) to intermediate frequency (IF) section and an IF to a radio frequency (RF) section). The BB to IF section may be of a polar-based topology, a Cartesian-based topology, a hybrid polar-Cartesian-based topology, or a mixing stage to up-convert the outbound symbol stream(s). In the three former cases, the BB to IF section generates an IF signal(s) (e.g., $A(t)\cos(\omega_{IF}(t)+\phi(t))$) and the IF to RF section includes a mixing stage, a filtering stage and the power amplifier driver (PAD) to produce the pre-PA outbound RF signal(s).

When the BB to IF section includes a mixing stage, the IF to RF section may have a polar-based topology, a Cartesian-based topology, or a hybrid polar-Cartesian-based topology. In this instance, the BB to IF section converts the outbound symbol stream(s) (e.g., $A(t)\cos((\omega_{BB}(t)+\phi(t)))$) into intermediate frequency symbol stream(s) (e.g., $A(t)$ $(\omega_{IF}(t)+\phi(t))$). The IF to RF section converts the IF symbol stream(s) into the pre-PA outbound RF signal(s).

The SAW-less transmitter section 20 outputs the pre-PA outbound RF signal(s) to a power amplifier module (PA) 34-36 of the front-end module (FEM) 14. The PA 34-36 includes one or more power amplifiers coupled in series and/or in parallel to amplified pre-PA outbound RF signal(s) to produce an outbound RF signal(s). Note that parameters (e.g., gain, linearity, bandwidth, efficiency, noise, output dynamic range, slew rate, rise rate, settling time, overshoot, stability factor, etc.) of the PA 34-36 may be adjusted based on control signals received from the baseband processing unit 22 and/or the processing module 24. For instance, as transmission conditions change (e.g., channel response changes, distance between TX unit and RX unit changes, antenna properties change, etc.), the processing resources (e.g., the BB processing unit 22 and/or the processing module 24) of the SOC 12 monitors the transmission condition changes and adjusts the properties of the PA 34-36 to optimize performance. Such a determination may not be made in isolation; for example, it is done in light to other parameters of the front-end module that may be adjusted (e.g., the ATU 42-44, the RX-TX isolation module 38-40) to optimize transmission and reception of the RF signals.

The RX-TX isolation module 38-40 (which may be a duplexer, a circulator, or transformer balun, or other device that provides isolation between a TX signal and an RX signal using a common antenna) attenuates the outbound RF signal(s). The RX-TX isolation module 38-40 may adjusts it attenuation of the outbound RF signal(s) (i.e., the TX signal) based on control signals received from the baseband processing unit and/or the processing module 24 of the SOC 12. For example, when the transmission power is relatively low, the RX-TX isolation module 38-40 may be adjusted to reduce its attenuation of the TX signal.

The antenna tuning unit (ATU) 42-44 is tuned to provide a desired impedance that substantially matches that of the antenna 16. As tuned, the ATU 42-44 provides the attenuated TX signal from the RX-TX isolation module 38-40 to the antenna 16 for transmission. Note that the ATU 42-44 may be continually or periodically adjusted to track impedance changes of the antenna 16. For example, the baseband processing unit 22 and/or the processing module 24 may detect a change in the impedance of the antenna 16 and, based on the detected change, provide control signals to the ATU 42-44 such that it changes it impedance accordingly.

In this example, the SAW-less transmitter 20 section has two outputs: one for a first frequency band and the other for a second frequency band. The preceding discussion has focused on the process of converting outbound data into outbound RF signals for a single frequency band (e.g., 850 MHz, 900 MHz, etc.). The process is similar for converting outbound data into RF signals for the other frequency band (e.g., 1800 MHz, 1900 MHz, 2100 MHz, 2.4 GHz, 5 GHz, etc.). Note that with a single antenna 16, the SAW-less transmitter 20 generates outbound RF signals in or of the other frequency band. The frequency band (FB) switch 46 of the FEM 14 couples the antenna 16 to the appropriate output of the SAW-less transmitter output path. The FB switch 46 receives control information from the baseband processing unit 22 and/or the processing module 24 to select which path to connect to the antenna 16.

The antenna 16 also receives one or more inbound RF signals, which are provided to one of the ATUs 42-44 via the frequency band (FB) switch 46. The ATU 42-44 provides the inbound RF signal(s) to the RX-TX isolation module 38-40, which routes the signal(s) to the receiver (RX) RF to IF section 28 of the SOC 12. The RX RF to IF section 28 converts the inbound RF signal(s) (e.g., $A(t)\cos(\omega_{RF}(t)+\phi(t))$) into an inbound IF signal (e.g., $A_I(t)\cos(\omega_{IF}(t)+\phi_I(t))$ and $A_Q(t)\cos(\omega_{IF}(t)+\phi_Q(t))$). Various embodiments of the RX RF to IF section 28 are illustrated in FIGS. 15-23 or others.

The RX IF to BB section 30 converts the inbound IF signal into one or more inbound symbol streams (e.g., $A(t)\cos((\omega_{BB}(t)+\phi(t)))$. In this instance, the RX IF to BB section 30 includes a mixing section and a combining & filtering section. The mixing section mixes the inbound IF signal(s) with a second local oscillation (e.g., LO2=IF−BB, where BB may range from 0 Hz to a few MHz) to produce I and Q mixed signals. The combining & filtering section combines (e.g., adds the mixed signals together—which includes a sum component and a difference component) and then filters the combined signal to substantially attenuate the sum component and pass, substantially unattenuated, the difference component as the inbound symbol stream(s).

The baseband processing unit 22 converts the inbound symbol stream(s) into inbound data (e.g., voice, text, audio, video, graphics, etc.) in accordance with one or more wireless communication standards (e.g., GSM, CDMA, WCDMA, HSUPA, HSDPA, WiMAX, EDGE, GPRS, IEEE 802.11, Bluetooth, ZigBee, universal mobile telecommunications system (UMTS), long term evolution (LTE), IEEE 802.16, evolution data optimized (EV-DO), etc.). Such a conversion may include one or more of: digital intermediate frequency to baseband conversion, time to frequency domain conversion, space-time-block decoding, space-frequency-block decoding, demodulation, frequency spread decoding, frequency hopping decoding, beamforming decoding, constellation demapping, deinterleaving, decoding, depuncturing, and/or descrambling. Note that the processing module 24 converts a single inbound symbol stream into the inbound data for Single Input Single Output (SISO) communications and/or for Multiple Input Single Output (MISO) communications and converts the multiple inbound symbol streams into the inbound data for Single Input Multiple Output (SIMO) and Multiple Input Multiple Output (MIMO) communications.

The power management unit 26 is integrated into the SOC 12 to perform a variety of functions. Such functions include monitoring power connections and battery charges, charging a battery when necessary, controlling power to the other components of the SOC 12, generating supply voltages, shutting down unnecessary SOC modules, controlling sleep modes of the SOC modules, and/or providing a real-time clock. To facilitate the generation of power supply voltages, the power management unit 26 may includes one or more switch-mode power supplies and/or one or more linear regulators.

With such an implementation of a portable computing communication device 10, expensive and discrete off-chip components (e.g., SAW filters, duplexers, inductors, and/or capacitors) are eliminated and their functionality is incorporated in the front-end module (FEM) 14 that can be implemented on a single die. Further, the SAW-less receiver architecture and the SAW-less transmitter architecture facilitate the elimination of the discrete off-chip components.

Figure 3:
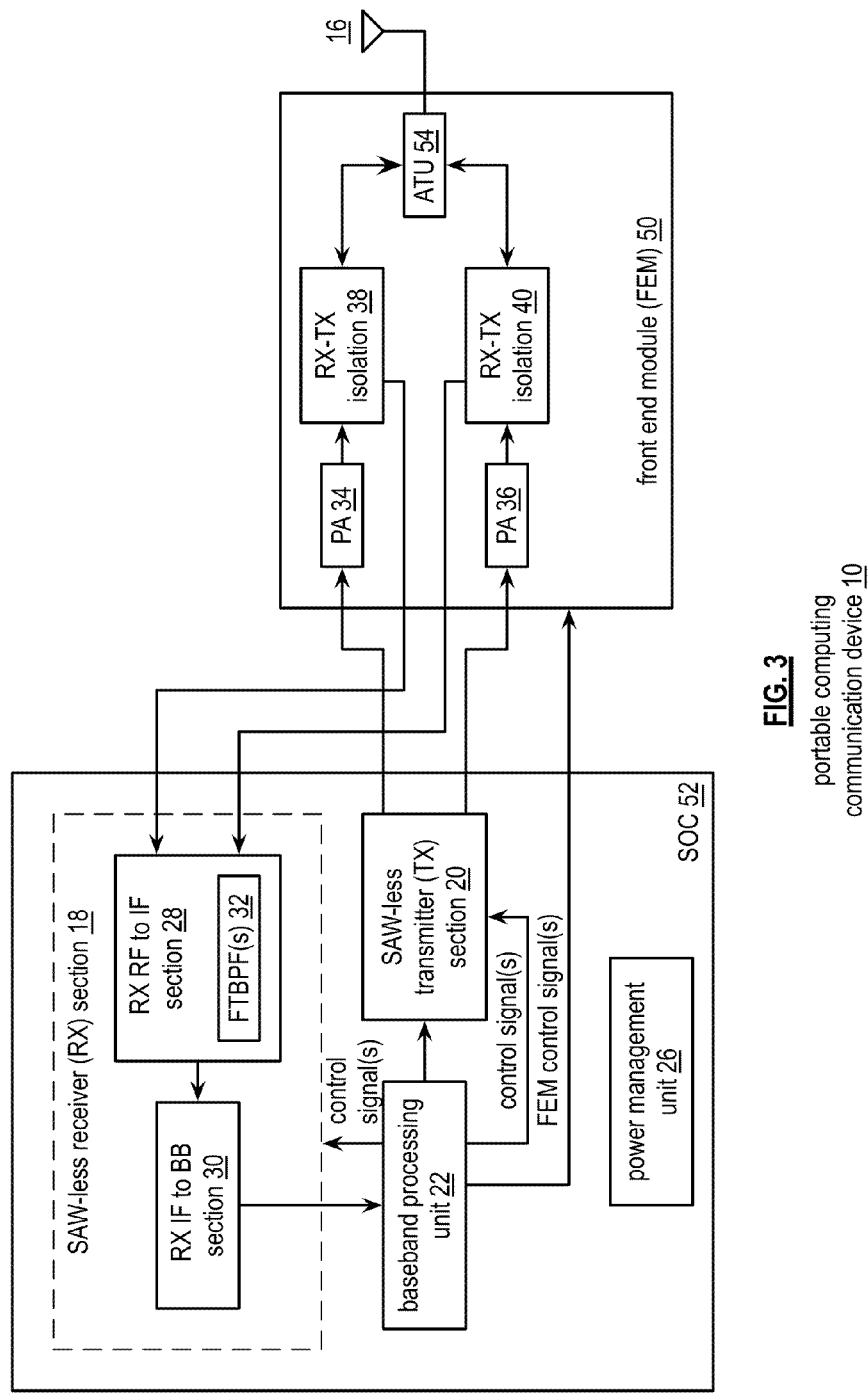
FIG. 3 is a schematic block diagram of another embodiment of a portable computing communication device in accordance with the present invention.

FIG. 3 is a schematic block diagram of another embodiment of a portable computing communication device 10 that includes a system on a chip (SOC) 52 and another embodiment of a front-end module (FEM) 50. The SOC 52 includes the power management unit 26, the SAW-less receiver section 18, the SAW-less transmitter section 20, the baseband processing unit 22, and may further include the processing module. The FEM 50 includes a plurality of power amplifier modules (PA) 34-36, a plurality of RX-TX isolation modules 38-40, and at least one antenna tuning unit (ATU) 54.

In this embodiment, the SOC 52 is operable to concurrently support two or more wireless communications (e.g., a cellular telephone call and a WLAN communication and/or a Bluetooth communication). Accordingly, the SAW-less transmitter 20 generates two (or more) different frequency band outbound RF signals in a manner discussed with reference to FIG. 2 and/or with reference to one or more subsequent figures. A first one of the different frequency outbound RF signals is provided to one of the PAs 34-36 of the FEM 50 and the other outbound RF signal is provided to the other PA 34-36. Each of the TX-RX isolation modules 38-40 functions as described with reference to FIG. 2 and as may be described with reference to one or more of the subsequent figures. The ATU 54, which is tuned based on control signals from the SOC 52, provides the two outbound RF signals to the antenna 16 for transmission.

The antenna 16 also receives two or more different frequency band inbound RF signals, which it provides to the ATU 54. The ATU 54 may includes a splitter to separate the two inbound RF signals and separate impedance matching circuits (e.g., one or more LC circuits) for each separated signal; a transformer balun to separate the signals and separate impedance matching circuits; or an impedance matching circuits for the two signals, which are provided to the RX-TX isolation modules 38-40.

The RX-TX isolation modules 38-40 are each frequency band dependent such that each will only pass inbound and outbound RF signals within their respective frequency bands (e.g., 850-900 MHz and 1800-1900 MHz). As such, a first TX-RX isolation module 38-40 provides a first frequency band inbound RF signal to a first input of the SAW-less RX section 18 and the second TX-RX isolation module 38-40 provides the second frequency band inbound RF signal to a second input of the SAW-less RX section 18. The SAW-less RX section 18 processes the inbound RF signals to produce first inbound data and second inbound data in manner as discussed with reference to FIG. 2 and/or as will be discussed with reference to one or more of the subsequent figures.

Figure 4:
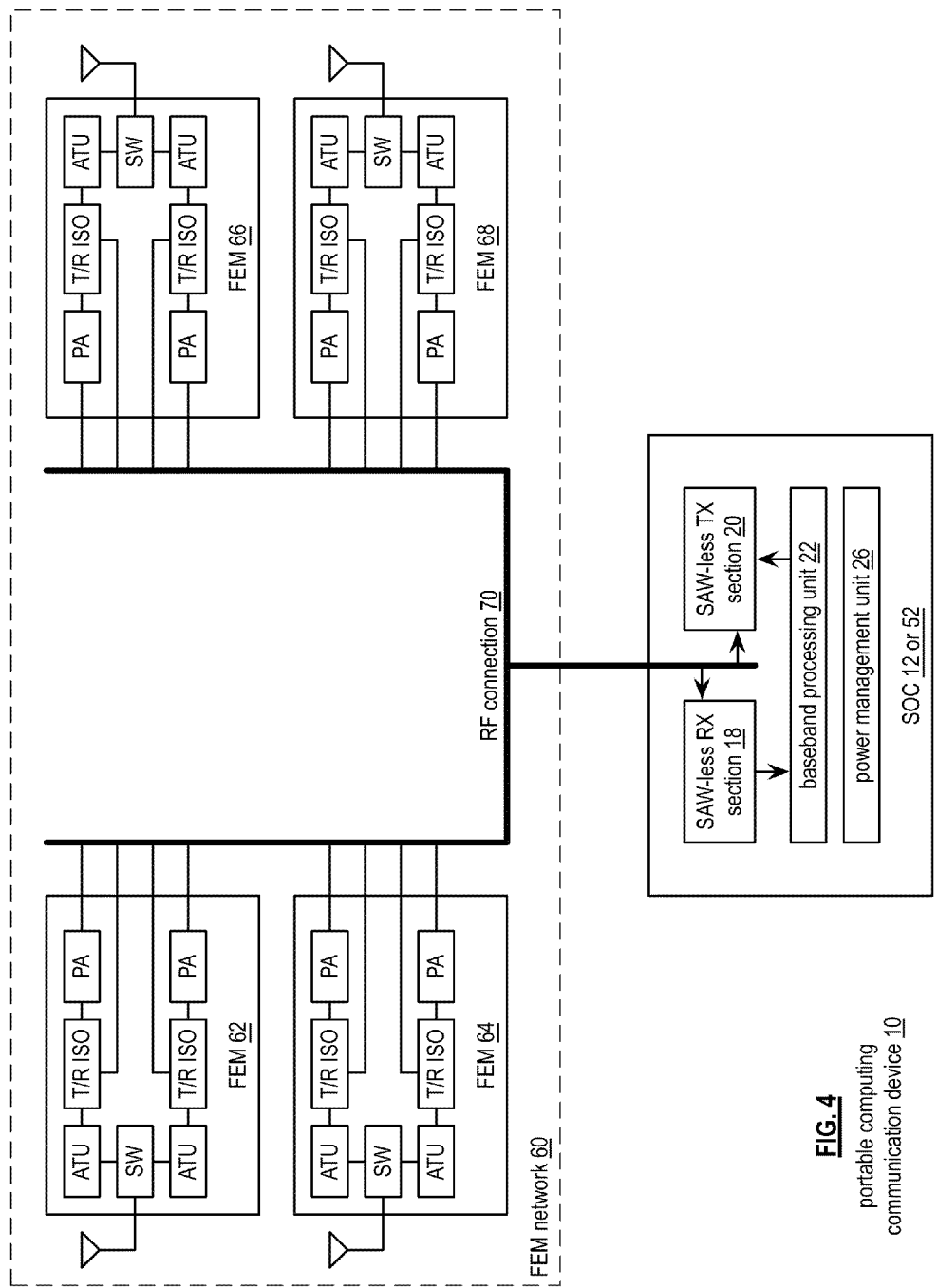
FIG. 4 is a schematic block diagram of another embodiment of a portable computing communication device in accordance with the present invention.

FIG. 4 is a schematic block diagram of another embodiment of a portable computing communication device 10 that includes a system on a chip (SOC) 12 or 52 coupled to a front-end module (FEM) network 60 via an RF connection 70. The SOC 12 or 52 includes the power management unit 26, the SAW-less receiver section 18, the SAW-less transmitter section 20, the baseband processing unit 22, and may further include the processing module. The RF connection 70 may be one or more of a coaxial cable, a flexible fiber optics cable, a flexible waveguide, and/or other high frequency electrical cabling. The FEM network 60 includes a plurality of FEMs 62-68 (e.g., two or more), where each FEM 62-68 includes a plurality of power amplifier modules (PA), a plurality of RX-TX isolation modules, at least one antenna tuning unit (ATU), and a frequency band switch (SW). Note that one or more of the FEMs 62-68 may be constructed as discussed with reference to FIG. 3.

Each of the FEMs 62-68 may support the same frequency bands, different frequency bands, or a combination thereof. For example, two FEM may support the same frequency bands (e.g., 850-900 MHz and 1800-1900 MHz) and two others may support different frequency bands (e.g., 2.4 GHz, 5 GHz, 60 GHz, etc.). In this example, the SOC 12 or 52 can select one of the FEMs 62-68 having the same frequency bands based on one or more of a plurality of RF communication parameters (e.g., transmit power level, receive signal strength, out-of-band blockers, signal-to-noise ratio, signal-to-interference ratio, frequency of operation, interference with other wireless communications, etc.) As an example, the SOC 12 or 52 selects the FEM that will provide it with a current optimal performance level for cell phone communications and another FEM that will provide it with a current optimal performance level for WLAN, personal area network, or other wireless network communications.

Since each of the FEMs 62-68 is programmable, the SOC 12 or 52 can program the selected modules to reduce interference there-between. For example, the FEM supporting cell phone communications may be tuned to have extra attenuation in the frequency bands of wireless area network communications (e.g., 2.4 GHz, 5 GHz, 60 GHz, etc.). In addition, as conditions change (e.g., interference, transmission-reception distance, antenna parameters, environmental factors, etc.), the SOC 12 or 52 can adjust parameters of the selected FEMs to substantially compensate for the changes. Alternatively, the SOC 12 or 52 may select a different FEM for one or both of the communications.

The SOC 12 or 52 may select multiple FEMs 62-68 to support MIMO communications, SIMO communications, and/or MISO communications. For example, in a 2×2 MIMO communication, one FEM is selected for one of the TX/RX MIMO communication and another FEM is selected for the other TX/RX MIMO communication.

The SOC 12 or 52 may also selection one FEM to support a transmission in one frequency band and another FEM to support the reception in the same frequency band. For example, the SOC 12 or 52 may select a first FEM to support 1800 MHz cellular telephone transmissions and a second FEM to support 1800 MHz cellular telephone receptions. In another example, the SOC 12 or 52 may select a first FEM to support 1800 MHz cellular telephone transmissions, a second FEM to support 900 MHz cellular telephone transmissions, a third FEM to support 1800 MHz cellular telephone transmissions; and a fourth FEM to support 900 MHz cellular telephone receptions. In yet another example, the SOC 12 or 52 may select a first FEM to support 1800 MHz cellular telephone transmissions, a second FEM to support 900 MHz cellular telephone transmissions, the second FEM to support 1800 MHz cellular telephone transmissions; and the first FEM to support 900 MHz cellular telephone receptions.

The FEM network 60 may be implemented on a single die on a single package substrate; on multiple dies (e.g., a FEM on each die) on a single substrate; each FEM as a separate integrated circuit (IC). In the latter case, one or more of the FEMs 62-68 may be remotely located from the SOC 12 or 52. For instance, the portable computing communication device may be a wireless femtocell transceiver that supports cellular telephone communications where one or more of the FEM is physically located at some distance (e.g., >1 meter) from the SOC 12 or 52. Further, one of the FEM may be used to communicate with a base station, while one or more other FEMs may be used to communicate with other wireless communication devices (e.g., cell phones).

As an example, the device 10 communicates with a base station (BS) using conventional cellular services, while the links between the device and other wireless communication device(s) uses a different frequency band. The SOC processing module coordinates Internet and/or cellular access for the other devices and the signal conversions for the various links.

As another example, the device 10 functions as a wireless femtocell for 1-4 cell phones or other handheld devices. The wireless local links between the devices may follow one or more protocols. One protocol is to follow the traditional cellular standards (e.g., wireless femtocell allocates the local wireless links like a BS). Another protocol has the wireless femtocell device functioning as a user interface extension over an Internet protocol (IP) pipe. The handset has one link to the access point (AP) or the handset links to other devices forming a mesh to logically connect to the AP by alternate means.

As yet another example, the device 10 functions as a wireless femtocell (e.g., AP) that uses data call wireless access to a cell system such that an IP pipe is provided to the AP logically connecting it to application servers anywhere on the internet. For example, the carrier does not have to provide the telephony system interface for voice calls. An IP pipe runs through the AP to connect something like an Internet phone client in the field to the Internet phone network. The load and the capacity of the data pipe to the carrier from the AP determine the number of active handsets supported from one AP.

In this example, the link from the AP to the supported wireless devices is not in the cellular band, but uses traditional cellular standards (i.e., the AP looks like a BS and runs a converter function while the handset client runs on the supported wireless device). Alternatively, the link between the device 10 and supported wireless devices uses a proprietary set of call procedures that is not the cellular standard. In this instance, the AP is running the device client and the device is merely a remote UI extension over an IP pipe.

As yet another example, the device 10 determines whether it should become a femtocell for other wireless devices. In this instance, the device 10 determines whether it meets a qualification threshold (e.g. it has a good & consistent signal to the carrier, it has good battery life, it is not likely to be used for a cell call, etc.). If it does, then it registers with the carrier as a femtocell in a given geographic location. Once registered, it seeks wireless device (e.g., cell phones) in the vicinity by way of the peer-to-peer wireless (60 GHz, TVWS, 2.4 GHz, etc). For devices it identifies, the device 10 determines signal strength for each of wireless devices with the carrier (e.g., they convey the information). For each wireless device with weak or no signal strength with the carrier (e.g., with a BS of the carrier), the device 10 offers to be a femtocell host for the wireless device. If the wireless device wants the device 10 to be its femtocell, the device 10 registers that it is functioning as the femtocell for the wireless device with the carrier. Note that this can be a dynamic process between several devices, where one can function as the femtocell AP for the other devices. If conditions change, one of the other devices can become the femtocell AP for the devices and the device that was the femtocell AP becomes a client of the new femtocell AP.

As yet another example, multiple devices may mesh together to form a femto-network. In this instance, one device functions as a relay for one or more other devices to access the device functioning as the wireless femtocell AP. Alternatively, meshing may include multiple wireless femtocell devices serving as a host to local devices and they are linking to other APs to provide connectivity. Such sharing may be to have one of the wireless femtocell devices provide cellular voice connections, another provide cellular data connections, and a third providing WLAN connections.

As yet another example, multiple devices are in a confined geographic area (e.g., in a car, room, etc.) and utilize a protocol to determine which device will function as the wireless femtocell AP for the other devices and what services to provide. For instance, a group of devices (where at least one is capable of being a femto AP) establish a peer-to-peer link between them (60 GHz, TVWS, 2.4 GHz, etc) and then determine if those links are sustainable over time and if they are moving substantially together (e.g. in the same car or train etc) by comparing notes on cell sites that they traverse as a group over time. If they determine they are in the same moving vehicle then they will each report to each other their particular average carrier quality metrics. Based on the metrics they will determine which handset has the best overall signal to a carrier. Each device may be on a different carrier or they could all be on the same carrier. Either way the signal may be quite different from one device to another as a function of many variables, such as position in the vehicle and how close to a body it may be, etc. If the best signal is substantially better than what a given device can do via its direct carrier link, it will request to be hosted by the device with the best signal. Once the registrations are done calls can be passed to the other devices through the AP host. If the carrier signal falls below a threshold the process repeats and a different device may be elected as the new host. In this special case, all the devices know which other devices to test, at least until they are out of range of each other.

As yet another example, for devices participating in a web conference, each provides a user interface to one person at a time (i.e., the device user). As such, each device is essentially supporting the same one-to-one wireless connection with the carrier. To reduce the redundant traffic and lower costs by bolstering network capacity, a 1st device of the web conference offers to be a wireless femtocell AP for other devices in the same geographic area. If accepted, the 1st device registers with the carrier and subsequently functions as a wireless femtocell AP for the other devices for the web conference. An expansion of this concept can be applied to any type of audio and/or video conference whether multiple users within a given geographic area will attend the conference via a portable computing communication device. A further expansion may include sharing a server-based application with other devices (e.g., one device is the wireless femtocell AP to access an internet hosted application (e.g., a database, a video game, etc.) and the other devices access the internet hosted application via the wireless femtocell AP).

As yet another example, a device that is being used as a wireless femtocell AP is configured based on it environment (e.g., being used in an office, at home, in the car, public place, private place, public use, private use, etc.). The configuration options includes frequency use patterns, transmit power, number of units to support, centralized femtocell control, distributed femtocell control, allocated capacity, level of encoding, symbols, and/or channel access. For example, if in a public place, will the device be used as a public wireless femtocell or a private wireless femtocell. When the device will be used for a private femtocell, it selects a configuration that insures privacy of the communications it supports.

Figure 5:
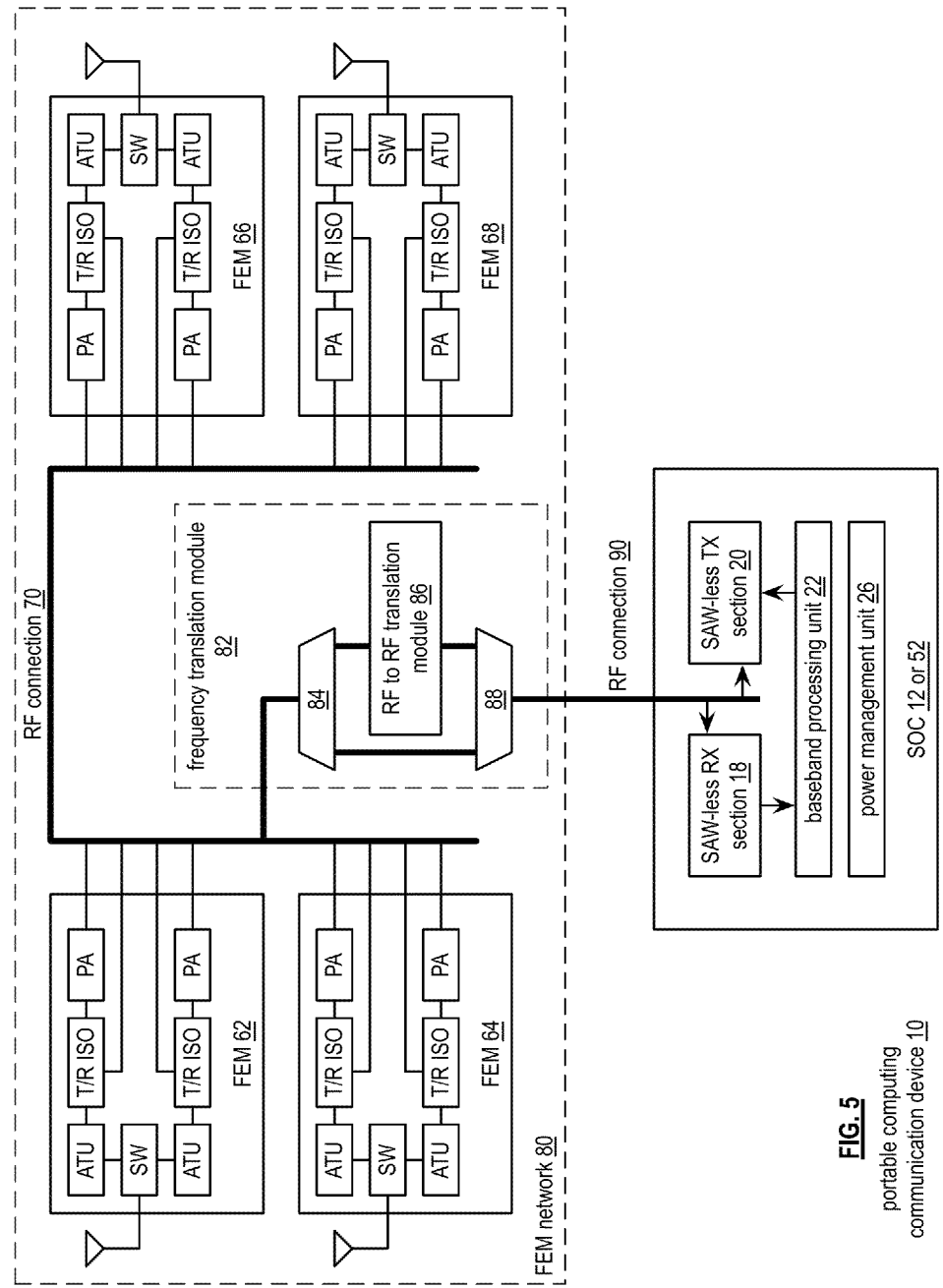
FIG. 5 is a schematic block diagram of another embodiment of a portable computing communication device in accordance with the present invention.

FIG. 5 is a schematic block diagram of another embodiment of a portable computing communication device 10 that includes a system on a chip (SOC) 12 or 52 coupled to a front-end module (FEM) network 80 via an RF connection 90. The SOC 12 or 52 includes the power management unit 26, the SAW-less receiver section 18, the SAW-less transmitter section 20, the baseband processing unit 22, and may further include the processing module. The RF connection 90 may be one or more of a coaxial cable, a flexible fiber optics cable, a flexible waveguide, and/or other high frequency electrical cabling. The FEM network 80 includes a plurality of FEMs 62-68 (e.g., two or more) and a frequency translation module 82. The frequency translation module 82 includes one or more by-passable RF-to-RF translation modules 86. Each of the FEM 62-68 includes a plurality of power amplifier modules (PA), a plurality of RX-TX isolation modules, at least one antenna tuning unit (ATU), and a frequency band switch (SW). Note that one or more of the FEMs 62-68 may be constructed as discussed with reference to FIG. 3.

The SOC 12 or 52 and the FEMs 62-68 function similarly to the SOC 12 or 52 and FEMs 62-68 of FIG. 4. In this embodiment, an inbound RF signal from an FEM and/or outbound RF signal from the SOC 12 or 52 may be frequency translated before being routed between the SOC 12 or 52 and the corresponding FEM. For example, the SOC 12 or 52 may be constructed to process inbound and outbound RF signals with a carrier frequency of 2.4 GHz, but has the baseband capabilities to produce symbol streams in accordance with a plurality of standardized wireless protocols and/or proprietary protocols. In this instance, the SOC 12 or 52 generates the an outbound symbol stream in accordance with a give wireless protocol and up converts the symbol stream to an RF signal having a 2.4 GHz carrier frequency.

The RF to RF frequency translation module 86, which includes a local oscillator, a mixing module, and filtering, mixes the outbound RF signal with the local oscillation to produce a mixed signal. The filtering section filters the mixed signal to produce the outbound RF signal at the desired carrier frequency (e.g., 900 MHz, 1800 MHz, 1900 MHz, 5 GHz, 60 GHz, etc.). Note that the frequency translation module 82 may include a plurality of RF-to-RF translation modules 86 (one or more for stepping up the carrier frequency and/or one or more for stepping down the carrier frequency). In this regard, a generic SOC 12 or 52 may be implemented that can be coupled to a variety of implementations of the FEM network 80 (e.g., number of FEM modules 62-68, number of RF-to-RF translation modules 86, etc.) to produce a variety of portable computing communication devices.

Figure 6:
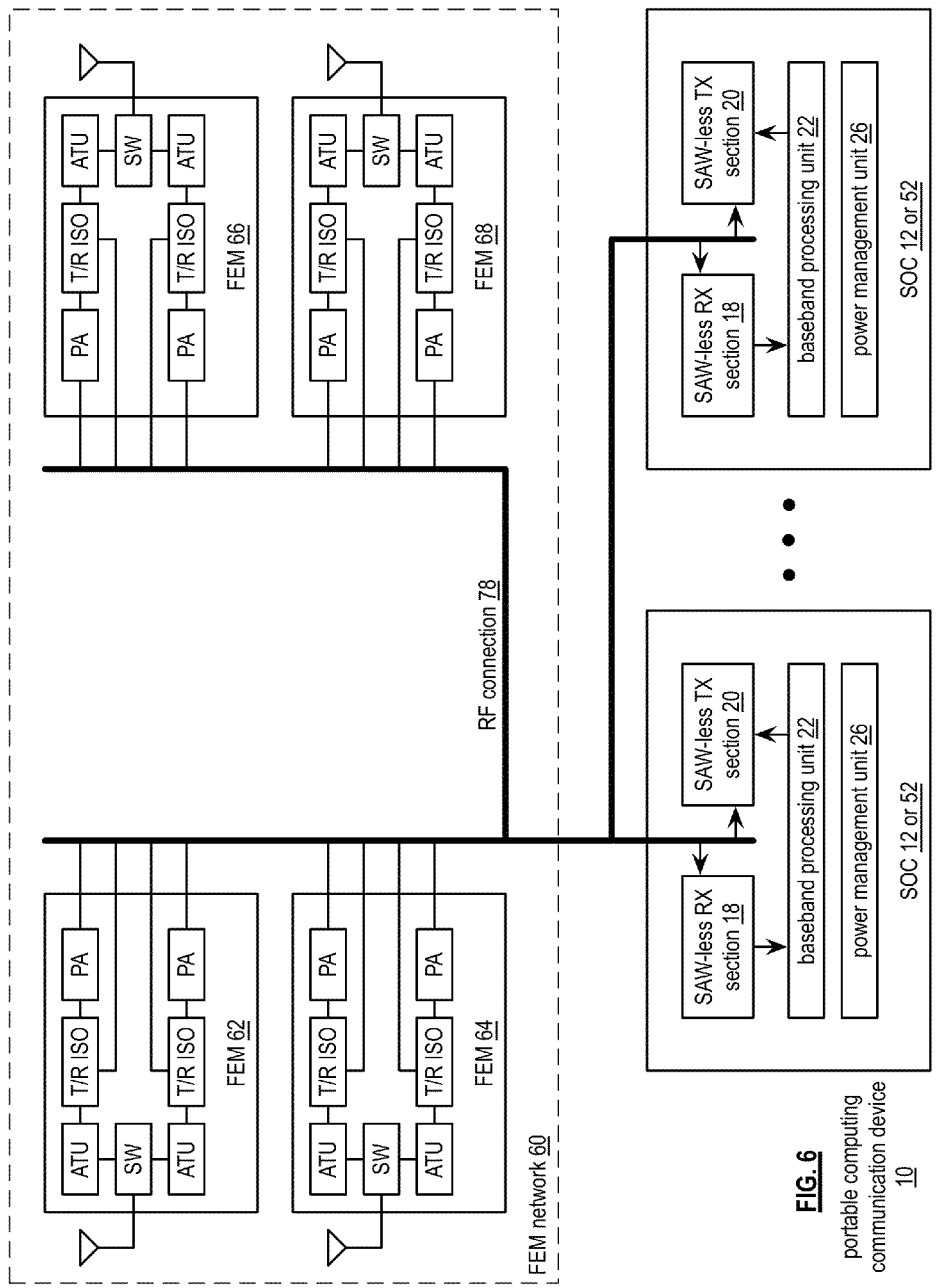
FIG. 6 is a schematic block diagram of another embodiment of a portable computing communication device in accordance with the present invention.

FIG. 6 is a schematic block diagram of another embodiment of a portable computing communication device 10 that includes a plurality of system on a chips (SOC) 12 or 52 coupled to a front-end module (FEM) network 60 via an RF connection 78. Each of the SOC 12 or 52 includes the power management unit 26, the SAW-less receiver section 18, the SAW-less transmitter section 20, the baseband processing unit 22, and may further include the processing module. The RF connection 78 may be one or more of a coaxial cable, a flexible fiber optics cable, a flexible waveguide, and/or other high frequency electrical cabling. The FEM network 60 includes a plurality of FEMs 62-68 (e.g., two or more), each of which includes a plurality of power amplifier modules (PA), a plurality of RX-TX isolation modules, at least one antenna tuning unit (ATU), and a frequency band switch (SW). Note that one or more of the FEMs 62-68 may be constructed as discussed with reference to FIG. 3.

In this embodiment, one of the SOCs 12 or 52 utilizes one or more of the FEMs 62-68 to support one or more wireless communications (e.g., cell phone, WLAN, WPAN, etc.) and another SOC 12-52 utilizes one or more other FEMs 62-68 to support one or more other wireless communications. To reduce interference between the wireless communications and/or to optimize each of the wireless communications, one or more of the SOCs 12 or 52 provides control signals to the FEMs 62-68 to adjust the properties thereof. As an alternative to each SOC 12 or 52 utilizing different FEMs 62-68, two or more SOCs 12 or 52 may share an FEM 62-68 via a switching module (not shown) in a time division manner. As yet another alternative, one SOC 12 or 52 may utilize one path of an FEM 62-68 and another SOC 12 or 52 may utilize one of the other paths of the FEM 62-68.

Figure 7:
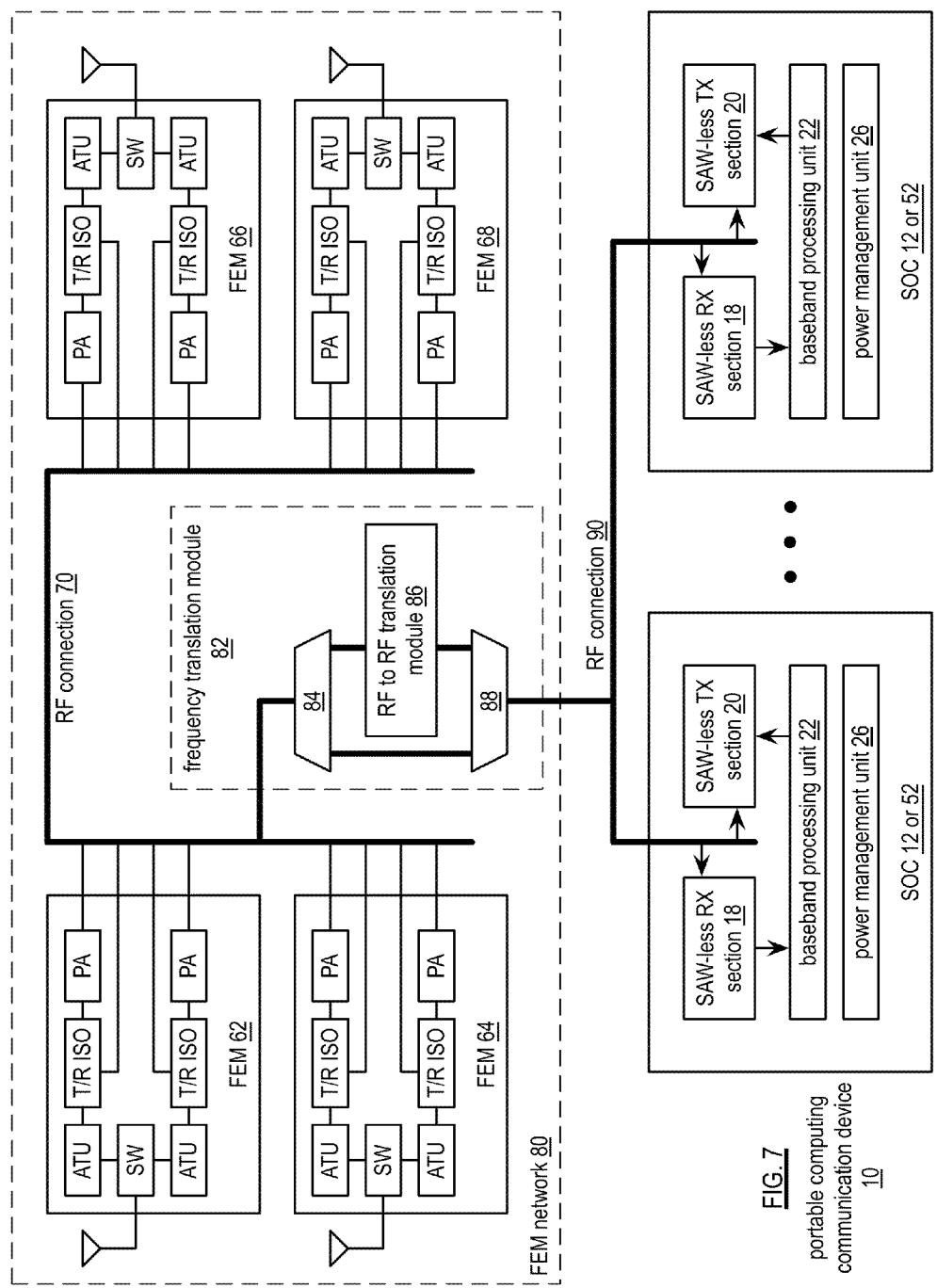
FIG. 7 is a schematic block diagram of another embodiment of a portable computing communication device in accordance with the present invention.

FIG. 7 is a schematic block diagram of another embodiment of a portable computing communication device 10 that includes a plurality of system on a chips (SOC) 12 or 52 coupled to a front-end module (FEM) network 80 via an RF connection 90. The SOC 12 or 52 includes the power management unit 26, the SAW-less receiver section 18, the SAW-less transmitter section 20, the baseband processing unit 22, and may further include the processing module. The RF connection 90 may be one or more of a coaxial cable, a flexible fiber optics cable, a flexible waveguide, and/or other high frequency electrical cabling. The FEM network 80 includes a plurality of FEMs 62-68 (e.g., two or more) and a frequency translation module 82. The frequency translation module 82 includes one or more by-passable RF-to-RF translation modules 86. Each of the FEM 62-68 includes a plurality of power amplifier modules (PA), a plurality of RX-TX isolation modules, at least one antenna tuning unit (ATU), and a frequency band switch (SW). Note that one or more of the FEMs 62-68 may be constructed as discussed with reference to FIG. 3.

In this embodiment, one of the SOCs 12 or 52 utilizes one or more of the FEMs 62-68 to support one or more wireless communications (e.g., cell phone, WLAN, WPAN, etc.) and another SOC 12 or 52 utilizes one or more other FEMs 62-68 to support one or more other wireless communications. One or more of the SOCs 12 or 52 provides control signals to the FEMs 62-68 to adjust the properties thereof to reduce interference between the wireless communications and to optimize each of the wireless communications. In addition, one or more of the wireless communications may be passed through the frequency translation module 82 to step up or step down the carrier frequency of the wireless communications.

Figure 8:
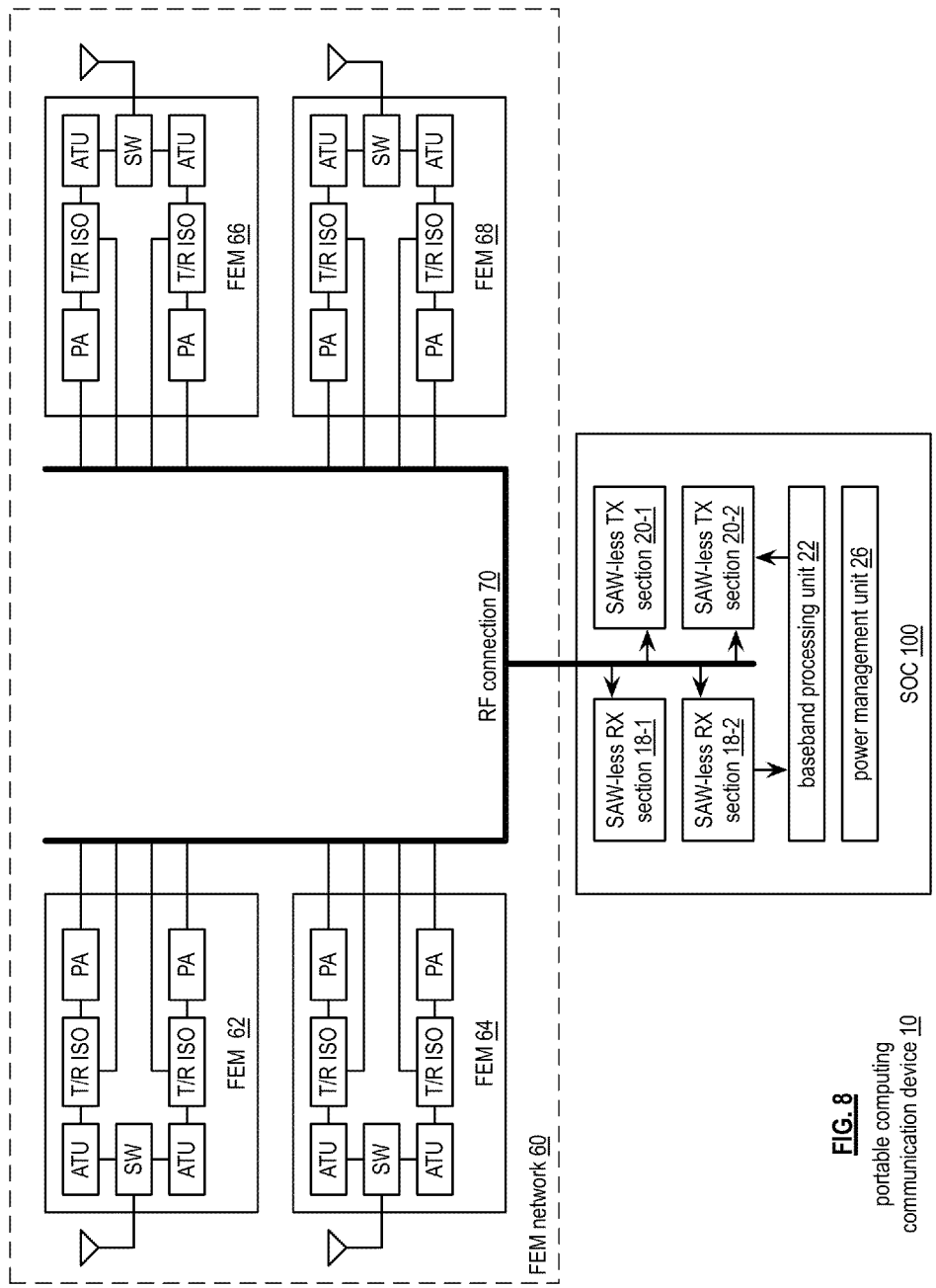
FIG. 8 is a schematic block diagram of another embodiment of a portable computing communication device in accordance with the present invention.

FIG. 8 is a schematic block diagram of another embodiment of a portable computing communication device 10 that includes a system on a chip (SOC) 100 coupled to a front-end module (FEM) network 60 via an RF connection 70. The SOC 100 includes the power management unit 26, a plurality of SAW-less receiver sections 18-1-18-2, a plurality of SAW-less transmitter sections 20-1-20-2, one or more baseband processing units 22, and may further include the processing module. The RF connection 70 may be one or more of a coaxial cable, a flexible fiber optics cable, a flexible waveguide, and/or other high frequency electrical cabling. The FEM network 60 includes a plurality of FEMs 62-68 (e.g., two or more), each of which includes a plurality of power amplifier modules (PA), a plurality of RX-TX isolation modules, at least one antenna tuning unit (ATU), and a frequency band switch (SW). Note that one or more of the FEMs 62-68 may be constructed as discussed with reference to FIG. 3.

In this embodiment, the SOC 100 is capable of multiple concurrent wireless communications using one or more of the FEMs 62-68. For example, one pair of SAW-less transmitter & receiver may be used for WLAN communications and another pair of SAW-less transmitter & receiver may be used for 850 or 900 MHz cellular telephone communications. In another example, one pair of SAW-less transmitter & receiver may be used for cellular voice communications and another pair of SAW-less transmitter & receiver may be used for cellular data communications. Note that the concurrent wireless communications may be in the same frequency band with different carrier frequencies and/or in different frequency bands.

Figure 9:
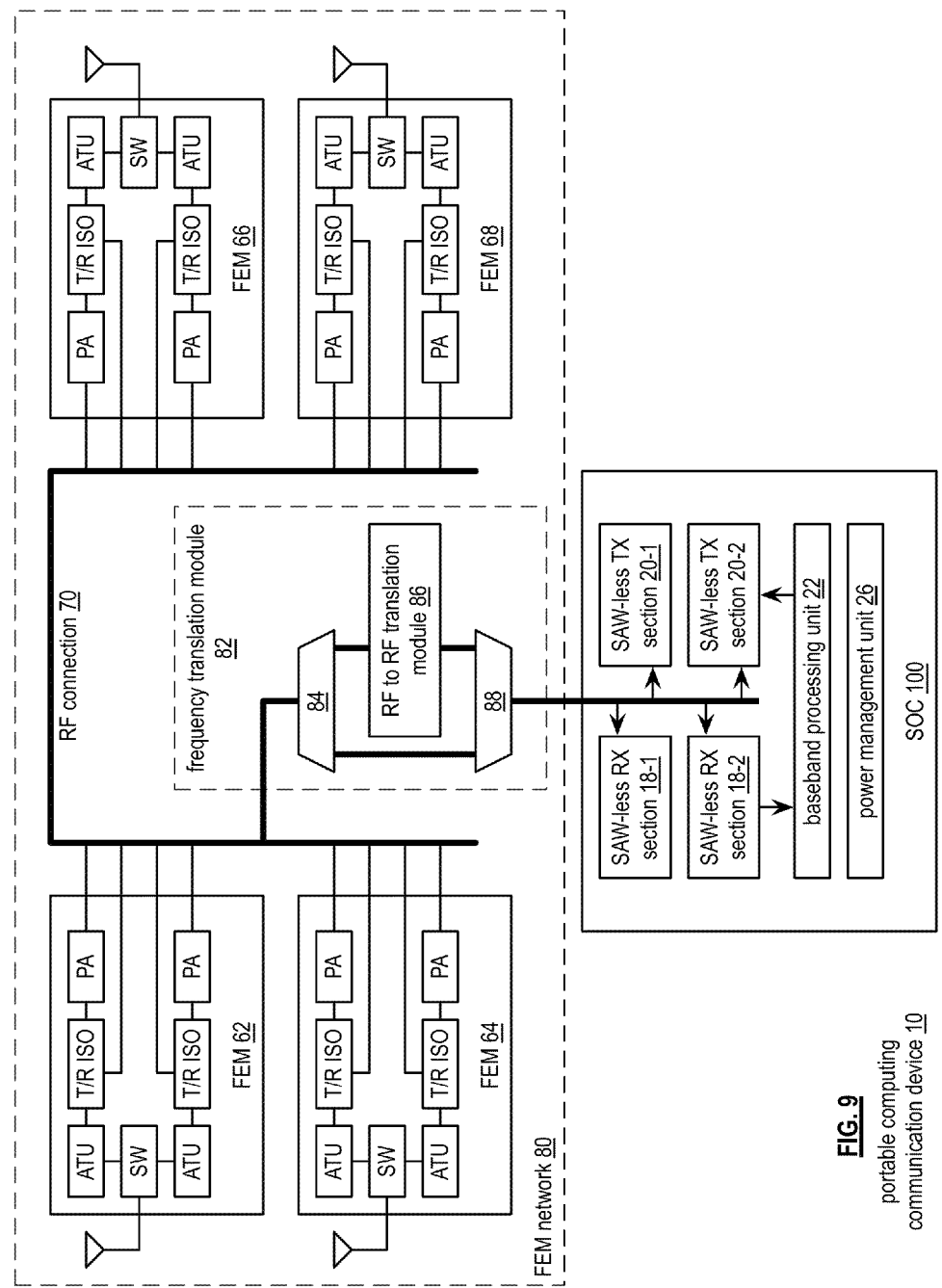
FIG. 9 is a schematic block diagram of another embodiment of a portable computing communication device in accordance with the present invention.

FIG. 9 is a schematic block diagram of another embodiment of a portable computing communication device 10 that includes a system on a chip (SOC) 100 coupled to a front-end module (FEM) network 80 via an RF connection 70. The SOC 100 includes the power management unit 26, a plurality of SAW-less receiver sections 18-1-18-2, a plurality of SAW-less transmitter sections 20-1-20-2, one or more baseband processing units 22, and may further include the processing module. The RF connection 70 may be one or more of a coaxial cable, a flexible fiber optics cable, a flexible waveguide, and/or other high frequency electrical cabling. The FEM network 80 includes a plurality of FEMs 62-68 (e.g., two or more) and a frequency translation module. The frequency translation module 86 includes one or more by-passable RF-to-RF translation modules 86. Each of the FEM 62-68 includes a plurality of power amplifier modules (PA), a plurality of RX-TX isolation modules, at least one antenna tuning unit (ATU), and a frequency band switch (SW). Note that one or more of the FEMs 62-68 may be constructed as discussed with reference to FIG. 3.

In this embodiment, the SOC 100 is capable of multiple concurrent wireless communications using one or more of the FEMs 62-68 and the carrier frequency of one or more of the wireless communications may be converted by the frequency translation module 82. For example, one pair of SAW-less transmitter & receiver may be used for WLAN communications and another pair of SAW-less transmitter & receiver may be used for 850 or 900 MHz cellular telephone communications. In another example, one pair of SAW-less transmitter & receiver may be used for cellular voice communications and another pair of SAW-less transmitter & receiver may be used for cellular data communications. In either of these examples, the carrier frequency of one or more of the wireless communications may be stepped up or stepped down by the frequency translation module 82.

Figure 10:
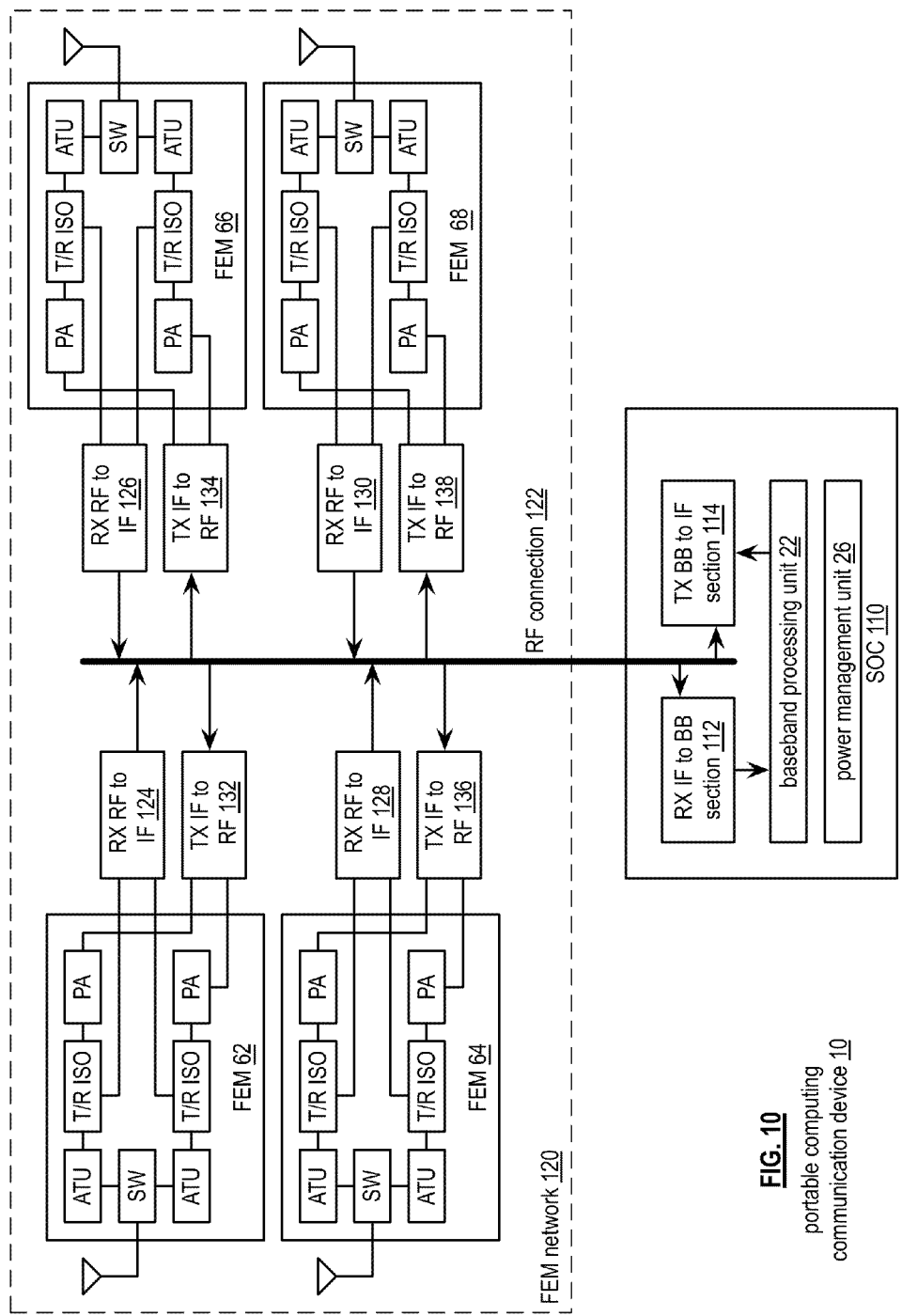
FIG. 10 is a schematic block diagram of another embodiment of a portable computing communication device in accordance with the present invention.

FIG. 10 is a schematic block diagram of another embodiment of a portable computing communication device 10 that includes a system on a chip (SOC) 110 coupled to a front-end module (FEM) network 120 via an RF connection 122. The SOC 110 includes the power management unit 26, an intermediate frequency (IF) to baseband (BB) receiver section 112, a BB to IF transmitter section 114, a baseband processing unit 22, and may further include the processing module. The RF connection 122 may be one or more of a coaxial cable, a flexible fiber optics cable, a flexible waveguide, and/or other high frequency electrical cabling.

The FEM network 120 includes a plurality of FEMs 62-68 (e.g., two or more) and a plurality of pairs of RF to IF TX and RX sections 124-138. Each of the FEMs 62-68 includes a plurality of power amplifier modules (PA), a plurality of RX-TX isolation modules, at least one antenna tuning unit (ATU), and a frequency band switch (SW). Each of the TX IF-to-RF sections 132-138 includes a polar-based topology, a Cartesian-based topology, a hybrid polar-Cartesian-based topology, or a mixing, filtering, & combining module. Each of the RX RF-to-IF sections 124-130 includes a low noise amplifier section and a down-conversion section. Note that one or more of the FEMs 62-68 may be constructed as discussed with reference to FIG. 3.

In this embodiment, the baseband processing module 22 converts outbound data into one or more outbound symbol streams in accordance with one or more wireless communication protocols. The TX BB to IF section 114 includes a mixing module that mixes the outbound symbol stream(s) with a transmit IF local oscillation (e.g., an oscillation having a frequency of 10's of MHz to 10's of GHz) to produce one or more outbound IF signals.

The SOC 110 provides the outbound IF signal(s) to the FEM network 120 via the RF connection 122. In addition, the SOC 110 provides a selection signal indicating which of the RX-TX section pairs 124-130 and corresponding FEM 62-68 will support the wireless communication. The selected TX IF to RF section 132-138 mixes the IF signal with a second local oscillation (e.g., an oscillation having a frequency of RF−IF) to produce one or more mixed signals. The combining & filtering section combines the one more mixed signals and filters them to produce the pre-PA outbound RF signal, which is provided to the corresponding FEM 62-68.

For an inbound RF signal, the antenna associated with a FEM 62-68 receives the signal and provides it to the frequency band switch (SW) if included or to the ATU if no switch is included. The FEM 62-68 processes the inbound RF signal as previously discussed and provides the processed inbound RF signal to the corresponding RX RF to IF section 124-130. The RX RF to IF section 124-130 mixes the inbound RF signal with a second RX local oscillation (e.g., an oscillation having a frequency of RF−IF) to produce one or more inbound IF mixed signals (e.g., I and Q mixed signal components or polar-formatted signal at IF (e.g., $A(t)\cos(\omega_{IF}(t)+\phi(t))$).

The RX IF to BB section 112 of the SOC 110 receives the one or more inbound IF mixed signals and converts them into one or more inbound symbol streams. The baseband processing module 22 converts the one or more inbound symbol streams into inbound data. Note that the SOC 110 may include a plurality of RX IF to BB and TX BB to IF sections to support multiple concurrent wireless communications.

Figure 11:
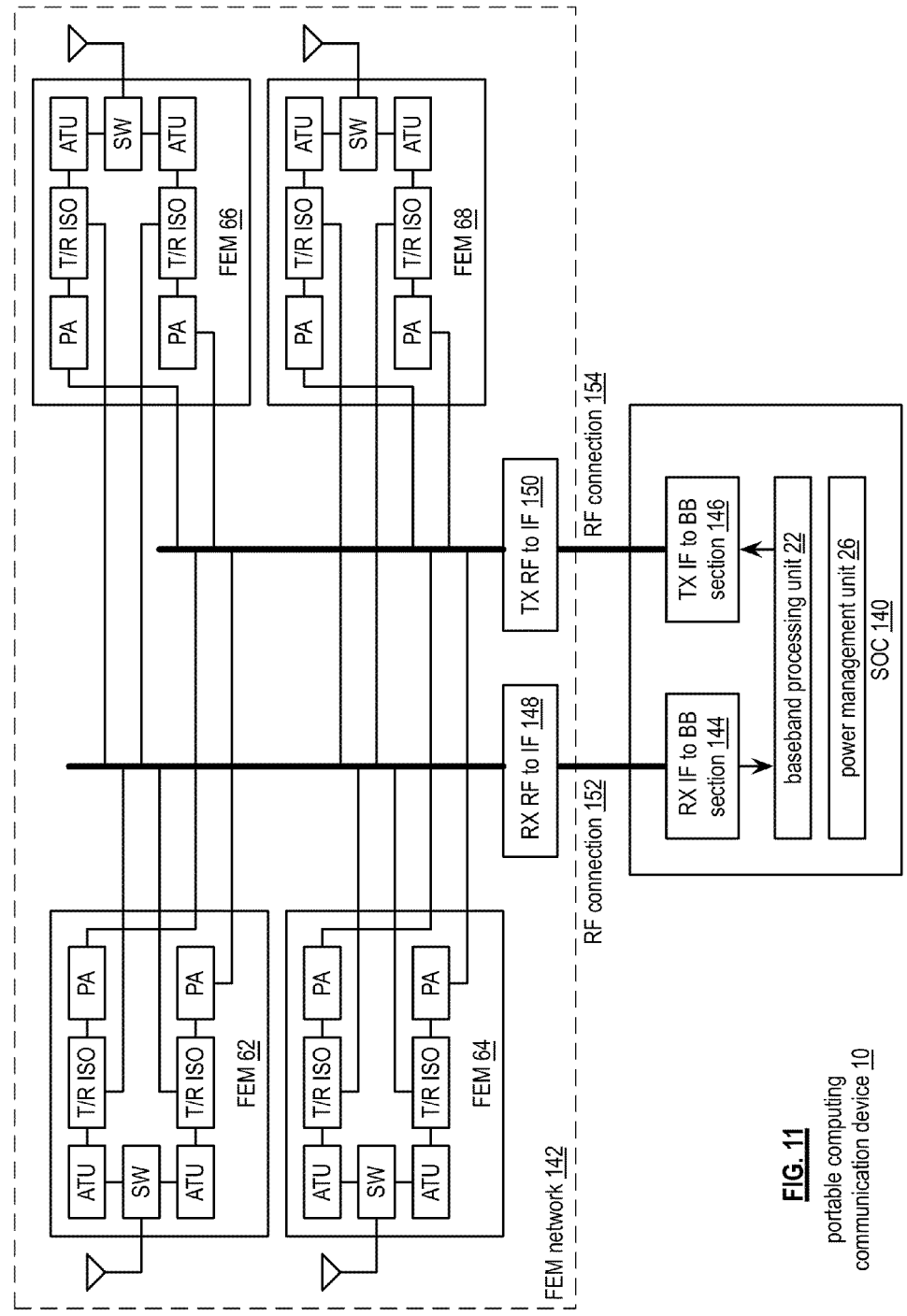
FIG. 11 is a schematic block diagram of another embodiment of a portable computing communication device in accordance with the present invention.

FIG. 11 is a schematic block diagram of another embodiment of a portable computing communication device 10 that includes a system on a chip (SOC) 140 coupled to a front-end module (FEM) network 142 via an RF connection 152-154. The SOC 140 includes the power management unit 26, an intermediate frequency (IF) to baseband (BB) receiver section 144, a BB to IF transmitter section 146, a baseband processing unit 22, and may further include the processing module. The RF connection 152-154 may be one or more of a coaxial cable, a flexible fiber optics cable, a flexible waveguide, and/or other high frequency electrical cabling.

The FEM network 142 includes a plurality of FEMs 62-68 (e.g., two or more) and a pair of RF to IF TX and RX sections 148-150. Each of the FEMs 62-68 includes a plurality of power amplifier modules (PA), a plurality of RX-TX isolation modules, at least one antenna tuning unit (ATU), and a frequency band switch (SW). The TX IF-to-RF section 150 includes a polar-based topology, a Cartesian-based topology, a hybrid polar-Cartesian-based topology, or a mixing, filtering, & combining module. The RX RF-to-IF section 148 includes a low noise amplifier section and a down-conversion section. Note that one or more of the FEMs 62-68 may be constructed as discussed with reference to FIG. 3.

In this embodiment, the baseband processing module 22 converts outbound data into one or more outbound symbol streams in accordance with one or more wireless communication protocols. The TX BB to IF section 146 includes a mixing module that mixes the outbound symbol stream(s) with a transmit IF local oscillation (e.g., an oscillation having a frequency of 10's of MHz to 10's of GHz) to produce one or more outbound IF signals.

The SOC 140 provides the outbound IF signal(s) to the FEM network 142 via the RF connection 152-154. The TX IF to RF section 150 mixes the IF signal with a second local oscillation (e.g., an oscillation having a frequency of RF−IF) to produce one or more mixed signals. The combining & filtering section combines the one more mixed signals and filters them to produce the pre-PA outbound RF signal, which is provided to a selected one of the FEMs 62-68.

For an inbound RF signal, the antenna associated with the select FEM 62-68 receives the signal and provides it to the frequency band switch (SW) if included or to the ATU if no switch is included. The FEM 62-68 processes the inbound RF signal as previously discussed and provides the processed inbound RF signal to the RX RF to IF section 148. The RX RF to IF section 148 mixes the inbound RF signal with a second RX local oscillation (e.g., an oscillation having a frequency of RF−IF) to produce one or more inbound IF mixed signals (e.g., I and Q mixed signal components or polar-formatted signal at IF (e.g., $A(t)\cos(\omega_{IF}(t)+\phi(t))$).

The RX IF to BB section 144 of the SOC 140 receives the one or more inbound IF mixed signals and converts them into one or more inbound symbol streams. The baseband processing module 22 converts the one or more inbound symbol streams into inbound data. Note that the SOC 140 may include a plurality of RX IF to BB 144 and TX BB to IF sections 146 to support multiple concurrent wireless communications.

Figure 12:
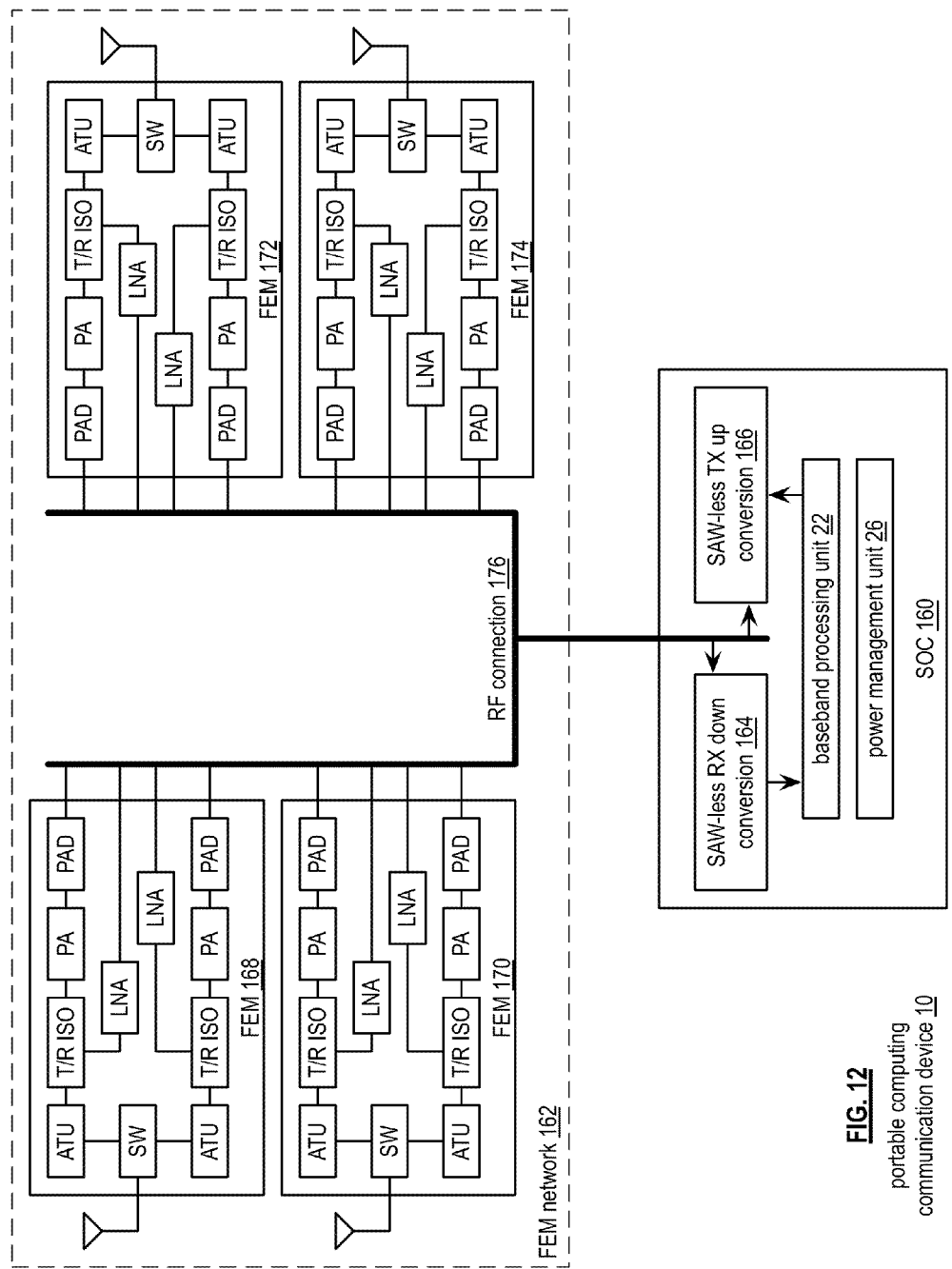
FIG. 12 is a schematic block diagram of another embodiment of a portable computing communication device in accordance with the present invention.

FIG. 12 is a schematic block diagram of another embodiment of a portable computing communication device 10 that includes a system on a chip (SOC) 160 coupled to a front-end module (FEM) network 162 via an RF connection 176. The SOC 160 includes the power management unit 26, a SAW-less receiver (RX) down-conversion section 164, a SAW-less transmitter (TX) up-conversion section 166, a baseband processing unit 22, and may further include the processing module. The RF connection 176 may be one or more of a coaxial cable, a flexible fiber optics cable, a flexible waveguide, and/or other high frequency electrical cabling.

The FEM network 162 includes a plurality of FEMs 168-174 (e.g., two or more) and a pair of RF to IF TX and RX sections. Each of the FEMs 168-174 includes a plurality of power amplifier drivers (PAD), a plurality of low noise amplifiers (LNA), a plurality of power amplifier modules (PA), a plurality of RX-TX isolation modules, at least one antenna tuning unit (ATU), and a frequency band switch (SW). Note that one or more of the FEMs 168-174 may be constructed as discussed with reference to FIG. 3.

In this embodiment, the baseband processing module 22 converts outbound data into one or more outbound symbol streams in accordance with one or more wireless communication protocols. The SAW-less TX up-conversion section 166, which may be implemented similarly to the SAW-less TX section less the power amplifier driver, converts the outbound symbol stream(s) into one or more outbound up-converted signals.

The SOC 160 provides the outbound up-converted signal(s) to the FEM network 162 via the RF connection 176. The SOC 160 may also provide an FEM selection signal to the FEM network 162. The selected FEM module receives the outbound up-converted signal(s) via the power amplifier driver (PAD). The PAD amplifies the outbound up-converted signal(s) to produce the pre-PA outbound RF signals, which are subsequently processed by the FEM 168-174 as previously discussed and/or as discussed with reference to one or more of the subsequent figures.

For an inbound RF signal, the antenna associated with the select FEM 168-174 receives the signal and provides it to the frequency band switch (SW), if included, or to the ATU if no switch is included. The ATU and RX-TX isolation module process the inbound RF signal as previously discussed and provides the processed inbound RF signal to the LNA. The LNA amplifies the inbound RF signal(s) to produce an amplified inbound RF signal(s).

The SAW-less RX section 164 (which may be implemented similarly to the SAW-less receive section less the LNA) receives the one or more amplified inbound IF mixed signals and converts them into one or more inbound symbol streams. The baseband processing module 22 converts the one or more inbound symbol streams into inbound data. Note that the baseband processing unit 22 and/or the processing module may provide control signals to the LNA and/or to the PAD of each of the FEMs 168-174 to adjust properties thereof (e.g., gain, linearity, bandwidth, efficiency, noise, output dynamic range, slew rate, rise rate, settling time, overshoot, stability factor, etc.).

Figure 13:
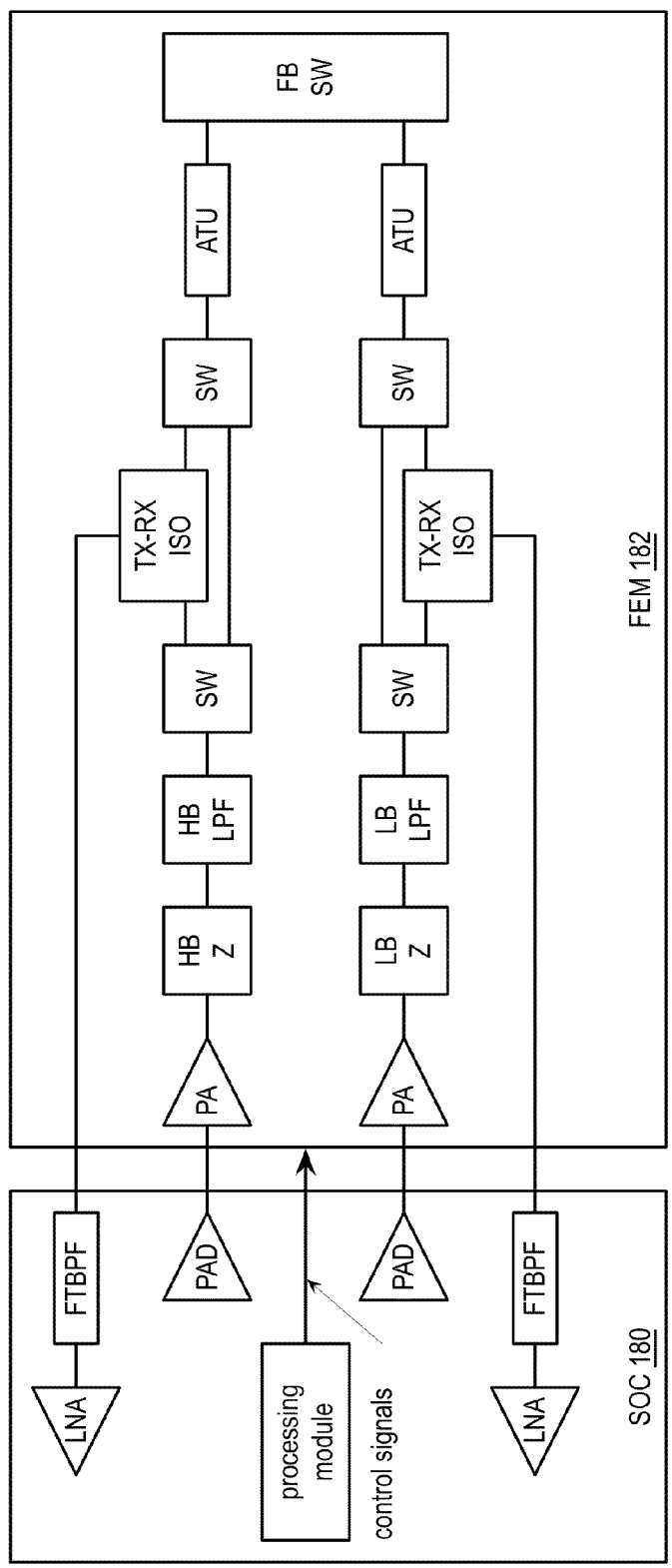
FIG. 13 is a schematic block diagram of another embodiment of a portable computing communication device in accordance with the present invention.

FIG. 13 is a schematic block diagram of another embodiment of a portable computing communication device that includes a system on a chip (SOC) 180 coupled to a front-end module (FEM) 182. The SOC 180 includes a plurality of SAW-less receiver sections (only the LNA and frequency translated bandpass filter (FTBPF) of the receiver section is shown), a plurality of SAW-less transmitter sections (only the power amplifier driver (PAD) is shown), the processing module, the baseband processing module (not shown or included in the processing module), and the power management unit (not shown).

The FEM 182 includes a low frequency band (LB) path, a high frequency band (HB) path, and a frequency band switch (FB SW). The LB path includes a power amplifier module (PA), a low band impedance stage (LB Z), a low band low pass filter (LB LPF), a switch (SW), a transmit-receive isolation module (TX-RX ISO) (e.g., a duplexer), a second switch (SW), and an antenna tuning unit (ATU). The HB path includes a power amplifier module (PA), a high band impedance stage (HB Z), a high band low pass filter (HB LPF), a switch (SW), a transmit-receive isolation module (TX-RX ISO) (e.g., a duplexer), a second switch (SW), and an antenna tuning unit (ATU). Note that the low band path may be used to support low band GSM, EDGE, and/or WCDMA wireless communications and the high band path may be used to support high band GSM, EDGE, and/or WCDMA wireless communications.

The SOC 180 functions to output pre-PA outbound RF signals and to input inbound RF signals as previously discussed and/or as will be discussed with reference to one or more of the subsequent figures. The FEM 182 receives the pre-PA outbound RF signals via the LB path or the HB path and amplifies them via the corresponding PA module. The impedance stage (LB Z or HB Z) provides a desired load on the output of the PA modules and is coupled to the low pass filter (LB LPF or HP LPF). The LPF filters the outbound RF signal, which is provided to the TX-RX ISO module or to the ATU depending on the configuration of the switches (SW). If switches couple the LPF to the TX-RX ISO module, the TX-RX module attenuates the outbound RF signals before providing them to the ATU. The ATU functions as previously described and/or as will be described with reference to one or more of the subsequent figures.

Note that there are no discrete components between the SOC 180 and the FEM 182. In particular, the portable computing communication device does not need discrete SAW-filters as are required in current cellular telephone implementations. One or more of the architecture of the SAW-less receiver, the architecture of the SAW-less transmitter, and/or the programmability of the various components of the FEM 182 contribute to the elimination of SAW filters and/or other conventional external components.

Figure 14:
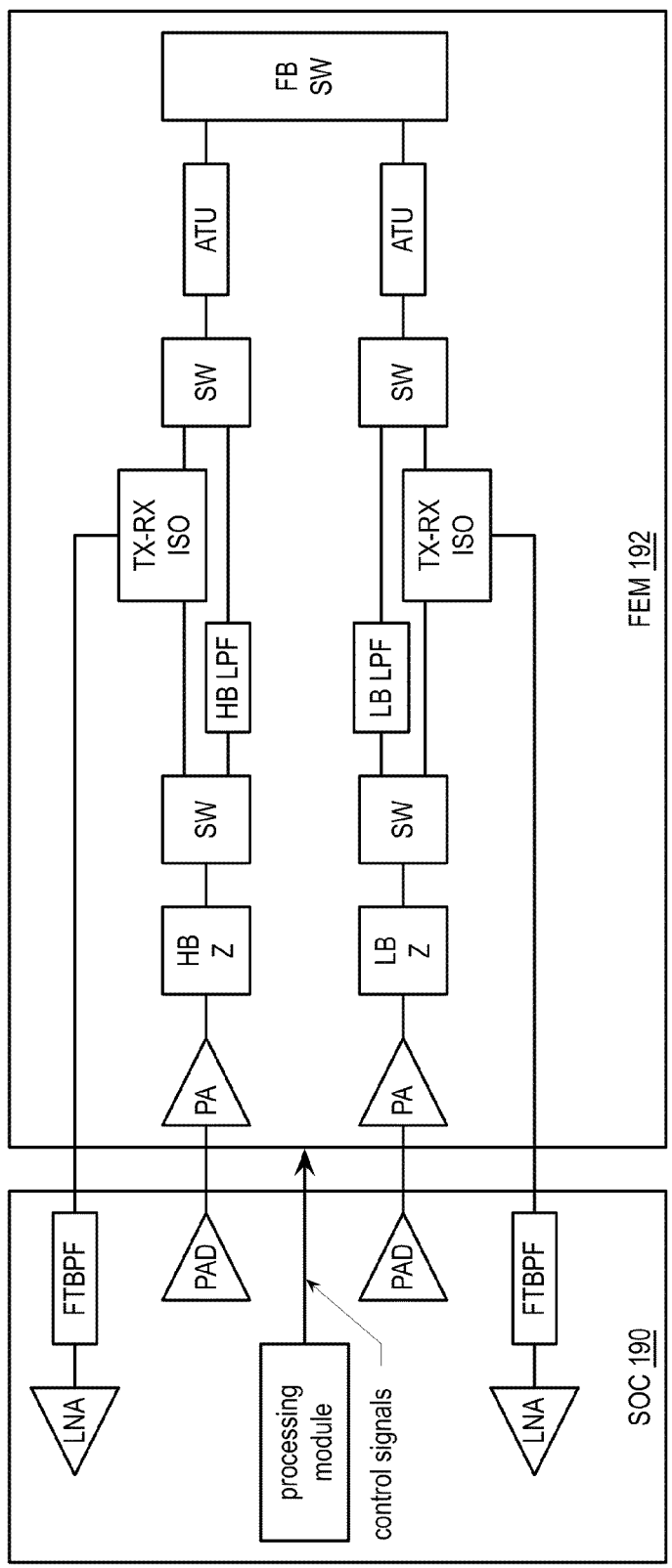
FIG. 14 is a schematic block diagram of another embodiment of a portable computing communication device in accordance with the present invention.

FIG. 14 is a schematic block diagram of another embodiment of a portable computing communication device that includes a system on a chip (SOC) 190 coupled to a front-end module (FEM) 192. The SOC 190 includes a plurality of SAW-less receiver sections (only the LNA and frequency translated bandpass filter (FTBPF) of the receiver section is shown), a plurality of SAW-less transmitter sections (only the power amplifier driver (PAD) is shown), the processing module, the baseband processing module (not shown or included in the processing module), and the power management unit (not shown).

The FEM 192 includes a low frequency band (LB) path, a high frequency band (HB) path, and a frequency band switch (FB SW). The LB path includes a power amplifier module (PA), a low band impedance stage (LB Z), a switch (SW), a low band low pass filter (LB LPF), a transmit-receive isolation module (TX-RX ISO) (e.g., a duplexer), a second switch (SW), and an antenna tuning unit (ATU). The HB path includes a power amplifier module (PA), a high band impedance stage (HB Z), a switch (SW), a high band low pass filter (HB LPF), a transmit-receive isolation module (TX-RX ISO) (e.g., a duplexer), a second switch (SW), and an antenna tuning unit (ATU). Note that the low band path may be used to support low band GSM, EDGE, and/or WCDMA wireless communications and the high band path may be used to support high band GSM, EDGE, and/or WCDMA wireless communications.

In the various embodiments of the SOC 190, the frequency translated bandpass filter in the receiver section of the SOC 190 provides sufficiently filters the far-out blockers and filters the image signal with negligible affect on the desired signal. This reduces the dynamic range requirement of the analog to digital converters (ADC) of the receiver section (at the output end of the baseband processing module or at the input of the RX BB to IF section). The super heterodyne architecture of the receiver section is optimal for reducing power consumption and die area in comparison to a comparable direction conversion receiver section.

Figure 15:
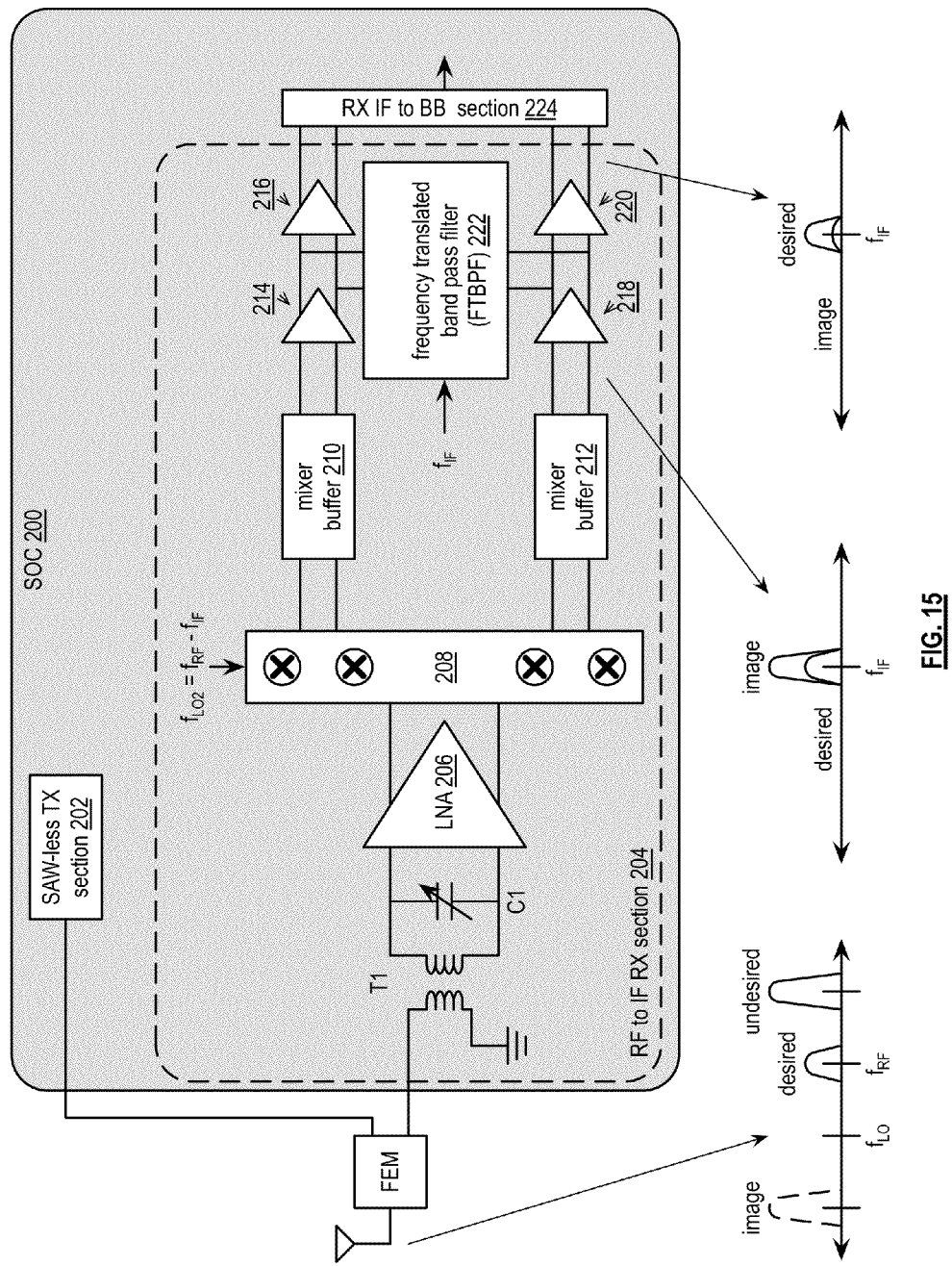
FIG. 15 is a schematic block diagram of an embodiment of an RF to IF receiver section of an SOC in accordance with the present invention.

FIG. 15 is a schematic block diagram of an embodiment of an RF to IF receiver section 204 of an SOC 200 that includes an FEM module (which includes a transformer T1, a tunable capacitor network C1, and/or a low noise amplifier module (LNA) 206), a mixing module 208, mixed buffers 210-212, a frequency translated bandpass filter (FTBPF) circuit module (which includes FTBPF 222 and/or additional buffers 214-220), and a receiver IF to BB section 224. The SOC 200 also includes the SAW-less transmitter section 202 and may further include the baseband processing unit, the processing module, and the power management unit.

In an example of operation, an inbound RF signal is received via the antenna. The inbound RF signal includes a desired signal component at RF and an undesired component at a frequency above or below RF (above is shown). With respect the local oscillation of the RF to IF section 204 (e.g., $f_{LO}$), an image signal component may occur if a signal is present at $r_{RF}-2f_{IF}$. Note that, as used herein and throughout this specification, RF includes frequencies in the radio frequency band up to 3 GHz and frequencies in the millimeter (or microwave) frequency band of 3 GHz to 300 GHz.

The antenna provides the inbound RF signal to the FEM, which processes it as previously discussed and/or as will be discussed with reference to one or more of the subsequent figures. The transformer T1 receives the FEM processed inbound RF signal and converts it into a differential signal, which is filtered by the tunable capacitor network C1 (e.g., a plurality of series coupled switches and capacitors, wherein the plurality is coupled in parallel). The tunable capacitor network C1 receives a control signal from the baseband processing unit and/or the processing module (e.g., SOC processing resources) to enable a desired capacitance.

The low noise amplifier module (LNA) 206, which includes one or more low noise amplifiers coupled in series and/or in parallel, amplifies the inbound RF signal to produce an amplified inbound RF signal. The LNA 206 may receive a control signal from the SOC processing resources, wherein the control signal indicates a setting for at least one of gain, linearity, bandwidth, efficiency, noise, output dynamic range, slew rate, rise rate, settling time, overshoot, and stability factor.

The mixing module 208 receives the amplified inbound RF signal and converts it into an in-phase (I) signal component and a quadrature (Q) signal component using a conversion module such as a π/2 phase shifter or other type of phase manipulation circuit. A mixer of the mixing module 208 mixes the I signal component with an I signal component of a local oscillation (e.g., $f_{LO}$) to produce an I mixed signal and another mixer mixes the Q signal component with a Q signal component of the local oscillation to produce a Q mixed signal. Note that the mixers of the mixing module 208 may each be a balanced mixer, a double balanced mixer, a passive switch mixer, a Gilbert cell mixer, or other type of circuit that multiplies two sinusoidal signals and produces a "sum of the frequencies" signal component and a "difference between the frequencies" signal component. Further note that the I and Q mixed signals may be differential signals or single ended signals; differential signals are shown.

The mixer buffers 210-212 filter and/or buffer the I and Q mixed signals, which are subsequently provided to the FTBPF structure (e.g., the buffers 214-220 and the frequency translated bandpass filter (FTBPF) 222). Note that each of the I and Q mixed signals includes an IF version of the desired signal component and may also include an IF version of the image signal component. Further note that the mixing module 208 and/or the mixer buffers 210-212 may included filtering to attenuate the undesired signal component such that it of minimal impact on the IF signal components.

The FTBPF 222 (various embodiments of which will be described in several of the subsequent figures) filters the IF signal by attenuating the image IF signal component and passing, substantially unattenuated, the desired IF signal component. For example, assume that the FTBPF frequency translates a narrow band baseband bandpass filter response to an IF (e.g., RF-LO) filter response. Further assume for this example that RF is 2 GHz, LO2 is 1900 MHz, and $RF_{image}$ is 1800 MHz. Based on these assumptions, the mixing module 208 will produce an I mixed signal and a Q mixed signal that is a combination of the desired signal and the image signal. In simplified terms, the I mixed signal (e.g., cos(RF)*cos(LO2) includes ½ cos(2000−1900)+½ cos(2000+1900) from the desired signal component and ½ cos(1800−1900)+½ cos (1800+1900) from the image signal component and the Q mixed signal (e.g., sin(RF)*sin(LO) includes ½ cos (2000−1900)−½ cos(2000+1900) from the desired signal component and ½ cos(1800−1900)−½ cos(1800+1900). Note that frequency components at 2000+1900 are filtered out by the buffer after the mixer.

The narrow band of the FTBPF filters out the image frequency at (1800−1900) and the undesired signal component, leaving the components having a frequency at (2000−1900) of the desired signal component. In particular, what is remaining is ½ cos (2000−1900) from the I mixed signal and ½ cos(2000−1900) from the Q mixed signal. The FTBPF 222 takes advantage of these two inputs to effective sum the terms from the desired signal component together (e.g., ½ cos (2000−1900)+½ cos(2000−1900)=cos (2000−1900)) and to effective sum the terms from the image signal component together (e.g., ½ cos(1800−1900)−½ cos(1800−1900)=0 (ideally)). As such, the image signal component is attenuated while the desired signal component is passed substantially unattenuated.

To enhance the filtering of the FTBPF 222, it may receive one or more control signals from the SOC processing resources. The control signal(s) may cause the FTBPF 222 to adjust the center frequency of the baseband filter response (which changes the center frequency of the high-Q IF filter), to change the quality factor of the filter, to change the gain, to change the bandwidth, etc.

The receiver IF to BB section 224 includes a mixing section and a combining & filtering section. The mixing section mixes the inbound IF signal with a second local oscillation to produce I and Q mixed signals. The combining & filtering section combines the I and Q mixed signals to produce a combined signal and then filters the combined signal to produce the one or more inbound symbol streams.

While the present RF to IF section 204 is shown coupled to a single antenna for SISO (single input single output) communications, the concepts are applicable to MISO (multiple input single output) communications and to MIMO (multiple input multiple output) communications. In these instances, a plurality of antennas (e.g., 2 or more) is coupled to a corresponding number of FEMs (or a less number of FEMs depending on the receive paths within a FEM). The FEMS are coupled to a plurality of receiver RF to IF sections (e.g., same number as the number of antennas), which are, in turn, coupled to a corresponding number of receiver IF to BB sections 224. The baseband processing unit processes the multiple symbol streams to produce the inbound data.

The RX RF to IF section 204 provides one or more of the follow benefits and/or includes one or more of the following characteristics: the super-heterodyne receiver architecture is more optimal with respect to die area and power consumption than a corresponding direct conversion receiver; using a complex baseband impedance in the FTBPF 222 allows for the center frequency of the bandpass filter to be shifted thus enabling the center of the on-chip high-Q image rejection filter to be tuned to the desired frequency; and only a signal local oscillator is needed, which can be used for the down-conversion mixer and the FTBPF 222.

Figure 16:
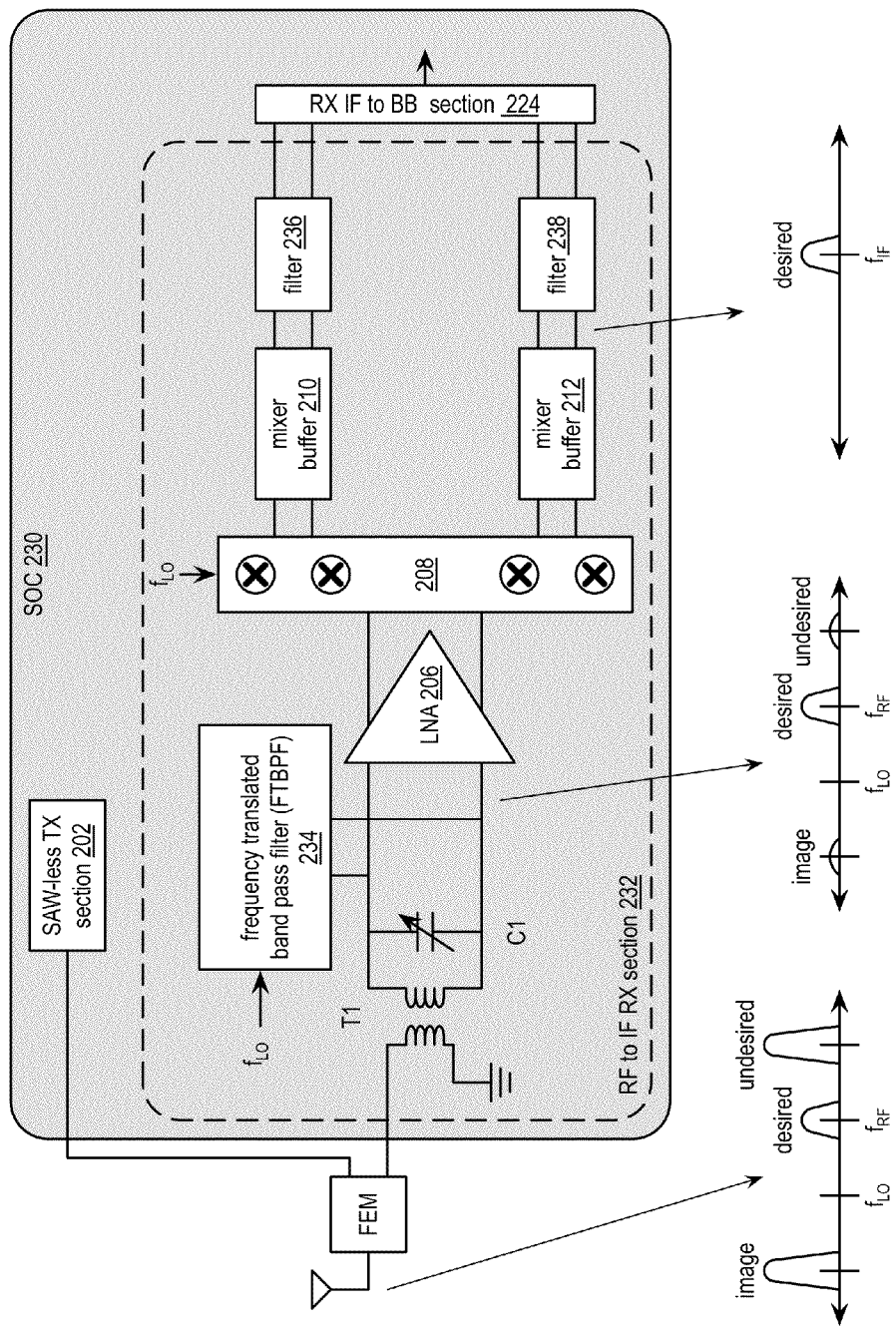
FIG. 16 is a schematic block diagram of another embodiment of an RF to IF receiver section of an SOC in accordance with the present invention.

FIG. 16 is a schematic block diagram of another embodiment of an RF to IF receiver section 232 of an SOC 230 that includes an FEM interface module (which includes a transformer T1 and/or a tunable capacitor network C1), a frequency translated bandpass filter (FTBPF) 234, a low noise amplifier module (LNA) 206, a mixing section (which includes a mixing module 208 and/or mixed buffers 210-212). The SOC 230 also includes a receiver IF to BB section 224, the SAW-less transmitter section 202, and may further include the baseband processing unit, the processing module, and/or the power management unit.

In an example of operation, an inbound RF signal is received via the antenna. The inbound RF signal includes a desired signal component at RF and an undesired component at a frequency above or below RF (above is shown). With respect the local oscillation of the RF to IF section 232 (e.g., $f_{LO}$), an image signal component may occur if a signal is present at $r_{RF}−2f_{IF}$. The antenna provides the inbound RF signal to the FEM, which processes it as previously discussed and/or as will be discussed with reference to one or more of the subsequent figures. The transformer T1 receives the FEM processed inbound RF signal and converts it into a differential signal, which is filtered by the tunable capacitor network C1 based on control signals from the SOC processing resources.

The FTBPF (various embodiments of which will be described in several of the subsequent figures) 234 filters the inbound RF signal by attenuating an image signal component and an undesired signal component and passing, substantially unattenuated, a desired RF signal component. For example, assume that the FTBPF frequency translates a narrow band baseband bandpass filter response to RF (e.g., the carrier frequency of the desired signal component) to produce a high-Q RF filter response. The narrow band high-Q RF filter filters out the image signal component and the undesired signal component and passes, substantially unattenuated, the desired signal component.

The low noise amplifier module (LNA) 206 amplifies the desired inbound RF signal component to produce an amplified desired inbound RF signal. The LNA 206 may receive a control signal from the SOC 230 processing resources, wherein the control signal indicates a setting for at least one of gain, linearity, bandwidth, efficiency, noise, output dynamic range, slew rate, rise rate, settling time, overshoot, and stability factor.

The mixing module 208 receives the amplified desired inbound RF signal and converts it into an in-phase (I) signal component and a quadrature (Q) signal component using a π/2 phase shifter or other type of phase manipulation circuit. A mixer of the mixing module 208 mixes the I signal component with an I signal component of a local oscillation (e.g., $f_{LO}$) to produce an I mixed signal and another mixer mixes the Q signal component with a Q signal component of the local oscillation to produce a Q mixed signal. Note that the I and Q mixed signals may be differential signals or single ended signals; differential signals are shown.

The mixer buffers buffer the I and Q mixed signals, which are subsequently provided to the filters (e.g., bandpass filters)

. The filters 236 238 filter the I and Q mixed signals, which are subsequently provided to the RX IF to BB section 224.

The receiver IF to BB section 224 includes a mixing section and a combining & filtering section. The mixing section mixes the inbound IF signal with a second local oscillation to produce I and Q mixed signals. The combining & filtering section combines the I and Q mixed signals to produce a combined signal and then filters the combined signal to produce the one or more inbound symbol streams.

While the present RF to IF section 232 is shown coupled to a single antenna for SISO (single input single output) communications, the concepts are applicable to MISO (multiple input single output) communications and to MIMO (multiple input multiple output) communications. In these instances, a plurality of antennas (e.g., 2 or more) is coupled to a corresponding number of FEMs (or a less number of FEMs depending on the receive paths within a FEM). The FEMS are coupled to a plurality of receiver RF to IF sections (e.g., same number as the number of antennas), which are, in turn, coupled to a corresponding number of receiver IF to BB sections. The baseband processing unit processes the multiple symbol streams to produce the inbound data.

Figure 17:
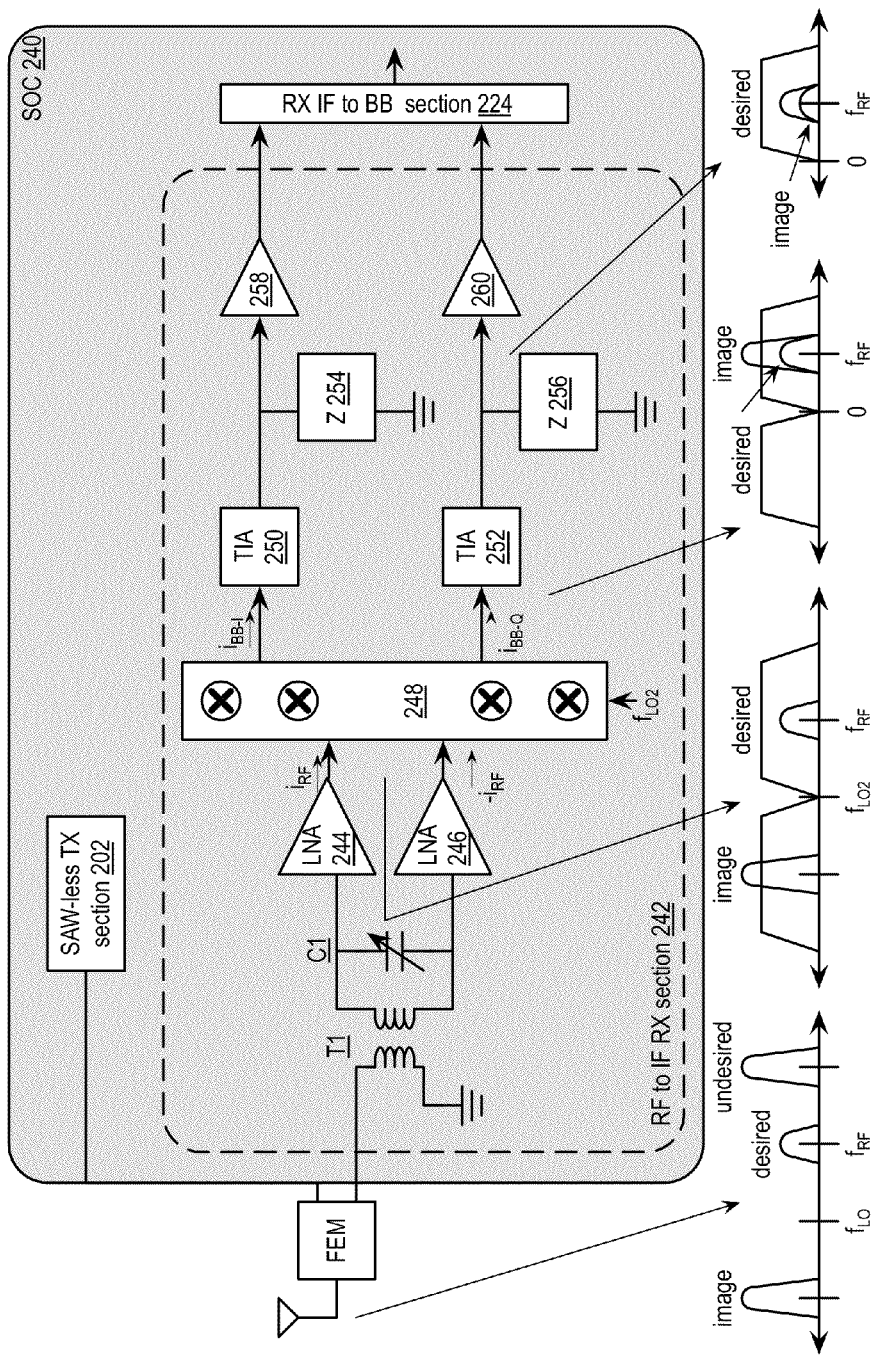
FIG. 17 is a schematic block diagram of another embodiment of an RF to IF receiver section of an SOC in accordance with the present invention.

FIG. 17 is a schematic block diagram of another embodiment of an RF to IF receiver section 242 of an SOC 240 that includes a front end module interface (which may include a transformer T1 and/or a tunable capacitor network C1), a pair of inverter-based low noise amplifier modules (LNA) 244-246, a mixing module 248, and a pair of transimpedance amplifier modules (each may include a transimpedance amplifiers (TIA) 250-252, an impedance (Z) 254-256, and/or a buffer 258-260). The SOC 240 also includes a receiver IF to BB section 224, the SAW-less transmitter section 202 and may further include the baseband processing unit, the processing module, and the power management unit.

In an example of operation, an inbound RF signal is received via the antenna. The inbound RF signal includes a desired signal component at RF and an undesired component at a frequency above or below RF (above is shown). With respect the local oscillation of the RF to IF section (e.g., $f_{LO}$), an image signal component may occur if a signal is present at $r_{RF}-2f_{IF}$. The antenna provides the inbound RF signal to the FEM, which processes it as previously discussed and/or as will be discussed with reference to one or more of the subsequent figures. The transformer T1 receives the FEM processed inbound RF signal and converts it into a differential signal, which is filtered by the tunable capacitor network C1 based on control signals from the SOC 240 processing resources.

A first LNA 244 amplifies a positive leg of the inbound RF signal to produce a positive leg current RF signal and the second LNA 246 amplifies a negative leg of the inbound RF signal to produce a negative leg current RF signal. Each of the LNAs 244-246 may receive a control signal from the SOC 240 processing resources, wherein the control signal indicates a setting for at least one of gain, linearity, bandwidth, efficiency, noise, output dynamic range, slew rate, rise rate, settling time, overshoot, and stability factor.

The mixing module 248 receives the positive leg current RF signal and negative leg current RF signal and converts them into an in-phase (I) current signal and a quadrature (Q) current signal using a π/2 phase shifter or other type of phase manipulation circuit. A mixer of the mixing module 248 mixes the I current signal with an I current signal of a local oscillation (e.g., $f_{LO}$) to produce an I mixed current signal (e.g., $i_{BB-I}$) and mixes the Q current signal with a Q current signal of the local oscillation to produce a Q mixed current signal (e.g., $i_{BB-Q}$). Note that the I and Q mixed current signals may be differential signals or single ended signals; differential signals are shown. Further note that each of the I and Q mixed current signals includes an image component and a desired component.

The TIAs 250-252 (of which one or more embodiments are discussed with reference to one or more of the subsequent figures) receive the I and Q mixed current signals and convert them into voltages, via the impedances (z), such that the resulting I and Q voltage mixed signals having an attenuated image component and a substantially unattenuated desired component. The structure of the TIAs 250-252 in combination with the impedances (z), provide a low impedance path from their inputs to a reference potential (e.g., Vdd or ground) for frequencies below the IF and provide a low impedance path between their respective inputs for frequencies above the IF. For frequencies proximal to the IF, the TIA 250-252 amplifies them and converts them into a voltage signal. The buffers provide the I and Q voltage signal components to the RX IF to BB section 224 which converts them into an inbound symbol stream.

The RX RF to IF section 224 provides one or more of the follow benefits and/or includes one or more of the following characteristics: the super-heterodyne receiver architecture is more optimal with respect to die area and power consumption than a corresponding direct conversion receiver; and substantially eliminates offset and flicker noise, which are inherent problems of a super heterodyne receiver.

Figure 18:
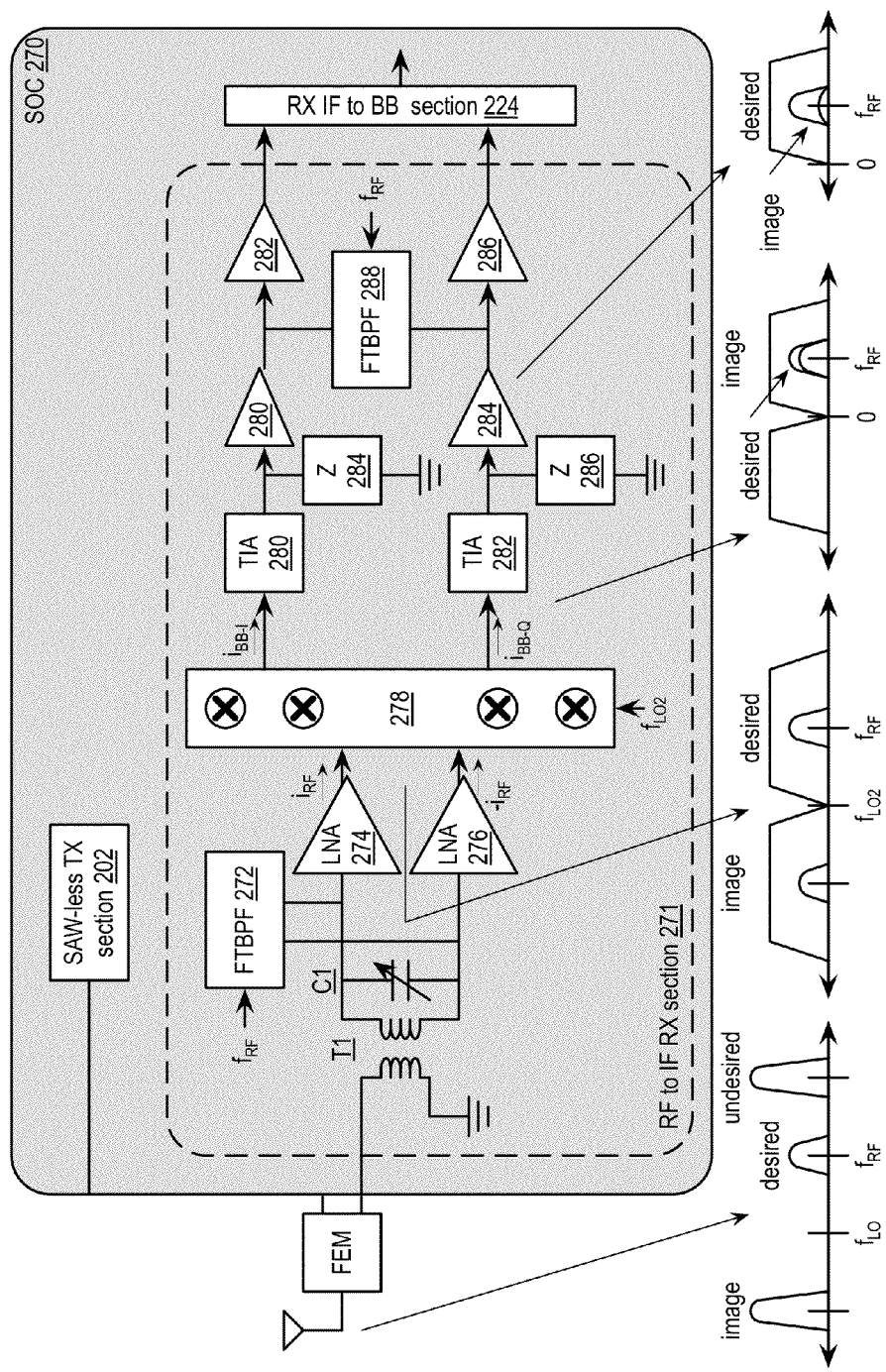
FIG. 18 is a schematic block diagram of another embodiment of an RF to IF receiver section of an SOC in accordance with the present invention.

FIG. 18 is a schematic block diagram of another embodiment of an RF to IF receiver section 271 of an SOC 270 that includes an FEM interface module (which may include a transformer T1 and/or a tunable capacitor network C1), an RF frequency translated bandpass filter (FTBPF) 272, a pair of inverter-based low noise amplifier modules (LNA) 274-276, a mixing module 278, a pair of transimpedance amplifier modules (each of which may include a transimpedance amplifier (TIA) 280-282, an impedance (Z) 284-286, and/or a buffer 280-286), and an IF FTBPR 288. The SOC 270 also includes a receiver IF to BB section 224, the SAW-less transmitter section 202 and may further include the baseband processing unit, the processing module, and the power management unit.

In this embodiment, the RF FTBPF 272 functions as described with reference to FIG. 16 and the TIAs 280-282 function as described with reference to FIG. 17. The IF FTBPF 288 is clocked from the RF clock and has its center frequency at RF. The bandwidth of the IF FTBPF 288 is such that the image signal is substantially attenuated and the desired signal component is passed substantially unattenuated. As such, the image is filtered three times: by the RF FTBPF 272, by the TIAs 280-282, and then by the IF FTBPF 288.

The RX RF to IF section 271 provides one or more of the follow benefits and/or includes one or more of the following characteristics: uses two clocks (e.g., RF and LO2); the super-heterodyne receiver architecture is more optimal with respect to die area and power consumption than a corresponding direct conversion receiver; flicker noise is not important, so the baseband circuits will be compact; can use inductor-less LNAs 274-276 (e.g., LNAs may be implemented as inverters); no DC offset issues, thus, offset cancellation circuit which is large in area is eliminated; receiver architecture has comparable frequency planning flexibility as a direct-conversion receiver; includes progressive bandpass filtering stages over the RX chain; and can be readily integrated into an SOC 270.

Figure 19:
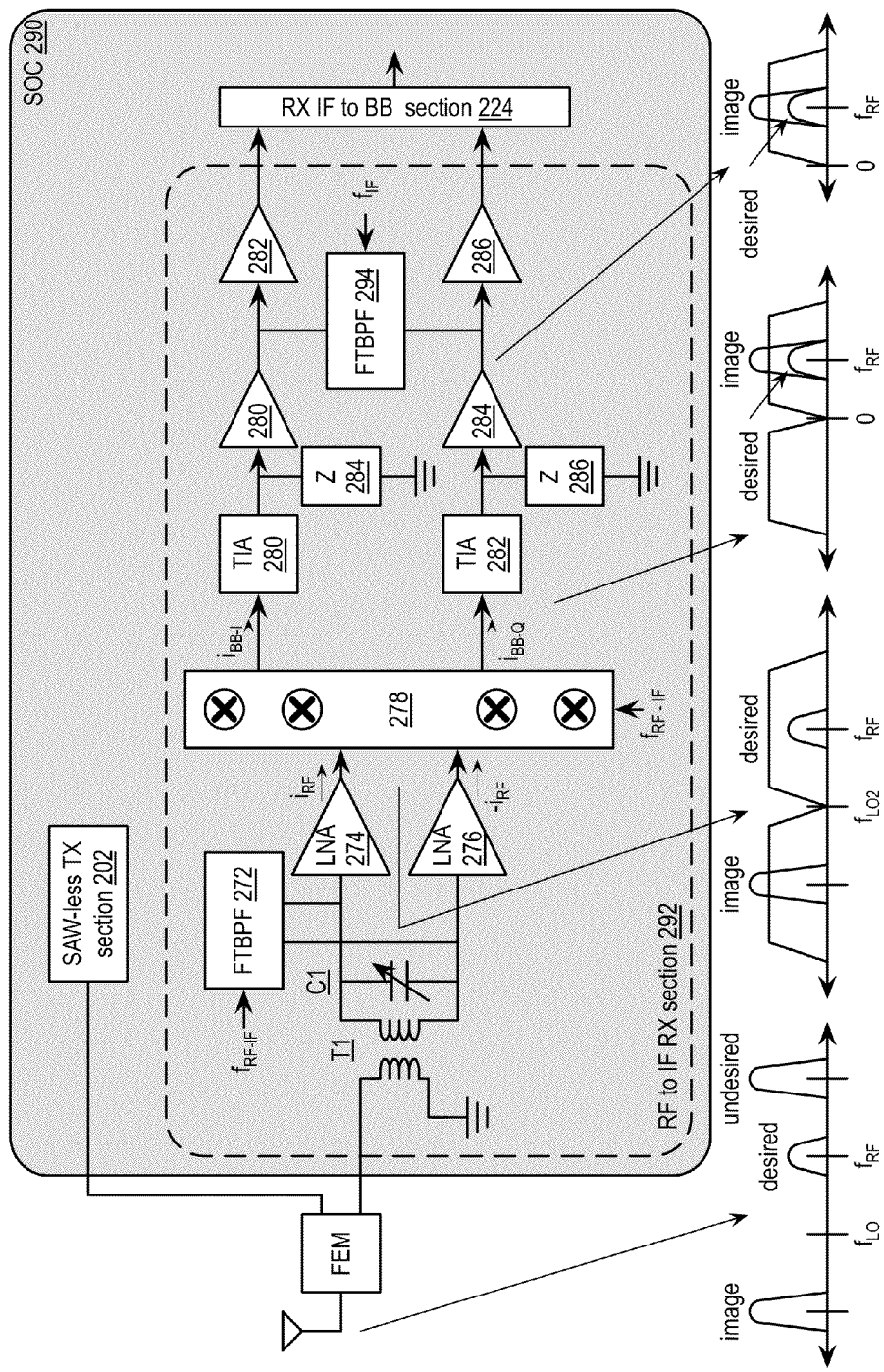
FIG. 19 is a schematic block diagram of another embodiment of an RF to IF receiver section of an SOC in accordance with the present invention.

FIG. 19 is a schematic block diagram of another embodiment of an RF to IF receiver section 292 of an SOC 290 that includes the FEM interface module (which may include a transformer T1 and/or a tunable capacitor network C1), an RF frequency translated bandpass filter (FTBPF) 272, a pair of inverter-based low noise amplifier modules (LNA) 274-276, a mixing module 278, a pair of transimpedance amplifier modules (each of which may include a transimpedance amplifier (TIA) 280-282, an impedance (Z) 284-286, and/or a buffer 280-286), and an IF FTBPR 294. The SOC 290 also includes a receiver IF to BB section 224, the SAW-less transmitter section 202 and may further include the baseband processing unit, the processing module, and the power management unit.

In this embodiment, the IF FTBPF 294 functions as described with reference to FIG. 15 and the TIAs function as described with reference to FIG. 17. The RF FTBPF 272 is clocked from the LO clock and has its center frequency at IF. The bandwidth of the RF FTBPF 272 is such that the image signal is substantially attenuated and the desired signal component is passed substantially unattenuated. As such, the image is filtered three times: by the RF FTBPF 272, by the TIAs 280-282, and then by the IF FTBPF 294.

The RX RF to IF section 292 provides one or more of the follow benefits and/or includes one or more of the following characteristics: uses one clock (e.g., LO2); the super-heterodyne receiver architecture is more optimal with respect to die area and power consumption than a corresponding direct conversion receiver; flicker noise is not important, so the baseband circuits will be compact; can use inductor-less LNAs (e.g., LNAs may be implemented as inverters); no DC offset issues, thus, offset cancellation circuit which is large in area is eliminated; receiver architecture has comparable frequency planning flexibility as a direct-conversion receiver; includes progressive bandpass filtering stages over the RX chain; and can be readily integrated into an SOC 290.

Figure 20:
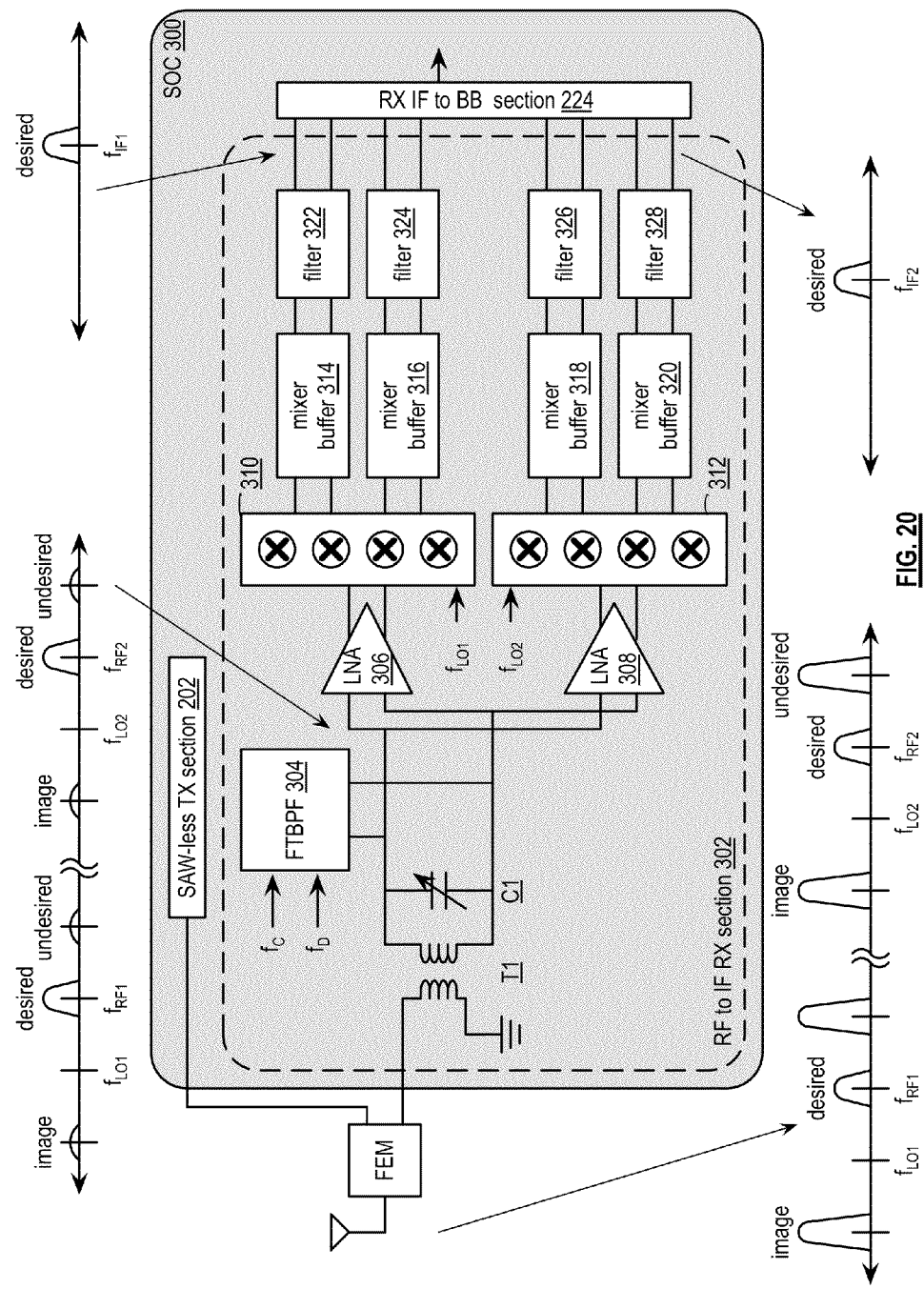
FIG. 20 is a schematic block diagram of another embodiment of an RF to IF receiver section of an SOC in accordance with the present invention.

FIG. 20 is a schematic block diagram of another embodiment of a dual band RF to IF receiver section 302 of an SOC 300 that includes an FEM interface module (which may include a transformer T1 and/or a tunable capacitor network C1), an RF frequency translated bandpass filter (FTBPF) 304, a pair of low noise amplifier modules (LNA) 306-308, and a mixing section (which may include a pair of mixing modules 310-312, mixing buffers 314-320, and/or filters 322-328). The SOC 300 also includes a receiver IF to BB section 224, the SAW-less transmitter section 202 and may further include the baseband processing unit, the processing module, and the power management unit.

In an example of operation, an inbound RF signal is received via the antenna. The inbound RF signal includes one or more desired signal components (e.g., one at $f_{RF1}$ and the other at $f_{RF2}$) and an undesired component(s) at a frequency above or below RF (above is shown). With respect the local oscillations (one for the first desired RF signal and another for the second desired RF signal $-f_{LO1}$ and $f_{LO2}$) of the RF to IF section, one or more image signal components may occur if a signal is present at $r_{RF1}-2f_{IF1}$ and/or at $r_{RF2}-2f_{IF2}$. The antenna provides the inbound RF signal to the FEM, which processes it as previously discussed and/or as will be discussed with reference to one or more of the subsequent figures. The transformer T1 receives the FEM processed inbound RF signal and converts it into a differential signal, which is filtered by the tunable capacitor network C1 based on control signals from the SOC processing resources.

The FTBPF 304 (various embodiments of which will be described in several of the subsequent figures) filters the inbound RF signal by attenuating the image signal components and the undesired signal components and passing, substantially unattenuated, the desired RF signal components. For example, assume that the FTBPF frequency translates a narrow band baseband bandpass filter to RF1 and RF2 (e.g., the carrier frequencies of the desired signal component) to produce two high-Q RF filters. Each of the narrow band high-Q RF filters respectively filters out the image signal component and the undesired signal component and passes, substantially unattenuated, the desired signal component.

A first low noise amplifier module (LNA) amplifies the desired inbound RF1 signal component, when included in the inbound RF signal, to produce an amplified desired inbound RF1 signal and a second LNA amplifies the desired inbound RF2 signal component, when included in the inbound RF signal, to produce an amplified desired inbound RF2 signal. Each of the LNAs may receive a control signal from the SOC processing resources, wherein the control signal indicates a setting for at least one of gain, linearity, bandwidth, efficiency, noise, output dynamic range, slew rate, rise rate, settling time, overshoot, and stability factor.

A first mixing module of the mixing section receives the amplified desired inbound RF1 signal and converts it into an in-phase (I) signal component and a quadrature (Q) signal component using a π/2 phase shifter or other type of phase manipulation circuit. A mixer of the first mixing module mixes the I signal component with an I signal component of a local oscillation (e.g., $f_{LO1}$) to produce a first I mixed signal and mixes the Q signal component with a Q signal component of the local oscillation to produce a first Q mixed signal. Note that the first I and Q mixed signals may be differential signals or single ended signals; differential signals are shown.

A second mixing module of the mixing section receives the amplified desired inbound RF2 signal and converts it into an in-phase (I) signal component and a quadrature (Q) signal component using a π/2 phase shifter or other type of phase manipulation circuit. A mixer of the second mixing module mixes the I signal component with an I signal component of a local oscillation (e.g., $f_{LO2}$) to produce a second I mixed signal and mixes the Q signal component with a Q signal component of the local oscillation to produce a second Q mixed signal. Note that the second I and Q mixed signals may be differential signals or single ended signals; differential signals are shown.

Each of the mixer buffers their respective I and Q mixed signals, which are subsequently provided to the filters (e.g., bandpass filters). The filters filter the I and Q mixed signals, which are subsequently provided to the RX IF to BB section 224.

While the present RF to IF section 302 is shown coupled to a single antenna for SISO (single input single output) communications, the concepts are applicable to MISO (multiple input single output) communications and to MIMO (multiple input multiple output) communications. In these instances, a plurality of antennas (e.g., 2 or more) is coupled to a corresponding number of FEMs (or a less number of FEMs depending on the receive paths within a FEM). The FEMS are coupled to a plurality of receiver RF to IF sections (e.g., same number as the number of antennas), which are, in turn, coupled to a corresponding number of receiver IF to BB sections. The baseband processing unit processes the multiple symbol streams to produce the inbound data.

The RX RF to IF section 302 provides one or more of the follow benefits and/or includes one or more of the following characteristics: is capable of receiving two inbound RF signals using a single RF input section; eliminates the need for two external SAW filters, one FTBPF 304 efficiently filters two channels (e.g., RF1 and RF2 signals); the center frequency of both high-Q RF filters is controlled by the local oscillation clocks; and can be readily integrated into an SOC 300.

Figure 21:
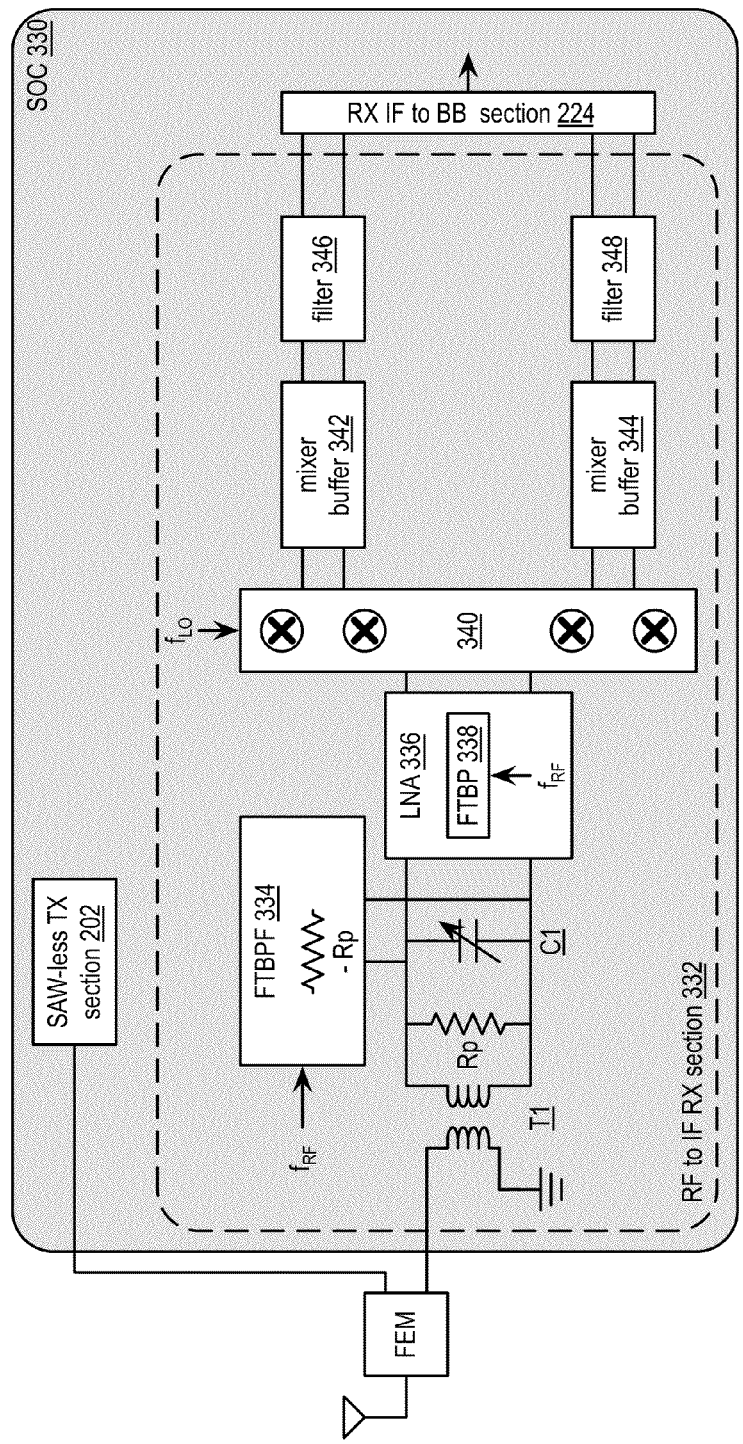
FIG. 21 is a schematic block diagram of another embodiment of an RF to IF receiver section of an SOC in accordance with the present invention.

FIG. 21 is a schematic block diagram of another embodiment of an RF to IF receiver section 332 of an SOC 330 that includes an FEM interface module (which may include a transformer T1 and/or a tunable capacitor network C1), a low noise amplifier module (LNA) 336 with a frequency translated bandpass filter (FTBPF) 338, an RF frequency translated bandpass filter (FTBPF) with negative resistance 334, and a mixing section (which may include a mixing module 340, mixed buffers 342-344, and/or filters 346-348). The SOC 330 also includes a receiver IF to BB section 224, the SAW-less transmitter section 202 and may further include the baseband processing unit, the processing module, and the power management unit.

In this embodiment, a parasitic resistance (Rp) is shown associated with the FEM interface module to represent switch loss (e.g., of the FTBPF) and/or inductor loss. The inductor loss is primarily due to ohmic resistance of the windings of the transformer (e.g., metal traces on a substrate) and/or substrate loss underneath the transformer and, with the tuning of the capacitor C1, is a dominant component of impedance at RF. A lower parasitic resistance reduces the quality factor of filtering and reduces the far-out attenuation of frequencies away from RF. The negative resistance in the FTBPF 334 effectively increases the parasitic resistance, thereby increasing the quality factor and far-out attenuation.

In an example of operation, an inbound RF signal is received via the antenna. The inbound RF signal includes a desired signal component at RF and an undesired component at a frequency above or below RF (above is shown). With respect the local oscillation of the RF to IF section 332 (e.g., $f_{LO}$), an image signal component may occur if a signal is present at $r_{RF}-2f_{IF}$. The antenna provides the inbound RF signal to the FEM, which processes it as previously discussed and/or as will be discussed with reference to one or more of the subsequent figures. The transformer T1 receives the FEM processed inbound RF signal and converts it into a differential signal, which is filtered by the tunable capacitor network C1 based on control signals from the SOC 330 processing resources.

The FTBPF 334 (various embodiments of which will be described in several of the subsequent figures) filters the inbound RF signal by attenuating an image signal component and an undesired signal component and passing, substantially unattenuated, a desired RF signal component. For example, assume that the FTBPF 334 frequency translates a narrow band baseband bandpass filter to RF (e.g., the carrier frequency of the desired signal component) to produce a high-Q RF filter. The narrow band high-Q RF filter filters out the image signal component and the undesired signal component and passes, substantially unattenuated, the desired signal component. In addition, the FTBPF 334 includes a negative resistance that may be comparable to the parasitic resistance (Rp) and compensates for the losses represented by the parasitic resistance (e.g., effectively increases the quality factor of filtering and increases far-out attenuation). The negative resistance can be dynamically adjusted via a control signal from the SOC 330 processing resources based on variations of the parasitic resistance.

The low noise amplifier module (LNA) 336 amplifies the desired inbound RF signal component to produce an amplified desired inbound RF signal. The LNA 336 may receive a control signal from the SOC 330 processing resources, wherein the control signal indicates a setting for at least one of gain, linearity, bandwidth, efficiency, noise, output dynamic range, slew rate, rise rate, settling time, overshoot, and stability factor. In addition, the LNA 336 may include an RF FTBPF 338 that functions similarly to RF FTBPF 334 previously discussed to further attenuate the image signal component.

The mixing module 340 receives the amplified desired inbound RF signal and converts it into an in-phase (I) signal component and a quadrature (Q) signal component using a π/2 phase shifter or other type of phase manipulation circuit. A mixer of the mixing module 340 mixes the I signal component with an I signal component of a local oscillation (e.g., $f_{LO}$) to produce an I mixed signal and mixes the Q signal component with a Q signal component of the local oscillation to produce a Q mixed signal. Note that the I and Q mixed signals may be differential signals or single ended signals; differential signals are shown.

The mixer buffers buffer the I and Q mixed signals, which are subsequently provided to the filters (e.g., bandpass filters). The filters filter the I and Q mixed signals, which are subsequently provided to the RX IF to BB section 224.

While the present RF to IF section 332 is shown coupled to a single antenna for SISO (single input single output) communications, the concepts are applicable to MISO (multiple input single output) communications and to MIMO (multiple input multiple output) communications. In these instances, a plurality of antennas (e.g., 2 or more) is coupled to a corresponding number of FEMs (or a less number of FEMs depending on the receive paths within a FEM). The FEMS are coupled to a plurality of receiver RF to IF sections (e.g., same number as the number of antennas), which are, in turn, coupled to a corresponding number of receiver IF to BB sections. The baseband processing unit processes the multiple symbol streams to produce the inbound data.

The RX RF to IF 332 section provides one or more of the follow benefits and/or includes one or more of the following characteristics: eliminates the need for off-chip SAW filters and matching components; quality factor of the FTBPF 334 is enhanced by the negative resistance; inductor loss can be compensated, thus inductors can have a lower tolerance; reduces the need for the number of thick metal layers, reducing die fabrication costs; the center frequency of both high-Q RF filters is controlled by the local oscillation clocks; and can be readily integrated into an SOC 330.

Figure 22:
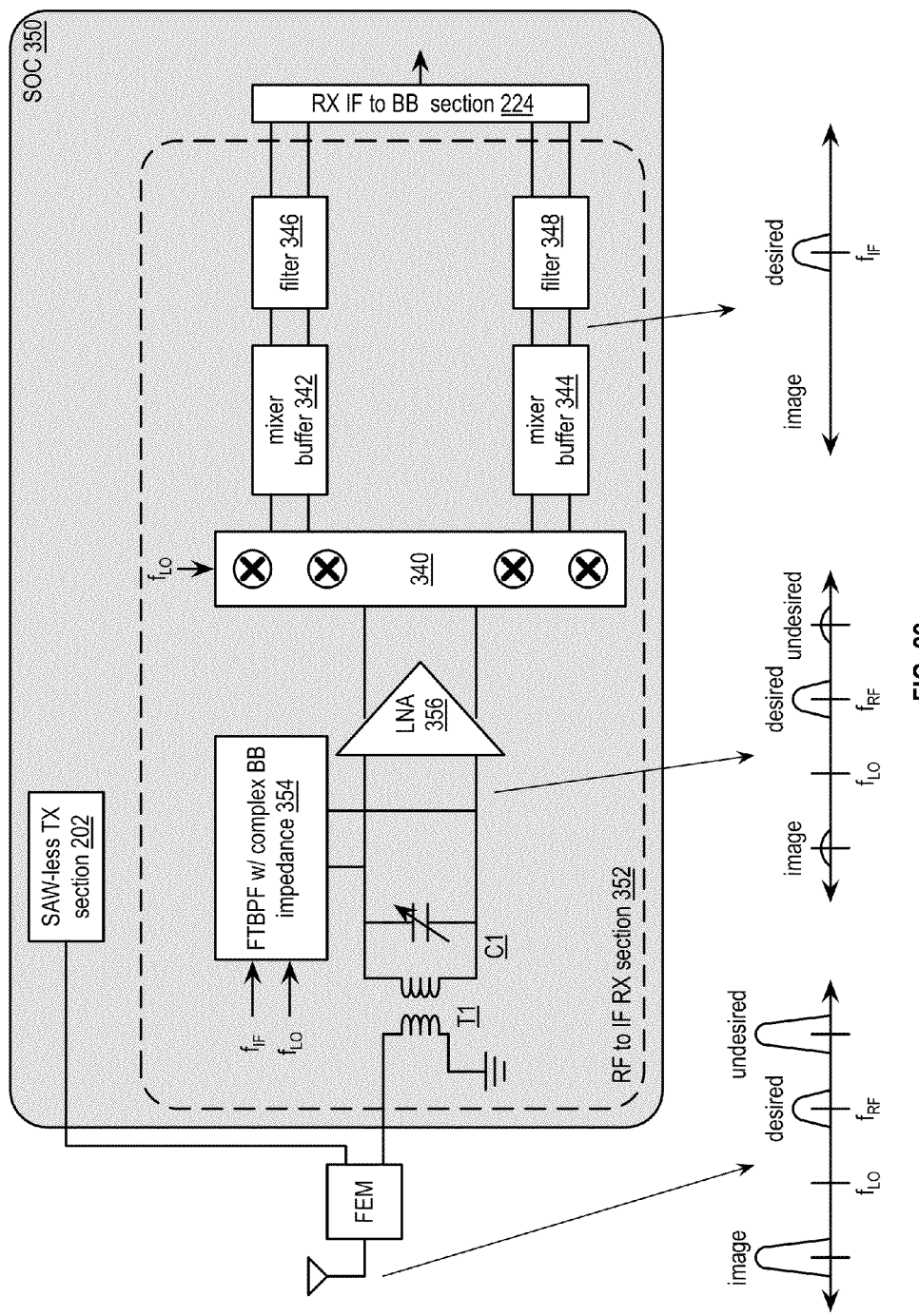
FIG. 22 is a schematic block diagram of another embodiment of an RF to IF receiver section of an SOC in accordance with the present invention.

FIG. 22 is a schematic block diagram of another embodiment of an RF to IF receiver section 352 of an SOC 350 that includes an FEM interface module (which may include a transformer T1 and/or a tunable capacitor network C1), a frequency translated bandpass filter (FTBPF) having a complex baseband (BB) impedance 354, a low noise amplifier module (LNA) 356, and a mixing section (which may include a mixing module 340 and/or mixed buffers 342-344). The SOC 350 also includes a receiver IF to BB section 224, the SAW-less transmitter section 202 and may further include the baseband processing unit, the processing module, and the power management unit.

In an example of operation, an inbound RF signal is received via the antenna. The inbound RF signal includes a desired signal component at RF and an undesired component at a frequency above or below RF (above is shown). With respect the local oscillation of the RF to IF section (e.g., $f_{LO}$), an image signal component may occur if a signal is present at $R_{RF}-2f_{IF}$. The antenna provides the inbound RF signal to the FEM, which processes it as previously discussed and/or as will be discussed with reference to one or more of the subsequent figures. The transformer T1 receives the FEM processed inbound RF signal and converts it into a differential signal, which is filtered by the tunable capacitor network C1 based on control signals from the SOC 350 processing resources.

The FTBPF 354 (various embodiments of which will be described in several of the subsequent figures) filters the inbound RF signal by attenuating an image signal component and an undesired signal component and passing, substantially unattenuated, a desired RF signal component. For example, assume that the FTBPF 354 frequency translates a narrow band offset baseband bandpass filter to RF (e.g., the carrier frequency of the desired signal component) to produce a high-Q RF filter. The narrow band high-Q RF filter filters out the image signal component and the undesired signal component and passes, substantially unattenuated, the desired signal component. With the use of a complex baseband impedance 354, the center frequency of the narrow band baseband BPF can be adjusted. For instance, the bandpass region can be shifted higher or lower in frequency based on adjustments to the complex BB impedance 354.

The low noise amplifier module (LNA) 356 amplifies the desired inbound RF signal component to produce an amplified desired inbound RF signal. The LNA 356 may receive a control signal from the SOC 350 processing resources, wherein the control signal indicates a setting for at least one of gain, linearity, bandwidth, efficiency, noise, output dynamic range, slew rate, rise rate, settling time, overshoot, and stability factor.

The mixing module 340 of the mixing section receives the amplified desired inbound RF signal and converts it into an in-phase (I) signal component and a quadrature (Q) signal component using a $\pi/2$ phase shifter or other type of phase manipulation circuit. A mixer of the mixing module 340 mixes the I signal component with an I signal component of a local oscillation (e.g., $f_{LO}$) to produce an I mixed signal and mixes the Q signal component with a Q signal component of the local oscillation to produce a Q mixed signal. Note that the I and Q mixed signals may be differential signals or single ended signals; differential signals are shown.

The mixer buffers 342-344 buffer the I and Q mixed signals, which are subsequently provided to the filters (e.g., bandpass filters). The filters 346-348 filter the I and Q mixed signals, which are subsequently provided to the RX IF to BB section 224.

While the present RF to IF section 352 is shown coupled to a single antenna for SISO (single input single output) communications, the concepts are applicable to MISO (multiple input single output) communications and to MIMO (multiple input multiple output) communications. In these instances, a plurality of antennas (e.g., 2 or more) is coupled to a corresponding number of FEMs (or a less number of FEMs depending on the receive paths within a FEM). The FEMS are coupled to a plurality of receiver RF to IF sections (e.g., same number as the number of antennas), which are, in turn, coupled to a corresponding number of receiver IF to BB sections. The baseband processing unit processes the multiple symbol streams to produce the inbound data.

The RX RF to IF section 352 provides one or more of the follow benefits and/or includes one or more of the following characteristics: the super-heterodyne receiver is optimized for minimum area and power in comparison to a comparable direct conversion receiver; the use of a complex baseband impedance in the FTBPF 354 allows the center frequency of the bandpass filter to be shifted; the complex baseband impedance 354 may be implemented with switches and capacitors and its center is controlled by the LO clock; the center of the on-chip high-Q image rejection filter (e.g., FTBPF) is tuned to the desired frequency using the same LO clock used by the down-conversion mixer; RF to IF sections 352 uses a signal phase locked loop (PLL); and can be readily integrated into an SOC 350.

Figure 23:
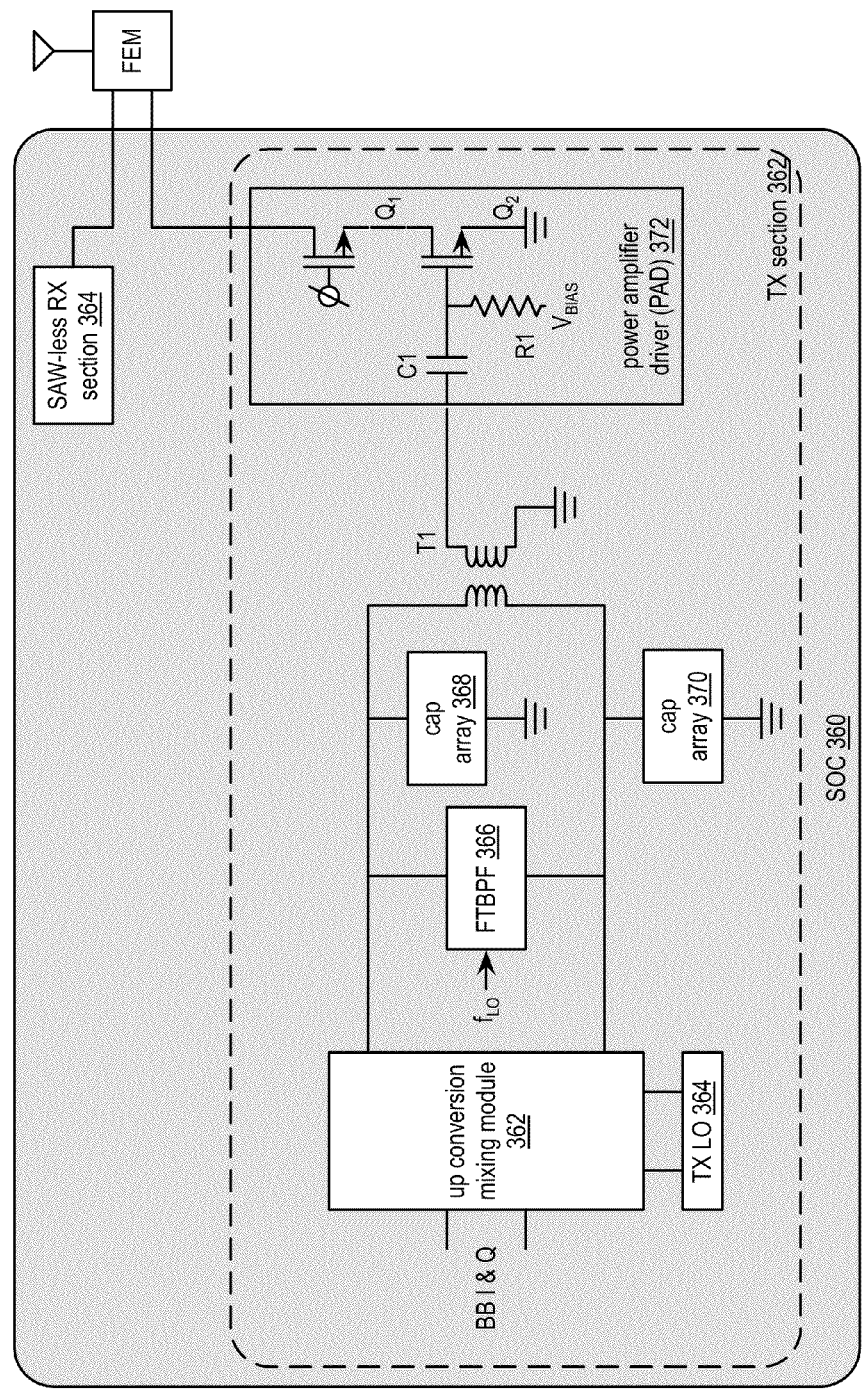
FIG. 23 is a schematic block diagram of an embodiment of a transmitter section of an SOC in accordance with the present invention.

FIG. 23 is a schematic block diagram of an embodiment of a transmitter section of an SOC 360 that includes an up-conversion mixing module 362, a transmitter local oscillation module (LO) 364, a frequency translated bandpass filter (FT-BPF) 366, an output module (which may include capacitor arrays 368-370 and/or a transformer T1), and a power amplifier driver (PAD) 372. The PAD 372 includes transistors Q1-Q2, a resistor R1, and a capacitor C1 coupled as shown. Note that the capacitor C1 and/or resistor R1 may be implemented using one or more transistors Q1-Q2. The SOC 360 also includes the SAW-less receiver section 364 and may further include the baseband processing unit, the processing module, and the power management unit.

In an example of operation, the up-conversion mixing module 362 receives a baseband (BB) I and Q signals (e.g., an analog and quadrature representation of an outbound symbol stream). The up-conversion mixing module 362 may employ a direct conversion topology or a super heterodyne topology to convert the BB I and Q signals into an up-converted signal, which has a carrier frequency at the desired RF.

The FTBPF 366 (various embodiments of which will be described in several of the subsequent figures) filters the up-converted signal by attenuating out-of-band signal components and passing, substantially unattenuated, the up-converted signal. For example, assume that the FTBPF 366 frequency translates a narrow band baseband bandpass filter to RF (e.g., the carrier frequency of the up-converted signal) to produce a high-Q RF filter. The narrow band high-Q RF filter filters out the out-of-band signals and passes, substantially unattenuated, the up-converted signal.

The capacitor arrays 368-370 provide an adjustable low pass filter that filters common-mode noise and/or line noise. The transformer T1 converts the differential up-converted signal into a single-ended signal, which is subsequently amplified by the PAD 372. The PAD 372 provides the amplified up-converted signal to the FEM, which further amplifies it, isolates it from an inbound RF signal, and provides it to the antenna for transmission.

The TX section provides one or more of the follow benefits and/or includes one or more of the following characteristics: using an FTBPF 366 clocked by the TX LO 364 at the LC load of the transmitter up-converter mixer reduces transmitter noise and other out-of-band signals at RX frequency with minimal impact on the desired TX signal; the baseband impedances of high-Q FTBPF 366 can be implemented using capacitors and its center frequency is controlled by the TX LO 364; TX SAW filters are eliminated; and provides for ease of integration into the SOC 360.

Figure 24:
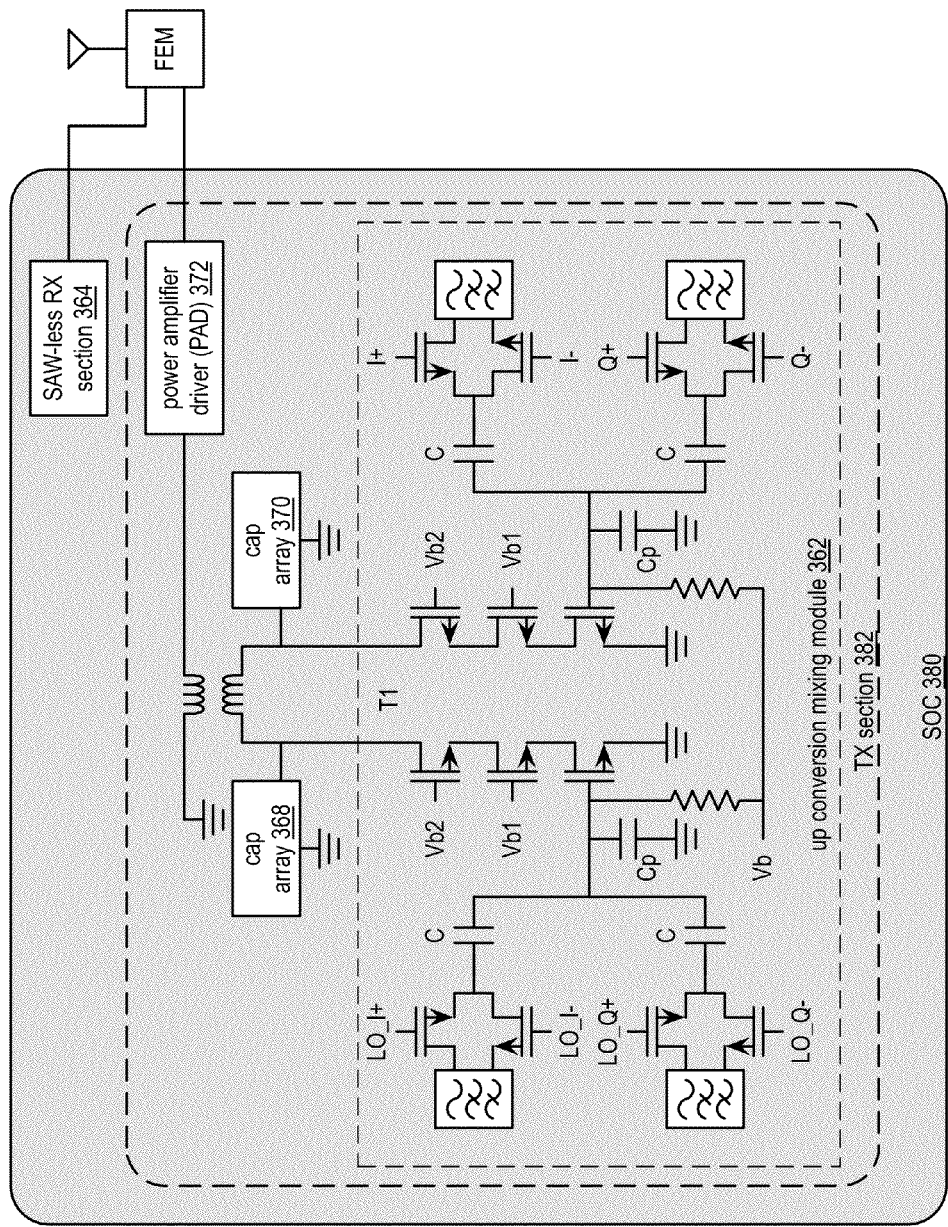
FIG. 24 is a schematic block diagram of an embodiment of a transmitter section of an SOC in accordance with the present invention.

FIG. 24 is a schematic block diagram of another embodiment of a transmitter section 382 of an SOC 380 an up-conversion mixing module 362, a transmitter local oscillation module (LO), a frequency translated bandpass filter (FT-BPF), an output module (which may include capacitor arrays 368-370 and/or a transformer T1), and a power amplifier driver (PAD) 372. The PAD 372 includes transistors, a resistor, and a capacitor coupled as shown. Note that the capacitor and/or resistor may be implemented using one or more transistors. The SOC 380 also includes the SAW-less receiver section 364 and may further include the baseband processing unit, the processing module, and the power management unit.

In this embodiment, the up-conversion mixing module includes the passive mixing structure as shown, which can be operated from a 50% duty cycle LO clock. In an example of operation, the LO I and Q signal components are mixed via the circuitry on the left of the diagram and the BB I and Q signal components are mixed via the circuitry on the right side of the drawing. The mixed LO signal components are then mixed with the mixed BB signals components to produce the up-converted signal. For instance, the LO_I+ pushes energy into its corresponding capacitor and the LO_I− pulls energy from the capacitor (or vice versa) to produce a varying voltage across the capacitor at a rate corresponding to the LO. The LO_Q+ and LO_Q− do a similar function with respect to their capacitor, just shifted 90°. The varying voltages across the capacitors are added together via the summing node to produce the mixed LO signals components. A like process occurs on the baseband side of the mixer.

The TX section 382 provides one or more of the follow benefits and/or includes one or more of the following characteristics: transistors driven by Vb1 and Vb2 are high voltage transistors (e.g., Vds voltage>2.5 volts); and the TX architecture provides a low-power area-efficient design and uses a passive mixer that is driven by 50% duty-cycle LO clocks, which reduces power consumption in comparison with a mixer driven by a 25% duty-cycle clock.

FIG. 25 is a schematic block diagram of an embodiment of a portion of an RF to IF receiver section that includes a single-ended FTBPF (frequency translated bandpass filter) 394. The portion of the RX RF to IF section includes the transformer T1, the variable capacitor network C1, and the LNA 392. The FTBPF 394 includes a plurality of transistors (e.g., a switching network) and a plurality of baseband impedances ($Z_{BB}(s)$) 396-402.

In an example of operation, the front-end module (FEM) 390 receives an inbound RF signal via an antenna, processes the signal as previously discussed and/or as will be discussed with reference to one or more of the subsequent figures, and provides the FEM 390 processed inbound RF signal to the transformer T1. The transformer T1 steps up or steps down the voltage level of the inbound RF signal, which is subsequently filtered by the variable capacitor network C1. Note that the transformer T1 may be omitted if an adjustment of the voltage level of the inbound RF signal is not needed and/or the isolation provided by the transformer T1 is not needed.

The FTBPF 394 provides a high-Q (quality factor) RF filter that filters the inbound RF signal such that desired signal components of the inbound RF signal are passed substantially unattenuated to the LNA 392 and undesired signal components (e.g., blockers, images, etc.) are attenuated. To achieve such a filter, the baseband impedances (($Z_{BB}(s)$)) 396-402 collectively provide a low-Q baseband filter having a corresponding filter response, where each of the baseband impedances may be a capacitor, a switched capacitor filter, a switch capacitor resistance, and/or a complex impedance. Note that the impedance of each of the baseband impedances may be the same, different, or combination thereof. Further note that the impedances of each of baseband impedances may be adjusted via control signal from the SOC processing resources to adjust the properties of the low-Q baseband filter (e.g., bandwidth, attenuation rate, quality factor, etc.).

The low-Q baseband filter is frequency translated to the desired RF frequency to produce the high-Q RF filter via the clock signals provided by a clock generator 404. FIG. 27 illustrates the frequency translation of the low-Q baseband filter response to the high-Q RF filter response and FIG. 26 illustrates an embodiment of the clock generator 404.

As shown in FIG. 26, the clock generator 404 (of which, various embodiments will be discussed with reference to one or more of the subsequent figures) produces four clocks signals each having a 25% duty cycle and sequentially phase offset by 90°. The clock signals have a frequency corresponding to the carrier frequency of the inbound RF signal and can be adjusted to better track the carrier frequency. The clock generator 404 may also generate local oscillation clock signals (not shown), which are used to down-convert the inbound RF signal to an inbound IF signal.

Returning to the discussion of FIG. 25, the FTBPF 394 receives the clock signals, which are coupled to the transistors to sequentially couple their respective baseband impedances to the inbound RF signal. With the clock rate being at RF (e.g., the carrier frequency(ies) of the desired component of the inbound RF signal), the baseband impedance affects (e.g., collectively the low-Q bandpass filter) is shifted to RF creating the high-Q RF bandpass filter.

Figure 29:
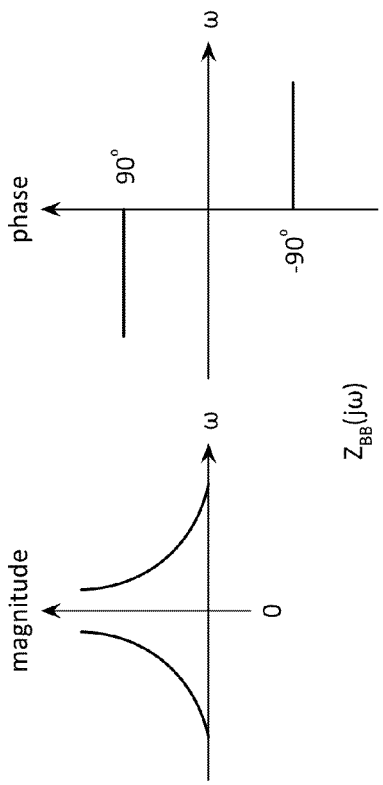
FIG. 29 is a diagram of an example of phase and frequency responses for the baseband component of the FTBPF in accordance with the present invention.
Figure 28:
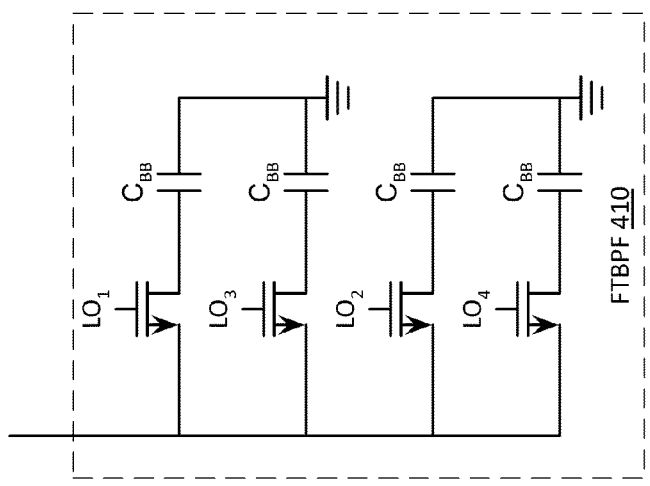
FIG. 28 is a schematic block diagram of an embodiment of an FTBPF in accordance with the present invention.

FIG. 28 is a schematic block diagram of an embodiment of a single-ended FTBPF 410 that includes 4 transistors and 4 capacitors, which provide the baseband impedances. The 4 capacitors provide a collective baseband impedance, which provides a low-Q baseband bandpass filter as show in FIG. 29. In particular, the impedance of a capacitor (or four in parallel) is $1/sC$, where s is $2\pi f$. Thus, as the frequency (f) approaches zero, the impedance of a capacitor approaches infinity and, as the frequency (f) increases, the impedance of the capacitor decreases. Further, the phase of the capacitor changes from +90° to −90° at zero frequency.

Figure 30:
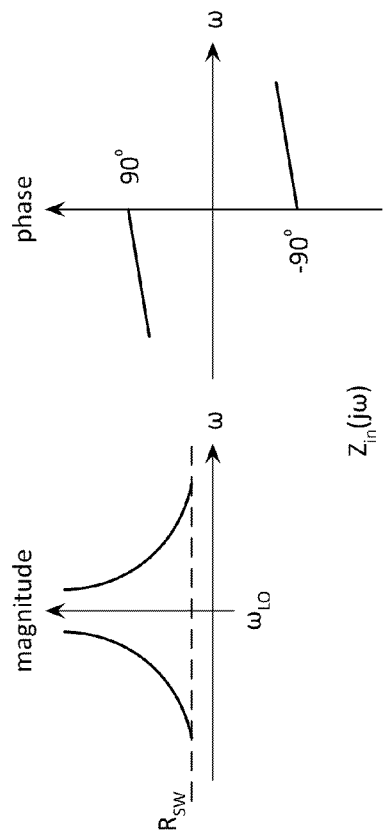
FIG. 30 is a diagram of an example of phase and frequency responses for the RF component of the FTBPF in accordance with the present invention.

Returning to the discussion of FIG. 28, as the clock signals are applied to the transistors, the capacitors are coupled to the common node of the FTBPF 410 (e.g., the input of the FTBPF). In this manner, the properties of the capacitor(s) are shifted in frequency to the rate of the clock signals (e.g., $f_{LO}$) as shown in FIG. 30. In particular, the impedance of the capacitor (and of the four capacitors in parallel) is shifted to the frequency of the clocks. With near infinite impedance at LO, the FTBPF 410 has a high impedance at LO and, and such, has little affect on signal components having a carrier frequency comparable to LO. As the frequency deviates from LO, the impedance of the FTBPF 410 decreases and, as such, the FTBPF 410 effectively "shorts" signal components having a carrier frequency that is not comparable to LO.

Figure 31:
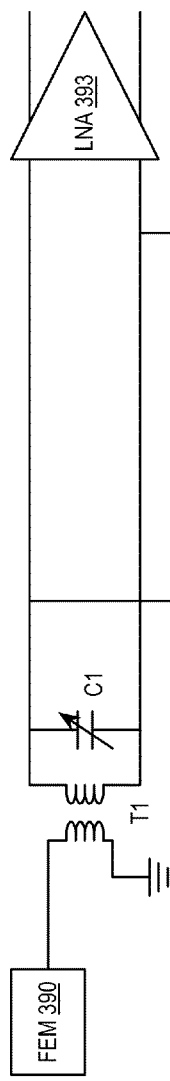
FIG. 31 is a schematic block diagram of another embodiment of a portion of an RF to IF receiver section that includes an FTBPF (frequency translated bandpass filter) in accordance with the present invention.

FIG. 31 is a schematic block diagram of another embodiment of a portion of an RF to IF receiver section that includes a differential FTBPF 412 (frequency translated bandpass filter). The portion of the RX RF to IF section includes the transformer T1, the variable capacitor network C1, and the LNA 393. The FTBPF 412 includes a plurality of transistors and a plurality of baseband impedances ($Z_{BB}(s)$) 414-420.

In an example of operation, the front-end module (FEM) 390 receives an inbound RF signal via an antenna, processes the signal as previously discussed and/or as will be discussed with reference to one or more of the subsequent figures, and provides the FEM 390 processed inbound RF signal to the transformer T1. The transformer T1 converts the single-ended inbound RF signal into a differential inbound RF signal.

The FTBPF 412 provides a differential high-Q (quality factor) RF filter that filters the differential inbound RF signal such that desired signal components of the inbound RF signal are passed substantially unattenuated to the LNA 393 and undesired signal components (e.g., blockers, images, etc.) are attenuated. To achieve such a filter, the baseband impedances (($Z_{BB}(s)$)) 414-420 collectively provide a low-Q baseband filter having a corresponding filter response, where each of the baseband impedances may be a capacitor, a switched capacitor filter, a switch capacitor resistance, and/or a complex impedance. Note that the impedance of each of the baseband impedances may be the same, different, or combination thereof. Further note that the impedances of each of baseband impedances may be adjusted via control signal from the SOC processing resources to adjust the properties of the low-Q baseband filter (e.g., bandwidth, attenuation rate, quality factor, etc.).

The low-Q baseband filter is frequency translated to the desired RF frequency to produce the high-Q RF filter via the clock signals provided by a clock generator 422. FIG. 33 illustrates the frequency translation of the low-Q baseband filter to the high-Q RF filter and FIG. 32 illustrates an embodiment of the clock generator 422.

Figure 32:
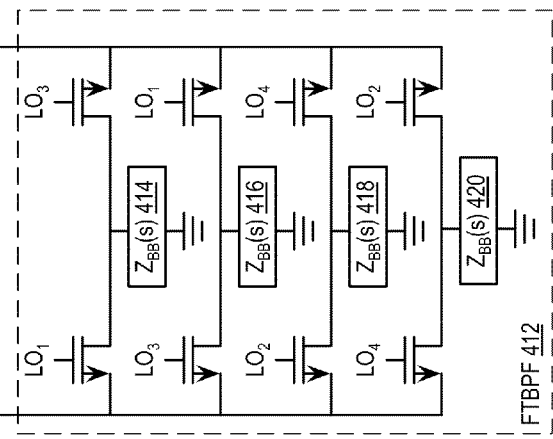
FIG. 32 is a schematic block diagram of another embodiment of a clock generator for the RF to IF receiver section in accordance with the present invention.
Figure 33:
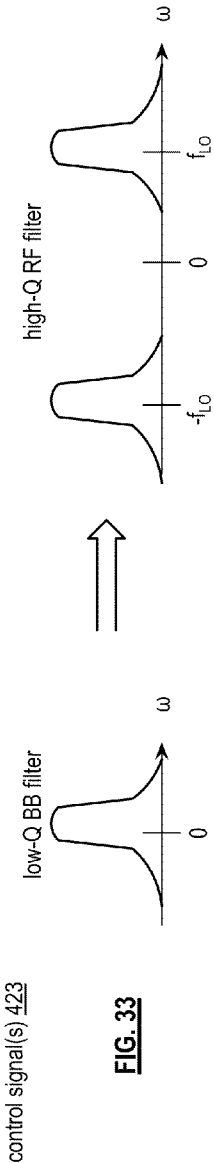
FIG. 33 is a diagram of another example of frequency responses for the RF to IF receiver section in accordance with the present invention.

As shown in FIG. 32, the clock generator 422 (of which, various embodiments will be discussed with reference to one or more of the subsequent figures) produces four clocks signals each having a 25% duty cycle and sequentially offset by 90°. The clock signals have a frequency corresponding to the carrier frequency of the inbound RF signal and can be adjusted to better track the carrier frequency. The clock generator 422 may also generate local oscillation clock signals (not shown), which are used to down-convert the inbound RF signal to an inbound IF signal.

Returning to the discussion of FIG. 31, the FTBPF 412 receives the clock signals, which are coupled to the transistors to sequentially couple their respective baseband impedances to the inbound RF signal. With the clock rate being at RF (e.g., the carrier frequency(ies) of the desired component of the inbound RF signal), the baseband impedance affects (e.g., collectively the low-Q bandpass filter) is shifted to RF creating the high-Q RF bandpass filter.

FIG. 34 is a schematic block diagram of another embodiment of a portion of an RF to IF receiver section that includes a single-ended FTBPF 430 (frequency translated bandpass filter). The portion of the RX RF to IF section includes the transformer T1, the variable capacitor network C1, and the LNA 392. The FTBPF 430 includes a plurality of transistors and a complex baseband filter 432.

In an example of operation, the front-end module (FEM) 390 receives an inbound RF signal via an antenna, processes the signal as previously discussed and/or as will be discussed with reference to one or more of the subsequent figures, and provides the FEM 390 processed inbound RF signal to the transformer T1. The transformer T1 steps up or steps down the voltage level of the inbound RF signal, which is subsequently filtered by the variable capacitor network C1. Note that the transformer T1 may be omitted if an adjustment of the voltage level of the inbound RF signal is not needed and/or the isolation provided by the transformer T1 is not needed.

The FTBPF 430 provides a high-Q (quality factor) RF filter that filters the inbound RF signal such that desired signal components of the inbound RF signal are passed substantially unattenuated to the LNA 392 and undesired signal components (e.g., blockers, images, etc.) are attenuated. To achieve such a filter, the complex baseband filter 432 provides a low-Q baseband filter that can have its bandpass region offset from zero frequency. Note that the properties (e.g., bandwidth, attenuation rate, quality factor, frequency offset, etc.) of the complex baseband filter 432 may be adjusted via control signal from the SOC processing resources.

The frequency offset low-Q baseband filter is frequency translated to the desired RF frequency to produce a frequency offset high-Q RF filter via the clock signals provided by a clock generator 434. FIG. 36 illustrates the frequency translation of the frequency offset low-Q baseband filter to the frequency offset high-Q RF filter and FIG. 35 illustrates an embodiment of the clock generator 434.

As shown in FIG. 35, the clock generator 434 (of which, various embodiments will be discussed with reference to one or more of the subsequent figures) produces four clocks signals each having a 25% duty cycle and sequentially offset by 90°. The clock signals have a frequency corresponding to the carrier frequency of the inbound RF signal and can be adjusted to better track the carrier frequency. The clock generator 434 may also generate local oscillation clock signals (not shown), which are used to down-convert the inbound RF signal to an inbound IF signal. Alternatively, one or more of the clock signals for the FTBPF 430 may be used for the LO clock signals.

Returning to the discussion of FIG. 34, the FTBPF 430 receives the clock signals, which are coupled to the transistors to sequentially couple the complex baseband filter to the inbound RF signal. With the clock rate being at RF (e.g., the carrier frequency(ies) of the desired component of the inbound RF signal), the response of the complex baseband filter 432 is shifted to RF (and/or to LO) creating the high-Q RF bandpass filter.

Figure 37:
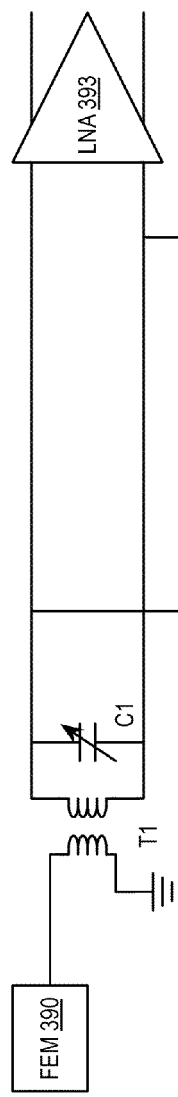
FIG. 37 is a schematic block diagram of another embodiment of a portion of an RF to IF receiver section that includes an FTBPF (frequency translated bandpass filter) in accordance with the present invention.

FIG. 37 is a schematic block diagram of another embodiment of a portion of an RF to IF receiver section that includes a differential FTBPF 440 (frequency translated bandpass filter). The portion of the RX RF to IF section includes the transformer T1, the variable capacitor network C1, and the LNA 393. The differential FTBPF 440 includes a plurality of transistors and a complex baseband filter 442.

In an example of operation, the front-end module 390 (FEM) receives an inbound RF signal via an antenna, processes the signal as previously discussed and/or as will be discussed with reference to one or more of the subsequent figures, and provides the FEM 390 processed inbound RF signal to the transformer T1. The transformer T1 converts the single-ended inbound RF signal into a differential inbound RF signal.

The differential FTBPF 440 provides a high-Q (quality factor) RF filter that filters the differential inbound RF signal such that desired signal components of the inbound RF signal are passed substantially unattenuated to the LNA 393 and undesired signal components (e.g., blockers, images, etc.) are attenuated. To achieve such a filter, the complex baseband filter 442 provides a low-Q baseband filter that can have its bandpass region offset from zero frequency. Note that the properties (e.g., bandwidth, attenuation rate, quality factor, frequency offset, etc.) of the complex baseband filter 442 may be adjusted via control signal from the SOC processing resources.

The frequency offset low-Q baseband filter is frequency translated to the desired RF frequency to produce a frequency offset high-Q RF filter via the clock signals provided by a clock generator 444. FIG. 39 illustrates the frequency translation of the frequency offset low-Q baseband filter to the frequency offset high-Q RF filter and FIG. 38 illustrates an embodiment of the clock generator 444.

Figure 38:
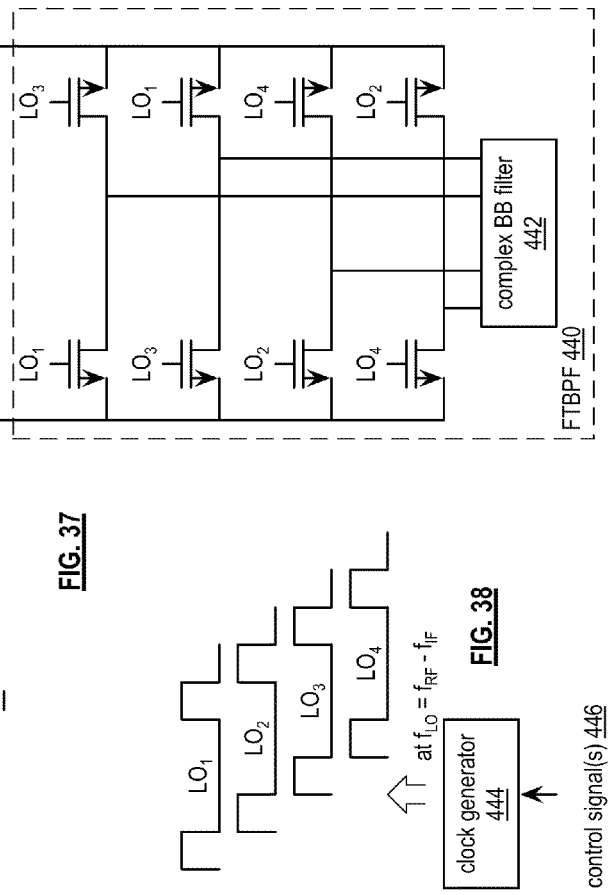
FIG. 38 is a schematic block diagram of another embodiment of a clock generator for the RF to IF receiver section in accordance with the present invention.
Figure 39:
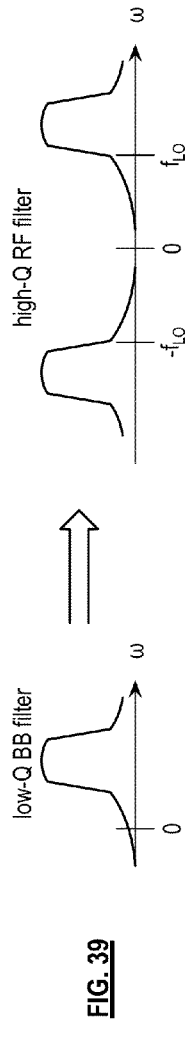
FIG. 39 is a diagram of another example of frequency responses for the RF to IF receiver section in accordance with the present invention.

As shown in FIG. 38, the clock generator 444 (of which, various embodiments will be discussed with reference to one or more of the subsequent figures) produces four clocks signals each having a 25% duty cycle and sequentially offset by 90°. The clock signals have a frequency corresponding to the carrier frequency of the inbound RF signal and can be adjusted to better track the carrier frequency. The clock generator 444 may also generate local oscillation clock signals (not shown), which are used to down-convert the inbound RF signal to an inbound IF signal. Alternatively, one or more of the clock signals for the FTBPF 440 may be used for the LO clock signals.

Returning to the discussion of FIG. 37, the FTBPF 440 receives the clock signals 442, which are coupled to the transistors to sequentially couple the complex baseband filter to the inbound RF signal. With the clock rate being at RF (e.g., the carrier frequency(ies) of the desired component of the inbound RF signal), the response of the complex baseband filter 442 is shifted to RF (and/or to LO) creating the high-Q RF bandpass filter.

FIG. 40 is a schematic block diagram of another embodiment of a portion of an RF to IF receiver section that includes an FTBPF 440 (frequency translated bandpass filter). The portion of the RX RF to IF section includes the transformer T1, the variable capacitor network C1, and the LNA 393. The differential FTBPF 440 includes a plurality of transistors and a complex baseband filter 442. The complex baseband filter 442 includes a plurality of baseband impedances (e.g., $Z_{BB}(s)$) 450-456, positive gain stage (Gm) 458, and a negative gain stage (−GM) 460.

In an example of operation, the front-end module 390 (FEM) receives an inbound RF signal via an antenna, processes the signal as previously discussed and/or as will be discussed with reference to one or more of the subsequent figures, and provides the FEM 390 processed inbound RF signal to the transformer T1. The transformer T1 converts the single-ended inbound RF signal into a differential inbound RF signal.

The differential FTBPF 440 provides a high-Q (quality factor) RF filter that filters the differential inbound RF signal such that desired signal components of the inbound RF signal are passed substantially unattenuated to the LNA 393 and undesired signal components (e.g., blockers, images, etc.) are attenuated. To achieve such a filter, the complex baseband filter 442 provides a low-Q baseband filter that can have its bandpass region offset from zero frequency based a ratio between the gain stages and the baseband impedances. Note that each of the baseband impedances may be a capacitor, a switched capacitor filter, a switch capacitor resistance, and/or a complex impedance. Further note that the impedance of each of the baseband impedances may be the same, different, or combination thereof. Still further note that the impedances of each of baseband impedances may be adjusted and/or the gain of one or more of the gain stages may be adjusted via control signals from the SOC processing resources to adjust the properties of the low-Q baseband filter (e.g., bandwidth, attenuation rate, quality factor, etc.).

The frequency offset low-Q baseband filter is frequency translated to the desired RF frequency to produce a frequency offset high-Q RF filter via the clock signals provided by a clock generator 444. FIG. 42 illustrates the frequency offset high-Q RF filter and FIG. 41 illustrates an embodiment of the clock generator 444.

As shown in FIG. 41, the clock generator 444 (of which, various embodiments will be discussed with reference to one or more of the subsequent figures) produces four clocks signals each having a 25% duty cycle and sequentially offset by 90°. The clock signals have a frequency corresponding to the carrier frequency of the inbound RF signal and can be adjusted to better track the carrier frequency. The clock generator 444 may also generate local oscillation clock signals (not shown), which are used to down-convert the inbound RF signal to an inbound IF signal. Alternatively, one or more of the clock signals for the FTBPF 440 may be used for the LO clock signals.

Returning to the discussion of FIG. 40, the FTBPF 440 receives the clock signals, which are coupled to the transistors to sequentially couple the complex baseband filter 442 to the inbound RF signal. With the clock rate being at RF (e.g., the carrier frequency(ies) of the desired component of the inbound RF signal), the response of the complex baseband filter 442 is shifted to RF (and/or to LO) creating the high-Q RF bandpass filter.

FIG. 43 is a schematic block diagram of another embodiment of a portion of an RF to IF receiver section that includes an FTBPF 440 (frequency translated bandpass filter). The portion of the RX RF to IF section includes the transformer T1, the variable capacitor network C1, and the LNA 393. The differential FTBPF 440 includes a plurality of transistors and a complex baseband filter 442. The complex baseband filter 442 includes a plurality of capacitors, positive gain stage (Gm) 458, and a negative gain stage (−Gm) 460.

In an example of operation, the front-end module 390 (FEM) receives an inbound RF signal via an antenna, processes the signal as previously discussed and/or as will be discussed with reference to one or more of the subsequent figures, and provides the FEM 390 processed inbound RF signal to the transformer T1. The transformer T1 converts the single-ended inbound RF signal into a differential inbound RF signal.

The differential FTBPF 440 provides a high-Q (quality factor) RF filter that filters the differential inbound RF signal such that desired signal components of the inbound RF signal are passed substantially unattenuated to the LNA 393 and undesired signal components (e.g., blockers, images, etc.) are attenuated. To achieve such a filter, the complex baseband filter 442 provides a low-Q baseband filter that can have its bandpass region offset from zero frequency based a ratio between the gain stages and the capacitors. Note that the capacitance of each of the capacitors may be the same, different, or combination thereof. Further note that the capacitance of each of capacitors may be adjusted and/or the gain of one or more of the gain stages may be adjusted via control signals from the SOC processing resources to adjust the properties of the low-Q baseband filter (e.g., bandwidth, attenuation rate, quality factor, etc.).

The frequency offset low-Q baseband filter is frequency translated to the desired RF frequency to produce a frequency offset high-Q RF filter via the clock signals provided by a clock generator 444. The clock generator 444 as shown in FIG. 44 (of which, various embodiments will be discussed with reference to one or more of the subsequent figures) produces four clocks signals each having a 25% duty cycle and sequentially offset by 90°. The clock signals have a frequency corresponding to the carrier frequency of the inbound RF signal and can be adjusted to better track the carrier frequency. The clock generator 444 may also generate local oscillation clock signals (not shown), which are used to down-convert the inbound RF signal to an inbound IF signal. Alternatively, one or more of the clock signals for the FTBPF 440 may be used for the LO clock signals.

Returning to the discussion of FIG. 43, the FTBPF 440 receives the clock signals, which are coupled to the transistors to sequentially couple the complex baseband filter 442 to the inbound RF signal. With the clock rate being at RF (e.g., the carrier frequency(ies) of the desired component of the inbound RF signal), the response of the complex baseband filter 442 is shifted to RF (and/or to LO) creating the high-Q RF bandpass filter.

FIG. 45 is a schematic block diagram of another embodiment of a portion of an RF to IF receiver section that includes an FTBPF 440 (frequency translated bandpass filter). The portion of the RX RF to IF section includes the transformer T1, the variable capacitor network C1, a control module 470, and the LNA 393. The differential FTBPF 440 includes a plurality of transistors and a complex baseband filter 442. The complex baseband filter 442 includes a plurality of baseband impedances (e.g., $Z_{BB}(s)$) 450-456, positive gain stage (Gm) 458, and a negative gain stage (−Gm) 460.

In an example of operation, the front-end module 390 (FEM) receives an inbound RF signal via an antenna, processes the signal as previously discussed and/or as will be discussed with reference to one or more of the subsequent figures, and provides the FEM 390 processed inbound RF signal to the transformer T1. The transformer T1 converts the single-ended inbound RF signal into a differential inbound RF signal.

The differential FTBPF 440 provides a high-Q (quality factor) RF filter that filters the differential inbound RF signal such that desired signal components of the inbound RF signal are passed substantially unattenuated to the LNA 393 and undesired signal components (e.g., blockers, images, etc.) are attenuated. To achieve such a filter, the complex baseband filter 442 provides a low-Q baseband filter that can have its bandpass region offset from zero frequency based a ratio between the gain stages and the baseband impedances as set by control signals provided by the control module 470.

The control module 470, which may be part of the SOC processing resources, determines a desired response (e.g., gain, bandwidth, quality factor, frequency offset, etc.) for the low-Q bandpass filter based on one or more of signal to noise ratio (SNR) of in the inbound RF signal, signal-to-interference ratio (SIR) of the inbound RF signal, received signal strength, bit error rate, etc. From the desired response, the control module 470 determines settings for the baseband impedances and/or for the gain modules. Note that the control module 470 may continually update the desired response based on changes in the various factors it monitors, do the updates periodically, and/or when a performance characteristic criterion is met (e.g., transmission power level changed, SNR drops below a threshold, SIR drops below a threshold, received signal strength decreases below a threshold, etc.).

Once the frequency response of the low-Q baseband filter is determined (or updated), it is frequency translated to the desired RF frequency to produce a frequency offset high-Q RF filter via the clock signals provided by a clock generator 476. The clock generator 476 as shown in FIG. 46 (of which, various embodiments will be discussed with reference to one or more of the subsequent figures) produces four clocks signals each having a 25% duty cycle and sequentially offset by 90°. The clock signals have a frequency corresponding to the carrier frequency of the inbound RF signal and can be adjusted to better track the carrier frequency. The clock generator 476 may also generate local oscillation clock signals (not shown), which are used to down-convert the inbound RF signal to an inbound IF signal. Alternatively, one or more of the clock signals for the FTBPF 440 may be used for the LO clock signals.

Returning to the discussion of FIG. 45, the FTBPF 440 receives the clock signals, which are coupled to the transistors to sequentially couple the complex baseband filter 442 to the inbound RF signal. With the clock rate being at RF (e.g., the carrier frequency(ies) of the desired component of the inbound RF signal), the response of the complex baseband filter 442 is shifted to RF (and/or to LO) creating the high-Q RF bandpass filter.

Figure 47:
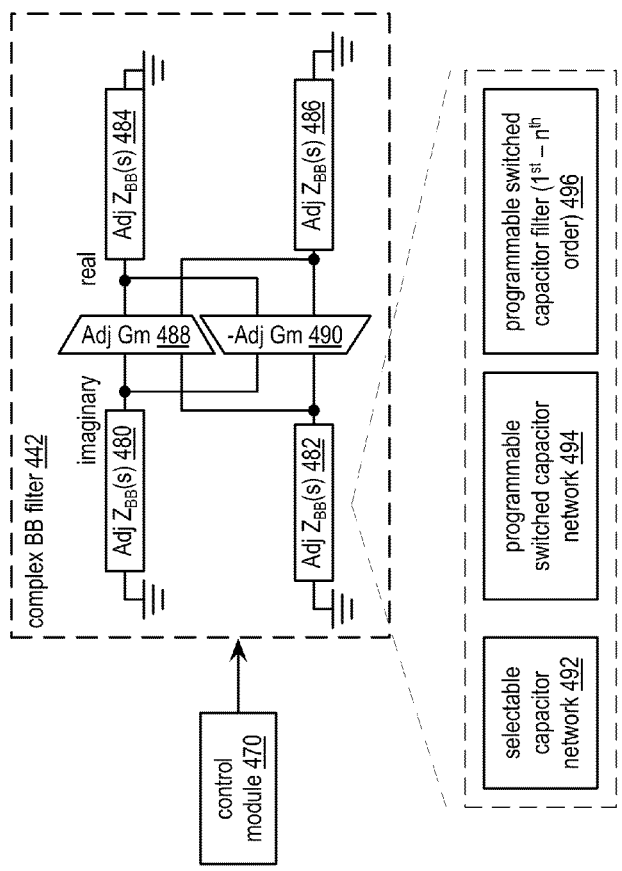
FIG. 47 is a schematic block diagram of an embodiment of a complex baseband (BB) filter in accordance with the present invention.

FIG. 47 is a schematic block diagram of an embodiment of a complex baseband (BB) filter 442 that includes a plurality of adjustable baseband impedances 480-486, an adjustable positive gain stage 488, and an adjustable negative gain stage 490. Each of the adjustable baseband impedances may include one or more of a selectable capacitor network 492 (e.g., tunable capacitor), a programmable switched capacitor network 494, a programmable switched capacitor filter 496 ($1^{st}$ to $n^{th}$ order), and any combination of components (e.g., inductors, capacitors, resistors) that provide a desired baseband frequency response.

The adjustable gain stages (+Gm and −Gm) 488-490 may each include an amplifier with a gain network coupled thereto. The gain network may include one or more of a resistor, a capacitor, a variable resistor, a variable capacitor, etc. In this regard, the gain of each of the gain stages may be adjusted to change the properties of the complex baseband filter 442. In particular, changing the gain with respect to the impedance of the adjustable impedances, the frequency offset of the low-Q bandpass filter can be changed. In addition, or in the alternative, the bandwidth, gain, slew rate, quality factor, and/or other properties of the complex baseband filter 442 can be changed via the control signals provided by the control module 470.

Figure 48:
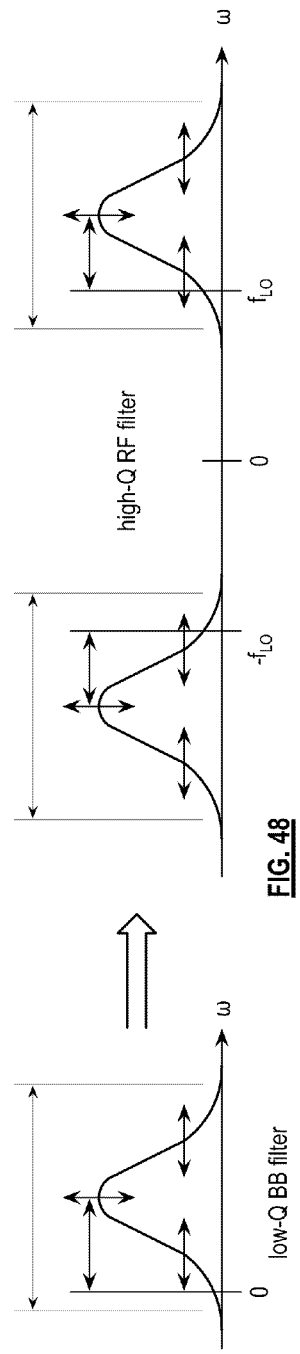
FIG. 48 is a diagram of an example of converting the frequency response of the complex BB filter into the frequency response for a high-Q RF filter in accordance with the present invention.

FIG. 48 is a diagram of an example of converting the frequency response of the complex BB filter 442 into the frequency response for a high-Q RF filter for an RX RF to IF section that includes an FTBPF 440 with the adjustable complex baseband filter 442 of FIG. 47. In this diagram, the low-Q baseband filter provided by the complex baseband filter 442 may have its bandwidth adjusted, its slew rate adjusted, it gain adjusted, its frequency offset adjusted, and/or other properties adjusted. The adjustable and adjusted aspects of the low-Q bandpass filter are translated to RF (or LO). In this regard, by adjusting properties of the low-Q baseband filter, the properties of the corresponding high-Q baseband filter are similarly adjusted.

FIG. 49 is a schematic block diagram of another embodiment of a portion of an RF to IF receiver section that includes a FTBPF 412 (frequency translated bandpass filter) module. The portion of the RX RF to IF section includes the I 504 and Q RF to IF mixers 500, and the mixer buffers 502. The FTBPF module includes an FTBPF and additional buffers. The FTBPF includes a plurality of transistors and a plurality of baseband impedances (e.g., $Z_{BB}(s)$) 414, 416, 418, and 420.

In an example of operation, the I mixer 504 mixes the I component of the inbound RF signal with an I component of the local oscillation (e.g., $f_{LO2}=f_{RF}-f_{IF}$ 500) to produce an I mixed signal. The I mixer buffer buffers the I mixed signal and provides the buffered I mixed signal to the FTBPF module 412. Similarly, the Q mixer mixes the Q component of the inbound RF signal with a Q component of the local oscillation (e.g., $f_{LO2}=f_{RF}-f_{IF}$) to produce a Q mixed signal. The Q mixer buffer buffers the I mixed signal and provides the buffered I mixed signal to the FTBPF module 412.

The FTBPF 412 provides a high-Q (quality factor) IF filter that filters the inbound IF signal (e.g., the I and Q mixed signals) such that desired signal components of the inbound IF signal are passed substantially unattenuated and undesired signal components (e.g., blockers, images, etc.) are attenuated. To achieve such a filter, the baseband impedances (($Z_{BB}(s)$) 414, 416, 418, and 420 collectively provide a low-Q baseband filter having a baseband filter response, where each of the baseband impedances may be a capacitor, a switched capacitor filter, a switch capacitor resistance, and/or a complex impedance. Note that the impedance of each of the baseband impedances may be the same, different, or combination thereof. Further note that the impedances of each of baseband impedances may be adjusted via control signal from the SOC processing resources to adjust the properties of the low-Q baseband filter (e.g., bandwidth, attenuation rate, quality factor, etc.).

The frequency offset low-Q baseband filter is frequency translated to the desired IF frequency to produce a frequency offset high-Q IF filter via the clock signals provided by a clock generator 510. FIG. 51 illustrates the frequency translation of the frequency offset low-Q baseband filter to the frequency offset high-Q IF filter and FIG. 50 illustrates an embodiment of the clock generator 510.

As shown in FIG. 50, the clock generator 510 (of which, various embodiments will be discussed with reference to one or more of the subsequent figures) produces four clocks signals each having a 25% duty cycle and sequentially phase offset by 90°. The clock signals have a frequency corresponding to the carrier frequency of the inbound IF signal and can be adjusted to better track the carrier frequency. The clock generator 510 may also generate local oscillation clock signals (not shown), which are used to down-convert the inbound RF signal to an inbound IF signal (e.g., LO2). Alternatively, one or more of the clock signals for the FTBPF 412 may be used for the LO clock signals.

Returning to the discussion of FIG. 49, the FTBPF 412 receives the clock signals, which are coupled to the transistors to sequentially couple the baseband impedances to the inbound IF signal. With the clock rate being at IF (e.g., the carrier frequency(ies) of the desired component of the inbound IF signal), the response of the complex baseband filter is shifted to IF (and/or to LO2) creating the high-Q IF bandpass filter.

Figure 52:
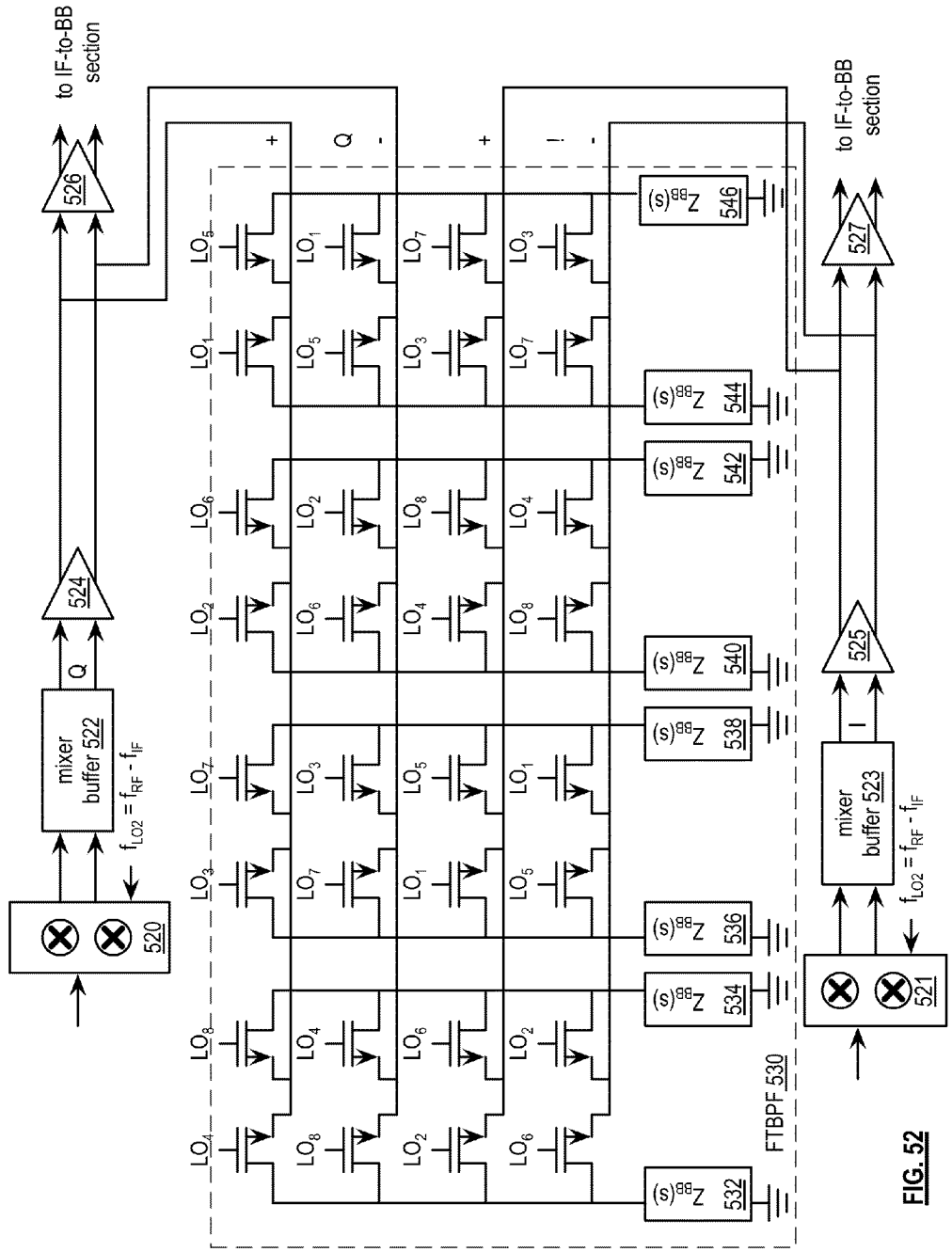
FIG. 52 is a schematic block diagram of another embodiment of a portion of an RF to IF receiver section that includes an FTBPF (frequency translated bandpass filter) in accordance with the present invention.

FIG. 52 is a schematic block diagram of another embodiment of a portion of an RF to IF receiver section that includes an IF FTBPF (frequency translated bandpass filter) module 530. The portion of the RX RF to IF section includes the I and Q RF to IF mixers, and the mixer buffers. The IF FTBPF 530 module includes a differential IF FTBPF 530 and additional buffers. The differential IF FTBPF 530 includes a plurality of transistors and a plurality of baseband impedances (e.g., $Z_{BB}(s)$).

In an example of operation, the I mixer 522 mixes the I component of the inbound RF signal with an I component of the local oscillation (e.g., $f_{LO2}=f_{RF}-f_{IF}$ 520) to produce an I mixed signal. The I mixer buffer 522 buffers the I mixed signal and provides the buffered I mixed signal to the FTBPF 530 module. Similarly, the Q mixer 523 mixes the Q component of the inbound RF signal with a Q component of the local oscillation (e.g., $f_{LO2}=f_{RF}-f_{IF}$ 521) to produce a Q mixed signal. The Q mixer buffer 523 buffers the I mixed signal and provides the buffered I mixed signal to the FTBPF 530 module.

The FTBPF 530 provides a high-Q (quality factor) IF filter that filters the inbound IF signal (e.g., the I and Q mixed signals) such that desired signal components of the inbound IF signal are passed substantially unattenuated and undesired signal components (e.g., blockers, images, etc.) are attenuated. To achieve such a filter, the baseband impedances $((Z_{BB}(s))$ 532,534,536,538,540,542,544, and 546 collectively provide a low-Q baseband filter, where each of the baseband impedances may be a capacitor, a switched capacitor filter, a switch capacitor resistance, and/or a complex impedance. Note that the impedance of each of the baseband impedances may be the same, different, or combination thereof. Further note that the impedances of each of baseband impedances may be adjusted via control signal from the SOC processing resources to adjust the properties of the low-Q baseband filter (e.g., bandwidth, attenuation rate, quality factor, etc.).

The frequency offset low-Q baseband filter is frequency translated to the desired IF frequency to produce a frequency offset high-Q IF filter via the clock signals provided by a clock generator. The clock generator 550 as shown in FIG. 53 (of which, various embodiments will be discussed with reference to one or more of the subsequent figures) produces eight clocks signals each having a 12.5% duty cycle and sequentially phase offset by 45°. The clock signals have a frequency corresponding to the carrier frequency of the inbound IF signal and can be adjusted to better track the carrier frequency. The clock generator 550 may also generate local oscillation clock signals (not shown), which are used to down-convert the inbound RF signal to an inbound IF signal (e.g., LO2). Alternatively, one or more of the clock signals for the FTBPF may be used for the LO clock signals.

Returning to the discussion of FIG. 52, the FTBPF 530 receives the clock signals, which are coupled to the transistors to sequentially couple the baseband impedances to the inbound IF signal. With the clock rate being at IF (e.g., the carrier frequency(ies) of the desired component of the inbound IF signal), the response of the complex baseband filter is shifted to IF (and/or to LO2) creating the high-Q IF bandpass filter.

FIG. 54 is a schematic block diagram of another embodiment of a portion of an RF to IF receiver section that includes a single-ended FTBPF 560 (frequency translated bandpass filter) that includes a negative resistance. The portion of the RX RF to IF section includes the transformer, the variable capacitor network, and the LNA. The FTBPF 560 includes a plurality of transistors and a plurality of baseband impedances $(Z_{BB}(s))$ 562,564,566, and 568.

In an example of operation, the front-end module (FEM) 390 receives an inbound RF signal via an antenna, processes the signal as previously discussed and/or as will be discussed with reference to one or more of the subsequent figures, and provides the FEM 390 processed inbound RF signal to the transformer. The transformer steps up or steps down the voltage level of the inbound RF signal, which is subsequently filtered by the variable capacitor network. Note that the transformer may be omitted if an adjustment of the voltage level of the inbound RF signal is not needed and/or the isolation provided by the transformer is not needed.

The FTBPF 560 provides a high-Q (quality factor) RF filter that filters the inbound RF signal such that desired signal components of the inbound RF signal are passed substantially unattenuated to the LNA 392 and undesired signal components (e.g., blockers, images, etc.) are attenuated. To achieve such a filter, the baseband impedances $((Z_{BB}(s))$ 562,564,566, and 568 collectively provide a low-Q baseband filter, where each of the baseband impedances may be a capacitor, a switched capacitor filter, a switch capacitor resistance, and/or a complex impedance. Note that the impedance of each of the baseband impedances may be the same, different, or combination thereof. Further note that the impedances of each of baseband impedances may be adjusted via control signal from the SOC processing resources to adjust the properties of the low-Q baseband filter (e.g., bandwidth, attenuation rate, quality factor, etc.).

In addition, the FTBPF 560 includes negative resistance (e.g., −2R) to compensate for inductance loss, to compensate for switch loss, and/or to improve the selectivity and/or quality factor of the low-Q bandpass filter. The negative impedance may be implemented as shown in FIG. 56 to include a plurality of transistors.

The low-Q baseband filter is frequency translated to the desired RF frequency to produce the high-Q RF filter via the clock signals provided by a clock generator. The clock generator as shown in FIG. 55 (of which, various embodiments will be discussed with reference to one or more of the subsequent figures) produces four clocks signals each having a 25% duty cycle and sequentially offset by 90°. The clock signals have a frequency corresponding to the carrier frequency of the inbound RF signal and can be adjusted to better track the carrier frequency. The clock generator 572 may also generate local oscillation clock signals (not shown), which are used to down-convert the inbound RF signal to an inbound IF signal.

Returning to the discussion of FIG. 54, the FTBPF 560 receives the clock signals, which are coupled to the transistors to sequentially couple their respective baseband impedances to the inbound RF signal. With the clock rate being at RF (e.g., the carrier frequency(ies) of the desired component of the inbound RF signal), the baseband impedance affects (e.g., collectively the low-Q bandpass filter) is shifted to RF creating the high-Q RF bandpass filter.

Figures 57, 58:
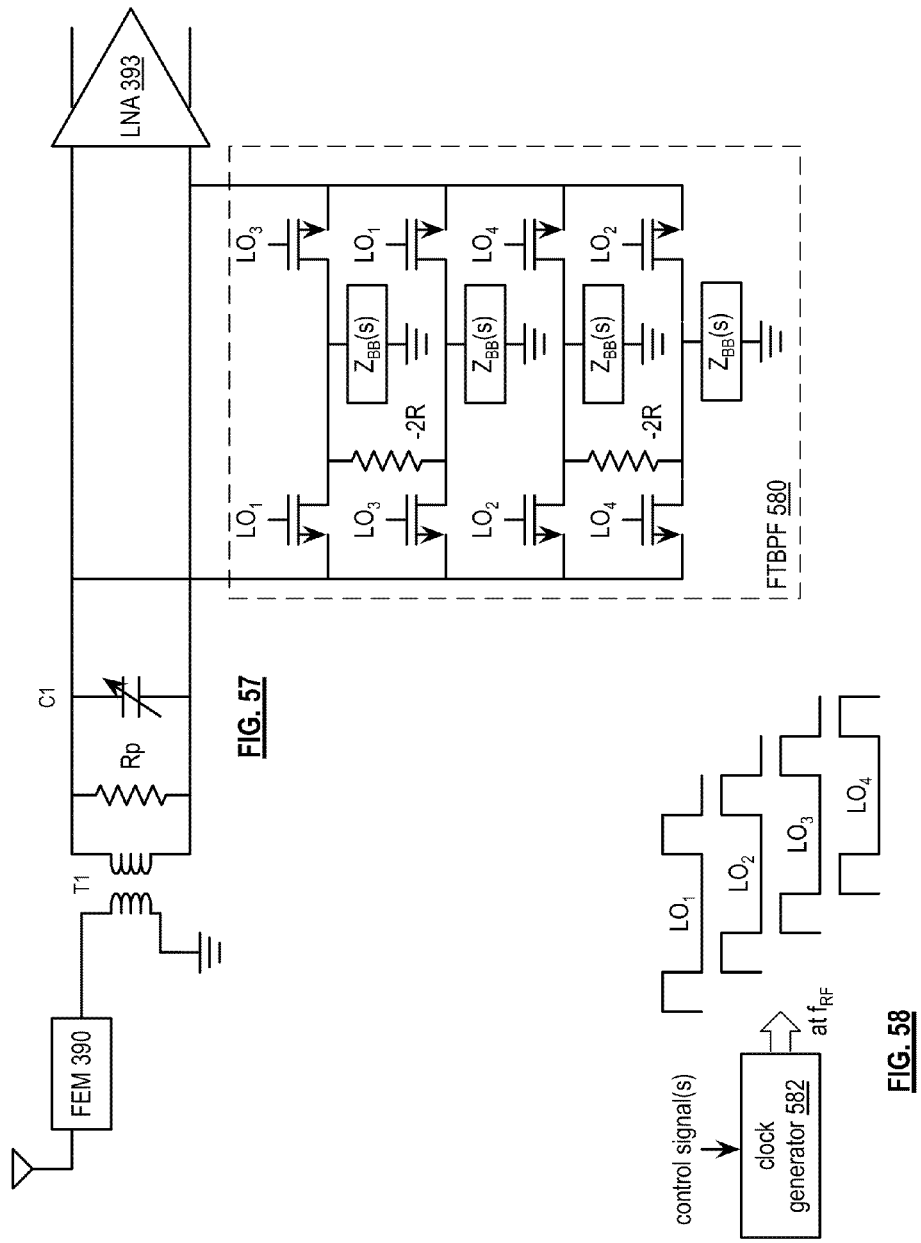
FIG. 57 is a schematic block diagram of another embodiment of a portion of an RF to IF receiver section that includes an FTBPF (frequency translated bandpass filter) in accordance with the present invention.
FIG. 58 is a schematic block diagram of another embodiment of a clock generator for the RF to IF receiver section in accordance with the present invention.

FIG. 57 is a schematic block diagram of another embodiment of a portion of an RF to IF receiver section that includes a differential FTBPF 580 (frequency translated bandpass filter) that includes a negative resistance. The portion of the RX RF to IF section includes the transformer, the variable capacitor network, and the LNA 393. The differential FTBPF 580 includes a plurality of transistors and a plurality of baseband impedances ($Z_{BB}(s)$).

In an example of operation, the front-end module (FEM) 390 receives an inbound RF signal via an antenna, processes the signal as previously discussed and/or as will be discussed with reference to one or more of the subsequent figures, and provides the FEM processed inbound RF signal to the transformer. The transformer steps up or steps down the voltage level of the inbound RF signal, which is subsequently filtered by the variable capacitor network. Note that the transformer may be omitted if an adjustment of the voltage level of the inbound RF signal is not needed and/or the isolation provided by the transformer is not needed.

The FTBPF 580 provides a high-Q (quality factor) RF filter that filters the inbound RF signal such that desired signal components of the inbound RF signal are passed substantially unattenuated to the LNA 393 and undesired signal components (e.g., blockers, images, etc.) are attenuated. To achieve such a filter, the baseband impedances (($Z_{BB}(s)$)) collectively provide a low-Q baseband filter, where each of the baseband impedances may be a capacitor, a switched capacitor filter, a switch capacitor resistance, and/or a complex impedance. Note that the impedance of each of the baseband impedances may be the same, different, or combination thereof. Further note that the impedances of each of baseband impedances may be adjusted via control signal from the SOC processing resources to adjust the properties of the low-Q baseband filter (e.g., bandwidth, attenuation rate, quality factor, etc.).

In addition, the FTBPF 580 includes negative resistance (e.g., −2R) to compensate for inductance loss, to compensate for switch loss, and/or to improve the selectivity and/or quality factor of the low-Q bandpass filter. The negative impedance may be implemented as shown in FIG. 56.

The low-Q baseband filter is frequency translated to the desired RF frequency to produce the high-Q RF filter via the clock signals provided by a clock generator 582. The clock generator 582 as shown in FIG. 58 (of which, various embodiments will be discussed with reference to one or more of the subsequent figures) produces four clocks signals each having a 25% duty cycle and sequentially offset by 90°. The clock signals have a frequency corresponding to the carrier frequency of the inbound RF signal and can be adjusted to better track the carrier frequency. The clock generator 582 may also generate local oscillation clock signals (not shown), which are used to down-convert the inbound RF signal to an inbound IF signal.

Returning to the discussion of FIG. 57, the FTBPF 580 receives the clock signals, which are coupled to the transistors to sequentially couple their respective baseband impedances to the inbound RF signal. With the clock rate being at RF (e.g., the carrier frequency(ies) of the desired component of the inbound RF signal), the baseband impedance affects (e.g., collectively the low-Q bandpass filter) is shifted to RF creating the high-Q RF bandpass filter.

FIG. 59 is a schematic block diagram of another embodiment of a portion of an RF to IF receiver section that includes a dual band FTBPF (frequency translated bandpass filter) 590. The portion of the RX RF to IF section includes the transformer, the variable capacitor network, and the LNA 392-1, and 392-2. The FTBPF 590 includes a plurality of transistors and a plurality of baseband impedances ($Z_{BB}(s)$) 592, 594, 596, and 598.

In an example of operation, the front-end module (FEM) 396 receives a dual band inbound RF signal (e.g., $f_{RF1}$ and $f_{RF2}$) via an antenna, processes the signal as previously discussed and/or as will be discussed with reference to one or more of the subsequent figures, and provides the FEM processed inbound RF signal to the transformer. The transformer steps up or steps down the voltage level of the inbound RF signal, which is subsequently filtered by the variable capacitor network C1. Note that the transformer may be omitted if an adjustment of the voltage level of the inbound RF signal is not needed and/or the isolation provided by the transformer is not needed.

The FTBPF 590 provides two high-Q (quality factor) RF filters (one centered at $f_{RF1}$ and the other centered at $f_{RF2}$) that filters the inbound RF signal such that desired signal components of the dual band inbound RF signal are passed substantially unattenuated to the LNA 392-1, and 392-2 and undesired signal components (e.g., blockers, images, etc.) are attenuated. The two high-Q RF filters are produced by a plurality of baseband impedances (($Z_{BB}(s)$) 592, 594, 596, and 598 and a plurality of transistors, where each of the baseband impedances includes a second plurality of baseband impedances (e.g., $Z'_{BB}(s)$) 592, 594, 596, and 598 and a second plurality of transistors. The second plurality of baseband impedances ($Z'_{BB}(s)$) 592, 594, 596, and 598 provide a low-Q baseband filter, where each of the second plurality of baseband impedances may be a capacitor, a switched capacitor filter, a switch capacitor resistance, and/or a complex impedance. Note that the impedance of each of the baseband impedances may be the same, different, or combination thereof. Further note that the impedances of each of baseband impedances may be adjusted via control signal from the SOC processing resources to adjust the properties of the low-Q baseband filter (e.g., bandwidth, attenuation rate, quality factor, etc.).

The low-Q baseband filter is frequency translated to a desired RF frequency (e.g., $fD=(fLO1−f_{LO2})/2$) to produce the high-Q RF filter via the clock signals (at $f_D$) provided by a clock generator 600. The clock generator 600 as shown in FIG. 60 (of which, various embodiments will be discussed with reference to one or more of the subsequent figures) produces four clocks signals (e.g., $LO'_1$ through $LO'_4$) each having a 25% duty cycle and sequentially offset by 90°. The clock signals have a frequency corresponding to ½ the difference of the carrier frequency of the first frequency band of the inbound RF signal (e.g., $f_{RF1}$ or $f_{LO1}$) minus the carrier frequency of the second frequency band of the inbound RF signal (e.g., $f_{RF2}$ or $f_{LO2}$) and can be adjusted to better track one or both of the carrier frequencies.

Figure 61:
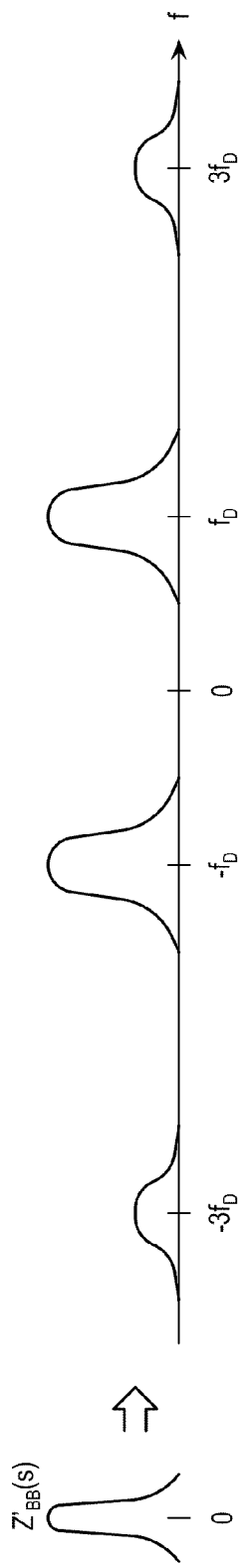
FIG. 61 is a diagram of an example of a frequency response for a first LO of an the RF to IF receiver section in accordance with the present invention.
Figure 62:
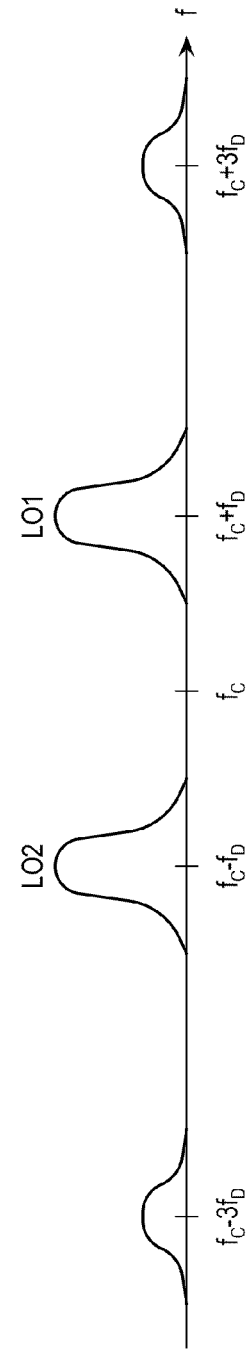
FIG. 62 is a diagram of an example of a frequency response for a second LO of an RF to IF receiver section in accordance with the present invention.

The high-Q RF filter produced by the first plurality of baseband impedances is frequency translated to higher desired RF frequencies as the first plurality of transistors are clocked by $LO_1$-$LO_4$ (as produced by the clock generator 600 of FIG. 60) at a rate of $f_C$, wherein $f_C=(fLO1+f_{LO2})/2$. For example with reference to FIG. 61, the low-Q baseband filter produced by the second plurality of baseband impedances is frequency translated to $+/−f_D$. As such, the response of the first high-Q bandpass filter is centered at $+/−f_D$, with third order harmonics are also shown. With reference to FIG. 62, the first high-Q bandpass filter is frequency translated to $f_C−f_D$ and to $f_C+F_D$ to produce two high-Q bandpass filters.

Since $f_C=(fLO1+f_{LO2})/2$ and $f_D=(fLO1+f_{LO2})/2$, $f_C-f_D=LO2$ and $f_C+f_D=LO1$. Thus, one of the high-Q bandpass filters is centered (or off-centered from) LO2 (or $f_{RF2}$) and the other high-Q bandpass filter is centered (or off-centered from) LO1 (or $f_{RF1}$). As such, the first high-Q bandpass filter passes the desired signal components of the inbound RF signal at LO2 (or $f_{RF2}$) and the second high-Q bandpass filter passes the desired signal components of the inbound RF signal at LO1 (or $f_{RF1}$).

Figure 63:
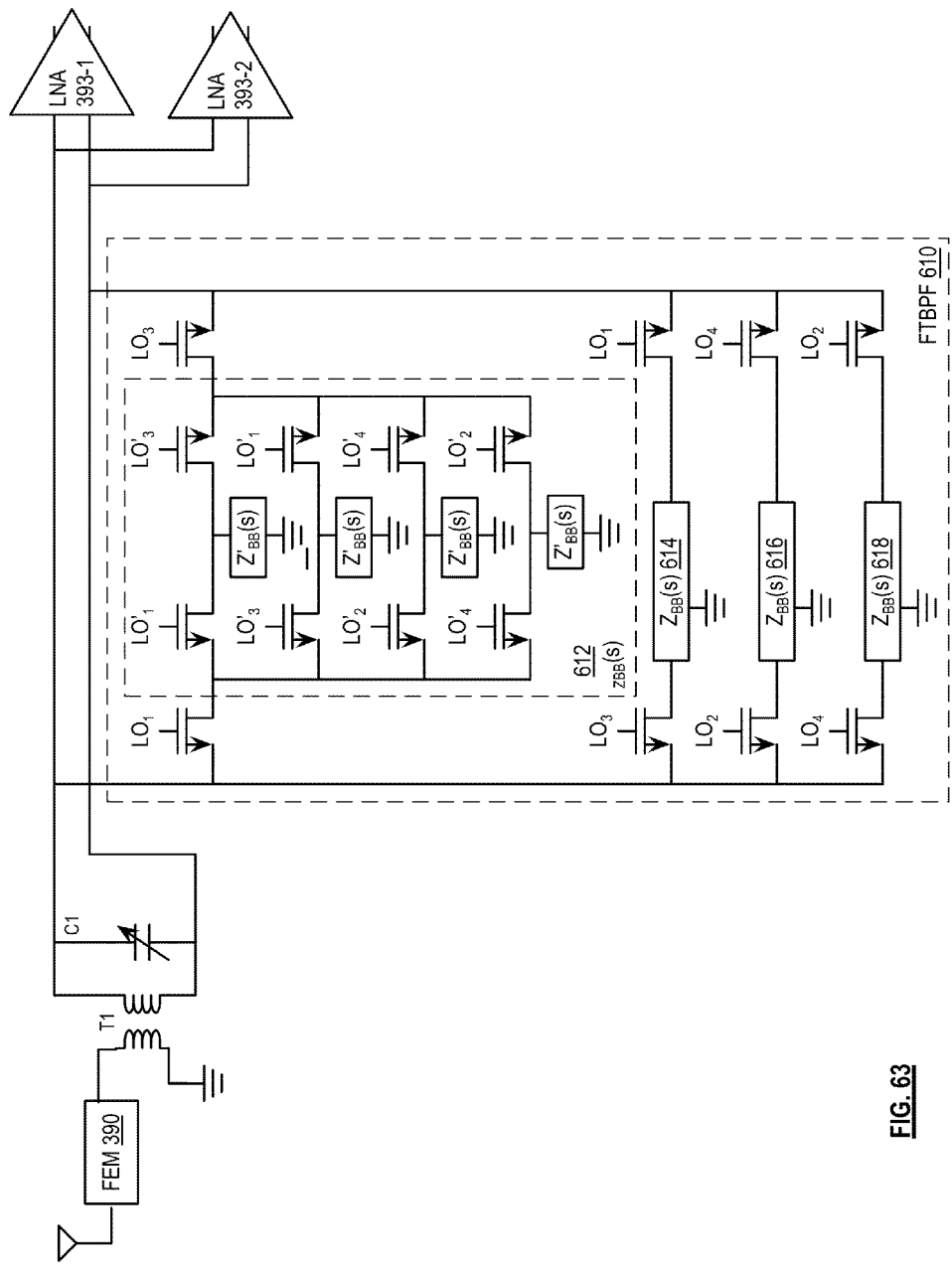
FIG. 63 is a schematic block diagram of another embodiment of a portion of an RF to IF receiver section that includes an FTBPF (frequency translated bandpass filter) in accordance with the present invention.

FIG. 63 is a schematic block diagram of another embodiment of a portion of an RF to IF receiver section that includes a dual band differential FTBPF (frequency translated bandpass filter) 610. The portion of the RX RF to IF section includes the transformer, the variable capacitor network, and the LNA 393-1, 393-2. The FTBPF 610 includes a plurality of transistors and a plurality of baseband impedances ($Z_{BB}(s)$) 612, 614, 616, and 618.

In an example of operation, the front-end module (FEM) 390 receives a dual band inbound RF signal (e.g., $f_{RF1}$ and $f_{RF2}$) via an antenna, processes the signal as previously discussed and/or as will be discussed with reference to one or more of the subsequent figures, and provides the FEM processed inbound RF signal to the transformer T1. The transformer converts the inbound RF signal into a differential inbound RF signal.

The FTBPF 610 provides two high-Q (quality factor) RF filters (one centered at $f_{RF1}$ and the other centered at $f_{RF2}$) that filters the inbound RF signal such that desired signal components of the dual band inbound RF signal are passed substantially unattenuated to the LNA 393-1, 393-2 and undesired signal components (e.g., blockers, images, etc.) are attenuated. The two high-Q RF filters are produce by a plurality of baseband impedances (($Z_{BB}(s)$) 612, 614, 616, and 618 and a plurality of transistors, where each of the baseband impedances includes a second plurality of baseband impedances (e.g., $Z'_{BB}(s)$) 612, 614, 616, and 618 and a second plurality of transistors. The second plurality of baseband impedances ($Z'_{BB}(s)$) 612, 614, 616, and 618 provide a low-Q baseband filter, where each of the second plurality of baseband impedances may be a capacitor, a switched capacitor filter, a switch capacitor resistance, and/or a complex impedance. Note that the impedance of each of the baseband impedances may be the same, different, or combination thereof. Further note that the impedances of each of baseband impedances may be adjusted via control signal from the SOC processing resources to adjust the properties of the low-Q baseband filter (e.g., bandwidth, attenuation rate, quality factor, etc.).

The low-Q baseband filter is frequency translated to a desired RF frequency (e.g., $fD=(fLO1-f_{LO2})/2$) to produce the high-Q RF filter via the clock signals (at $f_D$) provided by a clock generator 600. The clock generator 600 as shown in FIG. 60 (of which, various embodiments will be discussed with reference to one or more of the subsequent figures) produces four clocks signals (e.g., $LO'_1$ through $LO'_4$) each having a 25% duty cycle and sequentially offset by 90°. The clock signals have a frequency corresponding to ½ the difference of the carrier frequency of the first frequency band of the inbound RF signal (e.g., $f_{RF1}$ or $f_{LO1}$) minus the carrier frequency of the second frequency band of the inbound RF signal (e.g., $f_{RF2}$ or $f_{LO2}$) and can be adjusted to better track one or both of the carrier frequencies.

The high-Q RF filter produced by the first plurality of baseband impedances is frequency translated to higher desired RF frequencies as the first plurality of transistors are clocked by $LO_1$-$LO_4$ (as produced by the clock generator of FIG. 60) at a rate of $f_C$, wherein $f_C=(fLO1+f_{LO2})/2$. Thus, one of the high-Q bandpass filters is centered (or off-centered from) LO2 (or $f_{RF2}$) and the other high-Q bandpass filter is centered (or off-centered from) LO1 (or $f_{RF1}$). As such, the first high-Q bandpass filter passes the desired signal components of the inbound RF signal at LO2 (or $f_{RF2}$) and the second high-Q bandpass filter passes the desired signal components of the inbound RF signal at LO1 (or $f_{RF1}$).

FIG. 64 is a schematic block diagram of another embodiment of a portion of an RF to IF receiver section that includes a transformer, a variable capacitor network, a pair of inverter based LNAS 395, a mixer, and output buffers (or unity gain drivers). The mixer includes a plurality of transistors, a pair of transimpedance amplifiers (TIA) 622, and 624, and accompanying impedances (Z) 626, and 628.

In an example of operation, the LNAs 395 provide a differential current ($i_{RF}$ and $-i_{RF}$) to the mixer. Operating in the current domain, the mixer mixes the differential current with the differential I 630 component of the local oscillation ($LO_{IP}$ and $LO_{IN}$) to produce an I mixed current signal. The mixer also mixes the different current with the differential Q 632 component of the local oscillation $LO_{QP}$ and $LO_{QN}$) to produce a Q mixed current signal.

The first TIA 622, and 624 amplifies the I mixed current signal and, via the associated impedance (Z) 626, and 628, produces a voltage domain I mixed signal. Similarly, the second TIA amplifies the Q mixed current signal and, via the associated impedance (Z) 626, and 628, produces a voltage domain Q mixed signal.

FIG. 65 is a schematic block diagram of another embodiment of a clock generator 634 for the RF to IF receiver section. The clock generator (of which, various embodiments will be discussed with reference to one or more of the subsequent figures) produces four clocks signals (e.g., $LO_{IP}$; $LO_{IN}$; $LO_{IP}$; and $LO_{IN}$) each having a 25% duty cycle and sequentially offset by 90° as shown.

Figure 66:
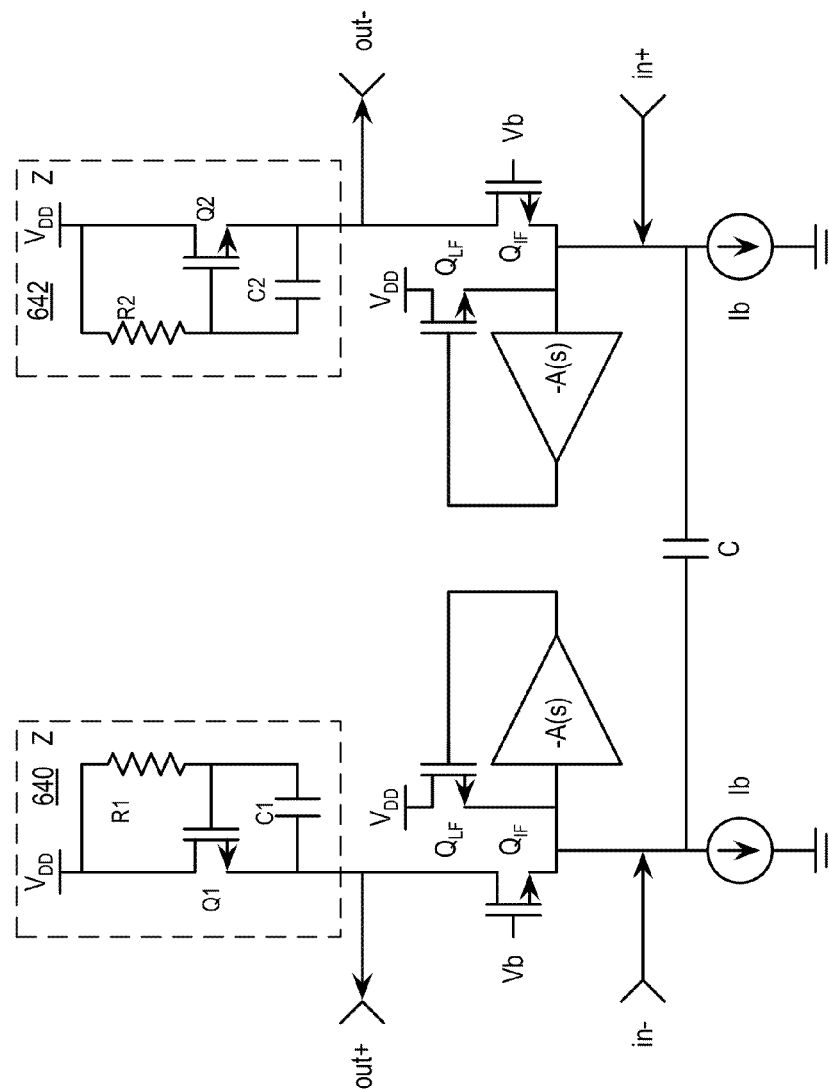
FIG. 66 is a schematic block diagram of an embodiment of a transimpedance amplifier (TIA) in accordance with the present invention.

FIG. 66 is a schematic block diagram of an embodiment of a transimpedance amplifier (TIA) and the corresponding impedance (Z) 640, and 642. The TIA includes current sources, frequency dependent amplifiers (−A(s)), IF transistors ($T_{IF}$), and low frequency transistors ($T_{IF}$). The corresponding impedance includes, in each output leg of the TIA, a resistor, a capacitor, and a transistor.

In an example of operation, the differential input current is received at in− and in+. A current node analysis (e.g., KCL—Kirchoff's current law) at the negative input node reveals that the current source current (ib) equals the input current ($i_{IN}$)+ the current through the capacitor ($i_C$)+the current through $T_{IF}$ ($i_{OUT}$)+the current through $T_{LF}$. A KVL (Kirchoff's voltage law) at the positive output (out+) reveals that the output voltage (Vout+) equals $Vdd-Z*I_{OUT}$ (i.e., the current through $T_{IF}$).

At high frequencies (e.g., above $r_{RF}$ of the inbound RF signal), the impedance of the capacitor becomes dominant such that the inputs are essentially shorted together; thus the output current ($i_{OUT}$) contains essentially no high frequency components. At low frequencies (e.g., below $r_{RF}$ of the inbound RF signal), the amplifier and low frequency transistor are configured with respect to $T_{IF}$ that $T_{IF}$, which is essentially an open circuit for low frequency currents. This may be achieved by sizing the transistors and biasing the amplifier such that $T_{LF}$ at low frequencies has a much smaller impedance than $Z+T_{IF}$.

For frequencies in the desired frequency range (e.g., $f_{RF}$), the capacitor and $T_{LF}$ have high impedances compared to the impedance of $T_{IF}$ and the corresponding impedance Z 640, 642. As such, $i_{OUT}=i_b-i_{IN}$ and $V_{OUT}=Z*i_{OUT}$. Accordingly, the TIA and corresponding Z 640, 642 can be tuned to provide a high-Q RF bandpass filter. Note that one or more of the components of the TIA may be adjustable via control signals provided by the SOC processing resources to adjust the properties of the high-Q RF bandpass filter.

FIG. 67 is a schematic block diagram of an embodiment of a low noise amplifier (LNA) 670 that includes an FTBPF 650,672, 674, AND 678. The LNA 670 includes a current source, a pair of input transistors (T3 & T4), a pair of biasing transistors (T1 & T2), and output impedances (resistors shown, but could be inductors, transistors, capacitors, and/or combination thereof. Note that the current source may be replaced with a passive device (e.g., resistor, inductor, capacitor, and/or a combination thereof) or may be omitted. The FTBPF 650,672, 674, AND 678 may be positioned within the LNA 670 at one or various locations as shown.

Figure 68:
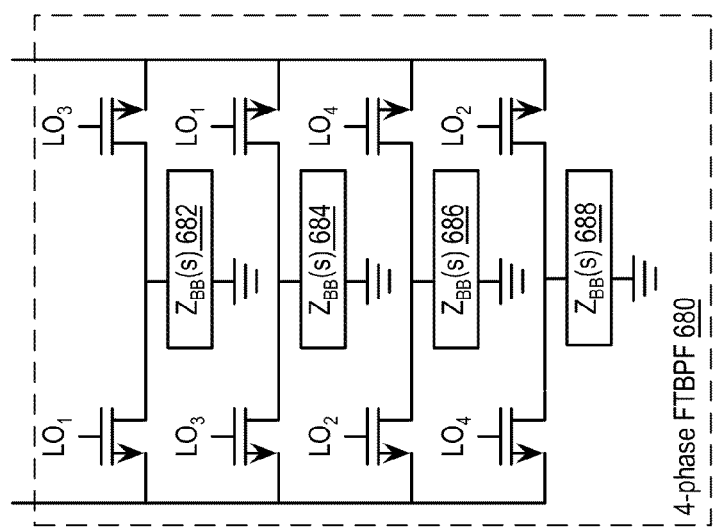
FIG. 68 is a schematic block diagram of an embodiment of a 4-phase FTBPF (frequency translated bandpass filter) in accordance with the present invention.

FIG. 68 is a schematic block diagram of an embodiment of a differential 4-phase FTBPF (frequency translated bandpass filter) 680 that includes a plurality of transistors and four baseband impedances (e.g., $Z_{BB}(s)$) 682, 684, 686, and 688 The baseband impedances (($Z_{BB}(s)$)) 682, 684, 686, and 688 collectively provide a low-Q baseband filter, where each of the baseband impedances may be a capacitor, a switched capacitor filter, a switch capacitor resistance, and/or a complex impedance. Note that the impedance of each of the baseband impedances may be the same, different, or combination thereof. Further note that the impedances of each of baseband impedances may be adjusted via control signal from the SOC processing resources to adjust the properties of the low-Q baseband filter (e.g., bandwidth, attenuation rate, quality factor, etc.).

The low-Q baseband filter is frequency translated to the desired RF frequency to produce a high-Q RF or IF filter via the clock signals (e.g., $LO_1$-$LO_4$) provided by a clock generator. The differential high-Q RF filter filters a differential RF or IF signal such that desired signal components of the RF or IF signal are passed substantially unattenuated and undesired signal components (e.g., blockers, images, etc.) are attenuated.

Figure 69:
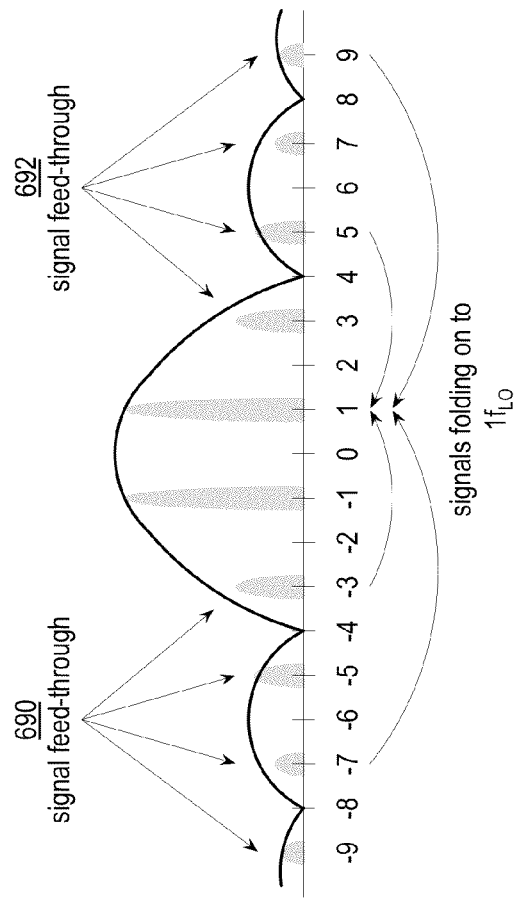
FIG. 69 is a diagram of an example of a frequency response for a 4-phase FTBPF in accordance with the present invention.

FIG. 69 is a diagram of an example of a frequency response for a 4-phase FTBPF 680 that illustrates signal feed-through harmonics and folding signal harmonics. The signal feed-through harmonics are at +/−3, +/−5, +/−7, and +/−9 692 and the folding signal harmonics are at −3, 5, −7, and −9 690.

Figure 70:
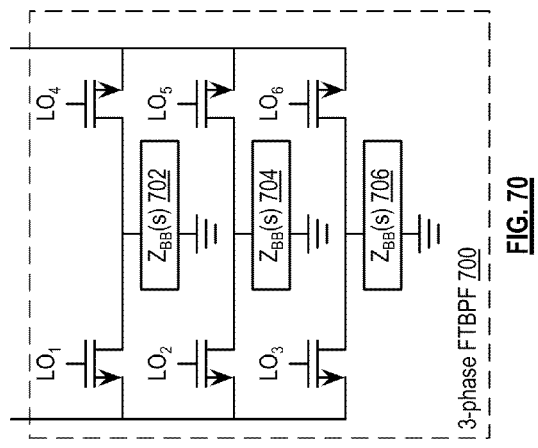
FIG. 70 is a schematic block diagram of another embodiment of a 3-phase FTBPF (frequency translated bandpass filter) in accordance with the present invention.

FIG. 70 is a schematic block diagram of another embodiment of a 3-phase FTBPF (frequency translated bandpass filter) 700 that includes a plurality of transistors and 3 baseband impedances (e.g., $Z_{BB}(s)$) 702, 704, and 706. The baseband impedances (($Z_{BB}(s)$)) 702, 704, and 706 collectively provide a low-Q baseband filter, where each of the baseband impedances may be a capacitor, a switched capacitor filter, a switch capacitor resistance, and/or a complex impedance. Note that the impedance of each of the baseband impedances may be the same, different, or combination thereof. Further note that the impedances of each of baseband impedances may be adjusted via control signal from the SOC processing resources to adjust the properties of the low-Q baseband filter (e.g., bandwidth, attenuation rate, quality factor, etc.).

Figure 71:
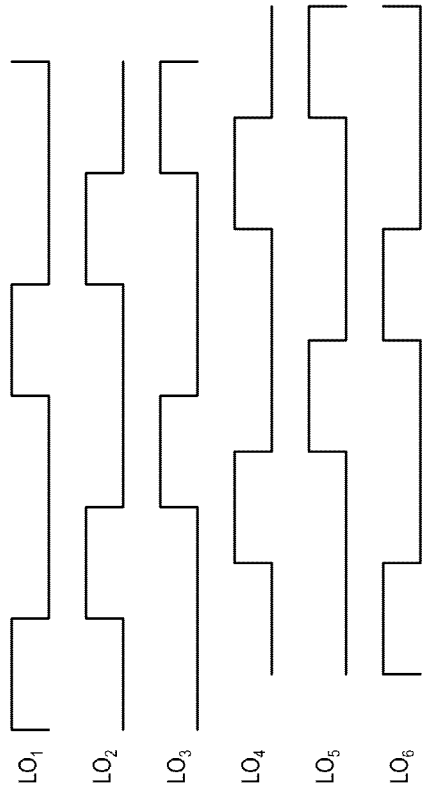
FIG. 71 is a diagram of an example of clock signals for a 3-phase FTBPF in accordance with the present invention.

The low-Q baseband filter is frequency translated to the desired RF frequency to produce a high-Q RF or IF filter via the clock signals (e.g., $LO_1$–$LO_-$) as shown in FIG. 71 and as provided by a clock generator. The differential high-Q RF filter filters a differential RF or IF signal such that desired signal components of the RF or IF signal are passed substantially unattenuated and undesired signal components (e.g., blockers, images, etc.) are attenuated.

Figure 72:
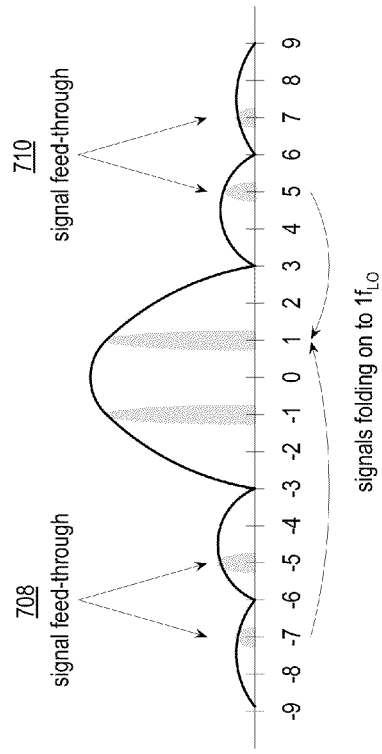
FIG. 72 is a diagram of an example of a frequency response for a 3-phase FTBPF in accordance with the present invention.

FIG. 72 is a diagram of an example of a frequency response for a 3-phase FTBPF 700 that illustrates signal feed-through harmonics and folding signal harmonics. The signal feed-through harmonics are at +/−5 and +/−7 708 and the folding signal harmonics are at 5 and 7 710.

Figure 73:
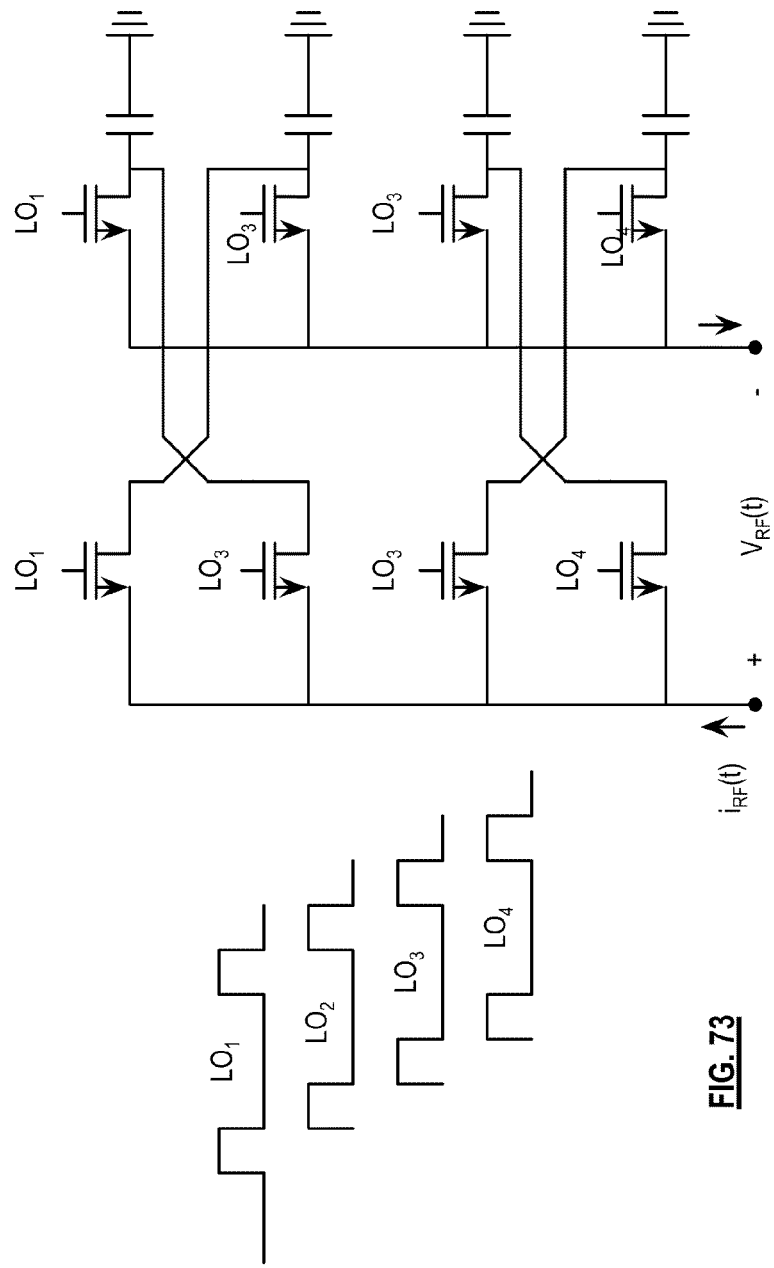
FIG. 73 is a schematic block diagram of another embodiment of a 4-phase FTBPF (frequency translated bandpass filter) in accordance with the present invention.

FIG. 73 is a schematic block diagram of another embodiment of a 4-phase FTBPF (frequency translated bandpass filter) 712 that includes a plurality of transistors and four capacitors. The capacitors collectively provide a low-Q baseband filter. Note that the capacitance of each of the capacitors may be the same, different, or combination thereof. Further note that the capacitances of each of capacitors may be adjusted via control signal from the SOC processing resources to adjust the properties of the low-Q baseband filter (e.g., bandwidth, attenuation rate, quality factor, etc.).

The low-Q baseband filter is frequency translated to the desired RF frequency to produce a high-Q RF or IF filter via the clock signals (e.g., $LO_1$-$LO_4$) provided by a clock generator. The differential high-Q RF filter filters a differential RF or IF signal such that desired signal components of the RF or IF signal are passed substantially unattenuated and undesired signal components (e.g., blockers, images, etc.) are attenuated.

Figure 74:
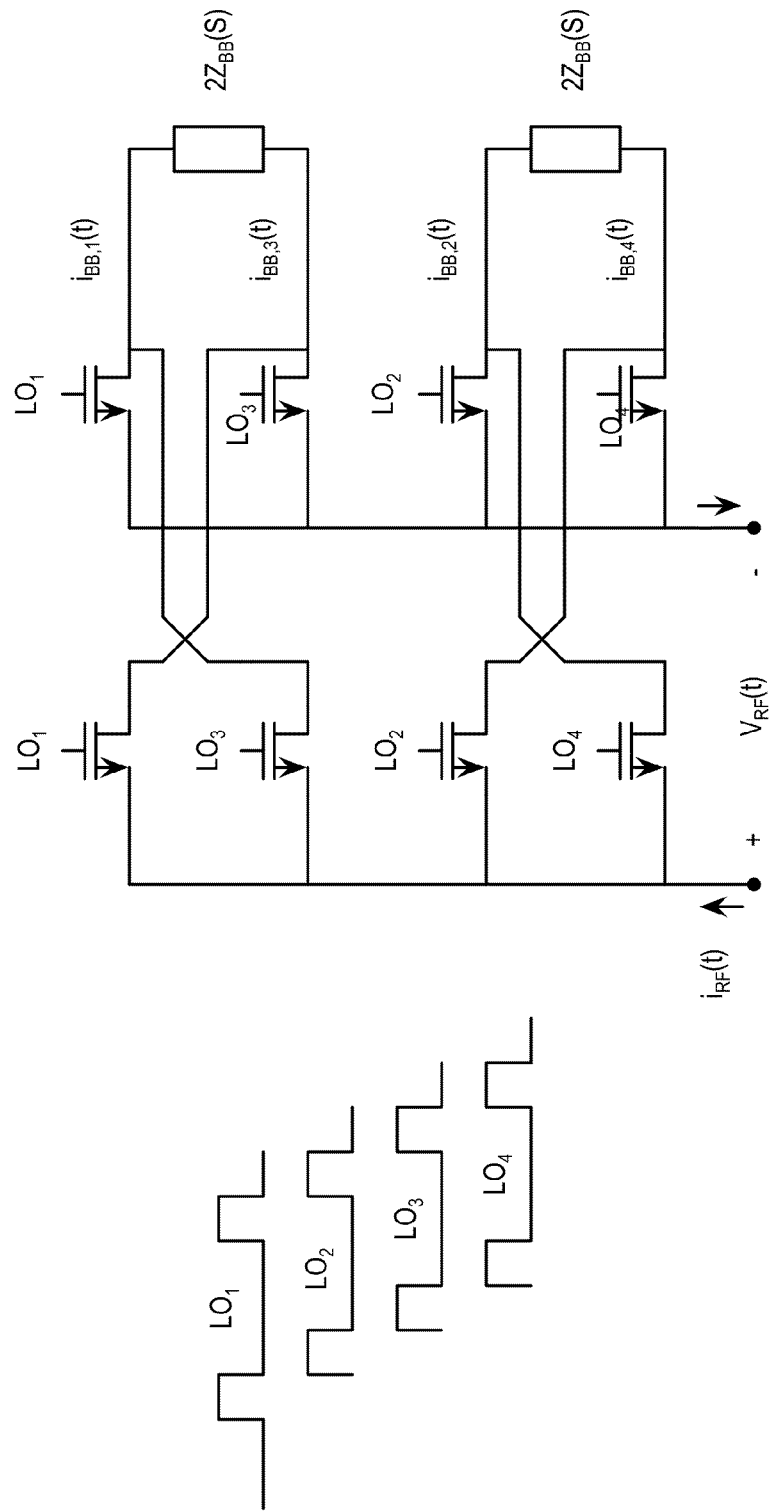
FIG. 74 is a schematic block diagram of another embodiment of a 4-phase FTBPF (frequency translated bandpass filter) in accordance with the present invention.

FIG. 74 is a schematic block diagram of another embodiment of a 4-phase FTBPF (frequency translated bandpass filter) 714 that includes a plurality of transistors and two baseband impedances (e.g., $Z_{BB}(s)$) coupled to the transistors as shown. The baseband impedances (($Z_{BB}(s)$)) collectively provide a low-Q baseband filter, where each of the baseband impedances may be a capacitor, a switched capacitor filter, a switch capacitor resistance, and/or a complex impedance. Note that the impedance of each of the baseband impedances may be the same, different, or combination thereof. Further note that the impedances of each of baseband impedances may be adjusted via control signal from the SOC processing resources to adjust the properties of the low-Q baseband filter (e.g., bandwidth, attenuation rate, quality factor, etc.).

The low-Q baseband filter is frequency translated to the desired RF frequency to produce a high-Q RF or IF filter via the clock signals (e.g., $LO_1$-$LO_4$) provided by a clock generator. The differential high-Q RF filter filters a differential RF or IF signal such that desired signal components of the RF or IF signal are passed substantially unattenuated and undesired signal components (e.g., blockers, images, etc.) are attenuated.

Figure 75:
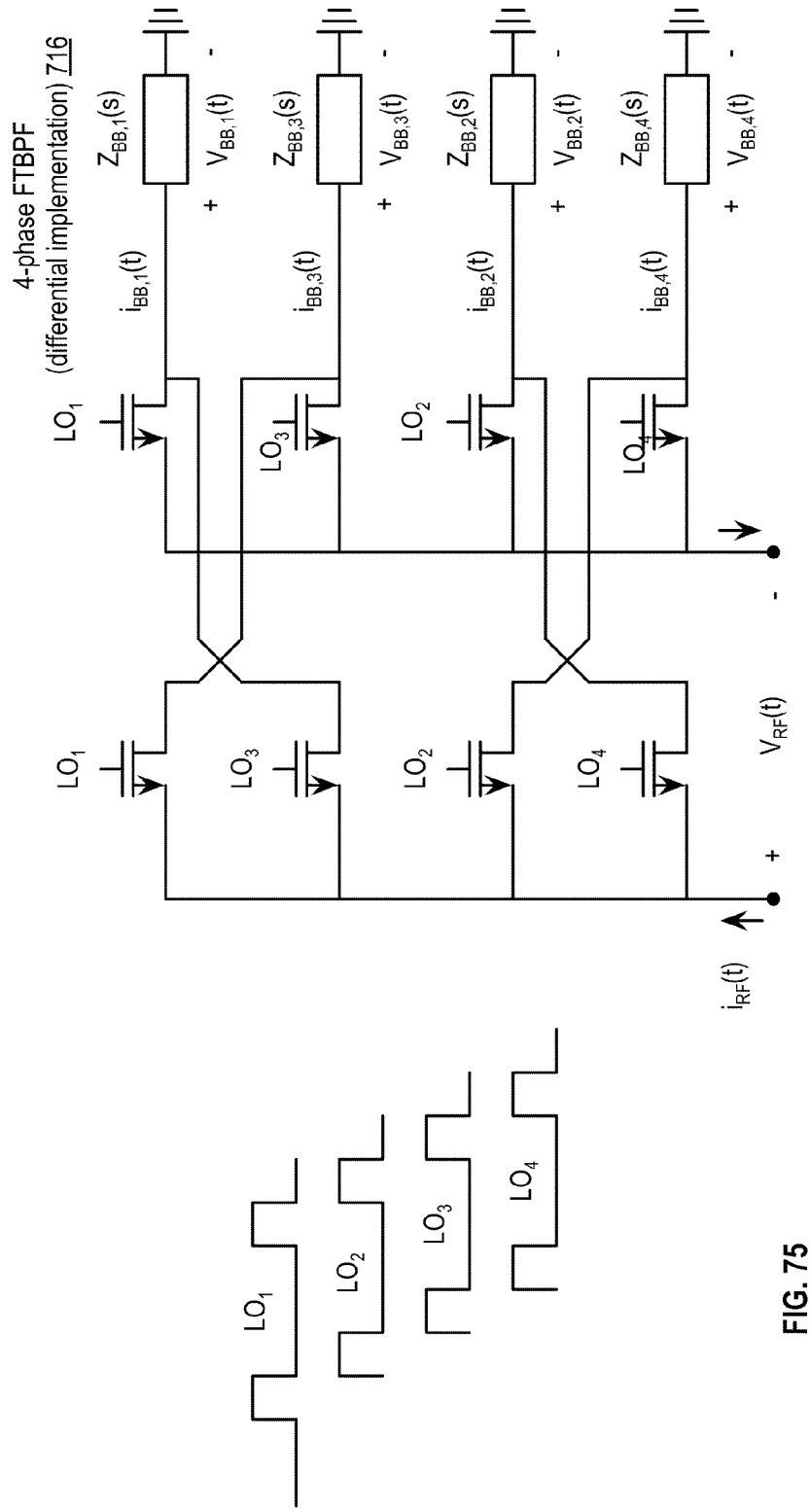
FIG. 75 is a schematic block diagram of another embodiment of a 4-phase FTBPF (frequency translated bandpass filter) in accordance with the present invention.

FIG. 75 is a schematic block diagram of another embodiment of a 4-phase FTBPF (frequency translated bandpass filter) 716 that includes a plurality of transistors and four baseband impedances (e.g., $Z_{BB}(s)$). The baseband impedances (($Z_{BB}(s)$)) collectively provide a low-Q baseband filter, where each of the baseband impedances may be a capacitor, a switched capacitor filter, a switch capacitor resistance, and/or a complex impedance. Note that the impedance of each of the baseband impedances may be the same, different, or combination thereof. Further note that the impedances of each of baseband impedances may be adjusted via control signal from the SOC processing resources to adjust the properties of the low-Q baseband filter (e.g., bandwidth, attenuation rate, quality factor, etc.).

The low-Q baseband filter is frequency translated to the desired RF frequency to produce a high-Q RF or IF filter via the clock signals (e.g., $LO_1$-$LO_4$) provided by a clock generator. The differential high-Q RF filter filters a differential RF or IF signal such that desired signal components of the RF or IF signal are passed substantially unattenuated and undesired signal components (e.g., blockers, images, etc.) are attenuated.

Figure 76:
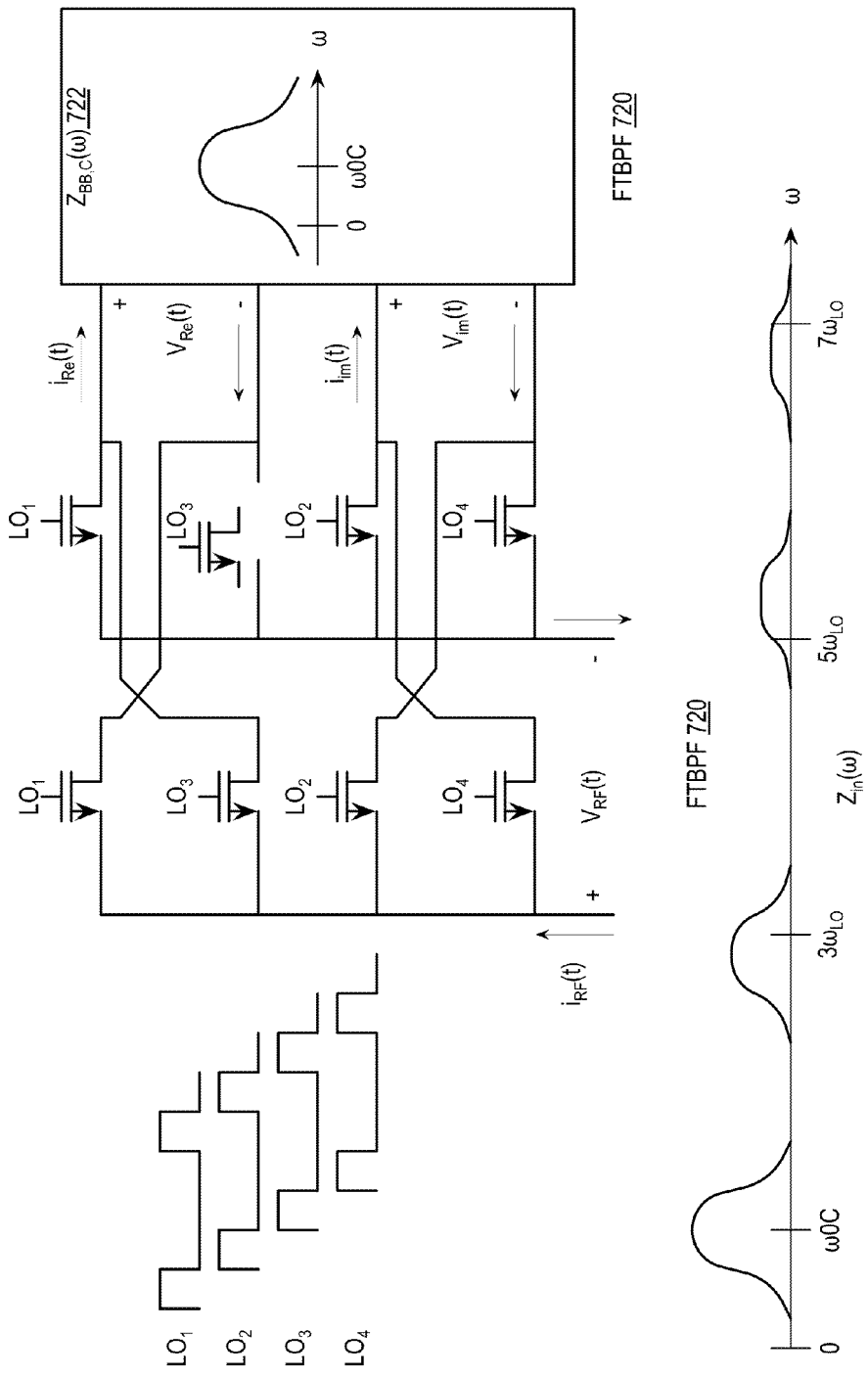
FIG. 76 is a schematic block diagram of another embodiment of a 4-phase FTBPF (frequency translated bandpass filter) in accordance with the present invention.

FIG. 76 is a schematic block diagram of another embodiment of a 4-phase FTBPF (frequency translated bandpass filter) 720 that includes a plurality of transistors and a complex baseband impedance (e.g., $Z_{BB,C}(\omega)$) 722. The complex baseband impedance provides a low-Q baseband filter that is offset from 0 by $\omega$OC. Note that the complex baseband impedance may be adjusted via control signal from the SOC processing resources to adjust the properties of the low-Q baseband filter (e.g., bandwidth, attenuation rate, quality factor, frequency offset, etc.).

The low-Q baseband filter is frequency translated to the desired RF frequency to produce a high-Q RF or IF filter via the clock signals (e.g., $LO_1$-$LO_4$) provided by a clock generator. The differential high-Q RF filter filters a differential RF or IF signal such that desired signal components of the RF or IF signal are passed substantially unattenuated and undesired signal components (e.g., blockers, images, etc.) are attenuated.

FIG. 77 is a schematic block diagram of an embodiment of a complex baseband impedance for an FTBPF (frequency translated bandpass filter). The complex baseband impedance 726 includes a first baseband impedance (e.g., $Z_{BB}(\omega)$), a negative gain stage (e.g., $-jGm(\omega)V_{IM}(\omega)$), a second baseband impedance (e.g., $Z_{BB}(\omega)$), and a positive gain stage (e.g., $jGm(\omega)V_{RE}(\omega)$). As such, the complex baseband impedance includes a real component (RE) and an imaginary component (IM). The complex baseband impedance provides a low-Q bandpass filter that has the frequency response as shown, where the real component is represented by the $\omega$>0 curve and the negative component is represented by the $\omega$<0 curve.

Figure 78:
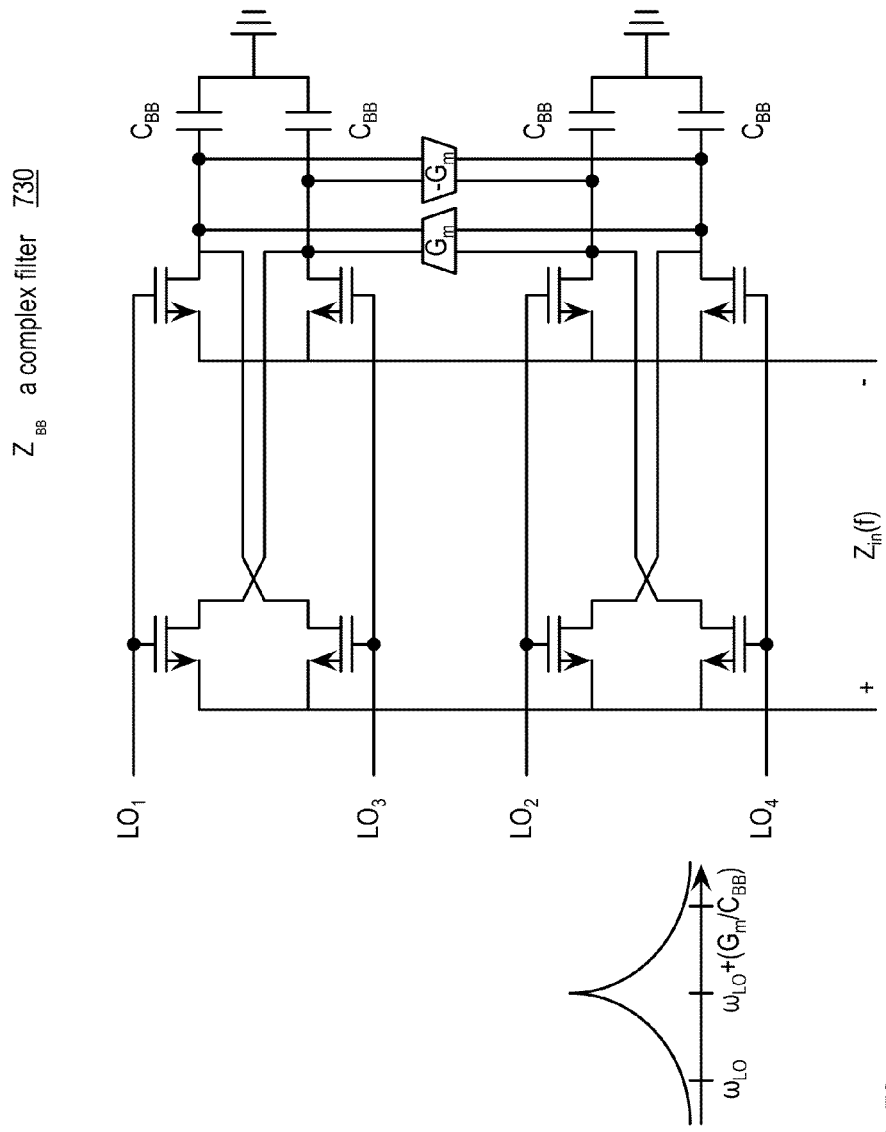
FIG. 78 is a schematic block diagram of an embodiment of a 4-phase FTBPF (frequency translated bandpass filter) in accordance with the present invention.

FIG. 78 is a schematic block diagram of an embodiment of a 4-phase FTBPF (frequency translated bandpass filter) that includes the complex baseband impedance with the baseband impedance implemented via capacitors. The complex baseband impedance provides a low-Q baseband filter 730 that is offset from 0 by $\omega$OC, which is based on a ratio between the gain (Gm) and the impedance of the capacitors ($C_{BB}$). Note that the complex baseband impedance may be adjusted via control signal from the SOC processing resources to adjust the properties of the low-Q baseband filter (e.g., bandwidth, attenuation rate, quality factor, frequency offset, etc.). For instance, the capacitors and/or the gain modules may be adjusted.

The frequency offset low-Q baseband filter is frequency translated to the desired RF frequency to produce a high-Q RF or IF filter via the clock signals (e.g., $LO_1$-$LO_4$) provided by a clock generator. The differential high-Q RF filter filters a differential RF or IF signal such that desired signal components of the RF or IF signal are passed substantially unattenuated and undesired signal components (e.g., blockers, images, etc.) are attenuated.

Figure 79:
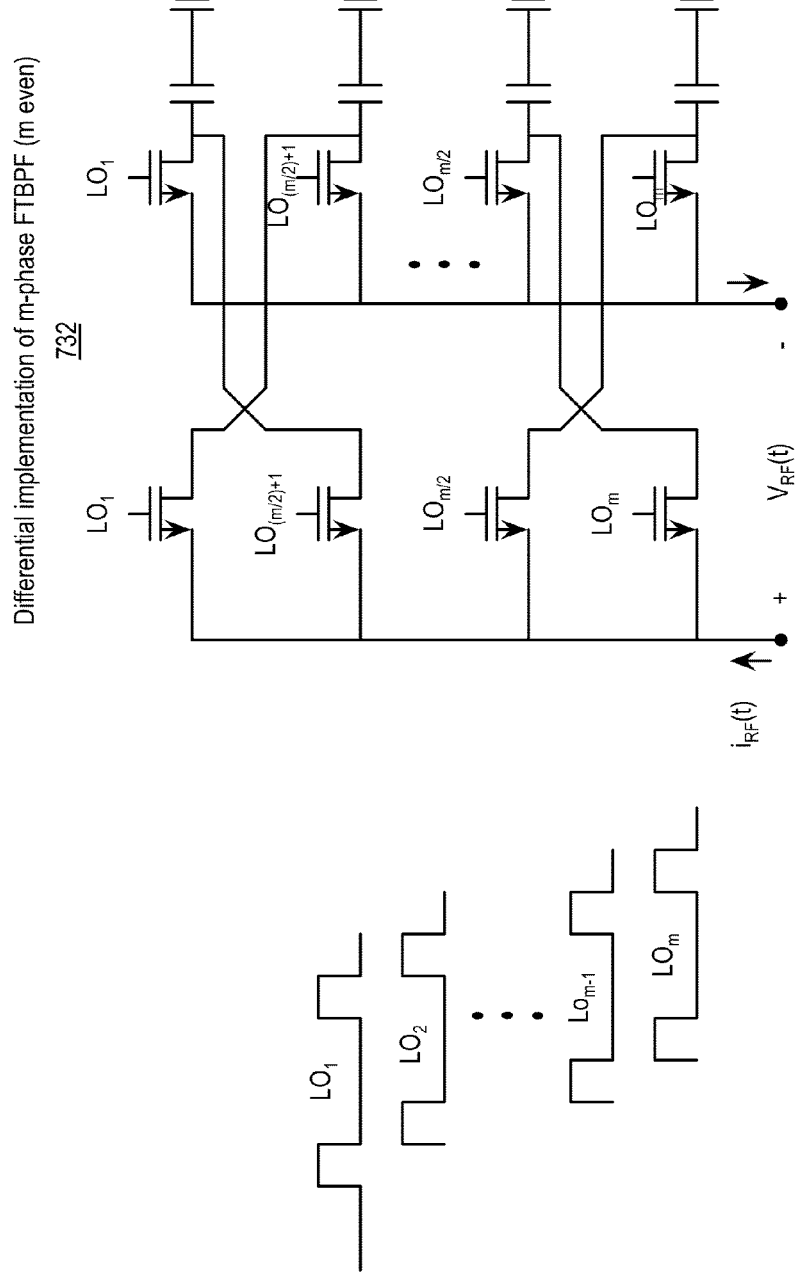
FIG. 79 is a schematic block diagram of an embodiment of an m-phase FTBPF (frequency translated bandpass filter) in accordance with the present invention.

FIG. 79 is a schematic block diagram of an embodiment of an m-phase FTBPF (frequency translated bandpass filter) 732 that includes a plurality of transistors and m number of capacitors, where m=>2. The capacitors collectively provide a low-Q baseband filter. Note that the capacitance of each of the capacitors may be the same, different, or combination thereof. Further note that the capacitances of each of capacitors may be adjusted via control signal from the SOC processing resources to adjust the properties of the low-Q baseband filter (e.g., bandwidth, attenuation rate, quality factor, etc.).

The low-Q baseband filter is frequency translated to the desired RF frequency to produce a high-Q RF or IF filter via the clock signals (e.g., $LO_1$-$LO_M$) provided by a clock generator. The differential high-Q RF filter filters a differential RF or IF signal such that desired signal components of the RF or IF signal are passed substantially unattenuated and undesired signal components (e.g., blockers, images, etc.) are attenuated.

Figure 80:
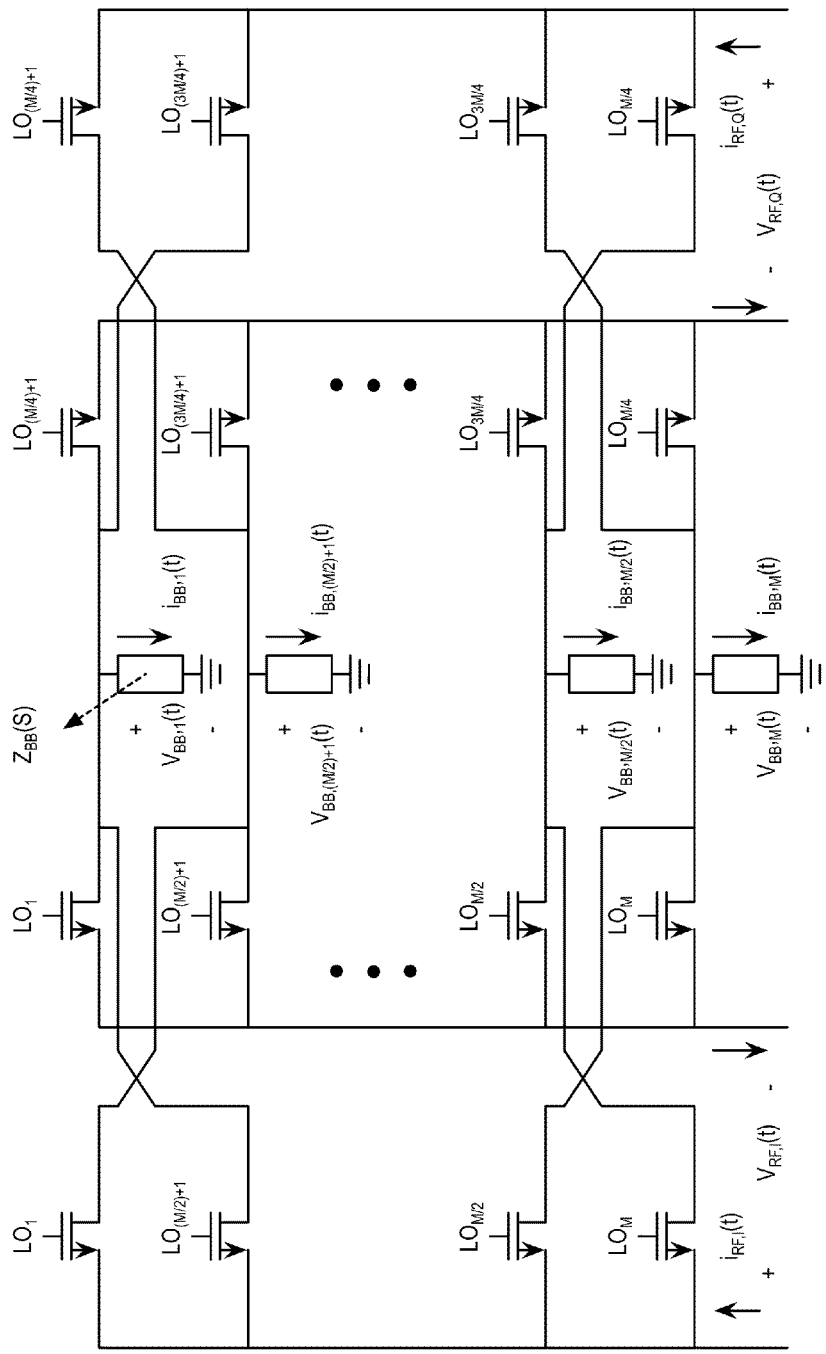
FIG. 80 is a schematic block diagram of an embodiment of an m-phase FTBPF (frequency translated bandpass filter) in accordance with the present invention.

FIG. 80 is a schematic block diagram of an embodiment of an m-phase FTBPF (frequency translated bandpass filter) 734 that includes a plurality of transistors and m number of baseband impedances (e.g., $Z_{BB}(s)$), where m is an integer multiple of 4 and is greater than 4. The baseband impedances (($Z_{BB}(s)$)) collectively provide a low-Q baseband filter, where each of the baseband impedances may be a capacitor, a switched capacitor filter, a switch capacitor resistance, and/or a complex impedance. Note that the impedance of each of the baseband impedances may be the same, different, or combination thereof. Further note that the impedances of each of baseband impedances may be adjusted via control signal from the SOC processing resources to adjust the properties of the low-Q baseband filter (e.g., bandwidth, attenuation rate, quality factor, etc.).

The low-Q baseband filter is frequency translated to the desired IF frequency to produce a high-Q IF filter via the clock signals (e.g., $LO_1$-$LO_M$) provided by a clock generator. The differential high-Q IF filter filters a differential I signal component and a differential Q signal component of the IF signal such that desired signal components of the IF signal are passed substantially unattenuated and undesired signal components (e.g., blockers, images, etc.) are attenuated.

Figure 81:
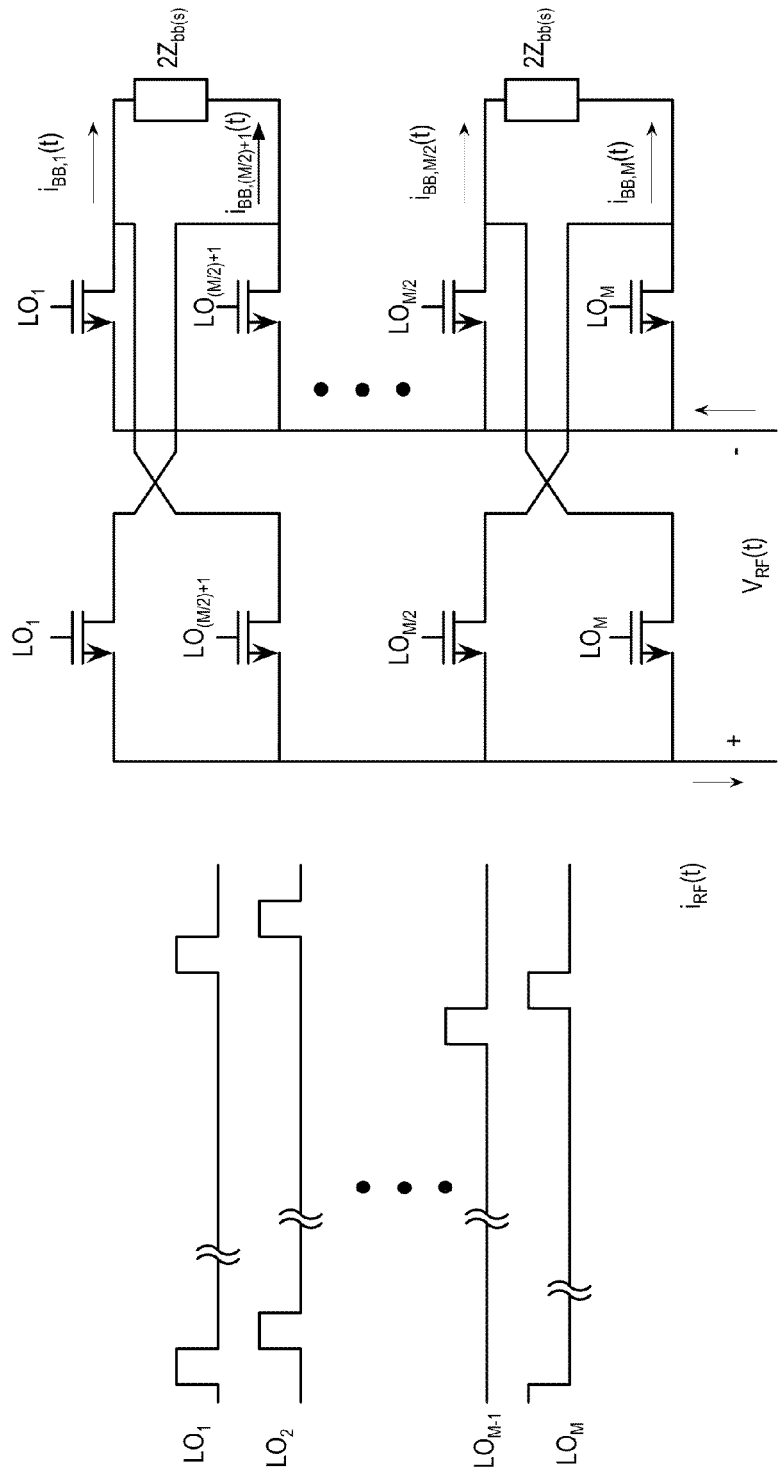
FIG. 81 is a schematic block diagram of an embodiment of an m-phase FTBPF (frequency translated bandpass filter) in accordance with the present invention.

FIG. 81 is a schematic block diagram of an embodiment of an m-phase FTBPF (frequency translated bandpass filter) 736 that includes a plurality of transistors and m/2 number of baseband impedances (e.g., $Z_{BB}(s)$), where m>=4. The baseband impedances (($Z_{BB}(s)$)) collectively provide a low-Q baseband filter, where each of the baseband impedances may be a capacitor, a switched capacitor filter, a switch capacitor resistance, and/or a complex impedance. Note that the impedance of each of the baseband impedances may be the same, different, or combination thereof. Further note that the impedances of each of baseband impedances may be adjusted via control signal from the SOC processing resources to adjust the properties of the low-Q baseband filter (e.g., bandwidth, attenuation rate, quality factor, etc.).

The low-Q baseband filter is frequency translated to the desired RF frequency to produce a high-Q RF or IF filter via the clock signals (e.g., $LO_1$-$LO_4$) provided by a clock generator. The differential high-Q RF filter filters a differential RF or IF signal such that desired signal components of the RF or IF signal are passed substantially unattenuated and undesired signal components (e.g., blockers, images, etc.) are attenuated.

Figure 82:
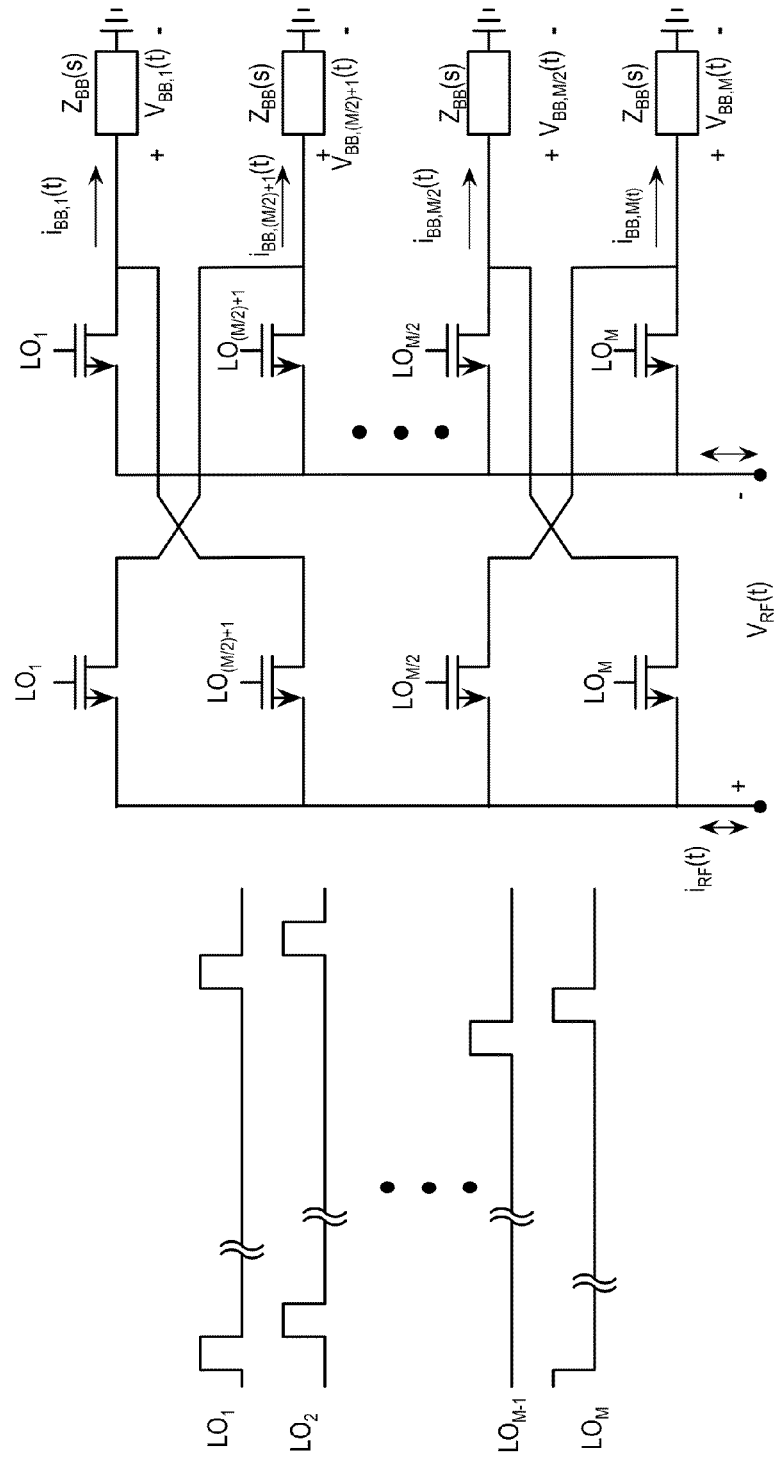
FIG. 82 is a schematic block diagram of an embodiment of an m-phase FTBPF (frequency translated bandpass filter) in accordance with the present invention.

FIG. 82 is a schematic block diagram of an embodiment of an m-phase FTBPF (frequency translated bandpass filter) 738 that includes a plurality of transistors and m number of baseband impedances (e.g., $Z_{BB}(s)$), where m>=2. The baseband impedances (($Z_{BB}(s)$)) collectively provide a low-Q baseband filter, where each of the baseband impedances may be a capacitor, a switched capacitor filter, a switch capacitor resistance, and/or a complex impedance. Note that the impedance of each of the baseband impedances may be the same, different, or combination thereof. Further note that the impedances of each of baseband impedances may be adjusted via control signal from the SOC processing resources to adjust the properties of the low-Q baseband filter (e.g., bandwidth, attenuation rate, quality factor, etc.).

The low-Q baseband filter is frequency translated to the desired RF frequency to produce a high-Q RF or IF filter via the clock signals (e.g., $LO_1$-$LO_4$) provided by a clock generator. The differential high-Q RF filter filters a differential RF or IF signal such that desired signal components of the RF or IF signal are passed substantially unattenuated and undesired signal components (e.g., blockers, images, etc.) are attenuated.

Figures 83, 84:
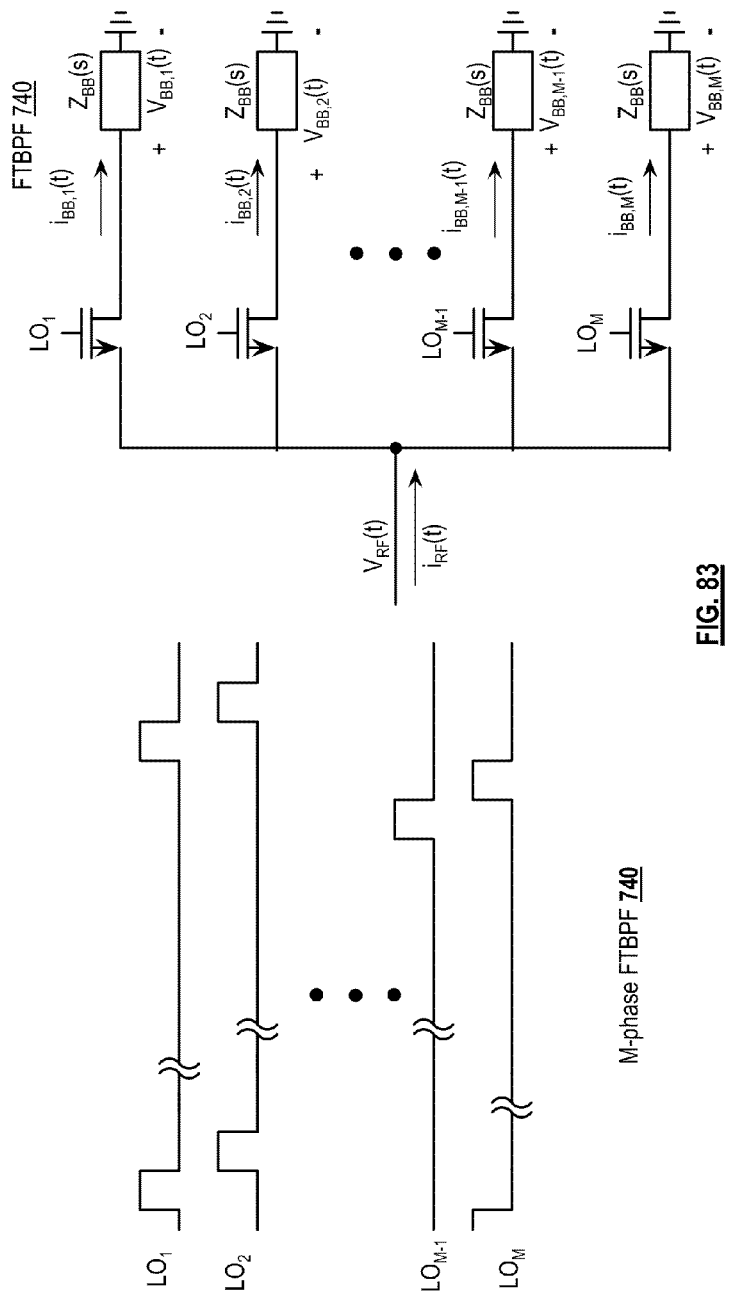
FIG. 83 is a schematic block diagram of an embodiment of an m-phase FTBPF (frequency translated bandpass filter) in accordance with the present invention.
FIG. 84 is a diagram of an example of a frequency response for an m-phase FTBPF in accordance with the present invention.

FIG. 83 is a schematic block diagram of an embodiment of a single-ended m-phase FTBPF (frequency translated band-pass filter) 740 that includes a plurality of transistors and m number of baseband impedances (e.g., $Z_{BB}(s)$), where m>=2. The baseband impedances (($Z_{BB}(s)$)) collectively provide a low-Q baseband filter, where each of the baseband impedances may be a capacitor, a switched capacitor filter, a switch capacitor resistance, and/or a complex impedance. Note that the impedance of each of the baseband impedances may be the same, different, or combination thereof. Further note that the impedances of each of baseband impedances may be adjusted via control signal from the SOC processing resources to adjust the properties of the low-Q baseband filter (e.g., bandwidth, attenuation rate, quality factor, etc.).

The low-Q baseband filter is frequency translated to the desired RF frequency to produce a high-Q RF or IF filter via the clock signals (e.g., $LO_1$-$LO_4$) provided by a clock generator. The differential high-Q RF filter filters a differential RF or IF signal such that desired signal components of the RF or IF signal are passed substantially unattenuated and undesired signal components (e.g., blockers, images, etc.) are attenuated.

FIG. 84 is a diagram of an example of a frequency response for an m-phase FTBPF 740 that illustrates the low-Q bandpass filter being frequency translated to a higher frequency (e.g., $f_{LO}$). fLO may corresponding to an RF frequency, an IF frequency, a local oscillation, or a combination thereof.

Figure 85:
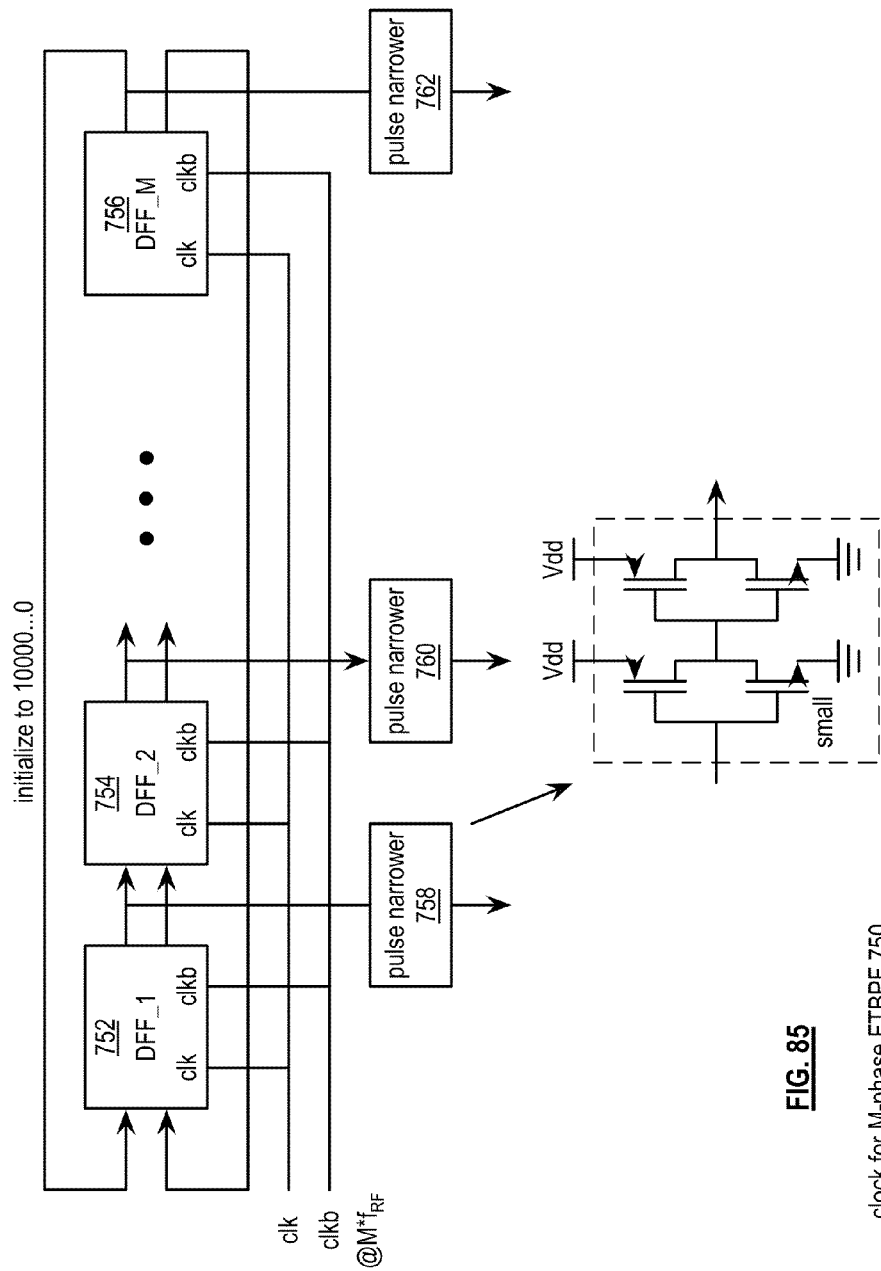
FIG. 85 is a schematic block diagram of an embodiment of a clock generator for an m-phase FTBPF in accordance with the present invention.

FIG. 85 is a schematic block diagram of an embodiment of a clock generator for an m-phase FTBPF 750. The clock generator includes a plurality of flip-flops (DFF) 752, 754, and 756 and a plurality of pulse narrower 758, 760, and 762. The flip-flops 752, 754, and 756 are clocked by a clock signal (clk) and a clock-bar signal (clkb) at a rate of $m*f_{RF}$. The resulting clock pulses from each flip-flop 752, 754, and 756 are pulse narrowed by the corresponding pulse narrower.

The pulse narrower 758, 760, and 762 includes two pairs of transistors coupled as shown. The lower left transistor is smaller than the others such that the rise time is slower than the fall time, thereby narrowing the pulse.

Figure 86:
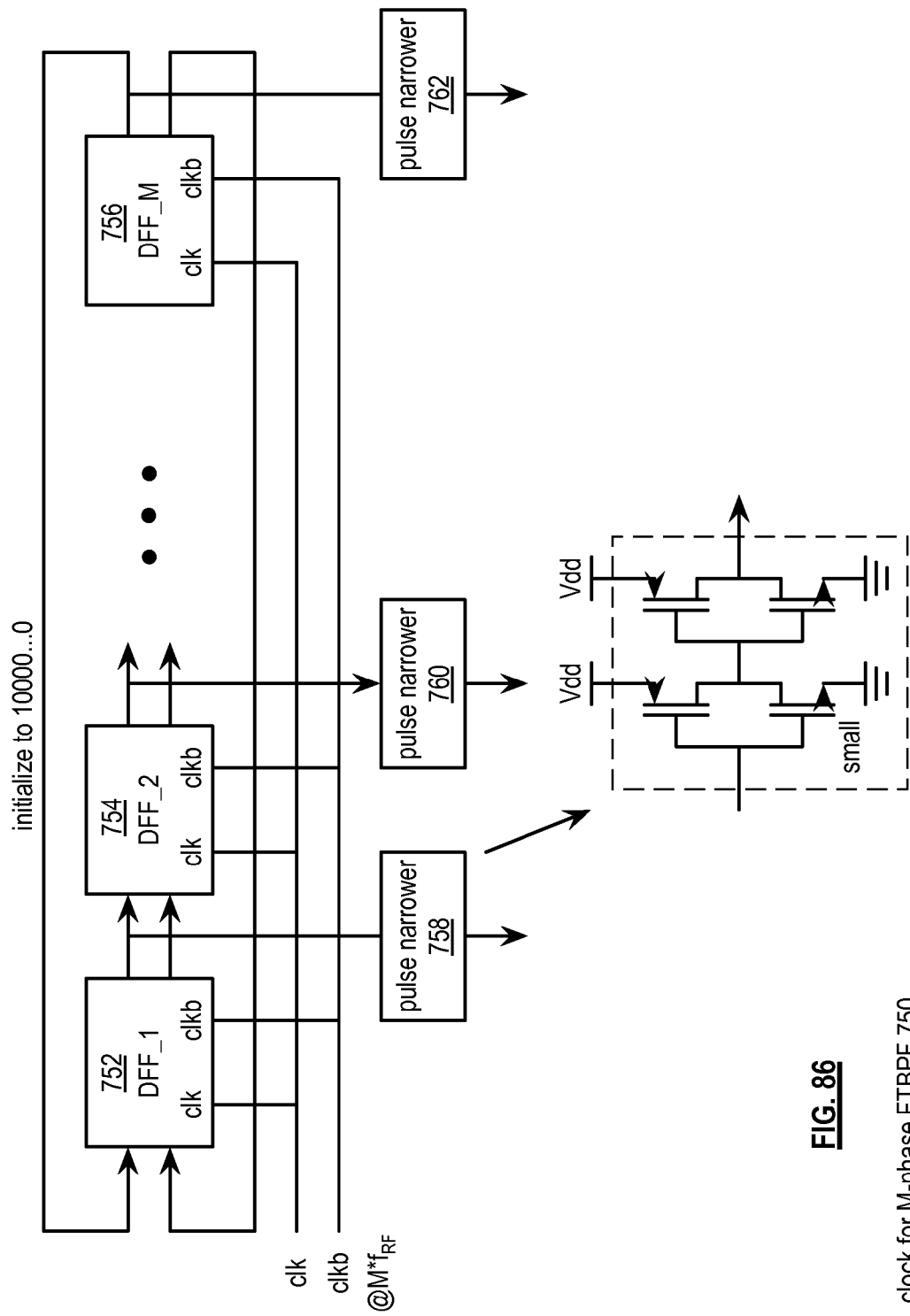
FIG. 86 is a schematic block diagram of another embodiment of a clock generator for an m-phase FTBPF in accordance with the present invention.

FIG. 86 is a schematic block diagram of another embodiment of a clock generator for an m-phase FTBPF 770. The clock generator includes a plurality of flip-flops (DFF) 772, 774, and 776 and a plurality of AND gates. The flip-flops 772, 774, and 776 are clocked by a clock signal (clk) and a clock-bar signal (clkb) at a rate of $\frac{1}{2}*m*f_{RF}$. The AND gates receive a non-inverted output from a first flip-flop 772 and the inverted output of the next flip-flop 774 to insure that consecutive clock pulses do not overlap.

Figure 87:
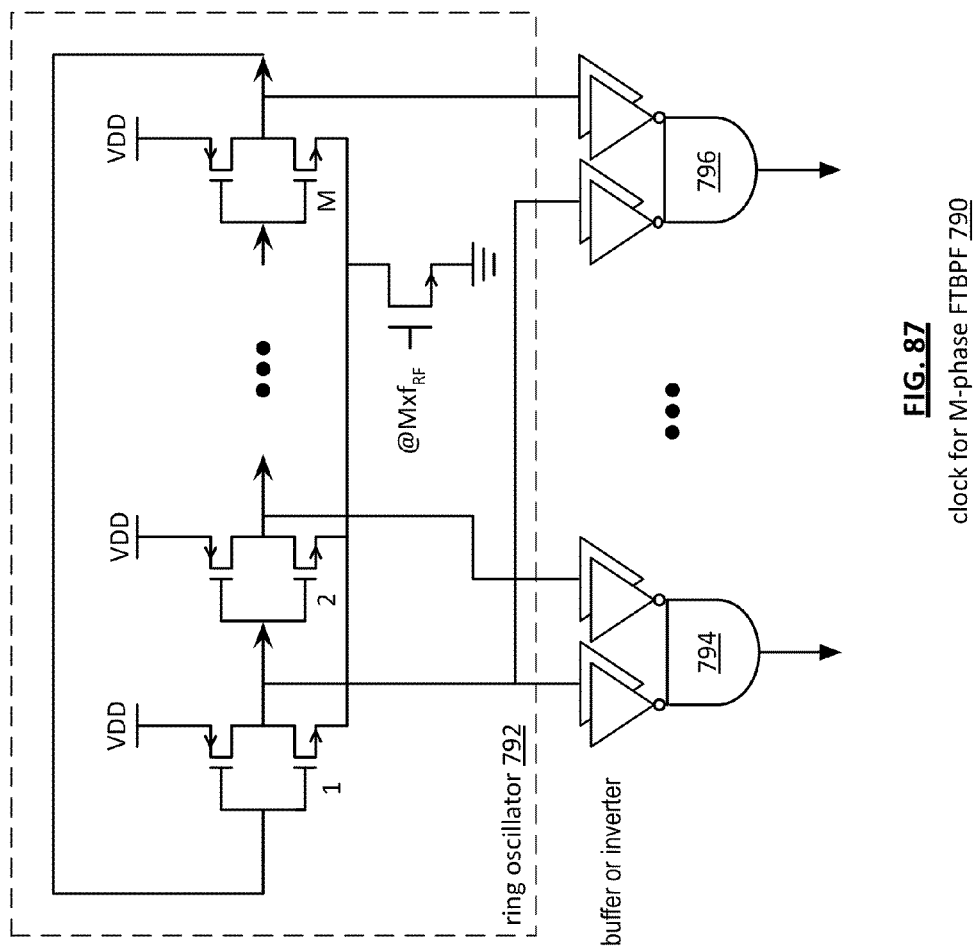
FIG. 87 is a schematic block diagram of another embodiment of a clock generator for an m-phase FTBPF in accordance with the present invention.

FIG. 87 is a schematic block diagram of another embodiment of a clock generator for an m-phase FTBPF 790. The clock generator includes a ring oscillator 792 and a plurality of logic circuits. Each logic circuit includes an AND gate and inverters or buffers. The ring oscillator 792 is gated at a clock rate of $m*f_{RF}$ (m is an odd number=to 3 or greater). Each of the logic circuits receives consecutive pulses of the ring oscillator 792 such that consecutive clock pulses do not overlap.

Figure 88:
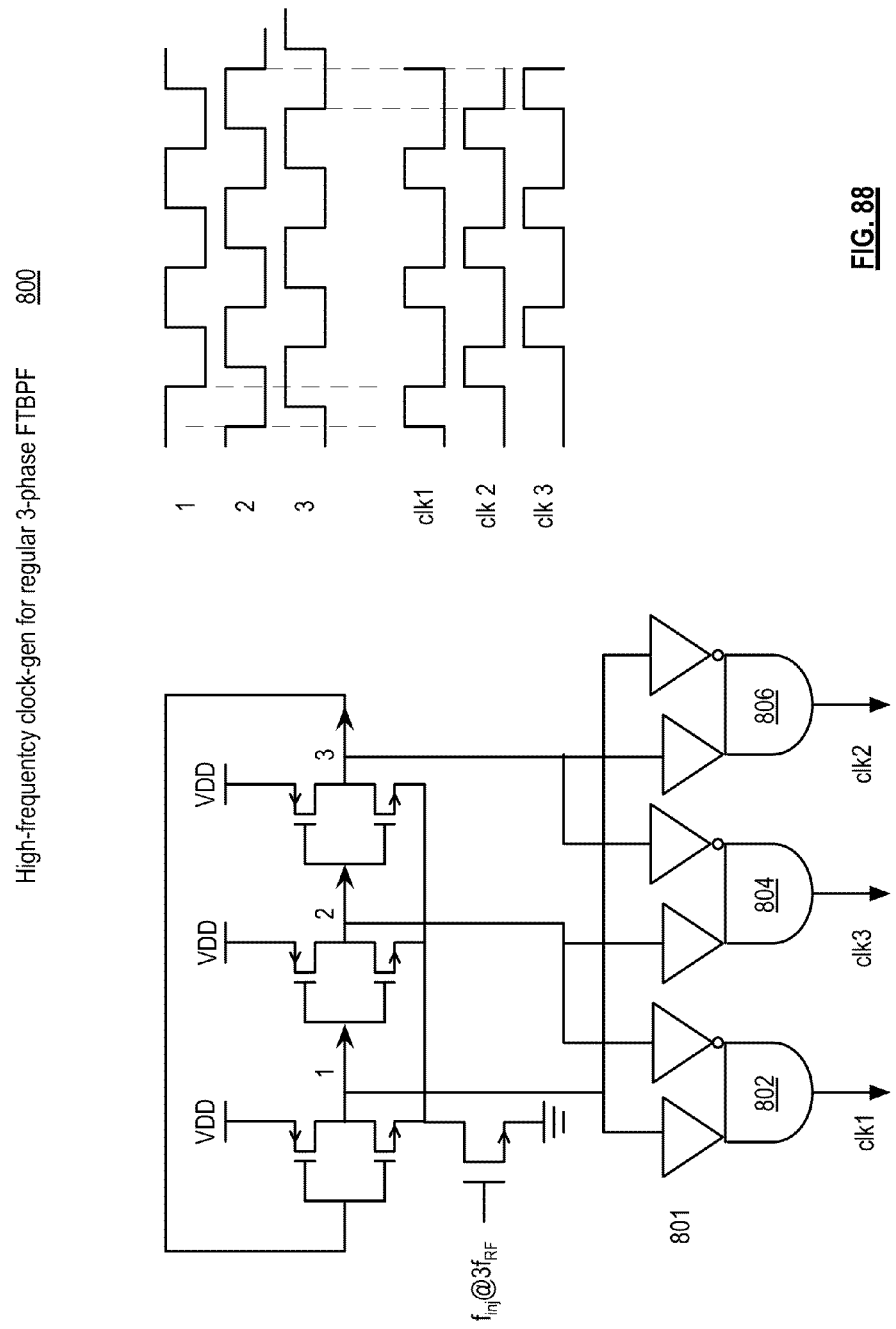
FIG. 88 is a schematic block diagram of an embodiment of a clock generator for a 3-phase FTBPF in accordance with the present invention.

FIG. 88 is a schematic block diagram of an embodiment of a clock generator for a 3-phase FTBPF 800 that includes a ring oscillator 792 and a plurality of logic circuits. Each of the logic circuits includes an AND gate and a combination of buffers and/or inverters. For instance, each of the logic circuits includes an AND gate, an inverter, and a buffer. The ring oscillator 792 is gated at a clock rate of $3*f_{RF}$. Via the logic circuits, the AND gates are skewed to produce the 1/3 duty cycle non-overlapping clocks (e.g., clk 1 802, clk 2 806, and clk 3 804).

Figure 89:
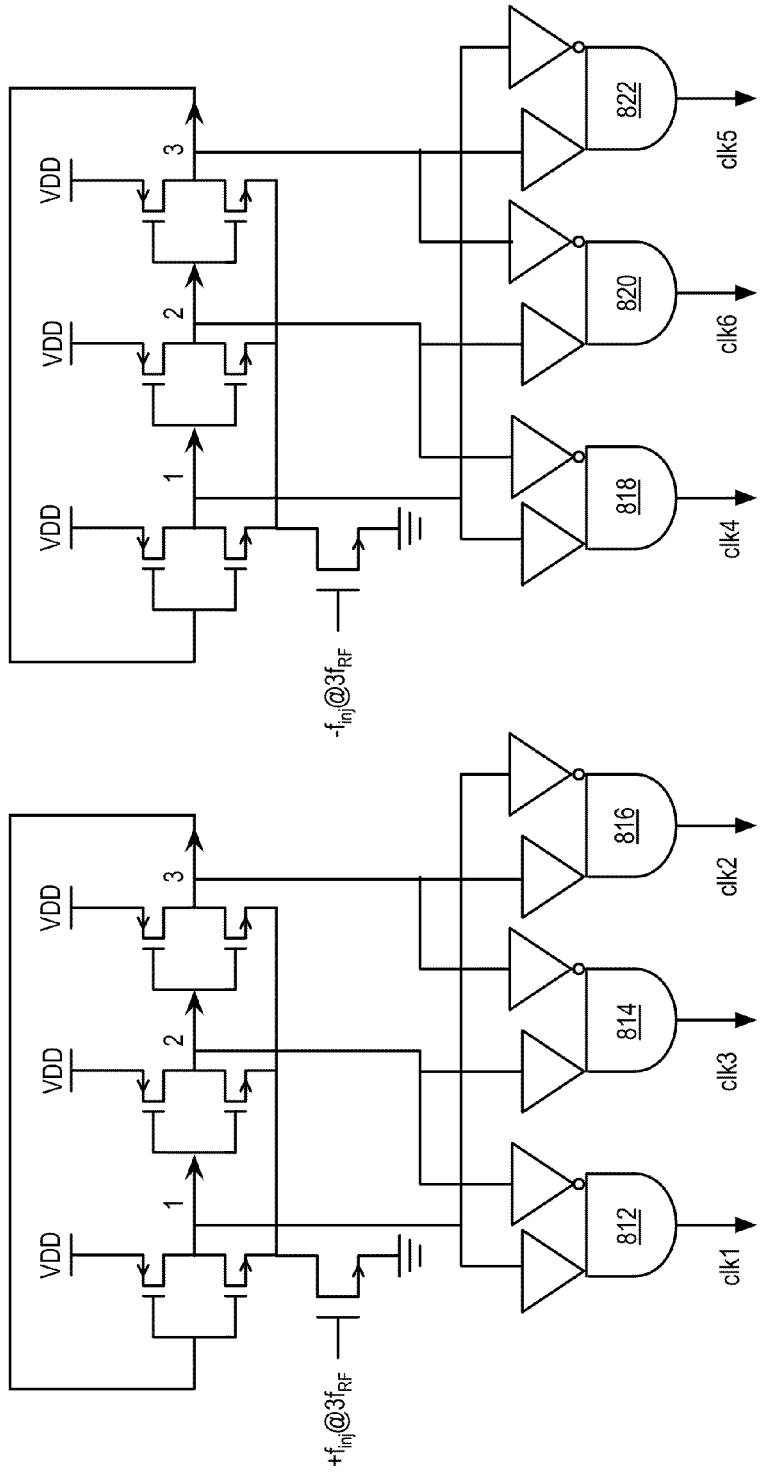
FIG. 89 is a schematic block diagram of another embodiment of a clock generator for a 3-phase FTBPF in accordance with the present invention.

FIG. 89 is a schematic block diagram of another embodiment of a clock generator for a 3-phase FTBPF 810 that includes two ring oscillators 792 and a plurality of logic gates. Each of the logic circuits includes an AND gate and a combination of buffers and/or inverters. For instance, each of the logic circuits includes an AND gate, an inverter, and a buffer. The first ring oscillator 792 is gated at a clock rate of $3*f_{RF}$ and the second ring oscillator 792 is gated at the inversion of $3*f_{RF}$ (e.g., $-3*f_{RF}$). In this configuration, clock signals 1-3 812, 814 and 816 are as shown in FIG. 88 and clock signals 4-6 818, 820 and 822 are the inversion of clocks 1-3, respectively.

Figure 90:
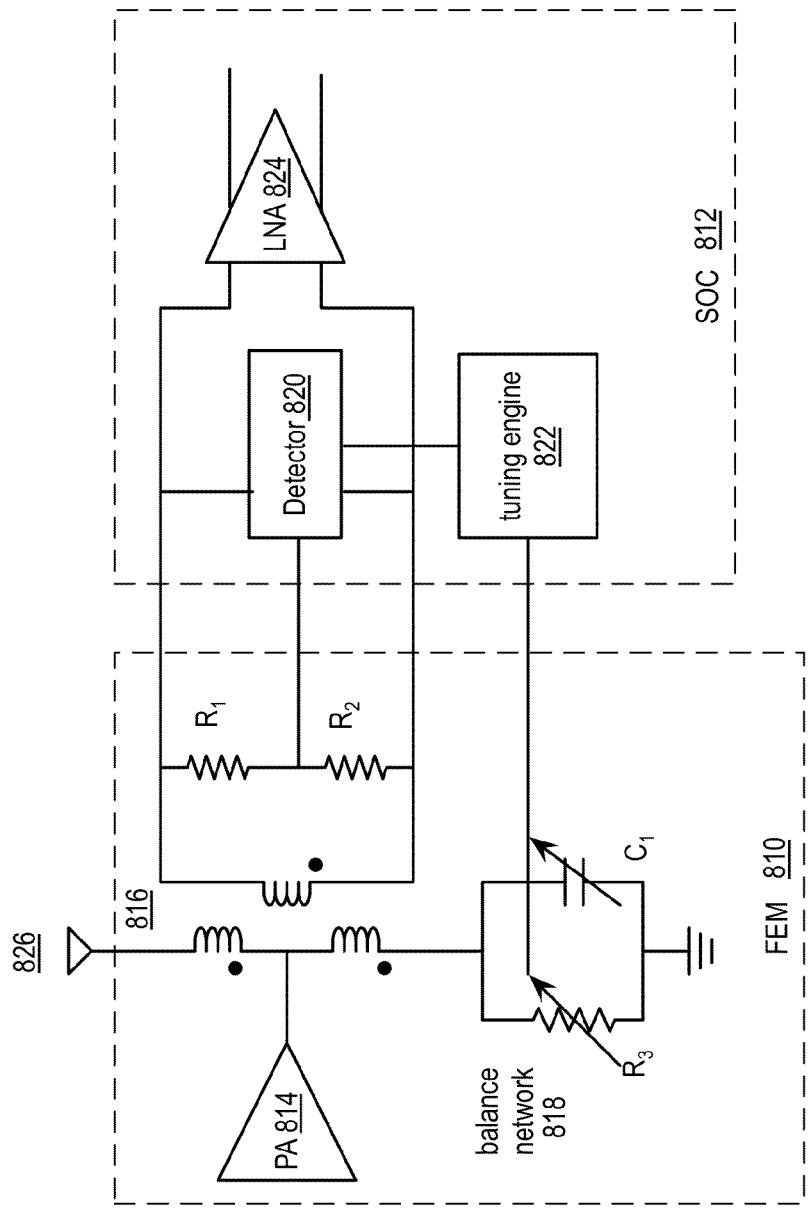
FIG. 90 is a schematic block diagram of an embodiment of a portion of each of a front-end module (FEM) and an SOC in accordance with the present invention.

FIG. 90 is a schematic block diagram of an embodiment of a portion of each of a front-end module (FEM) 810 and an SOC 812. The portion of the FEM 810 includes a power amplifier module (PA) 814, a duplexer, a balance network 818, and a common mode sensing circuit. The duplexer includes a transformer (or other structure such as a frequency selective duplexer and/or an electrical balance duplexer) and the balancing network 818 includes at least a variable resistor and at least one variable capacitor. The common mode sensing circuit includes a pair of resistors coupled across the secondary of the transformer. The portion of the SOC 812 includes a peak detector 820, a tuning engine 822, and a low noise amplifier module (LNA). Alternatively, the peak detector 820 and/or the tuning engine 822 may be within the FEM 810.

In an example of operation, the PA 814 supplies an outbound RF signal to the center tap of the dual winding primary of the transformer. Current of the outbound RF signal is split between the two windings proportional to the difference in impedance between the antenna and the balancing network 818. If the impedance of the balancing network 818 substantially matches the impedance of the antenna, the current is essentially equally split between the two windings.

With the winding configuration as shown, if the currents in the primary windings substantially match, their magnetic fields essential cancel each other in the secondary winding. Thus, the secondary has a substantially attenuated representation of the outbound RF signal. For an inbound RF signal, the two windings of the primary generate a magnetic corresponding to the current of the inbound RF signal. In this instance, the magnetic fields are added, thus producing twice the current in the secondary than in the primary (assuming each of the windings has the same number of turns). As such, the transformer amplifies the inbound RF signal.

If there is an imbalance between the impedance of the antenna and the impedance of the balancing network 818, an outbound RF signal current component will be present in the secondary (e.g., TX leakage). For example, assume that the current through the winding to the inductor is $i_{P1}$ and the current through the winding to the balance network 818 is $i_{P2}$. The TX leakage can be expressed as $i_{P1}-i_{P2}$. The resistors of the common mode sensing circuit sense the TX leakage. For instance, the voltage at the center node of the resistors equals VS$-(R_1*2i_R+R_1*i_{P2}-R_2*i_{P1})$, where VS is the voltage of the secondary and $2i_R$ is the current from the received inbound RF signal. Assuming $R_1=R_2$ and $i_{P1}=i_{P2}$, then the voltage at the center node equals ½ of VS. If, however, $i_{P1}$ does not equal $i_{P2}$, the voltage at the center node of the resistors will deviate from ½ VS proportionally to the difference.

The detector 820 detects the difference of the voltage at the center node of the resistors from ½ VS and provides an indication of the difference to the tuning engine 822. The tuning engine 822 interprets the difference and generates a control signal to adjust the impedance of the balance network.

For example, if $i_{P1}$ is greater than $i_{P2}$, then the common mode voltage of the sensing circuit (e.g., the center node of the resistors) will be greater than ½ VS, which indicates that the impedance of the balance network 818 is too high. As such, the tuning engine 822 generates a control signal that reduces the impedance of the balance network 818. As another example, if $i_{P1}$ is less than $i_{P2}$, then the common mode voltage of the sensing circuit will be less than ½ VS, which indicates that the impedance of the balance network is too low. As such, the tuning engine 822 generates a control signal that increases the impedance of the balance network 818.

The tuning engine 822 may interpret the common mode voltage deviation, determine a desired impedance for the balance network 818, and generate a control signal accordingly. Alternatively, the tuning engine 822 may iteratively generate control signals that adjust the impedance of the balancing network 818 in steps until the desired impedance is achieved. With either approach, the tuning engine 822 functions to keep the impedance of the balance network 818 substantially matching the impedance of the antenna (which varies over time, use, and/or environmental conditions) to minimize TX leakage.

Figure 91:
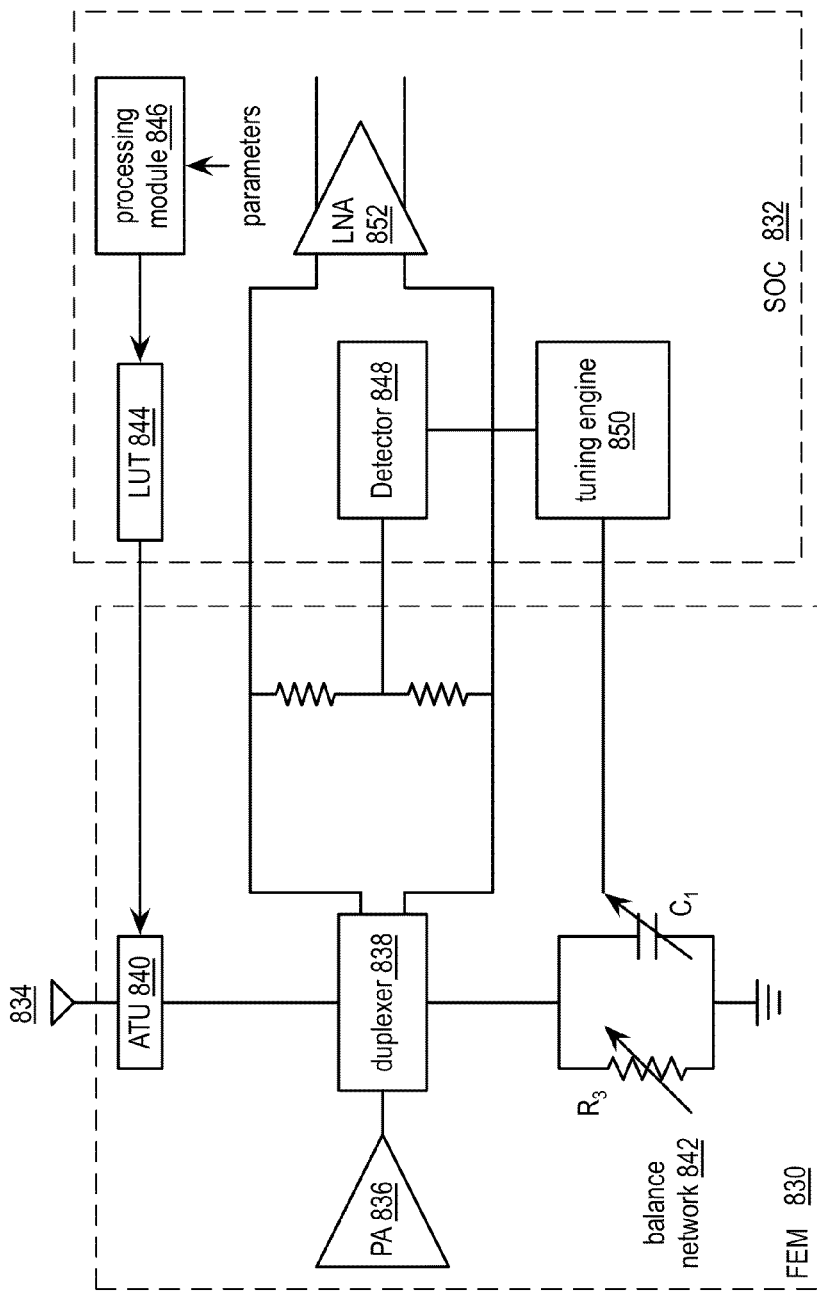
FIG. 91 is a schematic block diagram of another embodiment of a portion of each of a front-end module (FEM) and an SOC in accordance with the present invention.

FIG. 91 is a schematic block diagram of another embodiment of a portion of each of a front-end module (FEM 830) and an SOC 832. The portion of the FEM 830 includes a power amplifier module (PA 836), a duplexer 838, a balance network 842, an antenna tuning unit (ATU 840), and a common mode sensing circuit. The duplexer 838 includes a transformer (or other structure such as a frequency selective duplexer 838 and/or an electrical balance duplexer 838) and the balancing network includes at least a variable resistor and at least one variable capacitor. The common mode sensing circuit includes a pair of resistors coupled across the secondary of the transformer. The portion of the SOC 832 includes a peak detector 848, a tuning engine 850, a look up table (LUT) 844, the processing module 846, and a low noise amplifier module (LNA 852). Alternatively, the peak detector 848 and/or the tuning engine 850 may be within the FEM 830.

In addition to the functionality provided by the common mode sensing circuit (i.e., the resistors), the detector 848, the tuning engine 850, and the balance network 842 to balance the impendence of the balance network 842 with the impedance of the antenna (as described with reference to FIG. 90), the FEM 830 includes the ATU 840. The ATU 840 includes one or more fixed passive components and/or one or more variable passive components. For example, the ATU 840 may include a variable capacitor-inductor circuit, a variable capacitor, a variable inductor, etc.

In an example of operation, the PA 836 provides an amplified outbound RF signal to the duplexer 838, which may include a transformer that functions as described with reference to FIG. 90. The duplexer 838 outputs the amplified outbound RF signal to the ATU 840, which is tuned via settings stored in the LUT 844 to provide a desired antenna matching circuit (e.g., impedance matching, quality factor, bandwidth, etc.). The ATU 840 outputs the outbound RF signal to the antenna for transmission.

For an inbound RF signal, the antenna receives the signal and provides it to the ATU 840, which in turn provides it to the duplexer 838. The duplexer 838 outputs the inbound RF signal to the LNA 852 and the common mode sensing circuit. The common mode sensing circuit, the detector 848, the tuning engine 850, and the balance network 842 functions as previously described with reference to FIG. 90.

The processing module 846 is operable to monitor various parameters of the FEM 830. For instance, the processing module 846 may monitor the antenna impedance, the transmit power, the performance of the PA 836 (e.g., gain, linearity, bandwidth, efficiency, noise, output dynamic range, slew rate, rise rate, settling time, overshoot, stability factor, etc.), received signal strength, SNR, SIR, adjustments made by the tuning engine 850, etc. The processing module 846 interprets the parameters to determine if performance of the FEM 830 may be further optimized. For example, the processing module 846 may determine that an adjustment to the ATU 840 will improve PA 836 performance. In this case, the processing module 846 addresses the LUT 844 to provide a desired setting to the ATU 840. If this change in the ATU 840 affects the impedance balance between the ATU 840 and the balance network 842, the tuning engine 850 makes an appropriate adjustment.

In an alternate embodiment, the processing module 846 provides the functionality of the tuning engine 850 and balances adjustments to the ATU 840 and to the balance network 842 to achieve a desired performance of the FEM 830. In yet another alternate embodiment, the balance network 842 is fixed and the ATU 840 provides the desired adjusts in the FEM 830 to achieve impedance balance and to achieve the desired performance of the FEM 830.

Figure 92:
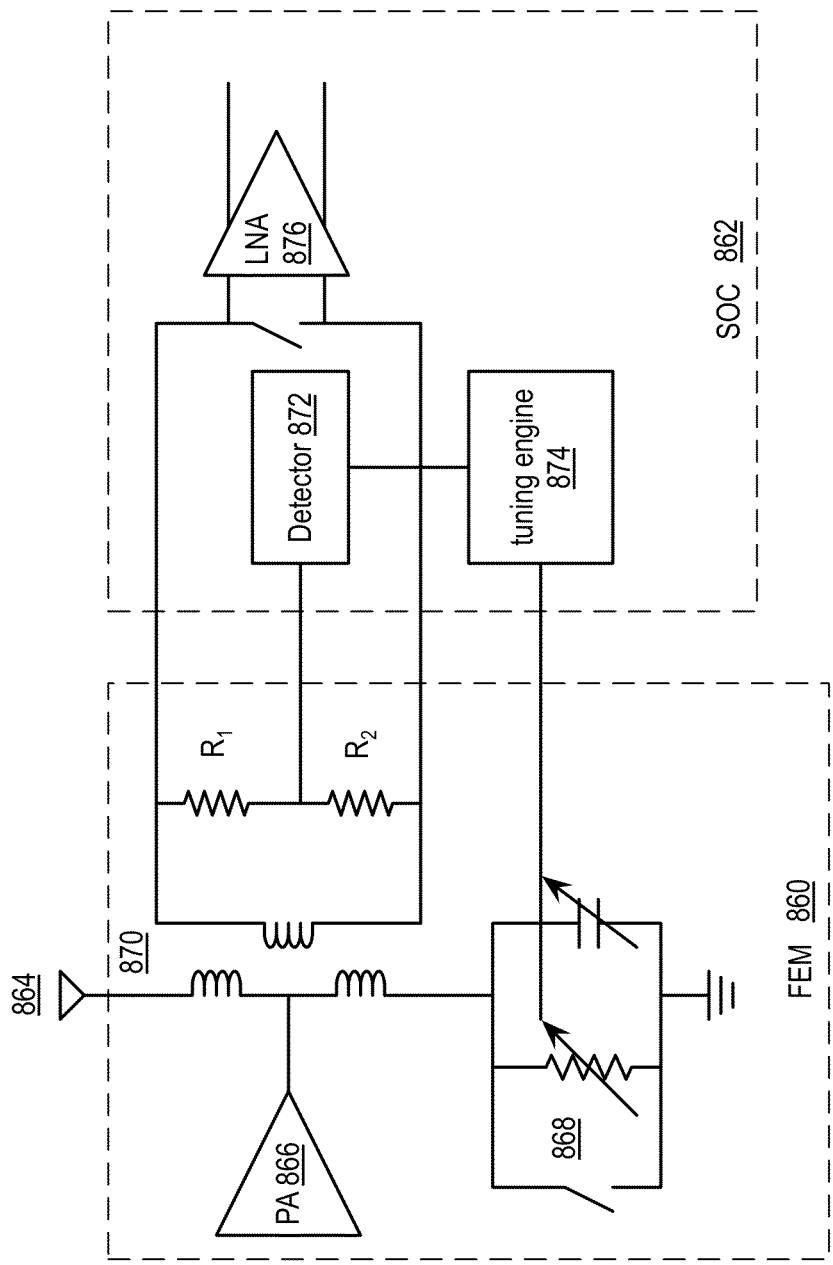
FIG. 92 is a schematic block diagram of another embodiment of a portion of each of a front-end module (FEM) and an SOC in accordance with the present invention.

FIG. 92 is a schematic block diagram of another embodiment of a portion of each of a front-end module (FEM 860) and an SOC 862 for 2G and 3G cellular telephone operations. The portion of the FEM 860 includes a power amplifier module (PA 866), a duplexer, a balance network, and a common mode sensing circuit. The duplexer includes a transformer (or other structure such as a frequency selective duplexer and/or an electrical balance duplexer) and the balancing network includes a switch, at least a variable resistor, and at least one variable capacitor. The common mode sensing circuit includes a pair of resistors coupled across the secondary of the transformer. The portion of the SOC 862 includes a peak detector 872, a tuning engine 874, a switch, and a low noise amplifier module (LNA 876). Alternatively, the peak detector 872 and/or the tuning engine 874 may be within the FEM 860.

In this embodiment, the duplexer is optimized for frequency division duplex (FDD), which is used in 3G cellular telephone applications and the balancing network switch and the LNA 876 switch are open. In time division duplex (TDD), which is used in 2G cellular telephone applications, the balancing network is shorted via the switch. This essentially removes the 3-dB theoretical insertion loss limit and leaves just implementation loss. Note that for 2G transmissions, the LNA 876 switch is closed and, for 2G receptions, the LNA 876 switch is open. Further note that for 3G mode, the FEM and SOC 862 function as previously discussed with reference to FIGS. 90 and/or 91.

Figure 93:
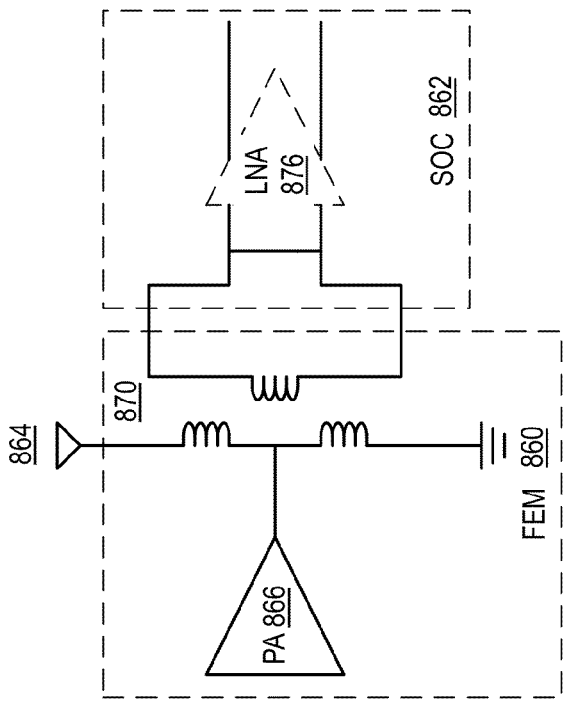
FIG. 93 is a schematic block diagram of an embodiment of a portion of each of a front-end module (FEM) and an SOC in 2G TX mode in accordance with the present invention.

FIG. 93 is a schematic block diagram of an embodiment of a portion of each of a front-end module (FEM 860) and an SOC 862 of FIG. 92 in 2G TX mode. In the mode, the LNA 876 switch shorts the LNA 876 and the balance network switch shorts the balance network. With a short across the secondary winding, the primary windings are essentially shorted. Thus, the PA 866 is effectively directly coupled to the antenna.

Figure 94:
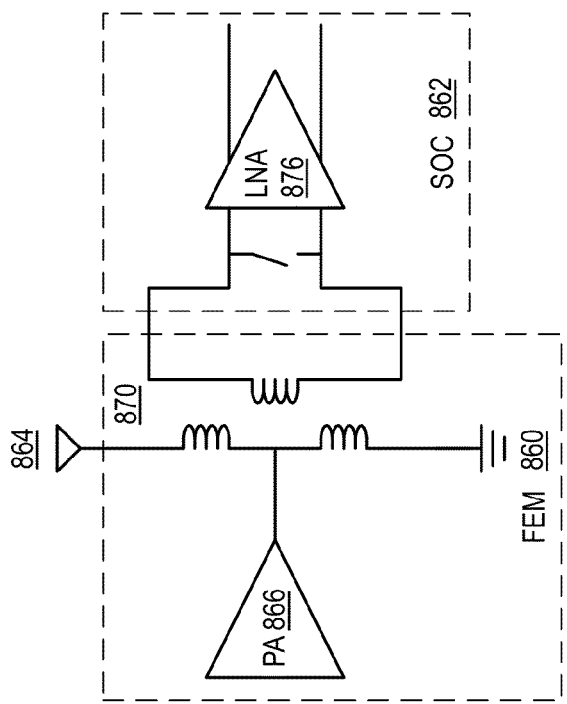
FIG. 94 is a schematic block diagram of an embodiment of a portion of each of a front-end module (FEM) and an SOC in 2G RX mode in accordance with the present invention.

FIG. 94 is a schematic block diagram of an embodiment of a portion of each of a front-end module (FEM 860) and an SOC 862 of FIG. 92 in 2G RX mode. In this mode, the LNA switch is open and the balance network switch is closed, thus shorting the balance network. In this configuration, the transformer is function as a transformer balun for the receiver section.

Figure 95:
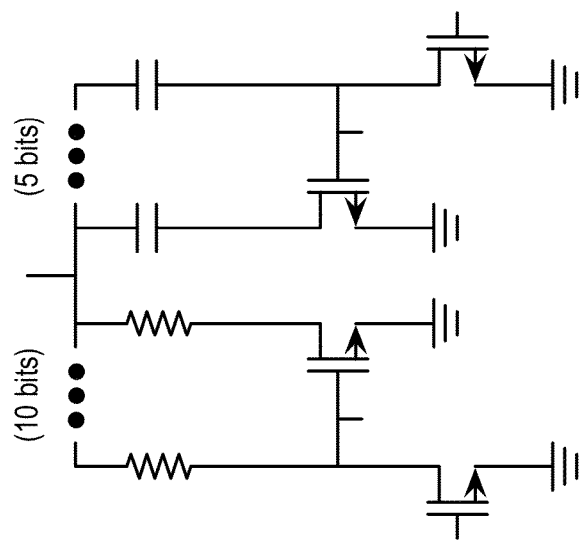
FIG. 95 is a schematic block diagram of an embodiment of a small signal balancing network in accordance with the present invention.

FIG. 95 is a schematic block diagram of an embodiment of a small signal balancing network 880 that includes a plurality of transistors, plurality of resistors, and a plurality of capacitors. The selection of resistors to include in the balance network may be controlled by a multi-bit signal (e.g., 10 bits) and the selection of capacitors to include in the balance network may be controlled by another multi-bit signal (e.g., 5 bits).

For example, if the resistor side of the balance network includes four resistor-transistor circuits, wherein the common node of the one of the resistor-transistor circuits is coupled to the gate of the preceding resistor-transistor circuits. In this example, each of the gates also is coupled to receive a bit of a 4-bit control signal. For instance, the gate of the left outer-most resistor-transistor circuit receives the most significant bit, the gate of the next left most resistor-transistor circuit receives the next most significant bit, and so on. Further, the resistor of the left most resistor-transistor circuit is R4, the resistor of the next left most resistor-transistor circuit is R3, and so on. Thus, for this example, when the 4-bit control signal is 0001, only the right most resistor transistor circuit is on and its resistor, R1, provides the resulting resistance. When the 4-bit control signal is 0011, the two right most resistor-transistor circuits are on and the resulting resistance is R1//R2. When the 4-bit control signal is 0111, the three right most resistor-transistor circuits are on and the resulting resistance is R1//R2//R3. When the 4-bit control signal is 1111, all four resistor-transistor circuits are on and the resulting resistance is R1//R2//R3//R4. The capacitor side of the balance network functions in a similar manner.

As an alternative embodiment, each resistor-transistor circuit and each capacitor-transistor circuit may be independently controlled by a bit of the corresponding control signals. For a four resistor-transistor circuit configuration as described in the preceding paragraph as modified herein, a control signal of 1000 would yield a resistance of R4; a control signal of 0100 would yield a resistance of R3; a control signal of 1010 would yield a resistance of R4//R2; and so on.

Figure 96:
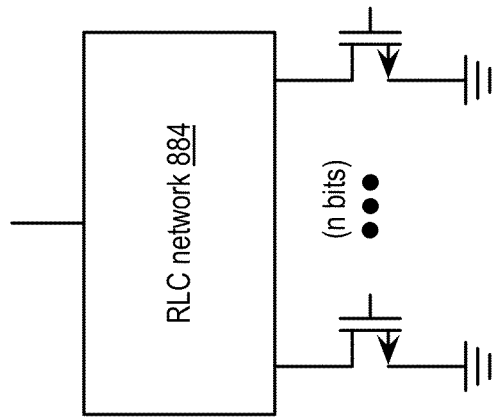
FIG. 96 is a schematic block diagram of an embodiment of a large signal balancing network in accordance with the present invention.

FIG. 96 is a schematic block diagram of an embodiment of a large signal balancing network 882 that includes an RLC (resistor-inductor-capacitor) network and a plurality of transistors. The transistors are gated on and off to provide different combinations of resistors, inductors, and/or capacitors of the RIC network to provide the desired impedance of the balance network. In this instance, the transistors have a relatively small voltage swing, and thus lower voltage transistors can be used.

Figure 97:
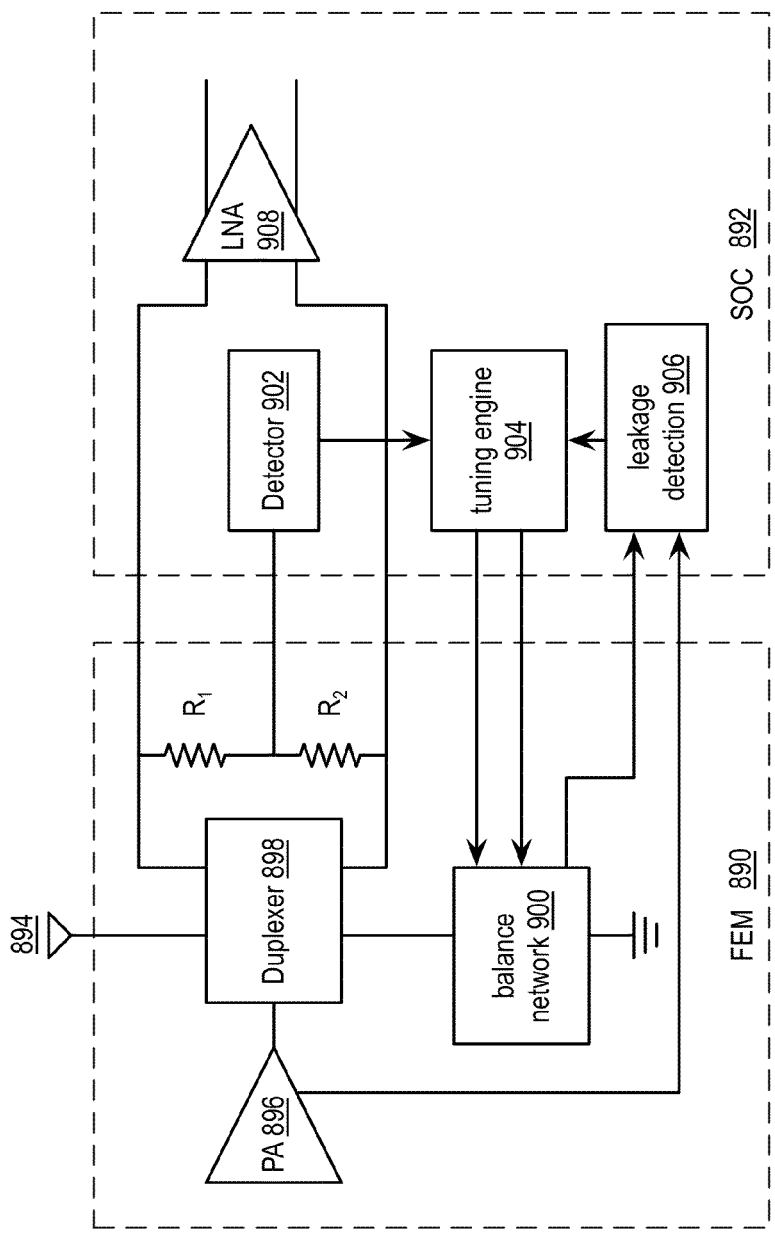
FIG. 97 is a schematic block diagram of another embodiment of a portion of each of a front-end module (FEM) and an SOC in accordance with the present invention.

FIG. 97 is a schematic block diagram of another embodiment of a portion of each of a front-end module (FEM 890) and an SOC 892. The portion of the FEM 890 includes a power amplifier module (PA 896), a duplexer 898, a balance network 900, and a common mode sensing circuit. The duplexer 898 includes a transformer (or other structure such as a frequency selective duplexer 898 and/or an electrical balance duplexer 898) and the balancing network includes at least a variable resistor and at least one variable capacitor. The common mode sensing circuit includes a pair of resistors coupled across the secondary of the transformer. The portion of the SOC includes a peak detector 902, a tuning engine 904, a leakage detection 906 module, and a low noise amplifier module (LNA 908). Alternatively, the peak detector 902, the leakage detection 906 module, and/or the tuning engine 904 may be within the FEM 890.

This embodiment functions similarly to the embodiment of FIG. 90 with the inclusion of the leakage detection 906 module. The leakage module functions to detect variations of the transistor on-resistance of the circuits within the balance network 900 in accordance with the PA 896 output. For instance, as the PA 896 output increases, it causes the on-resistance of the transistors within the balance network 900 to change. Such changes affect the overall impedance of the balance network 900. Accordingly, the leakage detection 906 module detects the on-resistance changes and provides a representative signal to the tuning engine 904 and/or the processing module (as shown in FIG. 91).

Based on the input for the leakage detection 906 module, the tuning engine 904 adjusts the impedance of the balance network 900. Alternatively, or in addition to, the processing module uses the input from the leakage detection 906 module to adjust the setting of the ATU. Regardless of the particular method, variations in on-resistance of the transistors in the balance network 900 and/or of the transistors in the power amplifier are compensated.

Figure 98:
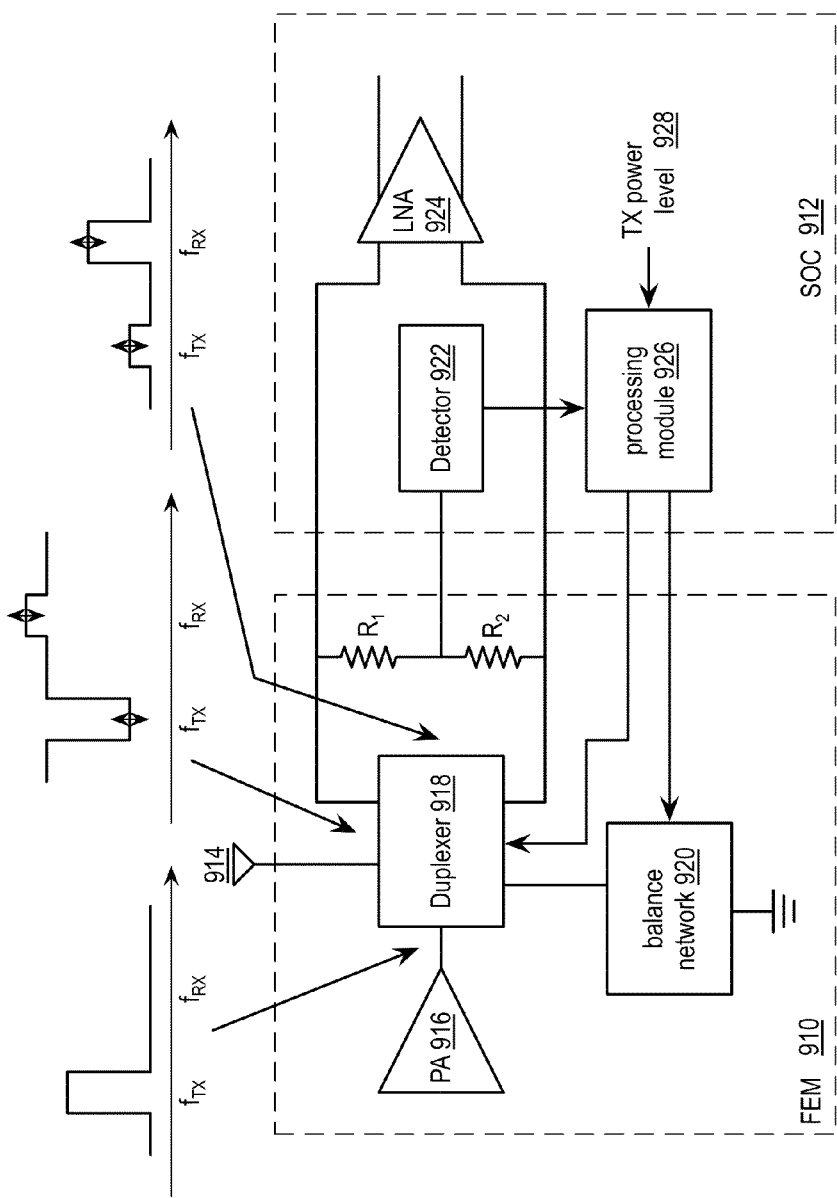
FIG. 98 is a schematic block diagram of another embodiment of a portion of each of a front-end module (FEM) and an SOC in accordance with the present invention.

FIG. 98 is a schematic block diagram of another embodiment of a portion of each of a front-end module (FEM 910) and an SOC 912. The portion of the FEM 910 includes a power amplifier module (PA 916), a duplexer 918, a balance network 920, and a common mode sensing circuit. The duplexer 918 includes a transformer (or other structure such as a frequency selective duplexer 918 and/or an electrical balance duplexer 918) and the balancing network includes at least a variable resistor and at least one variable capacitor. The common mode sensing circuit includes a pair of resistors coupled across the secondary of the transformer. The portion of the SOC 912 includes a peak detector 922, a processing module 926 (which includes the function of the tuning engine), and a low noise amplifier module (LNA 924). Alternatively, the peak detector 922 and/or the tuning engine may be within the FEM 910.

This embodiment functions similar to that of FIG. 90 with the ability to adjust the TX attenuation and/or RX gain of the duplexer 918. For instance, when the transmit power is relatively low (e.g., is a smaller blocker for the inbound RF signal and/or in the signal strength of the inbound RF signal is relatively high), the processing module 926 provides a signal to the duplexer 918 such that the duplexer 918 reduces the TX attenuation, thereby reducing insertion loss.

In an example, if the duplexer 918 includes the transformer of FIG. 90, and/or other type of frequency-selective duplexer 918, part of the filter can be shorted to improve the loss at the expense of less isolation. In another example, if the duplexer 918 includes an electrical-balance duplexer, the isolation can be traded-off for isolation from the balancing network.

Figure 99:
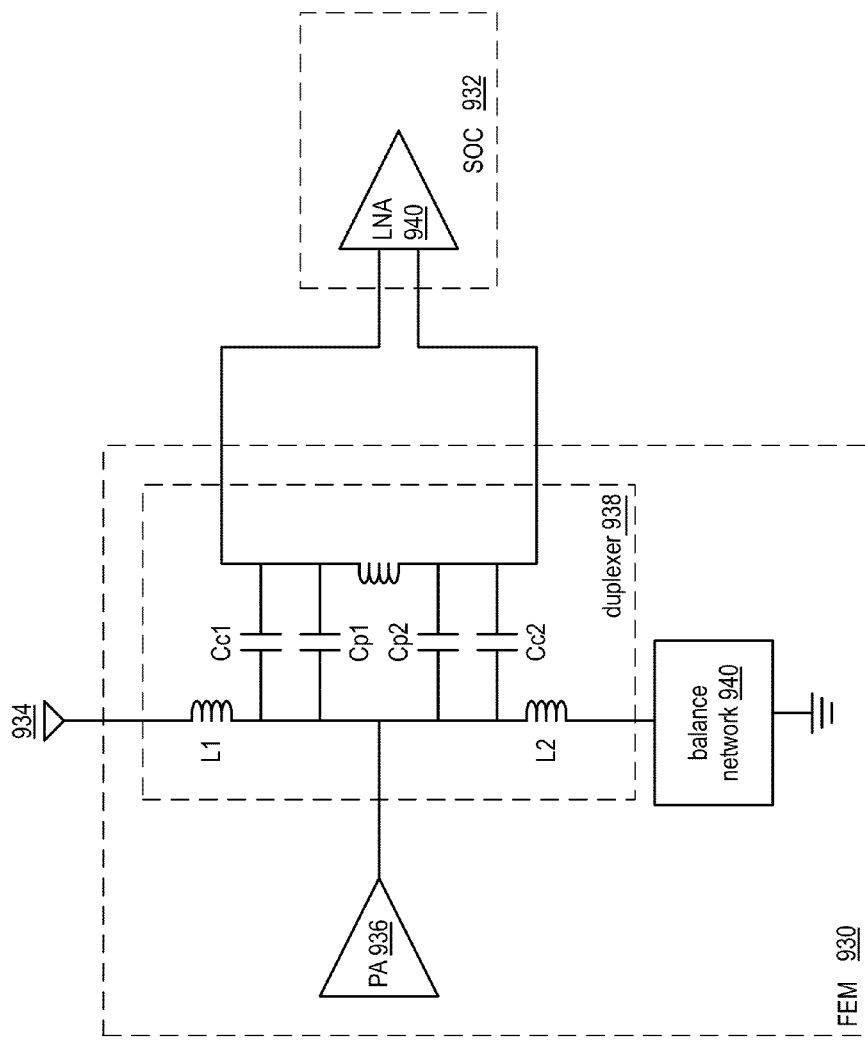
FIG. 99 is a schematic block diagram of another embodiment of a portion of each of a front-end module (FEM) and an SOC in accordance with the present invention.

FIG. 99 is a schematic block diagram of another embodiment of a portion of each of a front-end module (FEM 930) and an SOC 932. The portion of the FEM 930 includes a power amplifier module (PA 936), a duplexer 938, and a balance network 940. The duplexer 938 includes a transformer (or other structure such as a frequency selective duplexer 938 and/or an electrical balance duplexer 938), parasitic capacitance, and compensating capacitors, and the balancing network includes at least a variable resistor and at least one variable capacitor. The portion of the SOC 932 includes a peak detector, a processing module (which includes the function of the tuning engine), and a low noise amplifier module (LNA 940). Only the LNA 940 is shown.

In this embodiment, the compensation capacitors are added to compensate for mismatches of the parasitic capacitances (e.g., Cp1 and Cp2), which may result due to a mismatch between the windings of the primary (e.g., L1 and L2). As such, the compensating capacitors (Cc1 and Cc2) are selected such that Cp1+Cc1=Cp2+Cc2. By adding the compensation capacitors, the isolation bandwidth of the duplexer 938 is greater than without the compensation capacitors.

FIG. 100 is a schematic block diagram of another embodiment of a portion of each of a front-end module (FEM 950) and an LNA 952. The portion of the FEM 950 includes the power amplifier module (PA 954), the duplexer 956, and the balance network 958. The duplexer 956 includes the transformer (or other structure such as a frequency selective duplexer and/or an electrical balance duplexer 956), which has parasitic capacitance (Cp3 and Cp4). The LNA 952 includes input transistors, which have parasitic capacitance (Cp), bias transistors, an inductor (L3), and load impedances (Z). With the inclusion of L3 in the LNA 952, common mode isolation of the duplexer 956 and LNA 952 is improved in comparison with conventional LNA 952 input configurations.

FIG. 101 is a schematic block diagram of an embodiment of an equivalent circuit of a portion of each of a front-end module (FEM) and an LNA of FIG. 100. This diagram illustrates how the common mode isolation is improved. Imbalanced currents coupled to the secondary winding (L) by the transformer's parasitic capacitance (Cp3 and Cp4), are coupled to separate tank circuits formed by the inductor (L3) and the parasitic capacitance of the input transistors. The tank circuits provide a high differential impedance, but a low common mode impedance.

Figure 102:
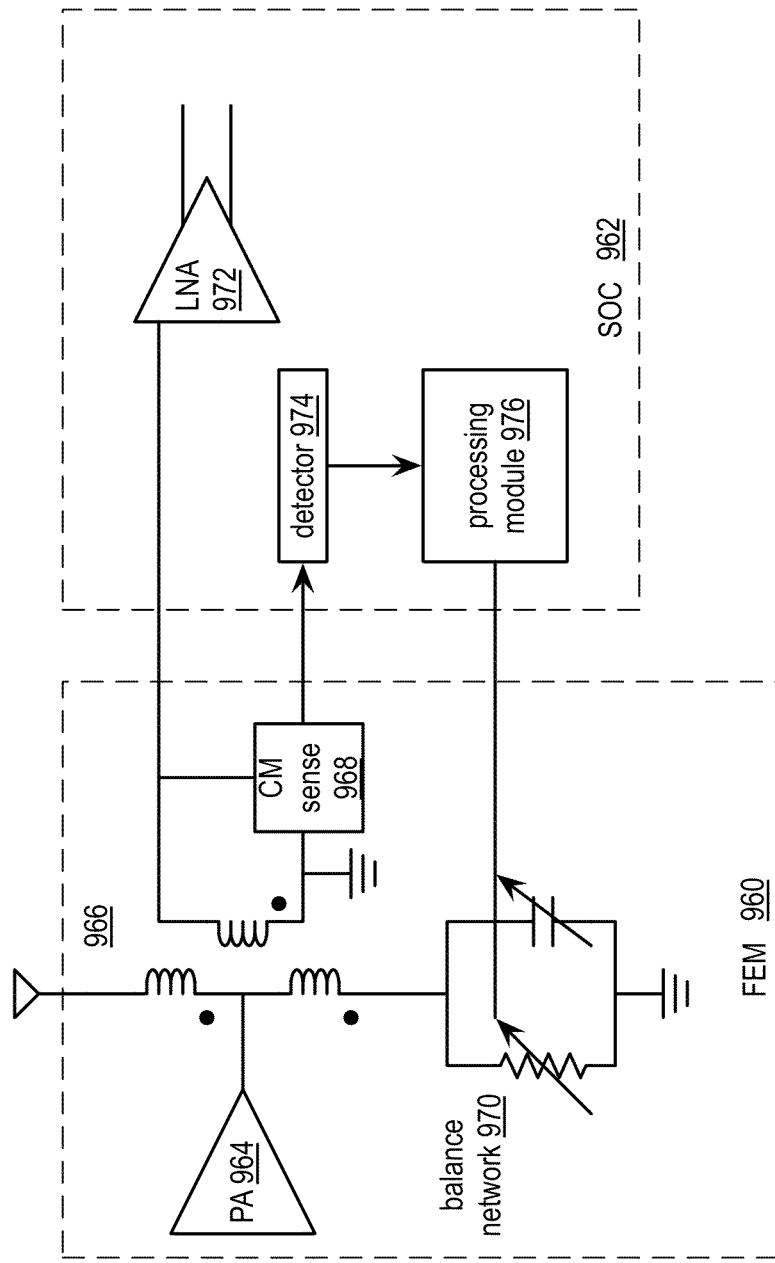
FIG. 102 is a schematic block diagram of another embodiment of a portion of each of a front-end module (FEM) and an LNA in accordance with the present invention.

FIG. 102 is a schematic block diagram of another embodiment of a portion of each of a front-end module (FEM 960) and an SOC 962. The portion of the FEM 960 includes a power amplifier module (PA), a duplexer, a balance network 970, and a common mode sensing circuit. The duplexer includes a transformer (or other structure such as a frequency selective duplexer and/or an electrical balance duplexer) and the balancing network includes at least a variable resistor and at least one variable capacitor. The common mode sensing circuit includes a pair of resistors coupled across the secondary of the transformer. The portion of the SOC 962 includes a peak detector 974, a processing module 976 (which performs the function of the tuning engine), and a single-ended low noise amplifier module (LNA 972). Alternatively, the peak detector 974 and/or the tuning engine may be within the FEM 960.

In this embodiment, the common-mode isolation is substantially eliminated by the use of a single-ended LNA 972. The other components of the FEM 960 and SOC 962 shown in this figure function as previously discussed.

Figure 103:
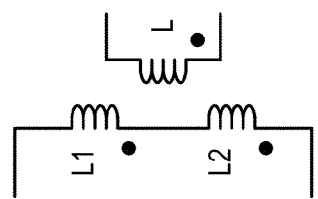
FIG. 103 is a schematic block diagram of an embodiment of a transformer balun in accordance with the present invention.

FIG. 103 is a schematic block diagram of an embodiment of a transformer of the duplexer. The transformer includes the primary windings (L1 & L2) and a secondary winding (L2). The primary windings each have the same number of turns; the secondary winding may have the same number of turns as a primary winding or different number of turns. The orientation of the windings is as shown.

Figure 104:
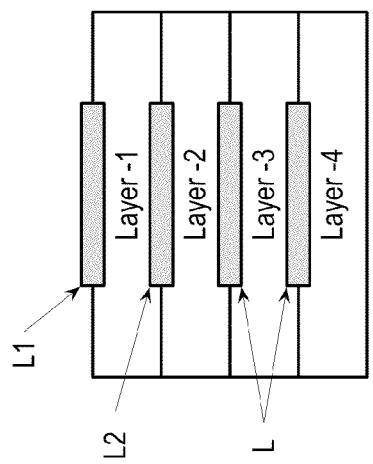
FIG. 104 is a diagram of an example of an implementation of a transformer balun in accordance with the present invention.

FIG. 104 is a diagram of an example of an implementation of a transformer implemented on 4 thick metal layers of an integrated circuit, of an IC packaging substrate, and/or on a printed circuit board. The primary windings are on the top two layers and the secondary winding is on the two lower layers. A first winding of the secondary on one layer may be connected in series or in parallel with the other winding of the secondary on the other layer.

Figure 105:
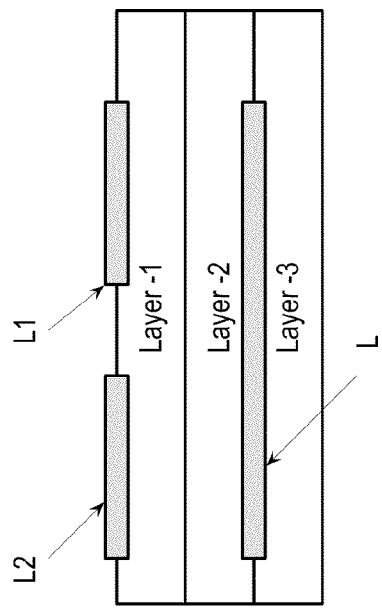
FIG. 105 is a diagram of another example of an implementation of a transformer balun in accordance with the present invention.

FIG. 105 is a diagram of another example of an implementation of a transformer on 3 thick metal layers of an IC, of an IC package substrate, and/or of a printed circuit board. The primary windings are on the top layer and use the next layer for interconnections. One or both of the primary windings may be rotated by 90°. The secondary winding is on the third lower layers.

Figure 106:
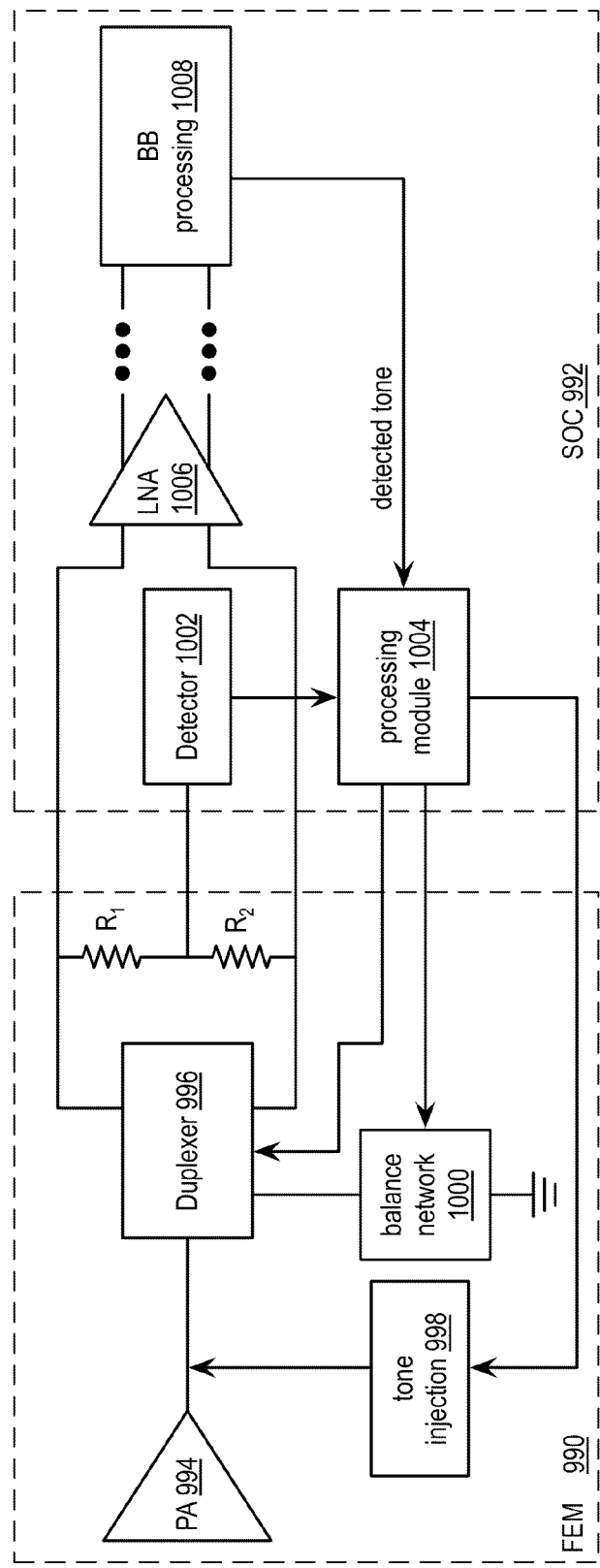
FIG. 106 is a schematic block diagram of another embodiment of a portion of each of a front-end module (FEM) and an LNA in accordance with the present invention.

FIG. 106 is a schematic block diagram of another embodiment of a portion of each of a front-end module (FEM 990) and an SOC 992. The portion of the FEM 990 includes a power amplifier module (PA 994), a duplexer 996, a balance network 1000, a tone injection 998 module, and a common mode sensing circuit. The duplexer 996 includes a transformer (or other structure such as a frequency selective duplexer 996 and/or an electrical balance duplexer 996) and the balancing network includes at least a variable resistor and at least one variable capacitor. The common mode sensing circuit includes a pair of resistors coupled across the secondary of the transformer. The portion of the SOC k includes a peak detector 1002, a processing module 1004 (which performs the function of the tuning engine), a baseband processing unit, and a low noise amplifier module (LNA 1006). Alternatively, the peak detector 1002 and/or the tuning engine may be within the FEM 990.

In an example of operation, the common mode sensing circuit, the tuning engine, the detector 1002 and the balance network 1000 function as previously discussed. In many instances, these components reduce the transmitter (TX) and/or receiver (RX) noise in the receiver band below or comparable to the noise floor of the LNA 1006. With the TX and/or RX noise at or below the noise floor, it is difficult to track, which makes it difficult to track the impedance of the antenna.

To improve the tracking of the antenna impedance, the tone injection 998 module injects a tone in the receiver frequency band (e.g., $A \cos(\omega_{RX\_RF}(t))$). The duplexer 996 attenuates the RX tone differently than a TX signal because it is in the RX band and the duplexer 996 and balance network 1000 are tuned for the TX band. As such, a readily detectable leakage signal is produced on the RX side of the duplexer 996 (e.g., on the secondary of the transformer).

The RX tone-based leakage signal is propagated through the receiver section until it is converted into a baseband signal. At baseband, the tone amplitude is a measure of the RX band isolation. From the measure of RX band isolation, the antenna's impedance can be determined. As the antenna impedance changes, the antenna tuning unit and/or the balance network 1000 may be adjusted to track the antenna's impedance. Note that the tone may be easily removed at baseband.

Figure 107:
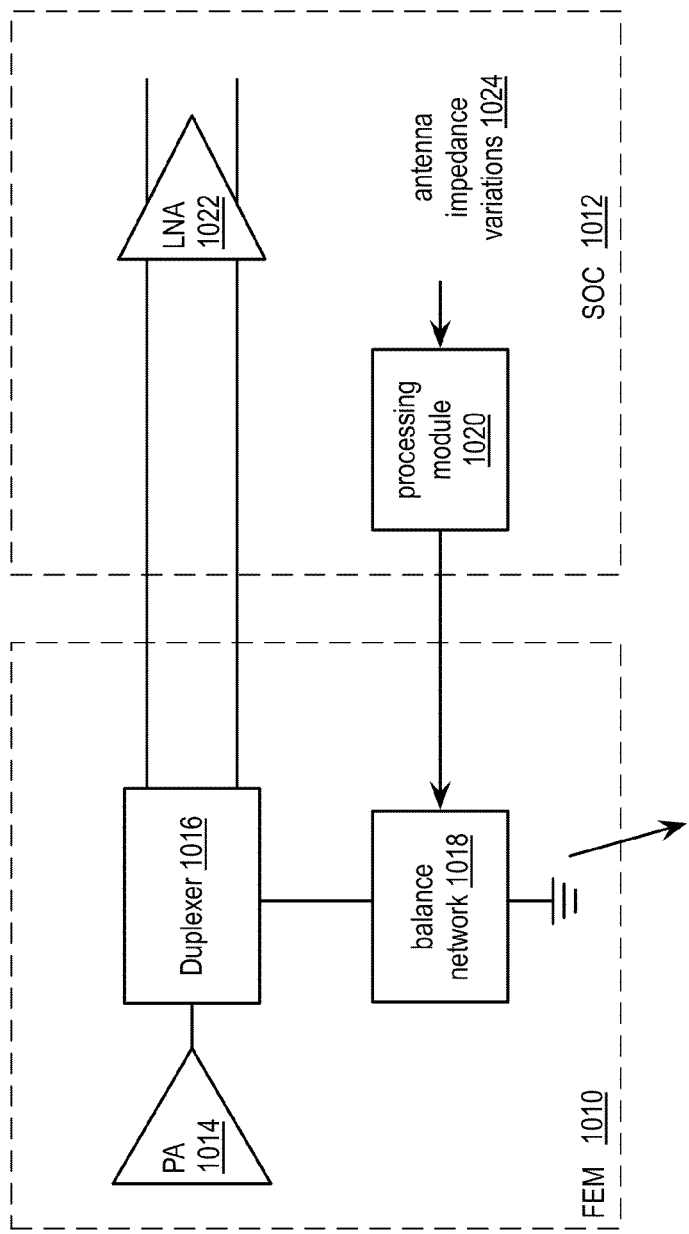
FIG. 107 is a schematic block diagram of another embodiment of a portion of each of a front-end module (FEM) and an LNA in accordance with the present invention.

FIG. 107 is a schematic block diagram of another embodiment of a portion of each of a front-end module (FEM 1010) and an SOC 1012. The portion of the FEM 1010 includes a power amplifier module (PA 1014), a duplexer 1016, a balance network 1018, and a common mode sensing circuit (not shown). The duplexer 1016 includes a transformer (or other structure such as a frequency selective duplexer 1016 and/or an electrical balance duplexer 1016). The common mode sensing circuit includes a pair of resistors coupled across the secondary of the transformer. The portion of the SOC 1012 includes a peak detector 1002 (not shown), a processing module 1020 (which performs the function of the tuning engine), and a low noise amplifier module (LNA 1022). Alternatively, the peak detector 1002 and/or the tuning engine may be within the FEM 1010.

The balance network 1018 includes an RLC network having a plurality of variable resistors, a plurality of variable capacitors, and at least one inductor. In this embodiment, the balance network 1018 can be tuned to provide a wide variety of impedance to enable a better matching to the impedance of the antenna.

Figure 108:
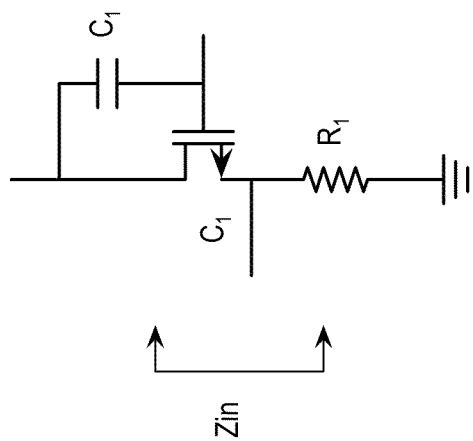
FIG. 108 is a schematic block diagram of an embodiment of an impedance in accordance with the present invention.

FIG. 108 is a schematic block diagram of an embodiment of an impedance of a resistor-transistor (R-T) circuit of a balance network. The capacitor corresponds to the parasitic capacitance of the transistor. Because the R-T circuit includes a real passive resistor, it contributes to the 3 dB theoretical limit on insertion loss.

Figure 109:
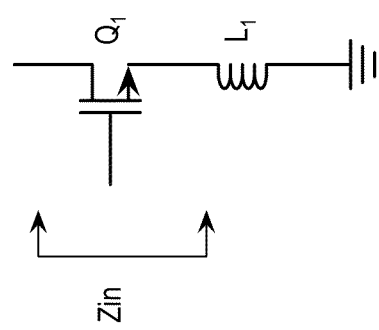
FIG. 109 is a schematic block diagram of another embodiment of an impedance in accordance with the present invention.

FIG. 109 is a schematic block diagram of another embodiment of an impedance of a resistor-transistor (R-T) circuit of the balance network. In this embodiment, the R-T circuit includes an inductively degenerated common-source transistor. As such, it is an active resistance and does not contribute to the 3 dB theoretical limit on insertion loss. Thus, the only loss due to the balance network is implementation loss.

Figure 110:
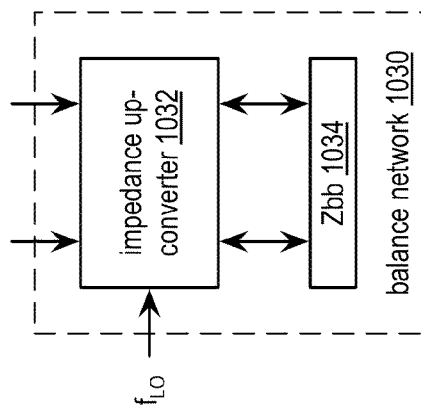
FIG. 110 is a schematic block diagram of an embodiment of a balance network in accordance with the present invention.

FIG. 110 is a schematic block diagram of an embodiment of a balance network 1030 that includes an impedance up-converter 1032 and one or more baseband impedances (Zbb 1034). The impedance up-converter is clocked at a desired frequency (e.g., $f_{LO}$ or $f_{RF}$). The combination of the impedance up-converter 1032 and the baseband impedance may be implemented in a similar fashion as an m-phase frequency translated bandpass filter as previously discussed.

Figure 111:
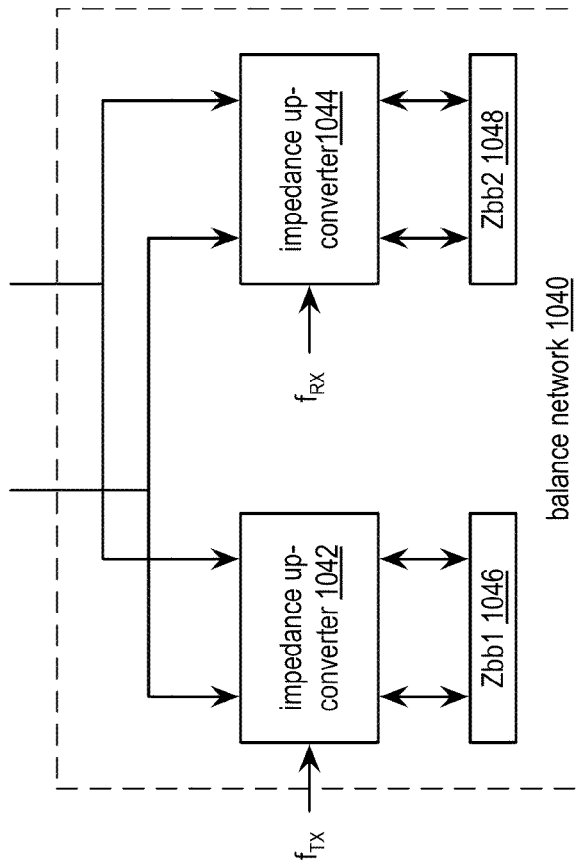
FIG. 111 is a schematic block diagram of another embodiment of a balance network in accordance with the present invention.

FIG. 111 is a schematic block diagram of another embodiment of a balance that includes two impedance up-converters 1042, 1044 and corresponding baseband impedances (Zbb 1046, 1048). Each of the impedance up-converters is clocked at a desired frequency (e.g., $f_{RF\_TX}$ and $f_{RF\_RX}$). Each of the combinations of an impedance up-converter 1042, 1044 and one or more baseband impedances may be implemented in a similar fashion as an m-phase frequency translated bandpass filter as previously discussed.

Figure 112:
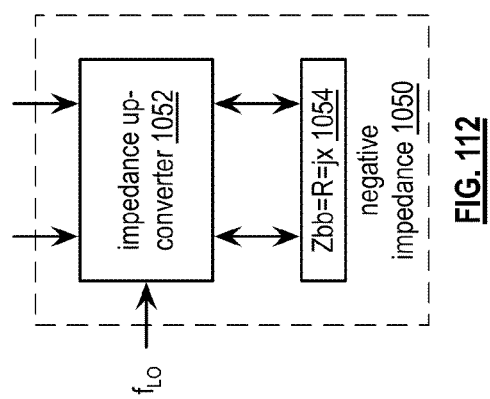
FIG. 112 is a schematic block diagram of an embodiment of a negative impedance in accordance with the present invention.

FIG. 112 is a schematic block diagram of an embodiment of a negative impedance 1050 for use in the balance network. The circuit includes a baseband negative impedance 1050 circuit, such as the one shown in FIG. 56 and the impedance up-converter 1052 may be implemented in a similar fashion as an m-phase frequency translated bandpass filter as previously discussed.

Figure 113:
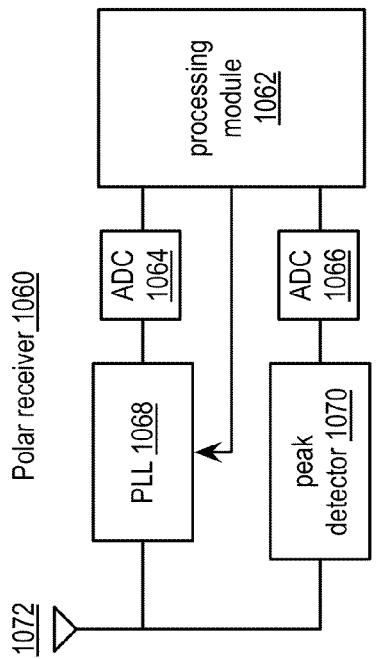
FIG. 113 is a schematic block diagram of an embodiment of a polar receiver in accordance with the present invention.

FIG. 113 is a schematic block diagram of an embodiment of a polar receiver 1060 that includes a phase locked loop (PLL 1068), analog to digital converts (ADC 1064, 1066), a phase processing module 1062, a peak detector 1070, and an amplitude processing module 1062. The PLL 1068 includes a phase and frequency detector (PFD), a charge pump, a loop filter, a voltage controlled oscillator (VCO), a divider (which may be a 1:1 divider), summing module, and a sigma-delta module.

In an example of operation, the antenna receives an inbound RF signal (e.g., A(t) cos($\omega_{RF}$(t)+θ(t))) and provides it through an FEM (not shown) to the PLL 1068 and the peak detector 1070 of the receiver section. The peak detector 1070, which may be an envelope detector, isolates the amplitude term (e.g., A(t)). The amplitude term is then converted to a digital signal via the ADC 1064, 1066. The PLL 1068 processes the cos($\omega_{RF}$(t)+θ(t)) of the inbound RF signal to extract the phase information (e.g., θ(t)). The processing module 1062 interprets the amplitude information and the phase information to reconstruct the transmitted data.

FIG. 114 is a schematic block diagram of an embodiment of a buffer circuit that may be used to couple the PLL 1082 of the local oscillator to the mixers of the down-conversion mixing module and/or to the up-conversion mixing module. The buffer circuit includes a differential buffer and a weaved connection 1086. The weaved connection 1086 introduces an increased inductance (in comparison to parallel traces) that attenuates undesired high frequency components from being presented to the mixers. Further, the size and shape of the weaved connection 1086 may be selected to obtain a desired capacitance between the traces to produce a tuned and distributed L-C circuit.

FIG. 115 is a schematic block diagram of an embodiment of a weaved connection 1100 that has a first trace on one layer of a substrate (e.g., die, package substrate, etc.) and another trace on another layer of the substrate. The traces may be interleaved on the two layers to improve magnetic coupling therebetween. Further, one or more of the traces may include an inductive loop to increase its inductance.

Figure 116:
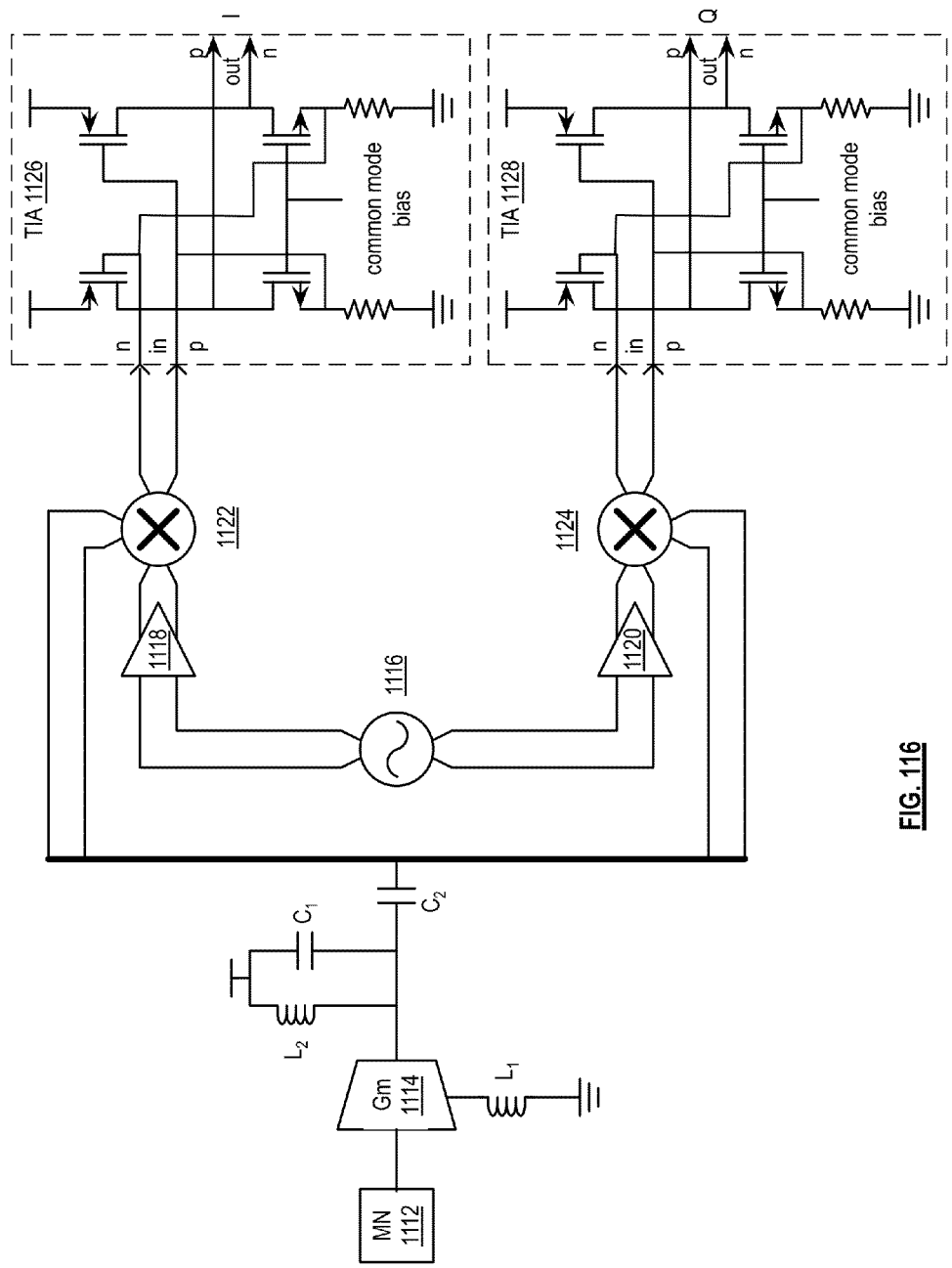
FIG. 116 is a schematic block diagram of an embodiment of a receiver in accordance with the present invention.

FIG. 116 is a schematic block diagram of an embodiment of a receiver that includes an input section, a down-conversion mixing section, and transimpedance amplifiers (TIA 1126, 1128). The input section includes the MN 1112, the gain module, inductors, and capacitors. The down-conversion mixing section includes mixers and a local oscillator. Each of the TIAs 1126, 1128 includes transistors and resistors coupled as shown. Note that the positive input may also be coupled to the common node between the resistor and the transistor on the positive output leg and the negative input may also be coupled to the common node between the resistor and the transistor on the negative output leg.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "operably coupled to", "coupled to", and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

While the transistors in the above described figure(s) is/are shown as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described, at least in part, in terms of one or more embodiments. An embodiment of the present invention is used herein to illustrate the present invention, an aspect thereof, a feature thereof, a concept thereof, and/or an example thereof. A physical embodiment of an apparatus, an article of manufacture, a machine, and/or of a process that embodies the present invention may include one or more of the aspects, features, concepts, examples, etc. described with reference to one or more of the embodiments discussed herein.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

What is claimed is:

1. A surface acoustic wave (SAW)-less receiver comprises:
   a front end module (FEM) interface module operable to receive an inbound radio frequency (RF) signal;
   an RF to intermediate frequency (IF) receiver section that includes:
      a frequency translated bandpass filter (FTBPF) that includes:
         a switching network; and
         a plurality of baseband impedances forming a baseband filter response, wherein the switching network is operable to couple the plurality of baseband impedances to the FEM interface in accordance with a plurality of phase-offset RF clock signals to frequency translate the baseband filter response to an RF filter response and to RF bandpass filter the inbound RF signal to produce a filtered inbound RF signal;
      a low noise amplifier module (LNA) operable to amplify the filtered inbound RF signal to produce an amplified inbound RF signal; and
      a mixing section operable to mix the amplified inbound RF signal with a local oscillation to produce an inbound IF signal; and
   a receiver IF to baseband section operable to convert the inbound IF signal into one or more inbound symbol streams.

2. The SAW-less receiver of claim 1, wherein the FEM interface module comprises:
   a transformer; and
   a tunable capacitor network C1 operably coupled to a secondary of the transformer and to filter a received inbound RF signal to produce the inbound RF signal.

3. The SAW-less receiver of claim 1 further comprises:
   a front end module operable to isolate the inbound RF signal from an undesired RF signal.

4. The SAW-less receiver of claim 1, wherein the receiver IF to BB section comprises:
   a mixing section operable to mix the inbound IF signal with a second local oscillation to produce I and Q mixed signals; and
   a combining & filtering section operable to:
      combine the I and Q mixed signals to produce a combined signal; and
      filter the combined signal to produce the one or more inbound symbol streams.

5. The SAW-less receiver of claim 1 further comprises:
   a clock generator operable to generate the plurality of phase-offset clock signals, wherein the switching network periodically couples the plurality of baseband impedances to the FEM interface module and the LNA based on the plurality of phase-offset clock signals, and wherein a rate of the plurality of phase-offset clock signals corresponds to a frequency of the inbound RF signal.

6. The SAW-less receiver of claim 1, wherein the mixing section comprises:
   a mixing module operable to:
      convert the amplified inbound RF signal into an in-phase (I) signal component and a quadrature (Q) signal component;
      mix the I signal component with an I signal component of a local oscillation to produce an I mixed signal;
      mix the Q signal component with a Q signal component of the local oscillation to produce a Q mixed signal; and
   a filter module operable to filter the I and Q mixed signals to produce the inbound IF signal.

7. The SAW-less receiver of claim 1, wherein the switching network is further operable to:
   couple first and third baseband impedances of the plurality of baseband impedances in a first coupling pattern to filter the inbound RF signal during a first one of the plurality of phase-offset RF clock signals;
   couple second and fourth baseband impedances of the plurality of baseband impedances in a second coupling pattern to filter the inbound RF signal during a second one of the plurality of phase-offset RF clock signals;
   couple the first and third baseband impedances in an inverse first coupling pattern to filter the inbound RF signal during a third one of the plurality of phase-offset RF clock signals; and
   couple the second and fourth baseband impedances in an inverse second coupling pattern to filter the inbound RF signal during a fourth one of the plurality of phase-offset RF clock signals.

8. The SAW-less receiver of claim 7, wherein a baseband impedance of the plurality of baseband impedances comprises at least one of:
   a capacitor;
   a variable capacitor;
   a switched capacitor filter;
   a switch capacitor resistance; and
   a complex impedance.

9. The SAW-less receiver of claim 1, wherein the FTBPF further comprises:
   a control module operable to receive a control signal, wherein the control signal provides control information to adjust one or more of: the quality factor of the baseband filter response, gain of the baseband filter response, bandwidth of the baseband filter response, and an attenuation slope of the baseband filter response.

10. A surface acoustic wave (SAW)-less receiver comprises:
- a front end module (FEM) interface module operable to receive an inbound radio frequency (RF) signal;
- an RF to intermediate frequency (IF) receiver section that includes:
  - an RF frequency translated bandpass filter (FTBPF) that includes:
    - a first switching network; and
    - a first plurality of baseband impedances forming a first baseband filter response, wherein the first switching network is operable to couple the plurality of baseband impedances to the FEM interface in accordance with a plurality of phase-offset RF clock signals to frequency translate the first baseband filter response to an RF filter response and to RF bandpass filter the inbound RF signal to produce a filtered inbound RF signal;
  - a low noise amplifier module (LNA) operable to amplify the filtered inbound RF signal to produce an amplified inbound RF signal; and
  - a mixing section operable to mix the amplified inbound RF signal with a local oscillation to produce an inbound IF signal;
  - an IF FTBPF that includes:
    - a second switching network; and
    - a second plurality of baseband impedances forming a second baseband filter response, wherein the second switching network is operable to couple the second plurality of baseband impedances to the mixing section in accordance with a plurality of phase-offset IF clock signals to frequency translate the second baseband filter response to an IF filter response and to IF bandpass filter the inbound IF signal to produce a filtered inbound IF signal; and
- a receiver IF to baseband section operable to convert the filtered inbound IF signal into one or more inbound symbol streams.

11. The SAW-less receiver of claim 10, wherein the FEM interface module comprises:
- a transformer; and
- a tunable capacitor network C1 operably coupled to a secondary of the transformer and to filter a received inbound RF signal to produce the inbound RF signal.

12. The SAW-less receiver of claim 10 further comprises:
a front end module operable to isolate the inbound RF signal from an undesired RF signal.

13. The SAW-less receiver of claim 10, wherein the receiver IF to BB section comprises:
- a mixing section operable to mix the inbound IF signal with a second local oscillation to produce I and Q mixed signals; and
- a combining & filtering section operable to:
  - combine the I and Q mixed signals to produce a combined signal; and
  - filter the combined signal to produce the one or more inbound symbol streams.

14. The SAW-less receiver of claim 10 further comprises:
a clock generator operable to:
- generate the first plurality of phase-offset clock signals, wherein the first switching network periodically couples the first plurality of baseband impedances to the FEM interface module and the LNA based on the first plurality of phase-offset clock signals, and wherein a rate of the first plurality of phase-offset clock signals corresponds to a frequency of the inbound RF signal; and
- generate the second plurality of phase-offset clock signals, wherein the second switching network periodically couples the second plurality of baseband impedances to the mixing module based on the second plurality of phase-offset clock signals, and wherein a rate of the second plurality of phase-offset clock signals corresponds to a frequency of the inbound IF signal.

15. The SAW-less receiver of claim 10, wherein the mixing section comprises:
- a mixing module operable to:
  - convert the amplified inbound RF signal into an in-phase (I) signal component and a quadrature (Q) signal component;
  - mix the I signal component with an I signal component of a local oscillation to produce an I mixed signal;
  - mix the Q signal component with a Q signal component of the local oscillation to produce a Q mixed signal; and
- a filter module operable to filter the I and Q mixed signals to produce the inbound IF signal.

16. The SAW-less receiver of claim 10, wherein the first switching network is further operable to:
- couple first and third baseband impedances of the first plurality of baseband impedances in a first coupling pattern to filter the inbound RF signal during a first one of the plurality of phase-offset RF clock signals;
- couple second and fourth baseband impedances of the first plurality of baseband impedances in a second coupling pattern to filter the inbound RF signal during a second one of the plurality of phase-offset RF clock signals;
- couple the first and third baseband impedances in an inverse first coupling pattern to filter the inbound RF signal during a third one of the plurality of phase-offset RF clock signals; and
- couple the second and fourth baseband impedances in an inverse second coupling pattern to filter the inbound RF signal during a fourth one of the plurality of phase-offset RF clock signals.

17. The SAW-less receiver of claim 10, wherein the second switching network is further operable to:
- couple first and third baseband impedances of the second plurality of baseband impedances in a first coupling pattern to filter the inbound IF signal during a first one of the plurality of phase-offset IF clock signals;
- couple second and fourth baseband impedances of the second plurality of baseband impedances in a second coupling pattern to filter the inbound IF signal during a second one of the plurality of phase-offset IF clock signals;
- couple the first and third baseband impedances in an inverse first coupling pattern to filter the inbound IF signal during a third one of the plurality of phase-offset IF clock signals; and
- couple the second and fourth baseband impedances in an inverse second coupling pattern to filter the inbound IF signal during a fourth one of the plurality of phase-offset IF clock signals.

18. The SAW-less receiver of claim 10, wherein a baseband impedance of the first or second plurality of baseband impedances comprises at least one of:
- a capacitor;
- a variable capacitor;
- a switched capacitor filter;
- a switch capacitor resistance; and
- a complex impedance.

19. The SAW-less receiver of claim 10, wherein the RF FTBPF further comprises:
- a control module operable to receive a control signal, wherein the control signal provides control information to adjust one or more of: the quality factor of the baseband filter response, gain of the baseband filter response, bandwidth of the baseband filter response, and an attenuation slope of the first baseband filter response.

20. The SAW-less receiver of claim 10, wherein the IF FTBPF further comprises:
- a control module operable to receive a control signal, wherein the control signal provides control information to adjust one or more of: the quality factor of the baseband filter response, gain of the baseband filter response, bandwidth of the baseband filter response, and an attenuation slope of the second baseband filter response.

* * * * *